United States Patent
Yaglioglu et al.

(10) Patent No.: US 12,255,123 B2
(45) Date of Patent: Mar. 18, 2025

(54) MICRO HEAT TRANSFER ARRAYS, MICRO COLD PLATES, AND THERMAL MANAGEMENT SYSTEMS FOR SEMICONDUCTOR DEVICES, AND METHODS FOR USING AND MAKING SUCH ARRAYS, PLATES, AND SYSTEMS

(71) Applicant: Microfabrica Inc., Van Nuys, CA (US)

(72) Inventors: Onnik Yaglioglu, Thousand Oaks, CA (US); Richard T. Chen, San Jose, CA (US); Will J. Tan, Pasadena, CA (US); Jia Li, Valencia, CA (US); Uri Frodis, Los Angeles, CA (US); Nina C. Levy, Los Angeles, CA (US); Dennis R. Smalley, Newhall, CA (US)

(73) Assignee: Microfabrica Inc., Van Nuys, CA (US)

( * ) Notice: Subject to any disclaimer, the term of this patent is extended or adjusted under 35 U.S.C. 154(b) by 553 days.

(21) Appl. No.: 17/699,049

(22) Filed: Mar. 18, 2022

(65) Prior Publication Data
US 2023/0207426 A1 Jun. 29, 2023

Related U.S. Application Data

(60) Provisional application No. 63/162,826, filed on Mar. 18, 2021.

(51) Int. Cl.
*H01L 23/473* (2006.01)
*F28F 3/12* (2006.01)
(Continued)

(52) U.S. Cl.
CPC ........... *H01L 23/4735* (2013.01); *F28F 3/12* (2013.01); *F28F 13/06* (2013.01);
(Continued)

(58) Field of Classification Search
CPC ............. H01L 21/4871; H01L 21/4882; H01L 23/473; H01L 23/4735; H05K 7/20254;
(Continued)

(56) References Cited

U.S. PATENT DOCUMENTS

| 4,609,037 A | 9/1986 | Wheeler et al. |
| 5,239,443 A | 8/1993 | Fahey et al. |

(Continued)

FOREIGN PATENT DOCUMENTS

| JP | 2005045027 A | 2/2005 |
| JP | 2008016872 A | 1/2008 |

(Continued)

OTHER PUBLICATIONS

(07) Adam L. Cohen, et al., "EFAB: Low-Cost, Automated Electrochemical Batch Fabrication of Arbitrary 3-D Microstructures", Micromachining and Microfabrication Process Technology, SPIE 1999 Symposium on Micromachining and Microfabrication, Sep. 1999.

*Primary Examiner* — Monica D Harrison
(74) *Attorney, Agent, or Firm* — Greenberg Traurig

(57) ABSTRACT

Embodiments of the present invention are directed to heat transfer arrays, cold plates including heat transfer arrays along with inlets and outlets, and thermal management systems including cold-plates, pumps and heat exchangers. These devices and systems may be used to provide cooling of semiconductor devices or other devices and particularly such devices that produce high heat concentrations. The heat transfer arrays may include microjets, multi-stage microjets, microchannels, fins, wells, wells with flow passages, well with stress relief or stress propagation inhibitors, and integrated microjets and fins.

5 Claims, 78 Drawing Sheets

Side Cross-Section View

Top View

(51) Int. Cl.
*F28F 13/06* (2006.01)
*H01L 21/48* (2006.01)
*H05K 7/20* (2006.01)

(52) U.S. Cl.
CPC ...... *H01L 21/4871* (2013.01); *H01L 21/4882* (2013.01); *H01L 23/473* (2013.01); *H05K 7/20254* (2013.01); *H05K 7/20272* (2013.01); *H05K 7/20281* (2013.01); *F28F 2260/02* (2013.01)

(58) Field of Classification Search
CPC . H05K 7/20272; H05K 7/20281; F28F 13/06; F28F 3/12; F28F 2260/02
USPC .......................................................... 257/714
See application file for complete search history.

(56) References Cited

U.S. PATENT DOCUMENTS

| | | | |
|---|---|---|---|
| 5,864,466 | A | 1/1999 | Remsburg |
| 6,064,572 | A | 5/2000 | Remsburg |
| 6,529,377 | B1 | 3/2003 | Nelson et al. |
| 6,606,251 | B1 | 8/2003 | Kenny, Jr. et al. |
| 6,675,875 | B1 | 1/2004 | Vafai et al. |
| 6,771,086 | B2 | 8/2004 | Lutz et al. |
| 6,793,007 | B1 | 9/2004 | Kramer et al. |
| 6,827,135 | B1 | 12/2004 | Kramer et al. |
| 6,882,543 | B2 | 4/2005 | Kenny, Jr. et al. |
| 6,970,485 | B1 | 11/2005 | Kitayama et al. |
| 6,981,849 | B2 | 1/2006 | Kim et al. |
| 6,992,382 | B2 | 1/2006 | Chrysler et al. |
| 7,019,972 | B2 | 3/2006 | Kenny, Jr. et al. |
| 7,044,768 | B1 | 5/2006 | Tilton et al. |
| 7,061,104 | B2 | 6/2006 | Kenny, Jr. et al. |
| 7,100,381 | B2 | 9/2006 | Hale et al. |
| 7,129,731 | B2 | 10/2006 | Thayer et al. |
| 7,133,286 | B2 | 11/2006 | Schmidt et al. |
| 7,135,877 | B2 | 11/2006 | Beaman et al. |
| 7,143,818 | B2 | 12/2006 | Thayer et al. |
| 7,156,159 | B2 | 1/2007 | Lovette et al. |
| 7,190,580 | B2 | 3/2007 | Bezama et al. |
| 7,218,519 | B2 | 5/2007 | Prasher et al. |
| 7,219,714 | B1 | 5/2007 | Heydari |
| 7,227,257 | B2 | 6/2007 | Kim et al. |
| 7,233,494 | B2 | 6/2007 | Campbell et al. |
| 7,271,034 | B2 | 9/2007 | Brunschwiler et al. |
| 7,277,283 | B2 | 10/2007 | Campbell et al. |
| 7,298,617 | B2 | 11/2007 | Campbell et al. |
| 7,331,378 | B2 | 2/2008 | Bhatti et al. |
| 7,334,630 | B2 | 2/2008 | Goodson et al. |
| 7,353,859 | B2 | 4/2008 | Stevanovic et al. |
| 7,362,574 | B2 | 4/2008 | Campbell et al. |
| 7,375,962 | B2 | 5/2008 | Campbell et al. |
| 7,385,817 | B2 | 6/2008 | Campbell et al. |
| 7,394,657 | B2 | 7/2008 | Hoivik et al. |
| 7,401,471 | B1 | 7/2008 | Tilton |
| 7,425,838 | B2 | 9/2008 | Itakura et al. |
| 7,432,592 | B2 | 10/2008 | Shi et al. |
| 7,435,623 | B2 | 10/2008 | Chrysler et al. |
| RE40,618 | E | 1/2009 | Nelson et al. |
| 7,486,514 | B2 | 2/2009 | Campbell et al. |
| 7,490,478 | B1 | 2/2009 | Tilton |
| 7,511,372 | B2 | 3/2009 | Chiu |
| 7,511,957 | B2 | 3/2009 | Campbell et al. |
| 7,516,776 | B2 | 4/2009 | Bezama et al. |
| 7,538,425 | B2 | 5/2009 | Myers et al. |
| 7,607,470 | B2 | 10/2009 | Glezer et al. |
| 7,626,407 | B2 | 12/2009 | Kabbani |
| 7,639,030 | B2 | 12/2009 | Wadell |
| 7,671,615 | B2 | 3/2010 | van de Beek et al. |
| 7,715,194 | B2 | 5/2010 | Brewer et al. |
| 7,731,079 | B2 | 6/2010 | Campbell et al. |
| 7,762,314 | B2 | 7/2010 | Campbell et al. |
| 7,806,168 | B2 | 10/2010 | Upadhya et al. |
| 7,808,781 | B2 | 10/2010 | Colgan et al. |
| 7,842,553 | B2 | 11/2010 | Kim et al. |
| 7,898,176 | B2 | 3/2011 | Li et al. |
| 7,928,565 | B2 | 4/2011 | Brunschwiler et al. |
| 7,940,064 | B2 | 5/2011 | Segawa et al. |
| 7,978,473 | B2 | 7/2011 | Campbell et al. |
| 7,992,625 | B1 | 8/2011 | Spokoiny et al. |
| 7,992,627 | B2 | 8/2011 | Bezama et al. |
| 8,008,934 | B2 | 8/2011 | Wong et al. |
| 8,012,808 | B2 | 9/2011 | Shi et al. |
| 8,025,097 | B2 | 9/2011 | Di Stefano et al. |
| 8,037,927 | B2 | 10/2011 | Schuette |
| 8,058,802 | B2 | 11/2011 | Li et al. |
| 8,115,303 | B2 | 2/2012 | Bezama et al. |
| 8,129,253 | B2 | 3/2012 | Haji-Sheikh et al. |
| 8,182,869 | B2 | 5/2012 | Iwasaki |
| 8,232,637 | B2 | 7/2012 | Beaupre et al. |
| 8,264,841 | B2 | 9/2012 | Sasaki et al. |
| 8,266,802 | B2 | 9/2012 | Campbell et al. |
| 8,269,341 | B2 | 9/2012 | Barth |
| 8,358,000 | B2 | 1/2013 | Beaupre et al. |
| 8,378,322 | B2 | 2/2013 | Dahm et al. |
| 8,432,176 | B2 | 4/2013 | Gunji et al. |
| 8,482,919 | B2 | 7/2013 | Dede |
| 8,488,323 | B2 | 7/2013 | Peterson et al. |
| 8,528,628 | B2 | 9/2013 | Robinson |
| 8,559,175 | B2 | 10/2013 | Huisman et al. |
| 8,723,146 | B2 | 5/2014 | Dahm et al. |
| 8,737,441 | B2 | 5/2014 | Liu |
| 8,772,927 | B2 | 7/2014 | Bezama et al. |
| 8,804,781 | B2 | 8/2014 | Schleuning et al. |
| 8,804,782 | B2 | 8/2014 | Schleuning et al. |
| 8,912,643 | B2 | 12/2014 | De Bock et al. |
| 8,929,071 | B2 | 1/2015 | Beaupre et al. |
| 8,987,892 | B2 | 3/2015 | Davis et al. |
| 9,035,452 | B2 | 5/2015 | Weaver et al. |
| 9,052,724 | B2 | 6/2015 | Bernstein et al. |
| 9,065,238 | B2 | 6/2015 | Schleuning et al. |
| 9,953,899 | B2 | 4/2018 | Chen et al. |
| 10,119,776 | B2 | 11/2018 | Di Stefano |
| 10,665,530 | B2 | 5/2020 | Chen et al. |
| 10,957,624 | B2 | 3/2021 | Chen et al. |
| 11,456,235 | B1 | 9/2022 | Chen et al. |
| 2005/0008983 | A1 | 1/2005 | Wang |
| 2005/0045027 | A1 | 3/2005 | Celi et al. |
| 2007/0205787 | A1 | 9/2007 | Natsuhara et al. |
| 2008/0016872 | A1 | 1/2008 | Toffan et al. |
| 2008/0188990 | A1 | 8/2008 | Elsdoerfer et al. |
| 2008/0231304 | A1 | 9/2008 | Elsdoerfer et al. |
| 2008/0278913 | A1 | 11/2008 | Campbell et al. |
| 2009/0153735 | A1 | 6/2009 | Kondo et al. |
| 2010/0091457 | A1 | 4/2010 | Krause |
| 2010/0116788 | A1 | 5/2010 | Singh et al. |
| 2011/0109335 | A1 | 5/2011 | Schroeder et al. |
| 2012/0291995 | A1 | 11/2012 | Sasaki et al. |
| 2013/0105135 | A1 | 5/2013 | Kulah et al. |
| 2015/0194363 | A1 | 7/2015 | Jun et al. |
| 2015/0208549 | A1 | 7/2015 | Shedd et al. |
| 2015/0237767 | A1 | 8/2015 | Shedd et al. |
| 2015/0285857 | A1 | 10/2015 | Schroeder et al. |
| 2015/0342023 | A1 | 11/2015 | Refai-Ahmed et al. |
| 2017/0027084 | A1 | 1/2017 | Kabbani et al. |
| 2018/0218926 | A1 | 8/2018 | Stuckey et al. |

FOREIGN PATENT DOCUMENTS

| | | |
|---|---|---|
| WO | 2009153735 A1 | 12/2009 |
| WO | 2009155090 A2 | 12/2009 |
| WO | 2012017009 A1 | 2/2012 |
| WO | 2016110291 A1 | 7/2016 |
| WO | 2017059382 A1 | 4/2017 |

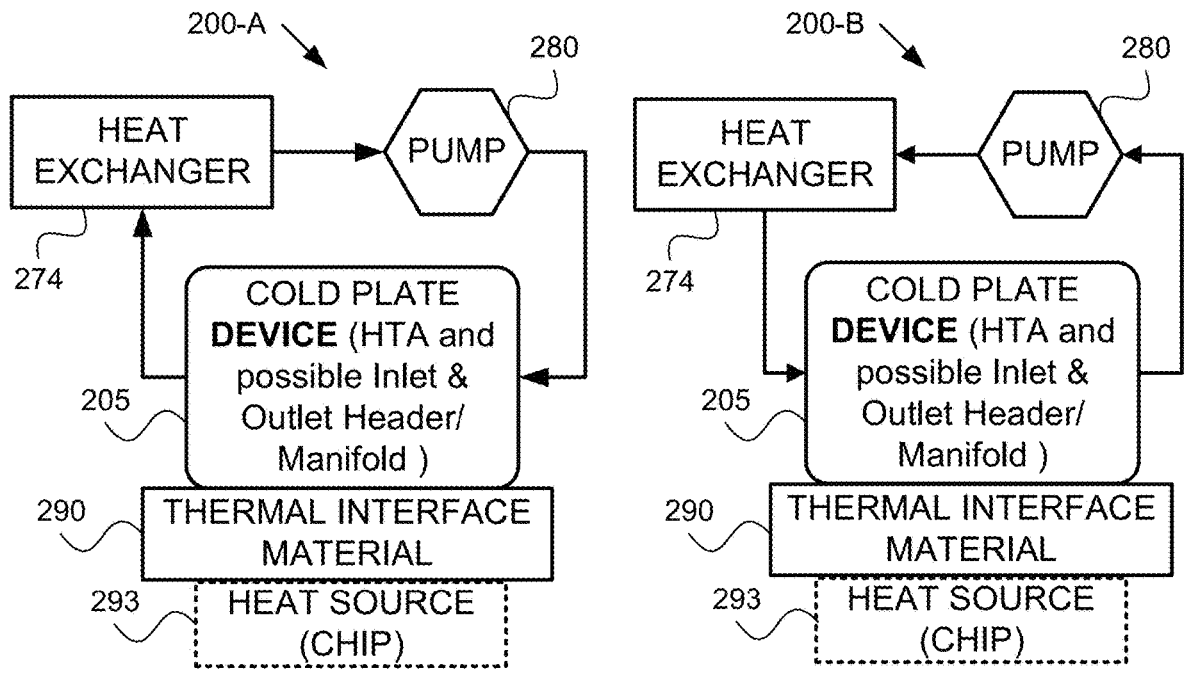
FIG. 2A          FIG. 2B
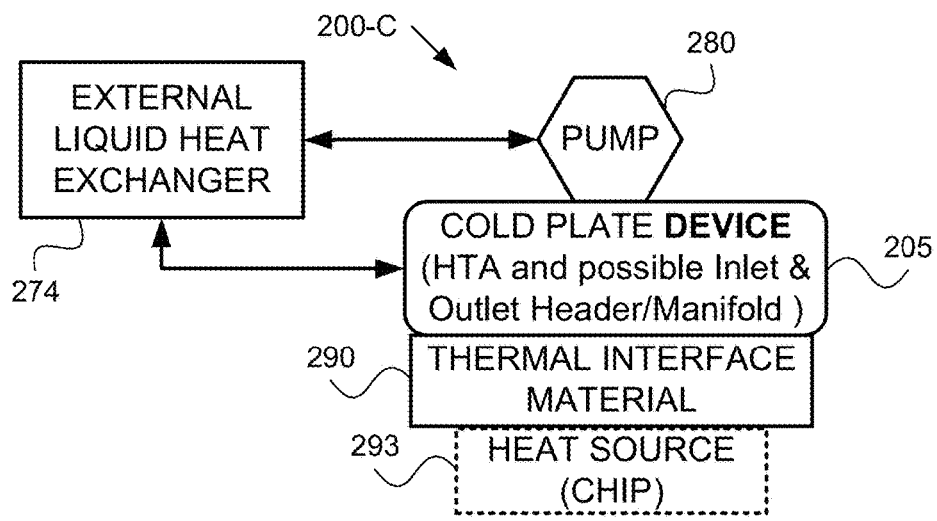
FIG. 2C

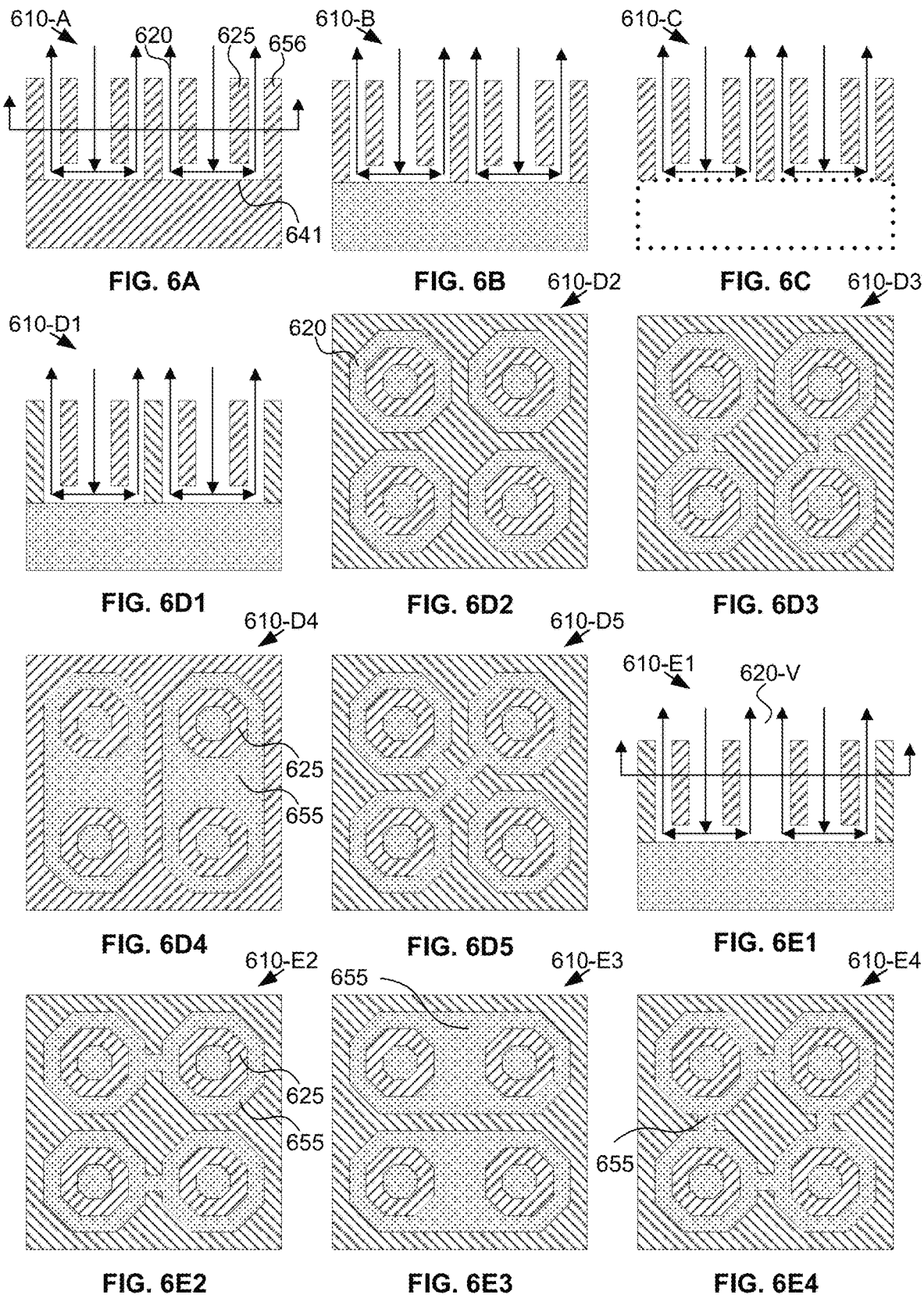

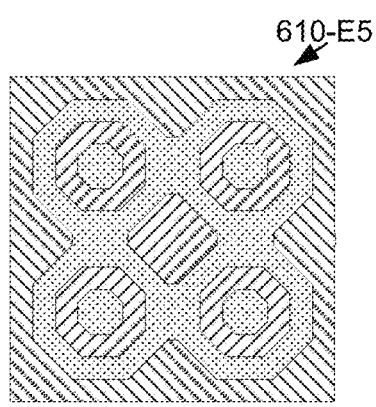
FIG. 6E5
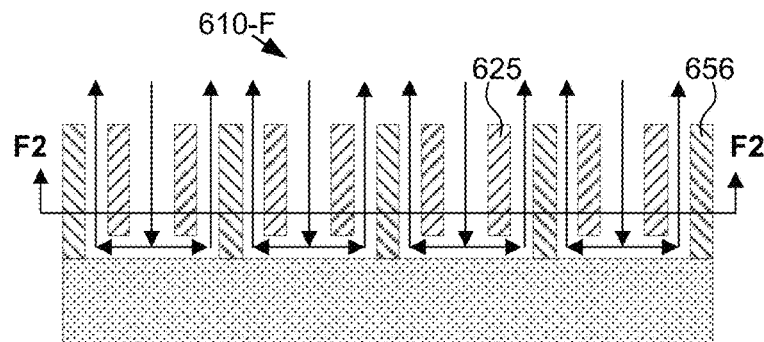
FIG. 6F1
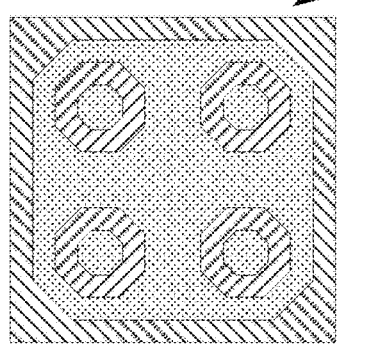
FIG. 6E6
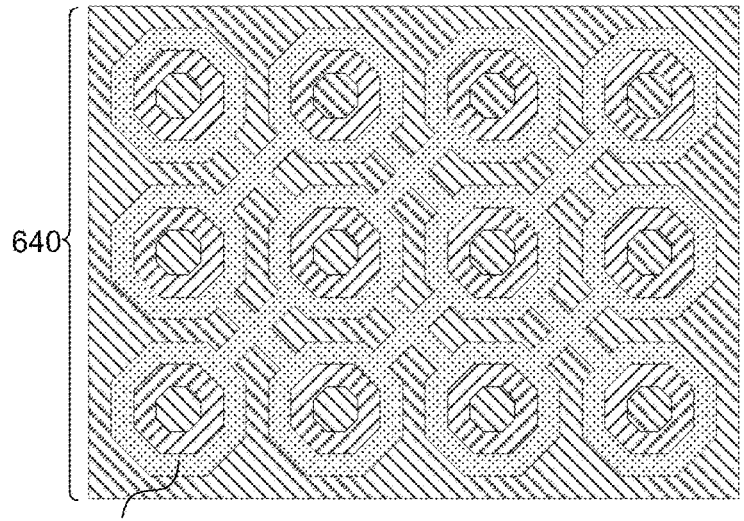
FIG. 6F2
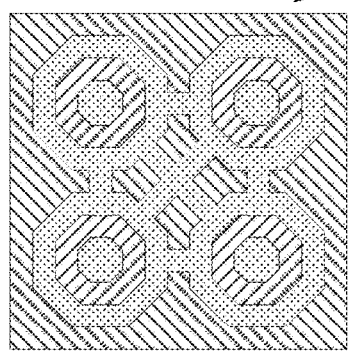
FIG. 6E7
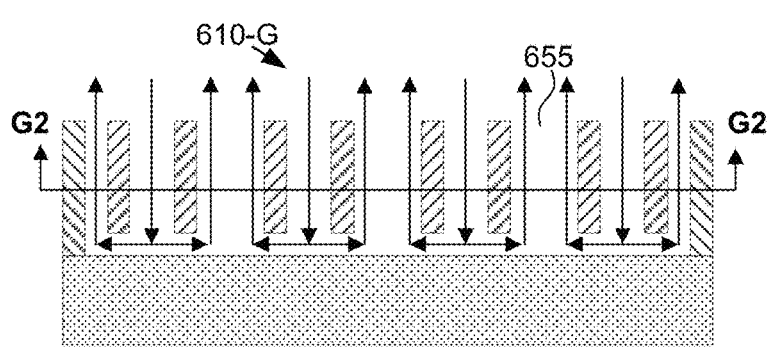
FIG. 6G1

FIG. 6G2
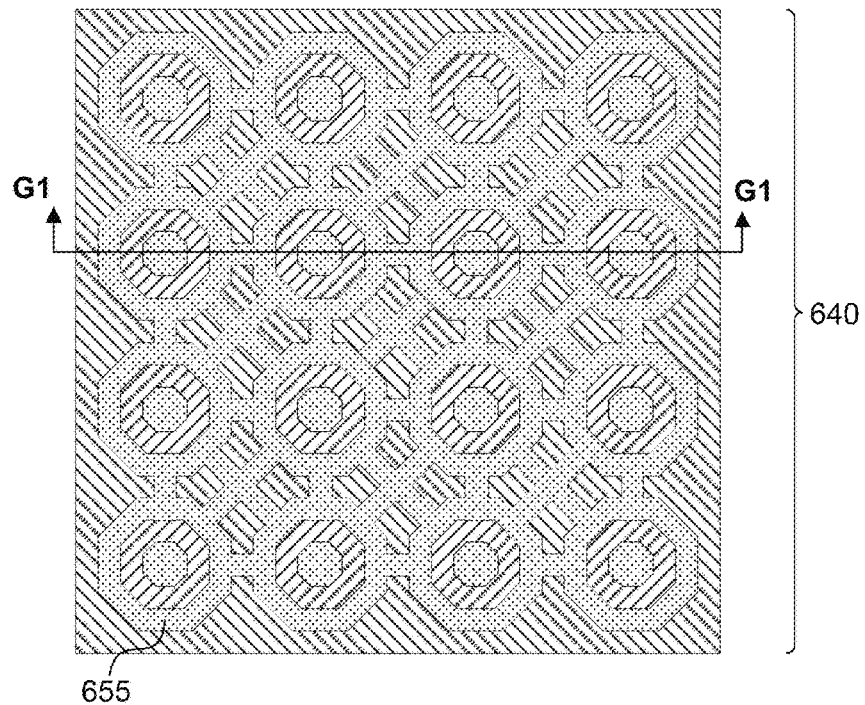
FIG. 6H1
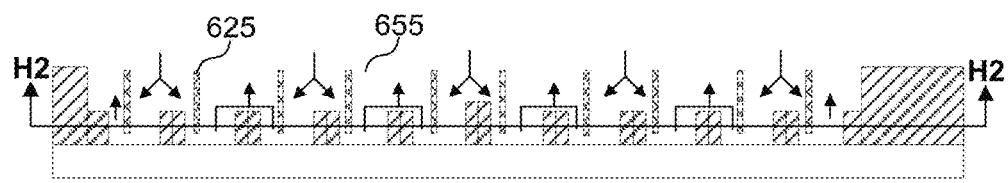
FIG. 6H2
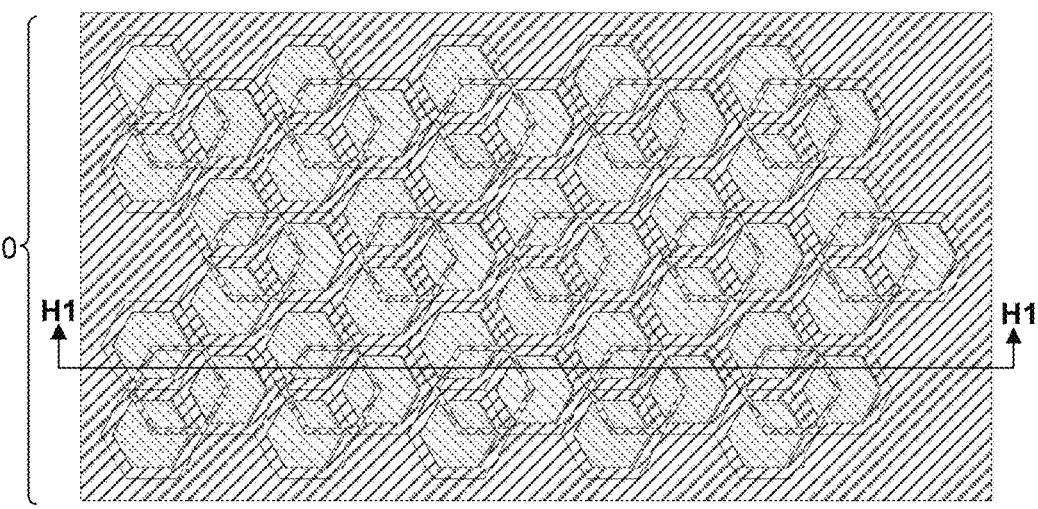

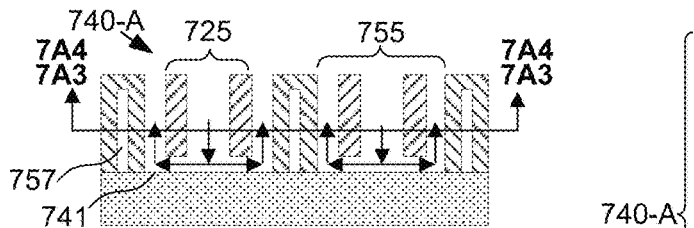
FIG. 7A1 Side Cross-Section View
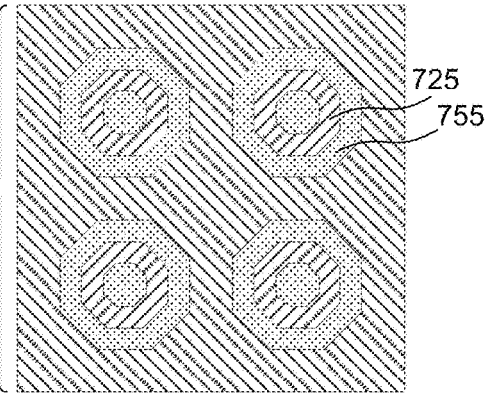
FIG. 7A2 Top View
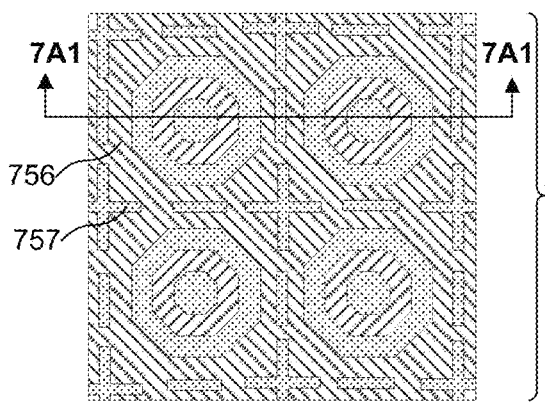
FIG. 7A3 Section View
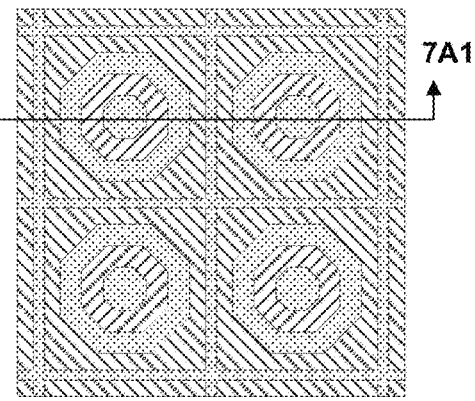
FIG. 7A4 Section View
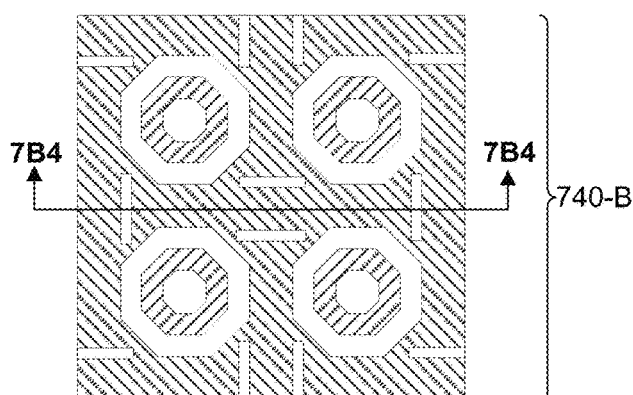
FIG. 7B3
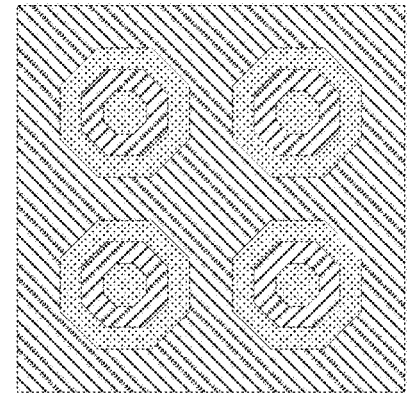
FIG. 7B2 Top View
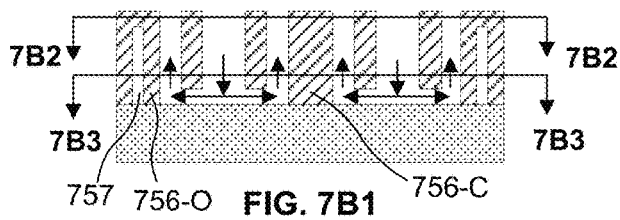
FIG. 7B1 Side Cross-Section View
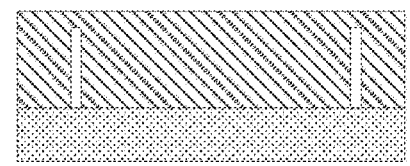
FIG. 7B4 Side Cross-Section View

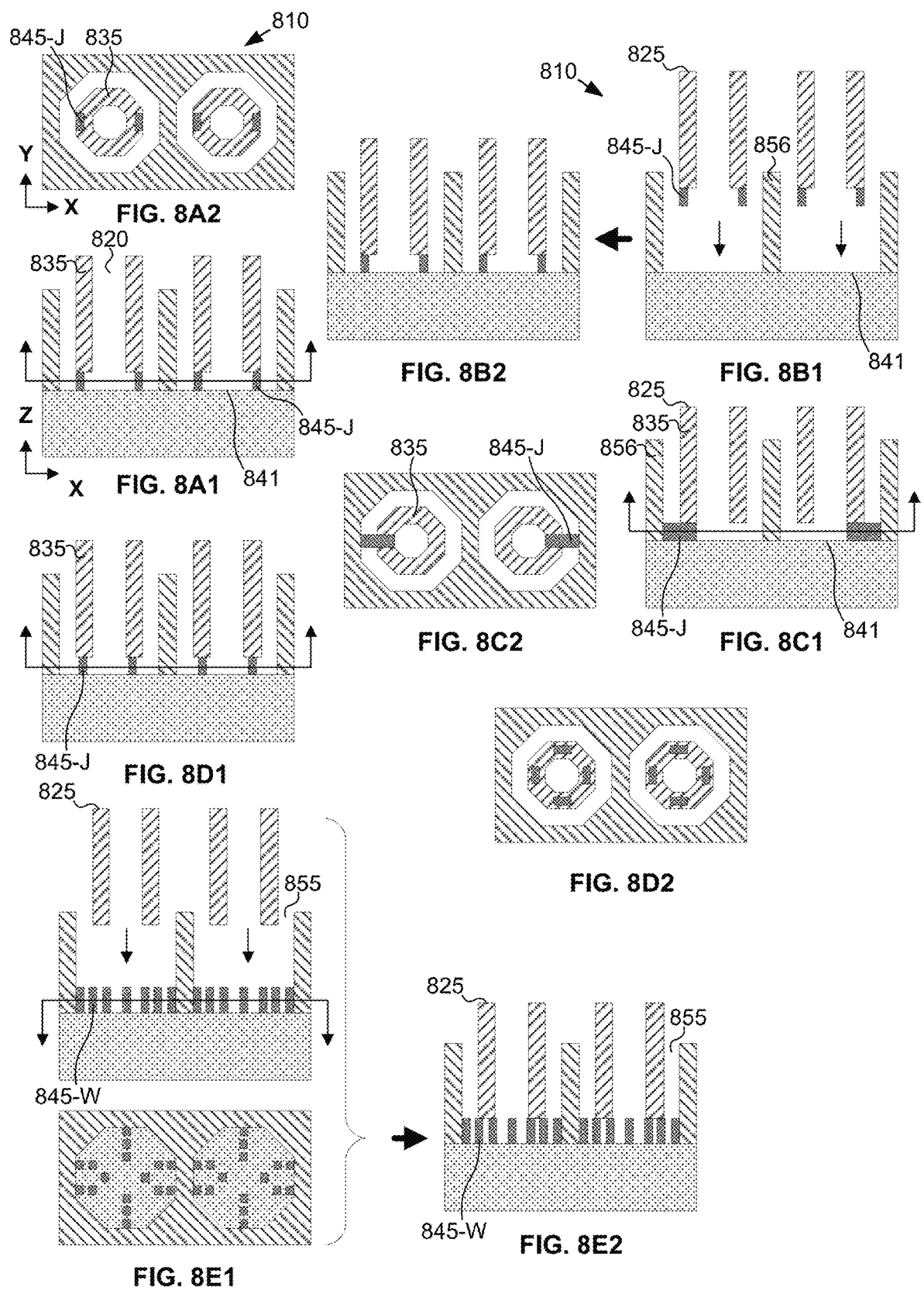

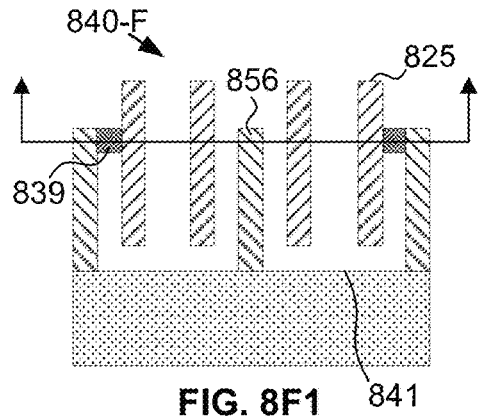
FIG. 8F1
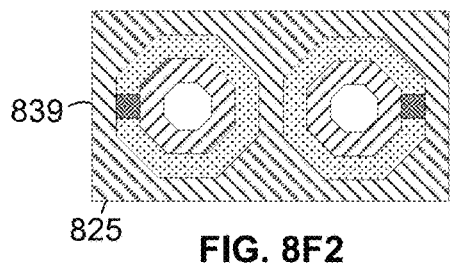
FIG. 8F2
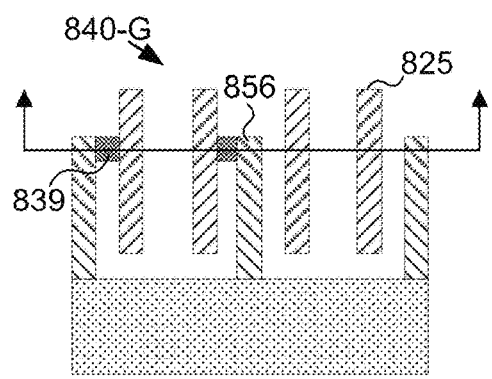
FIG. 8G1
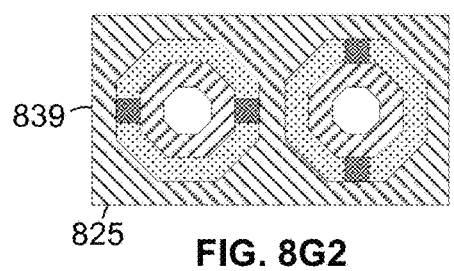
FIG. 8G2
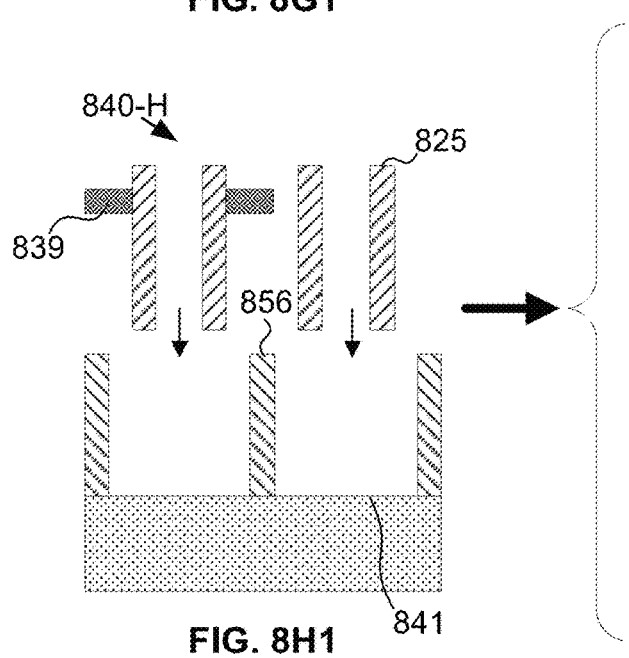
FIG. 8H1
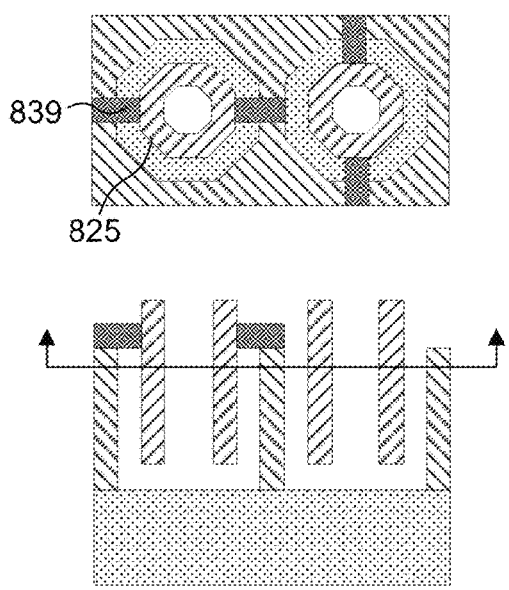
FIG. 8H2

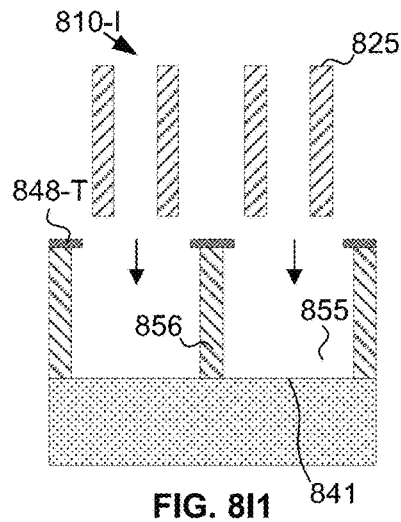
FIG. 8I1
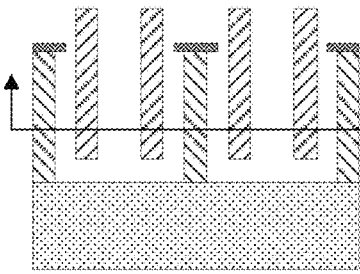
FIG. 8I2
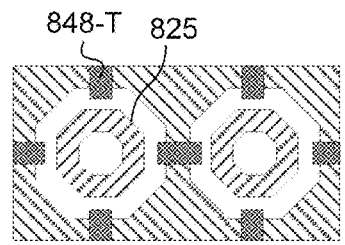
FIG. 8I3
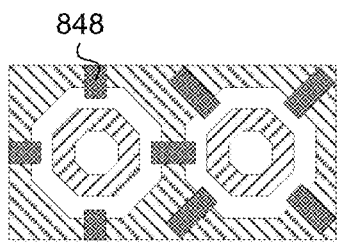
FIG. 8J1
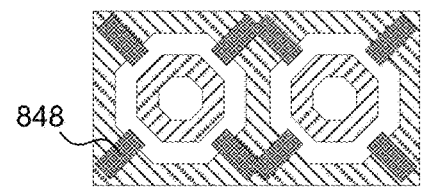
FIG. 8J2
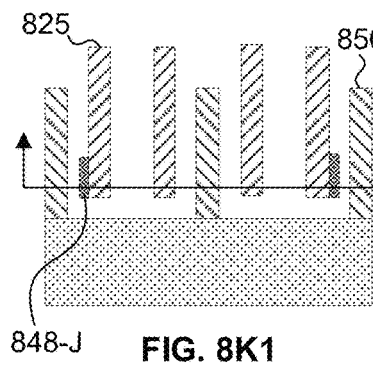
FIG. 8K1
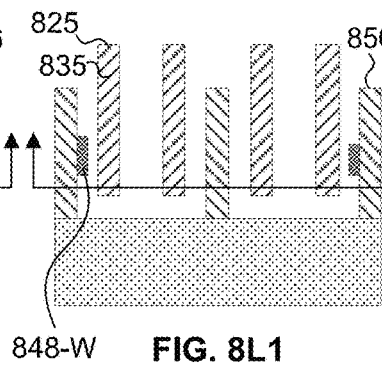
FIG. 8L1
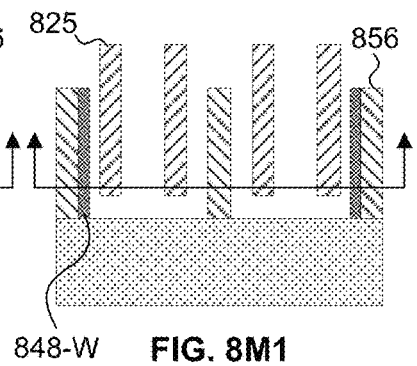
FIG. 8M1
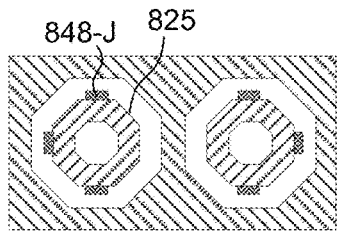
FIG. 8K2
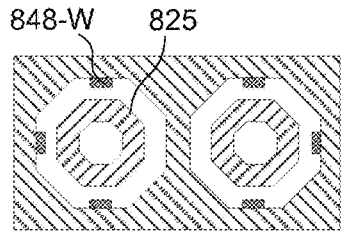
FIG. 8L2
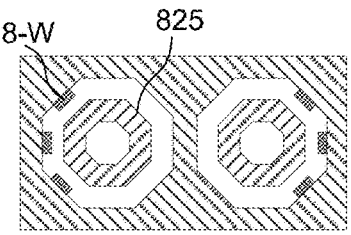
FIG. 8M2

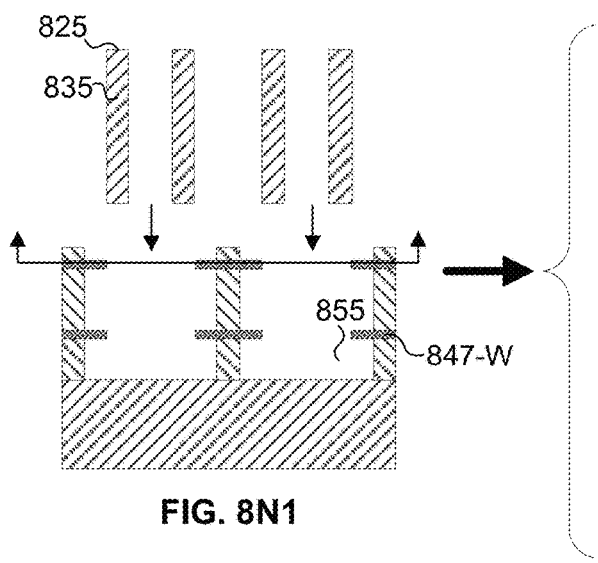
FIG. 8N1
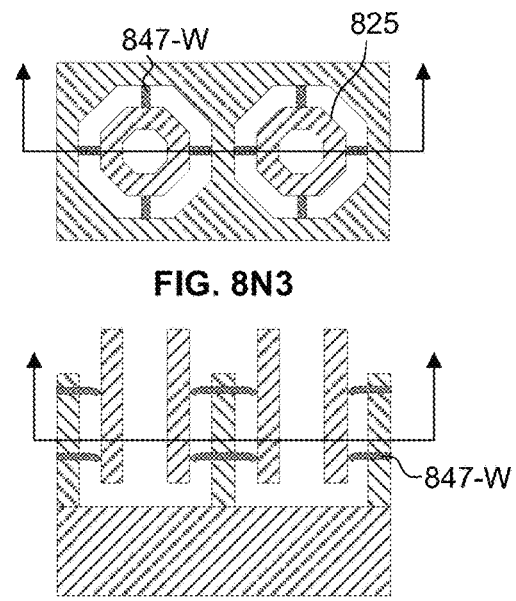
FIG. 8N3
FIG. 8N2
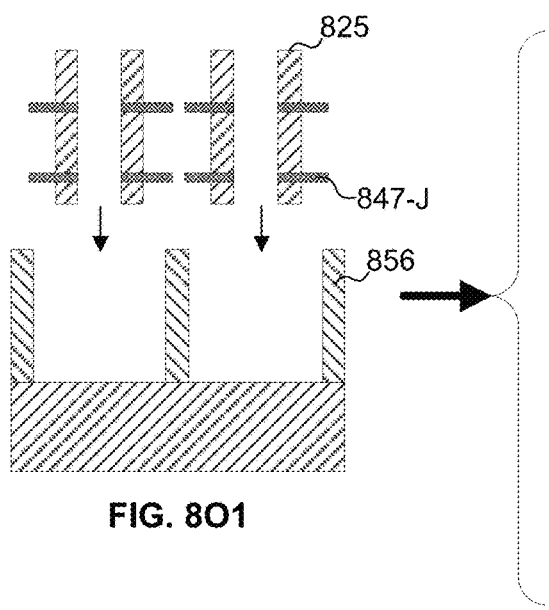
FIG. 8O1
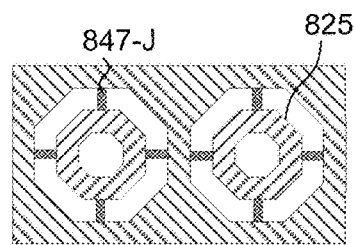
FIG. 8O3
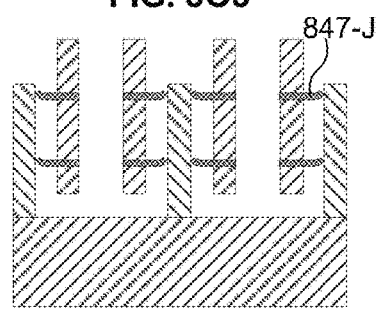
FIG. 8O2

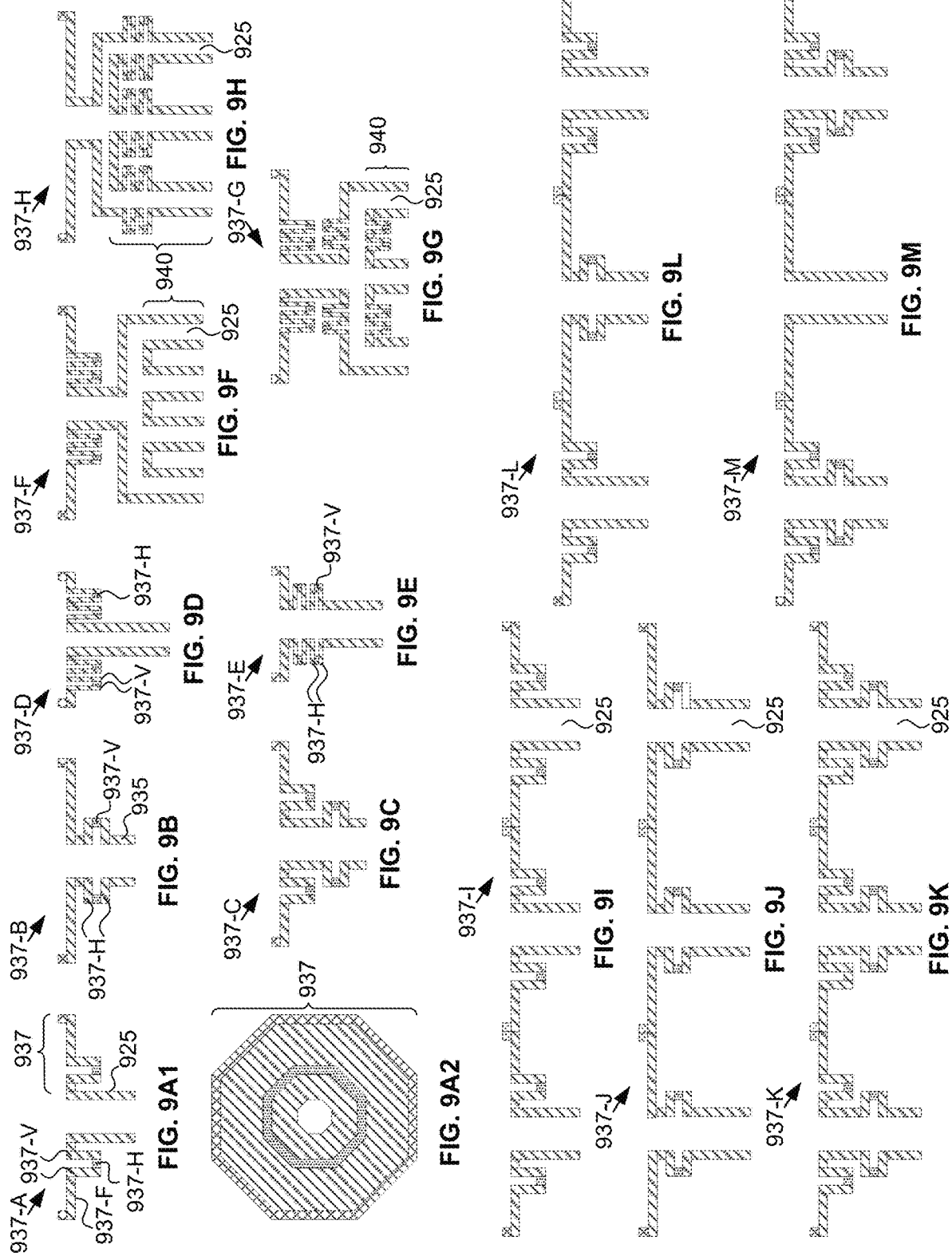

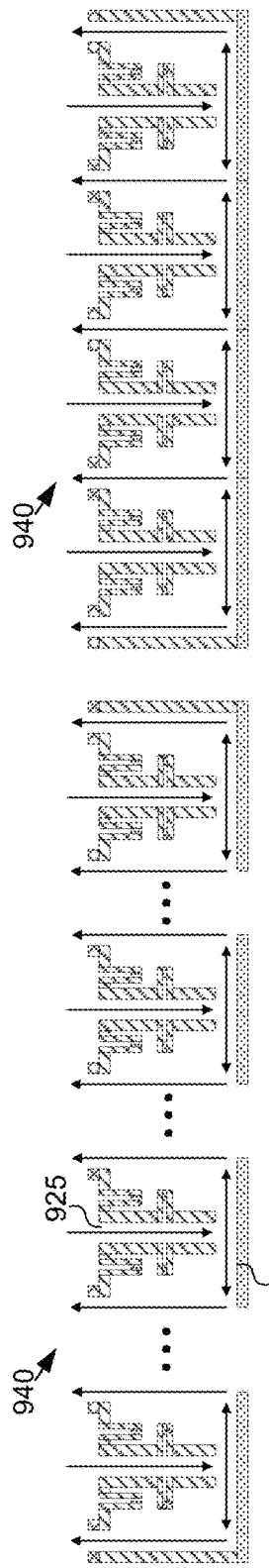
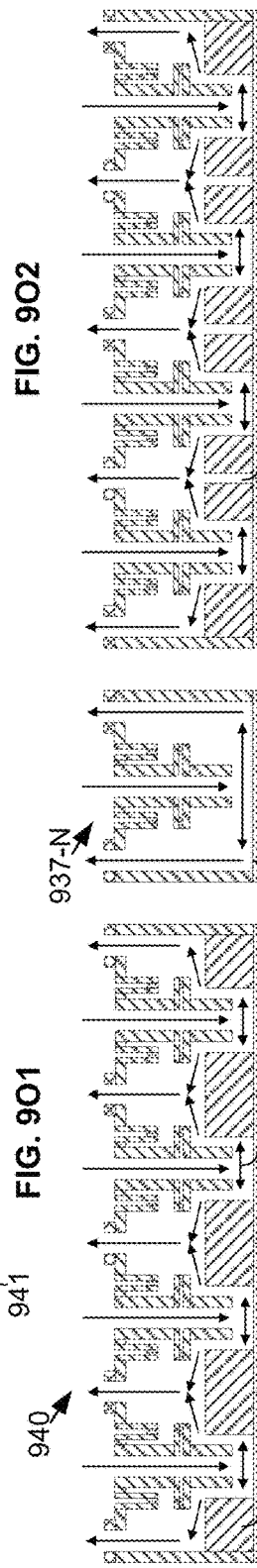
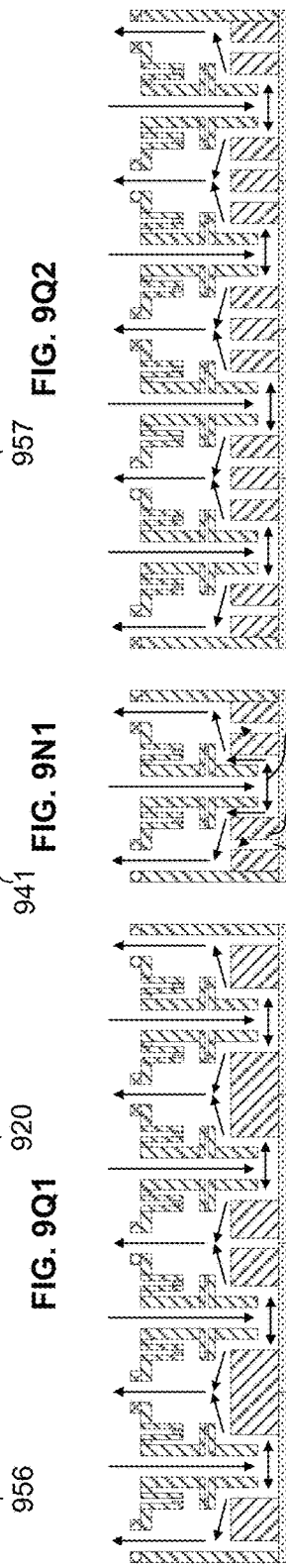
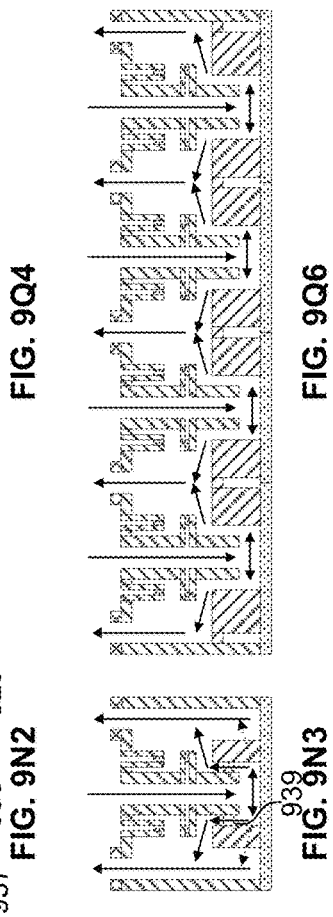
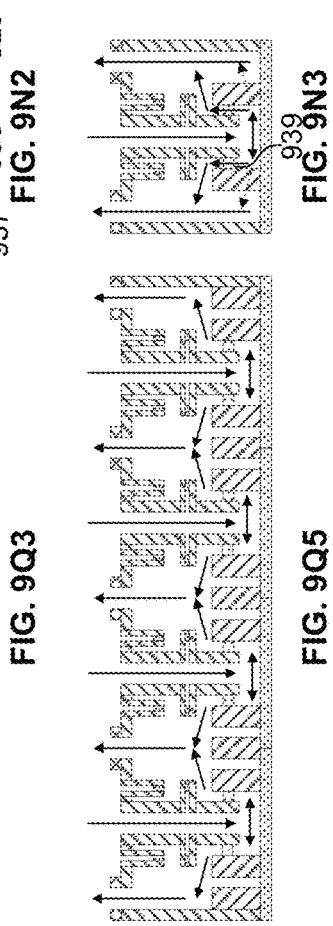

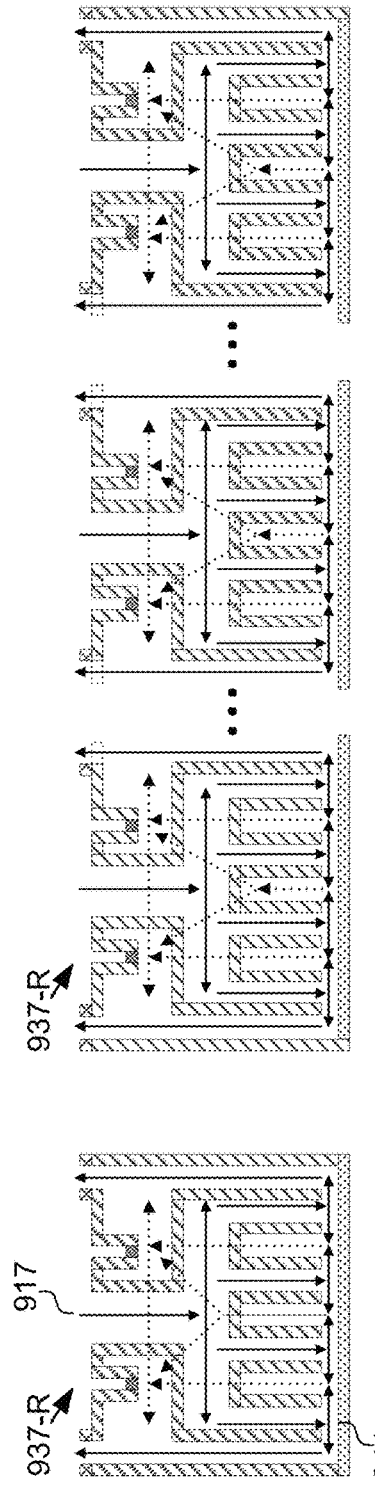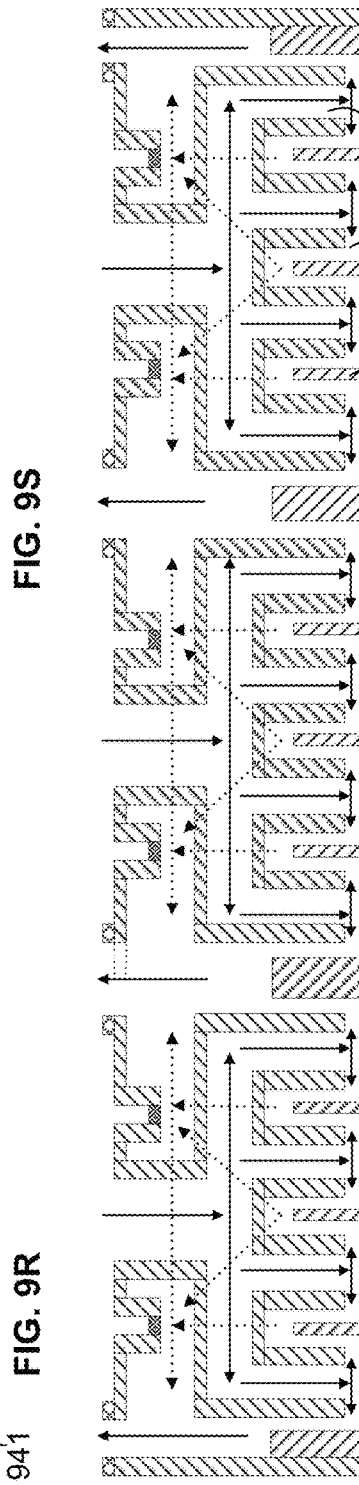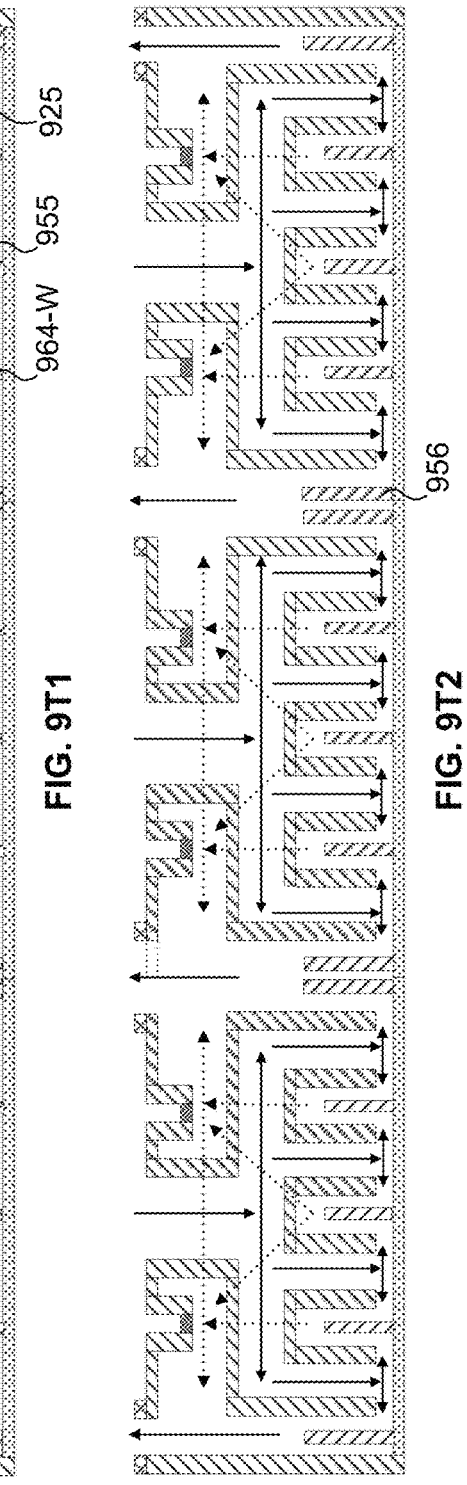

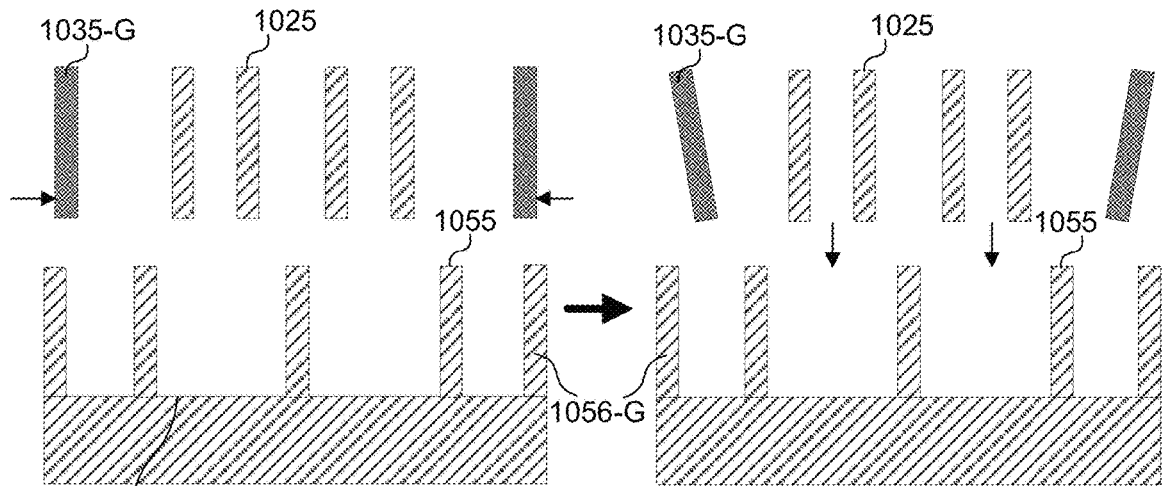
FIG. 10A1    FIG. 10A2
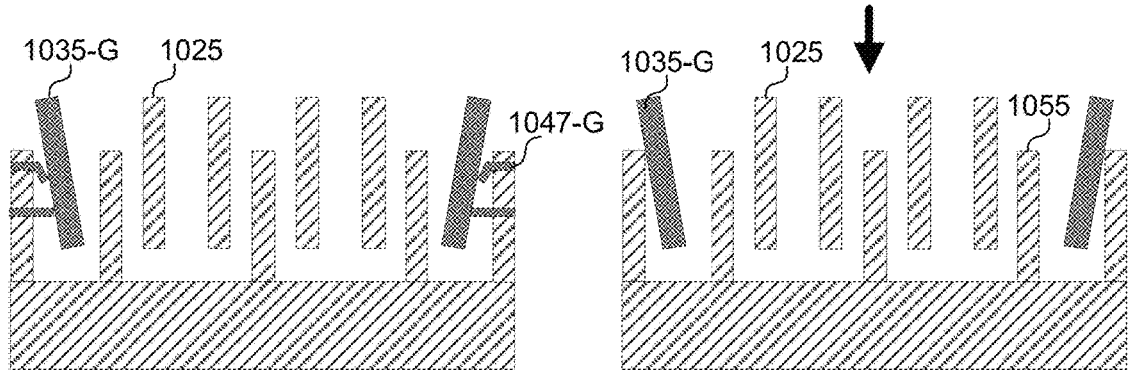
FIG. 10B3    FIG. 10A3
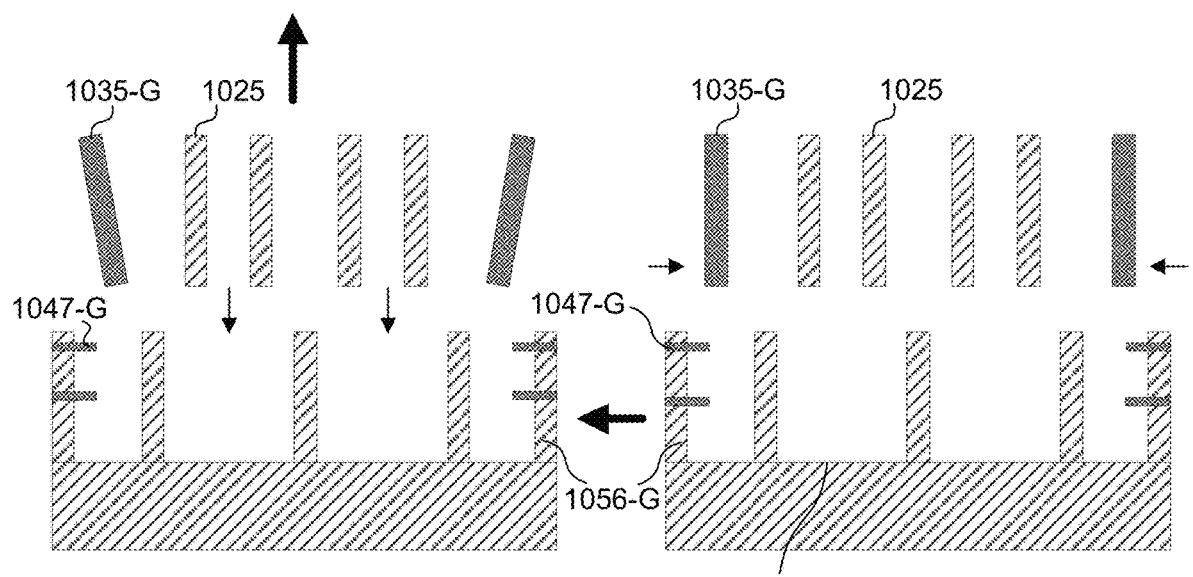
FIG. 10B2    FIG. 10B1

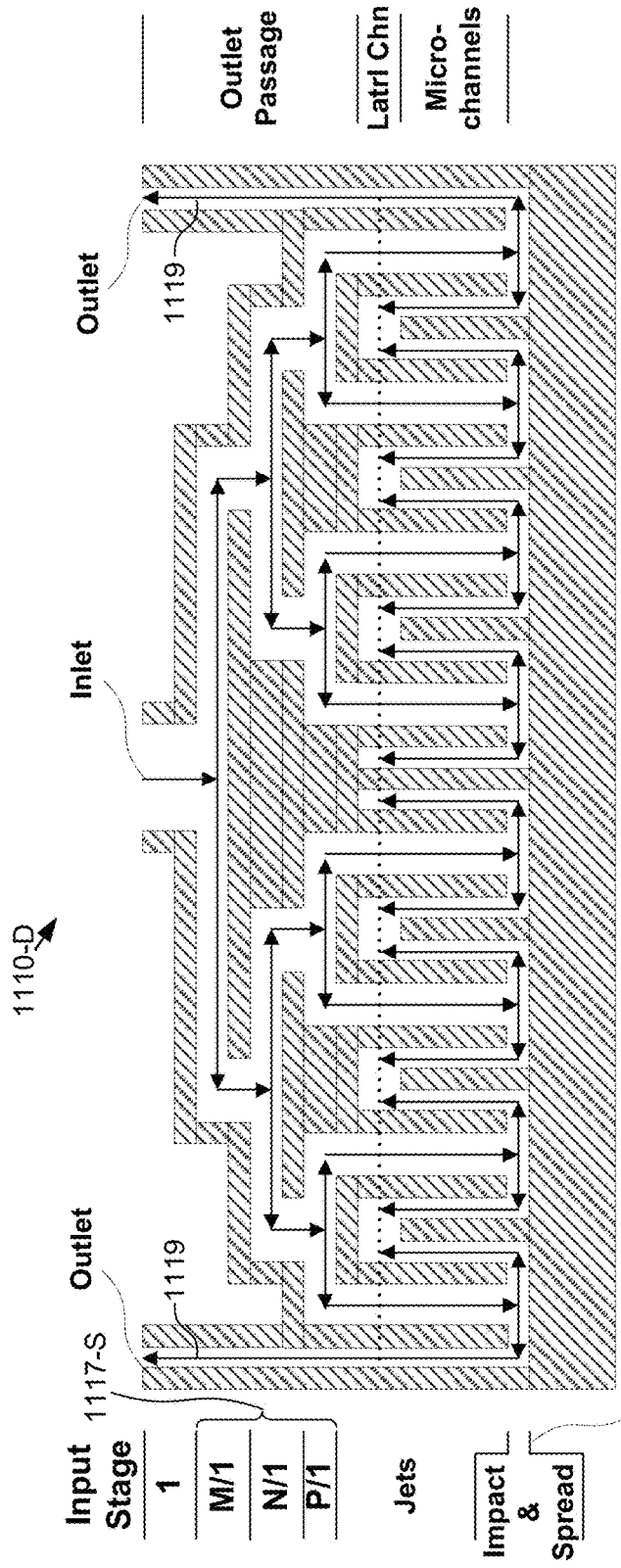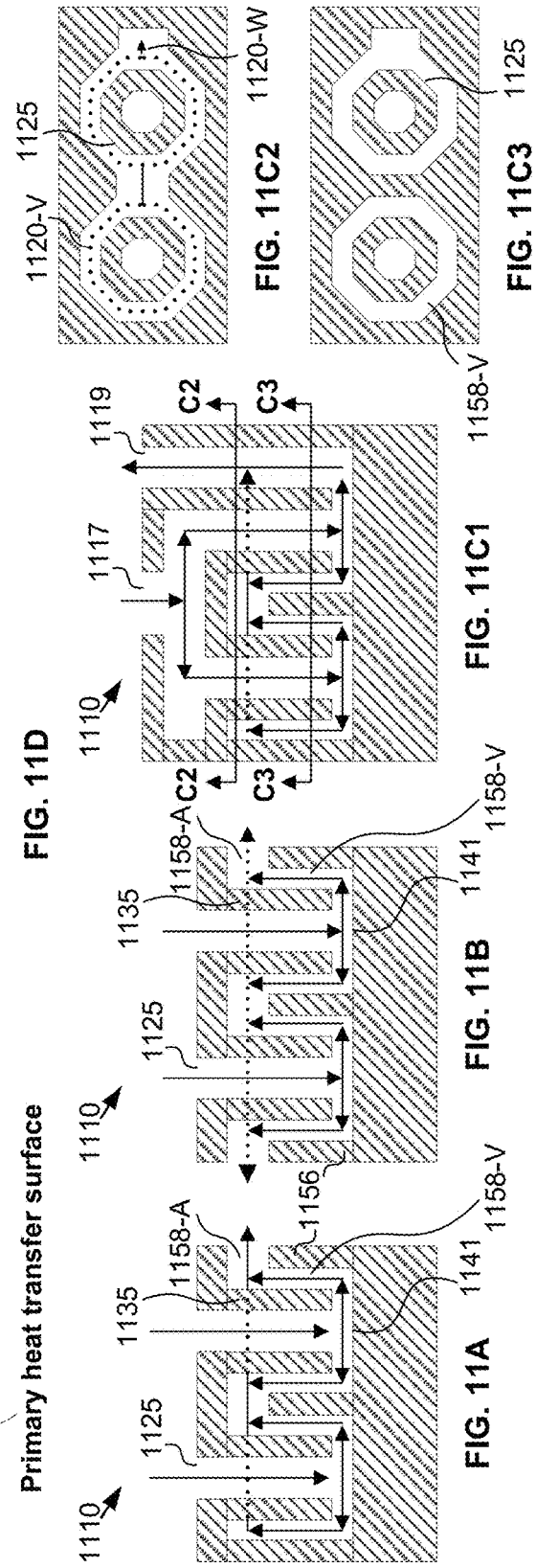

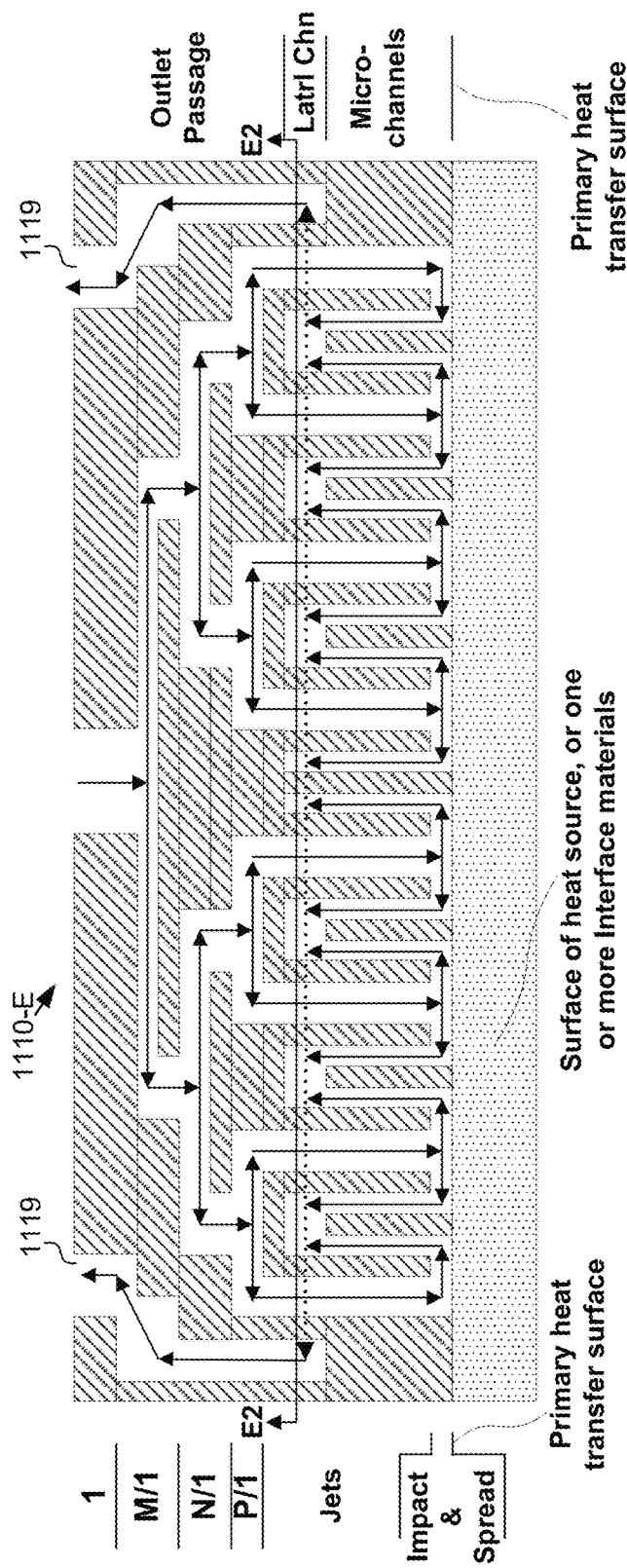
FIG. 11E1
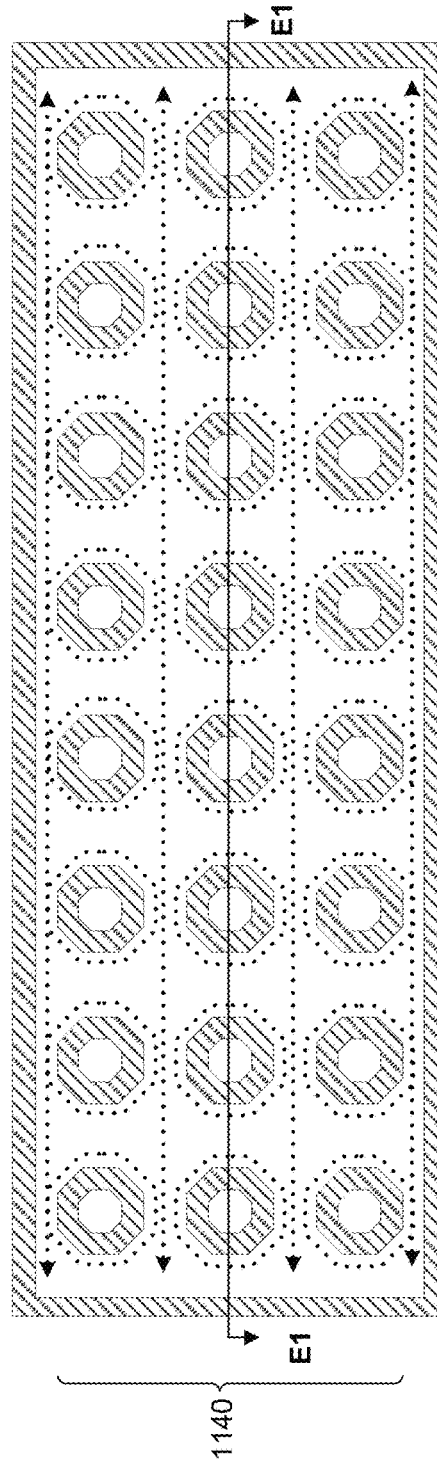
FIG. 11E2

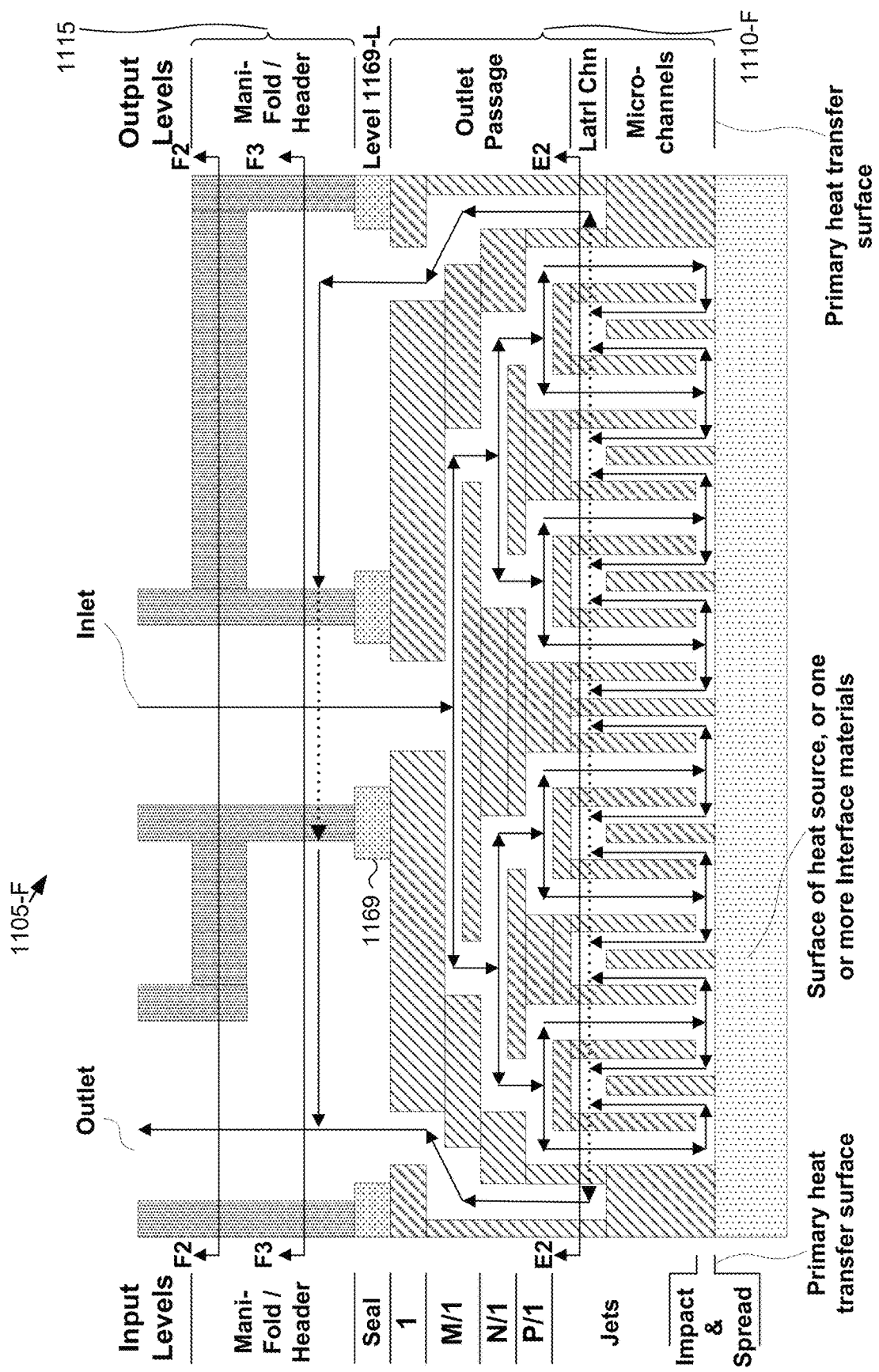
FIG. 11F1

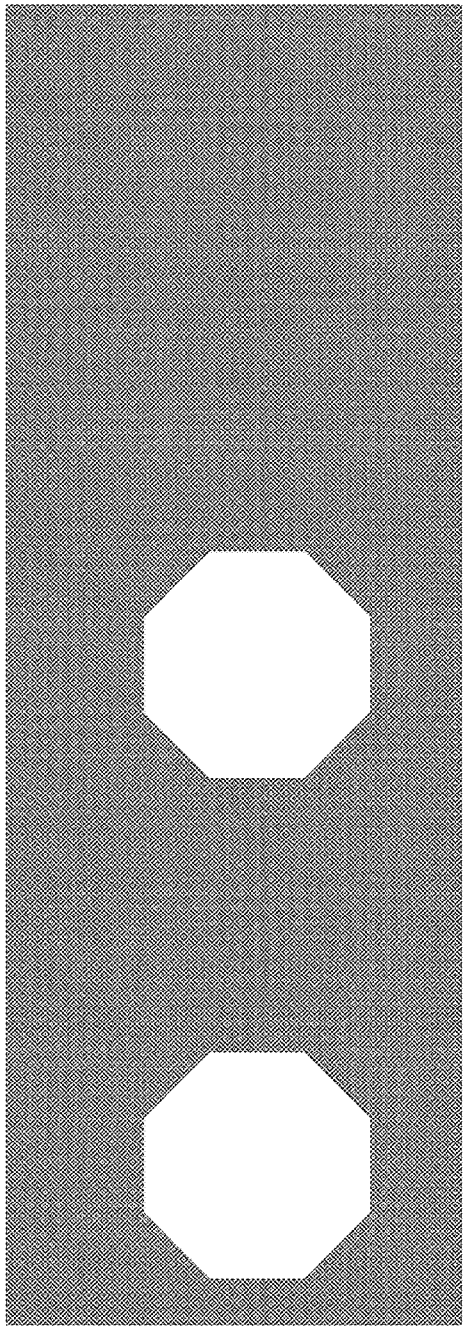
FIG. 11F2
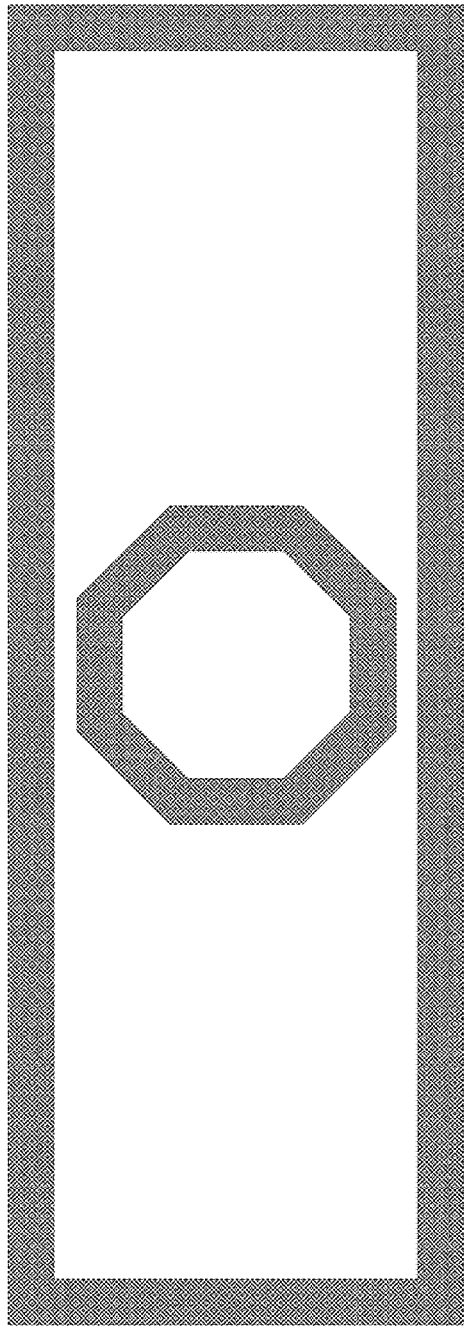
FIG. 11F3

A ≥ 300 microns (e.g. 600 - 1000 microns)
B ≥ 300 microns (e.g. 600 - 1000 microns)
C = 30 - 200 microns
D = 30 - 150 microns
E = 30 - 100 microns
F = 50 - 100 microns
G = 80 - 300 microns H = 100 - 300 microns
I = 50 - 200 microns
J = 50 - 200 microns
K = 50 - 100 microns

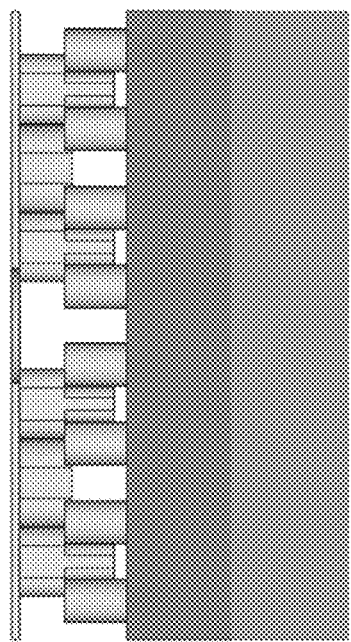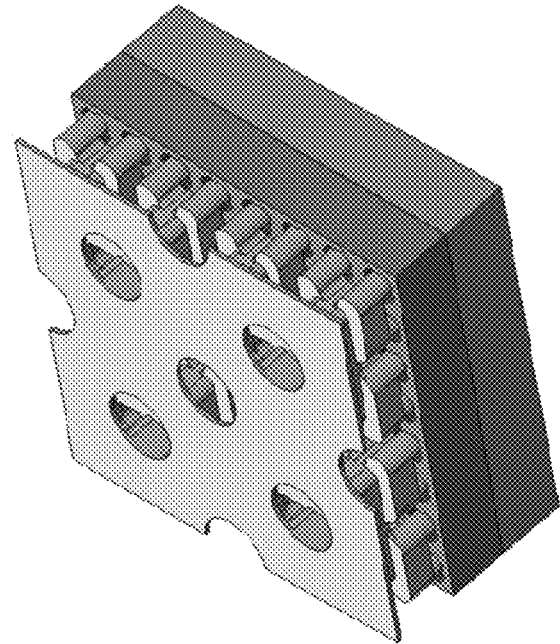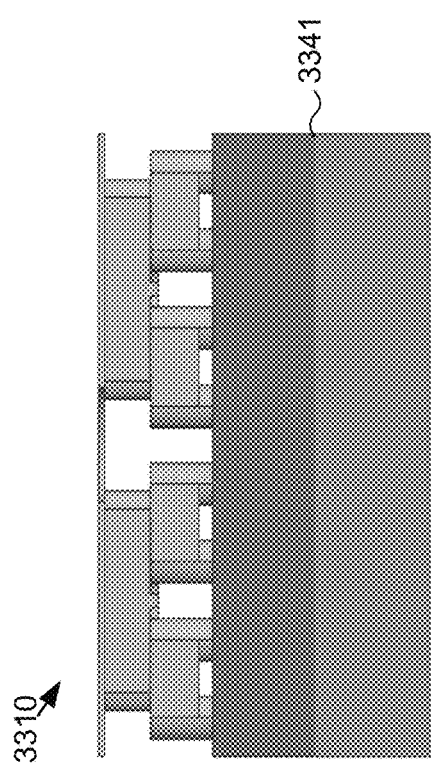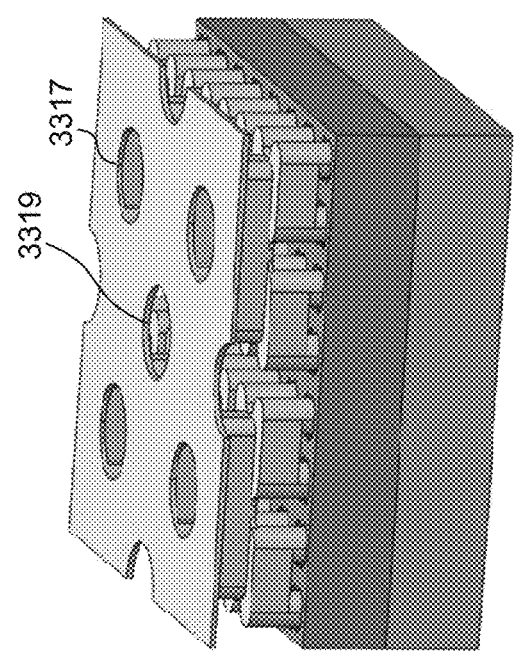
FIG. 33A
FIG. 33B
FIG. 33C
FIG. 33D

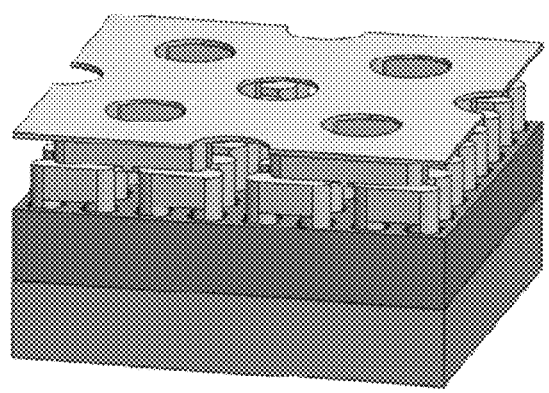
FIG. 33E
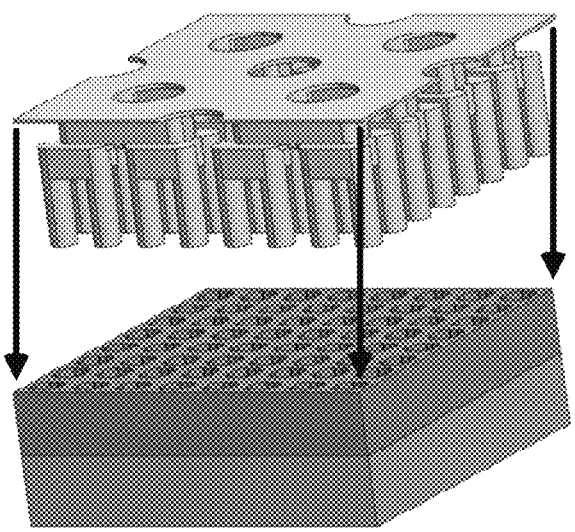
FIG. 33F2
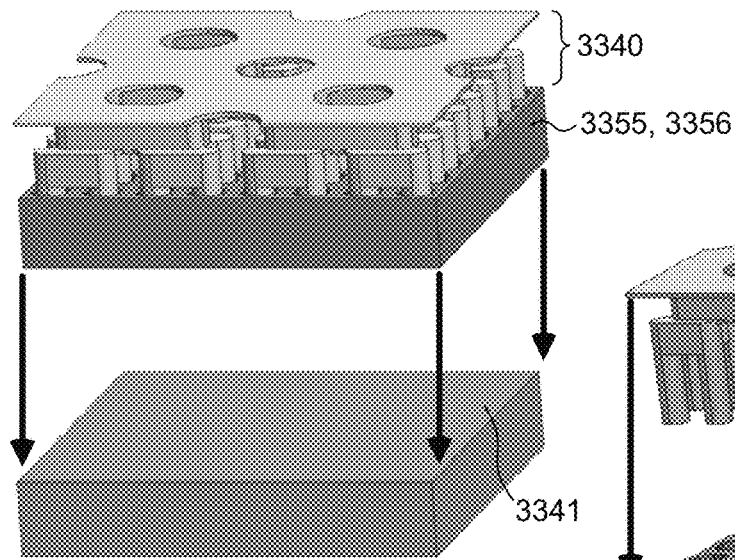
FIG. 33F1
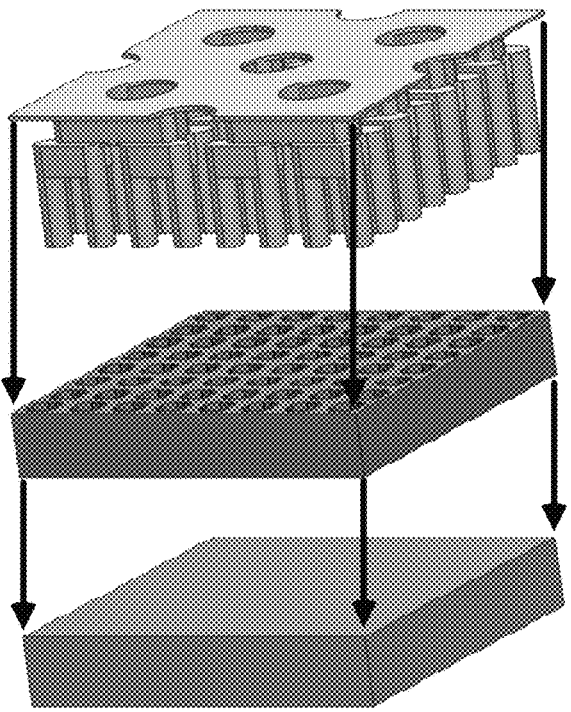
FIG. 33G

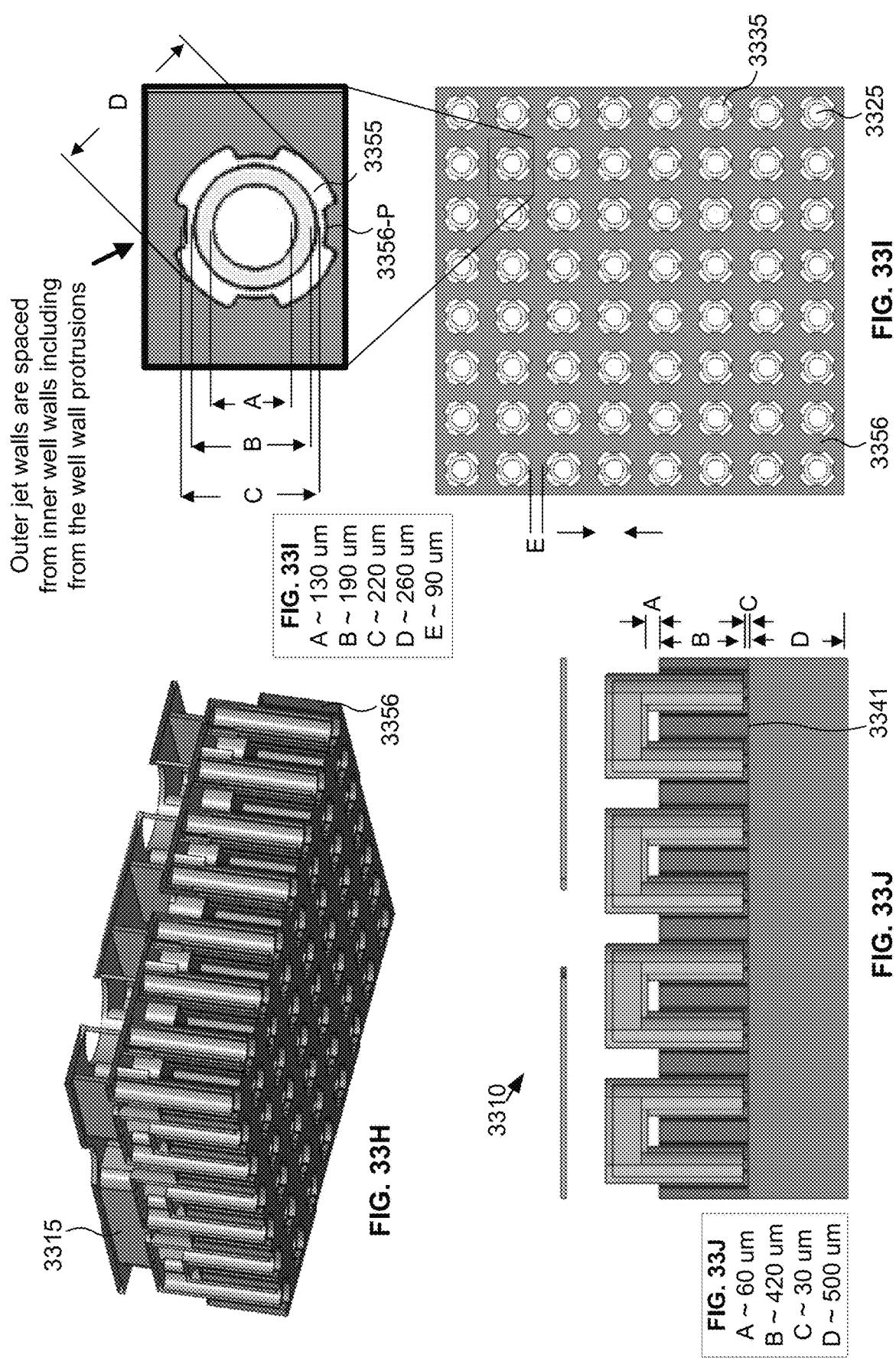

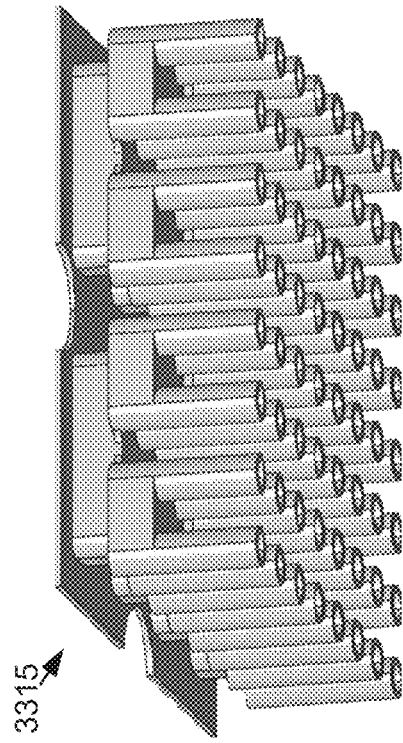
FIG. 33K2
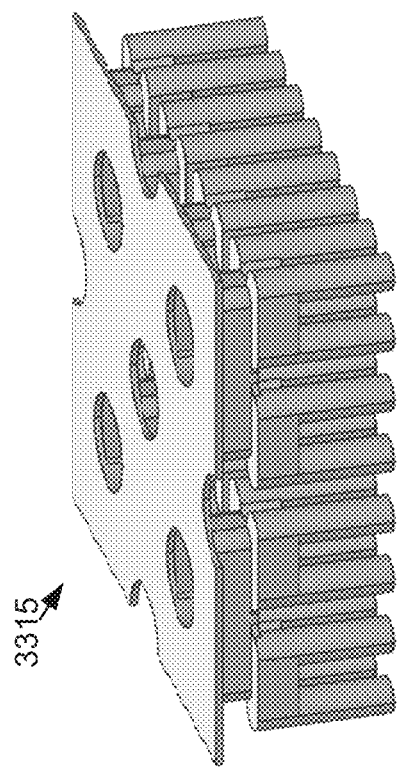
FIG. 33K1
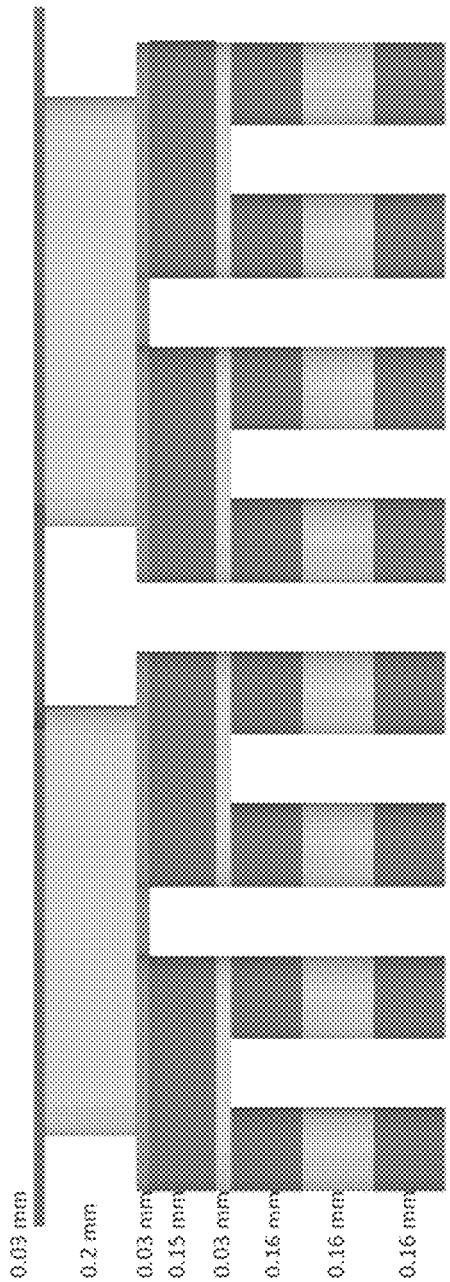
FIG. 33K3

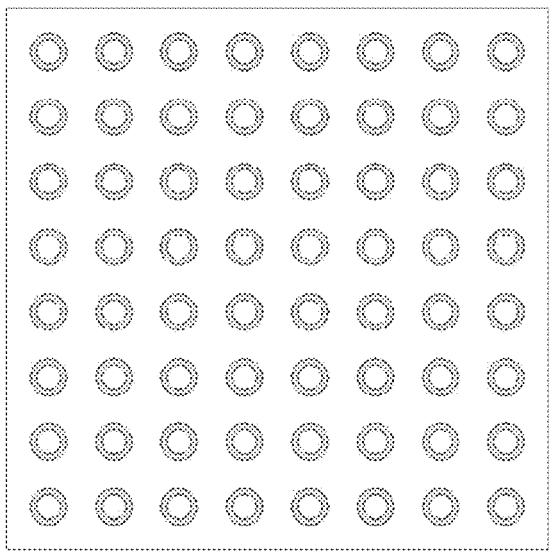
Top View of the Layer
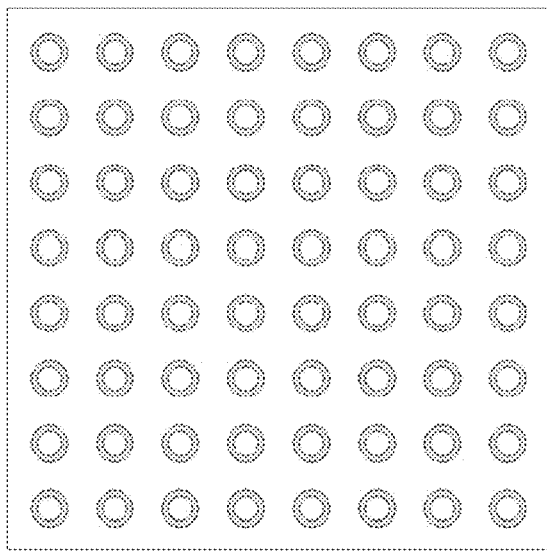
Top View of the Layer
Side View of Layer
Side View of Layer
L1
Side View Formed Layers
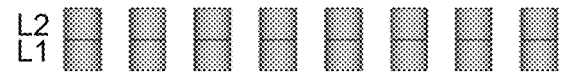
L2
L1
Side View Formed Layers
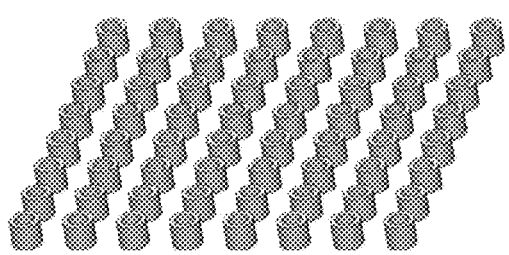
Isometric View of Formed Layers
Layer 1
FIG. 33K4-1
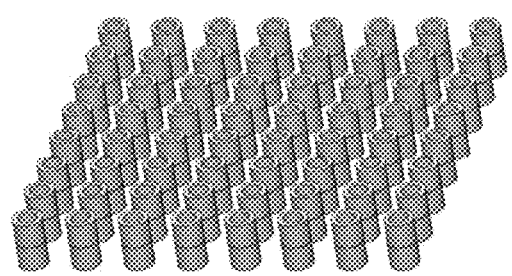
Isometric View
Layer 2
FIG. 33K4-2

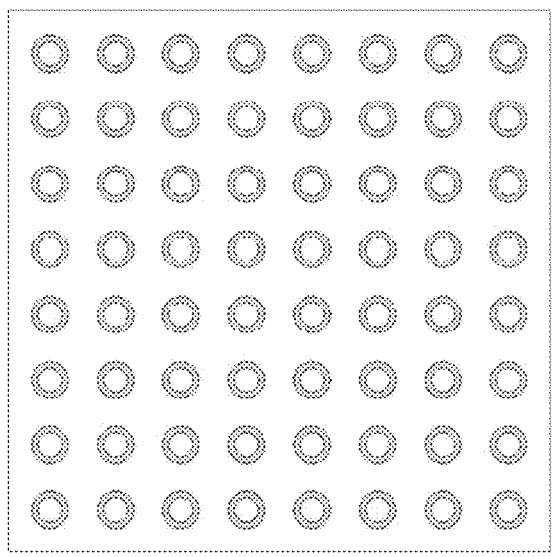
Top View of the Layer
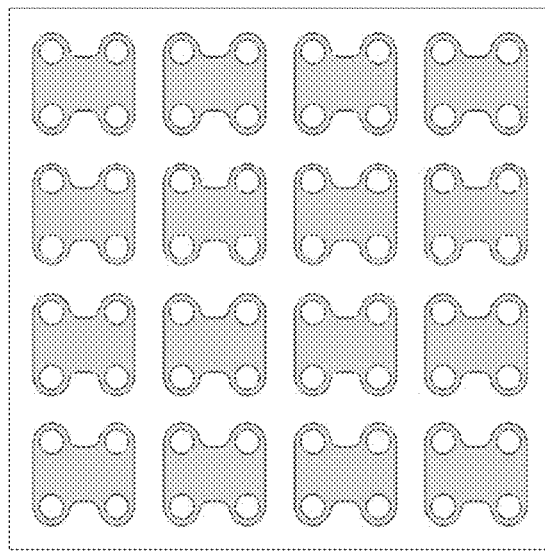
Top View of the Layer
Side View of Layer
Side View of Layer
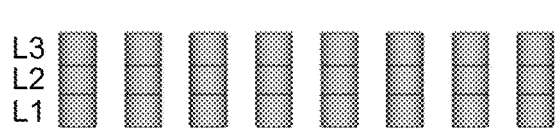
L3
L2
L1
Side View Formed Layers
L4
L3
L2
L1
Side View Formed Layers
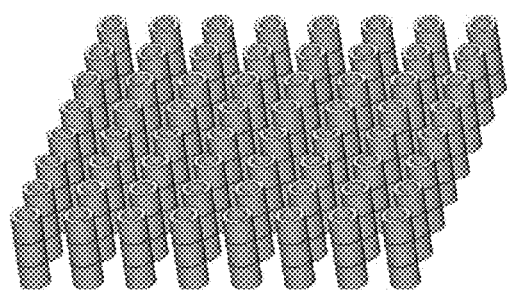
Isometric View
Layer 3
FIG. 33K4-3
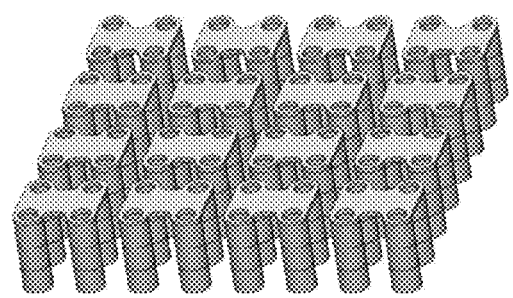
Isometric View
Layer 4
FIG. 33K4-4

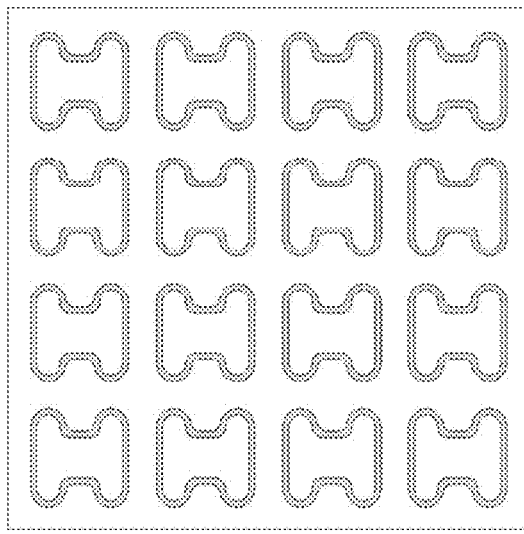
Top View of the Layer
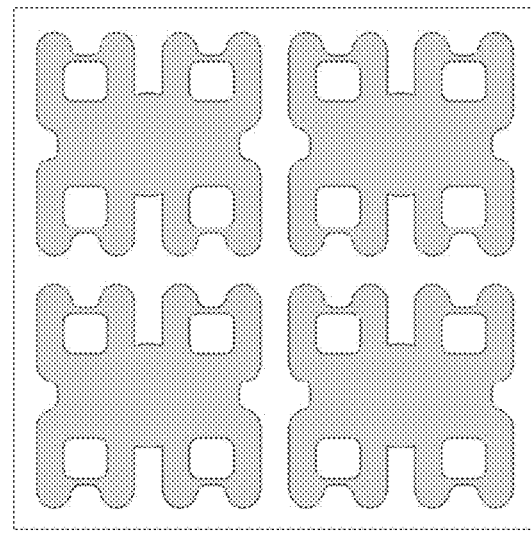
Top View of the Layer
Side View of Layer
Side View of Layer
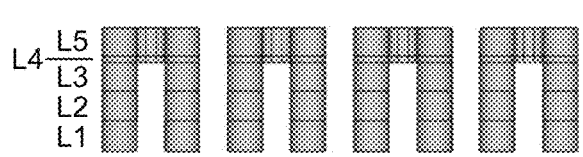
Side View Formed Layers
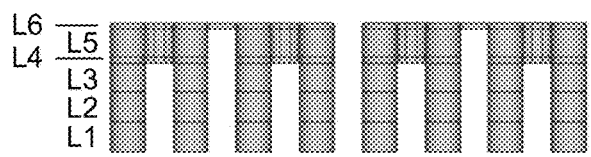
Side View Formed Layers
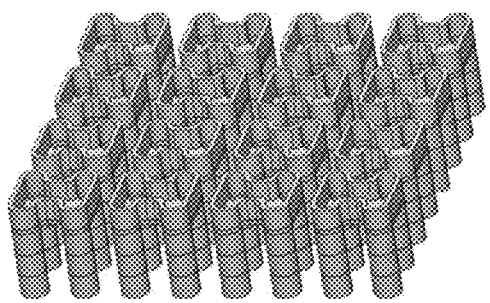
Isometric View
Layer 5
FIG. 33K4-5
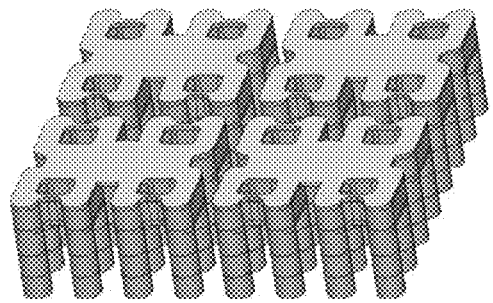
Isometric View
Layer 6
FIG. 33K4-6

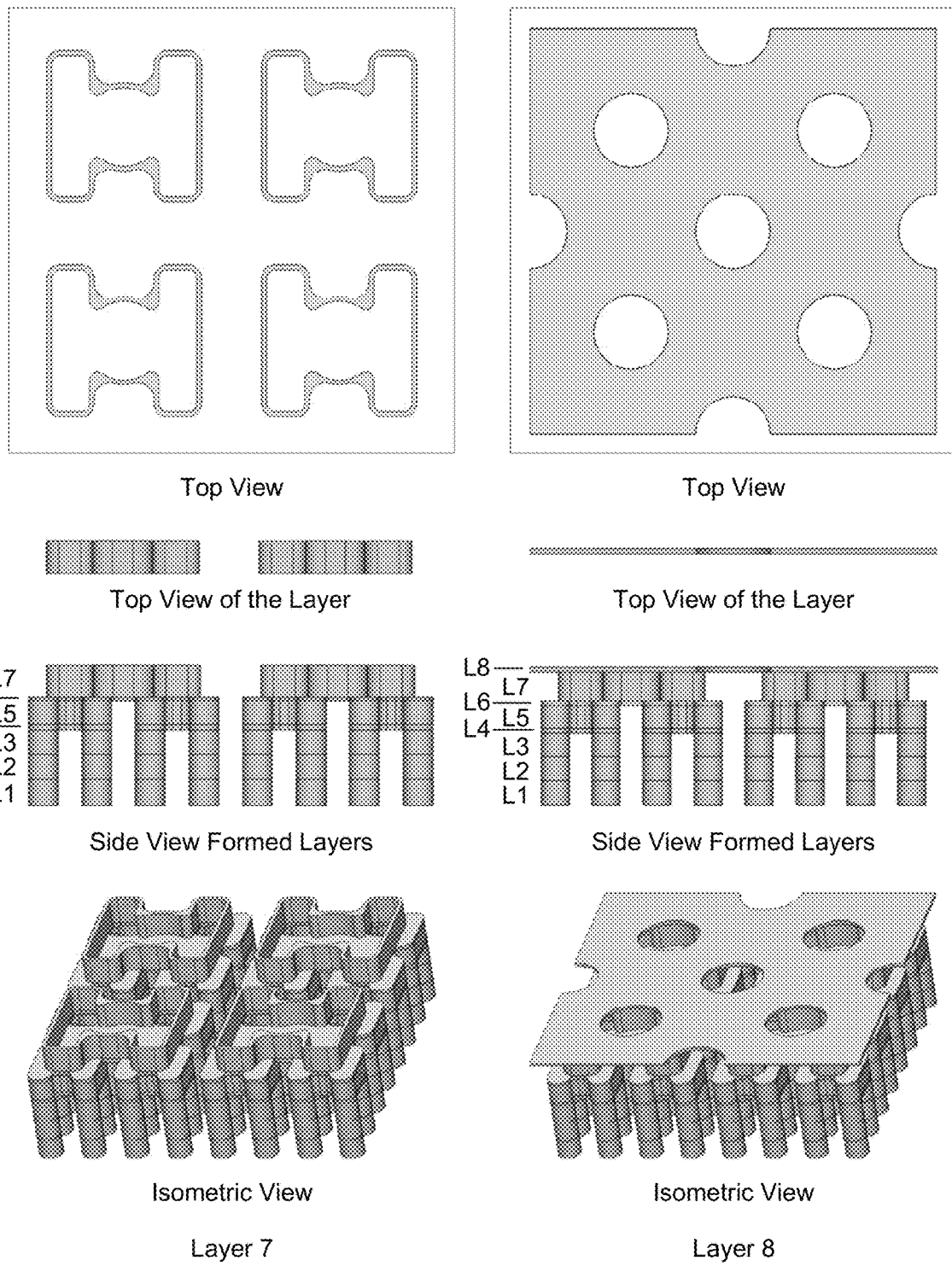
FIG. 33K4-7  FIG. 33K4-8

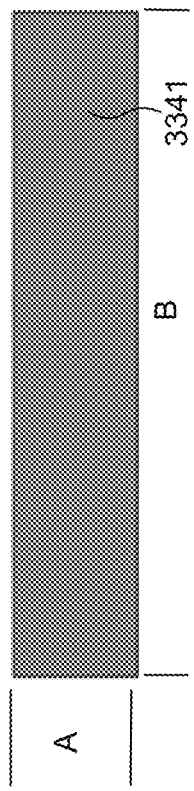
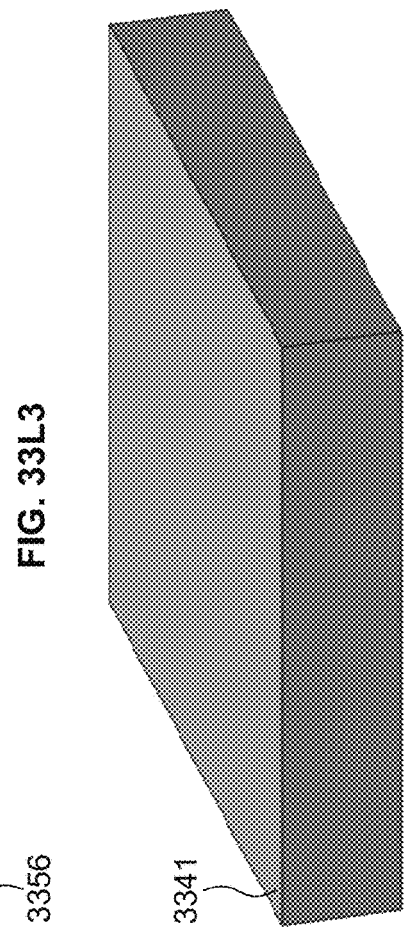
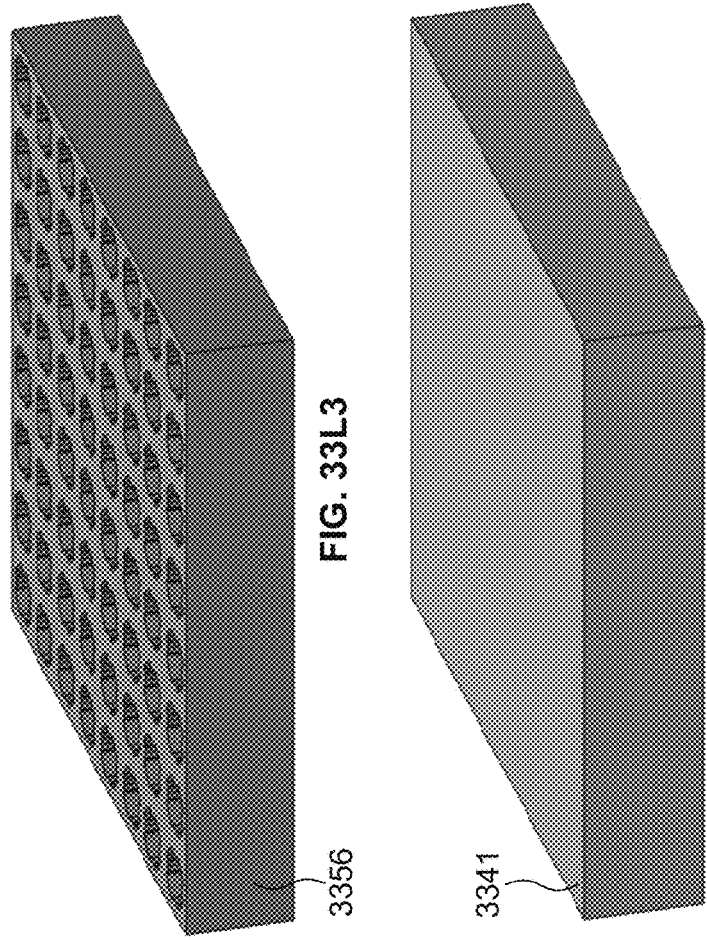
FIG. 33M1
A ~ 500 um
B ~ 2700 um
FIG. 33L3
FIG. 33M2
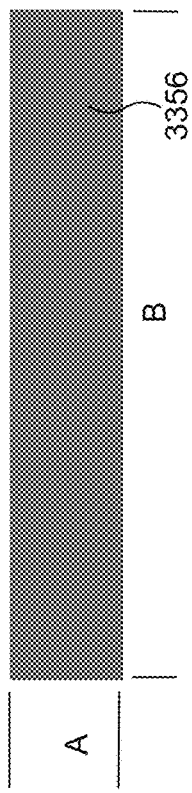
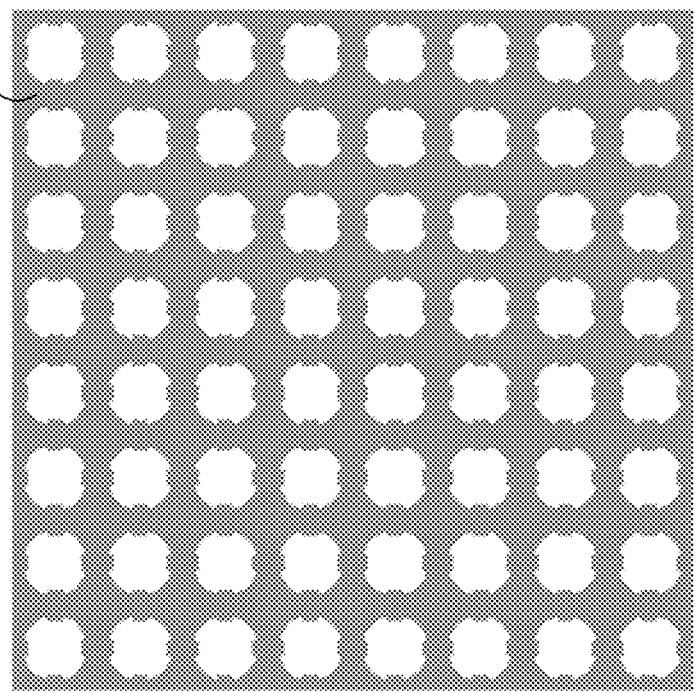
FIG. 33L1
A ~ 450 um
B ~ 2700 um
FIG. 33L2

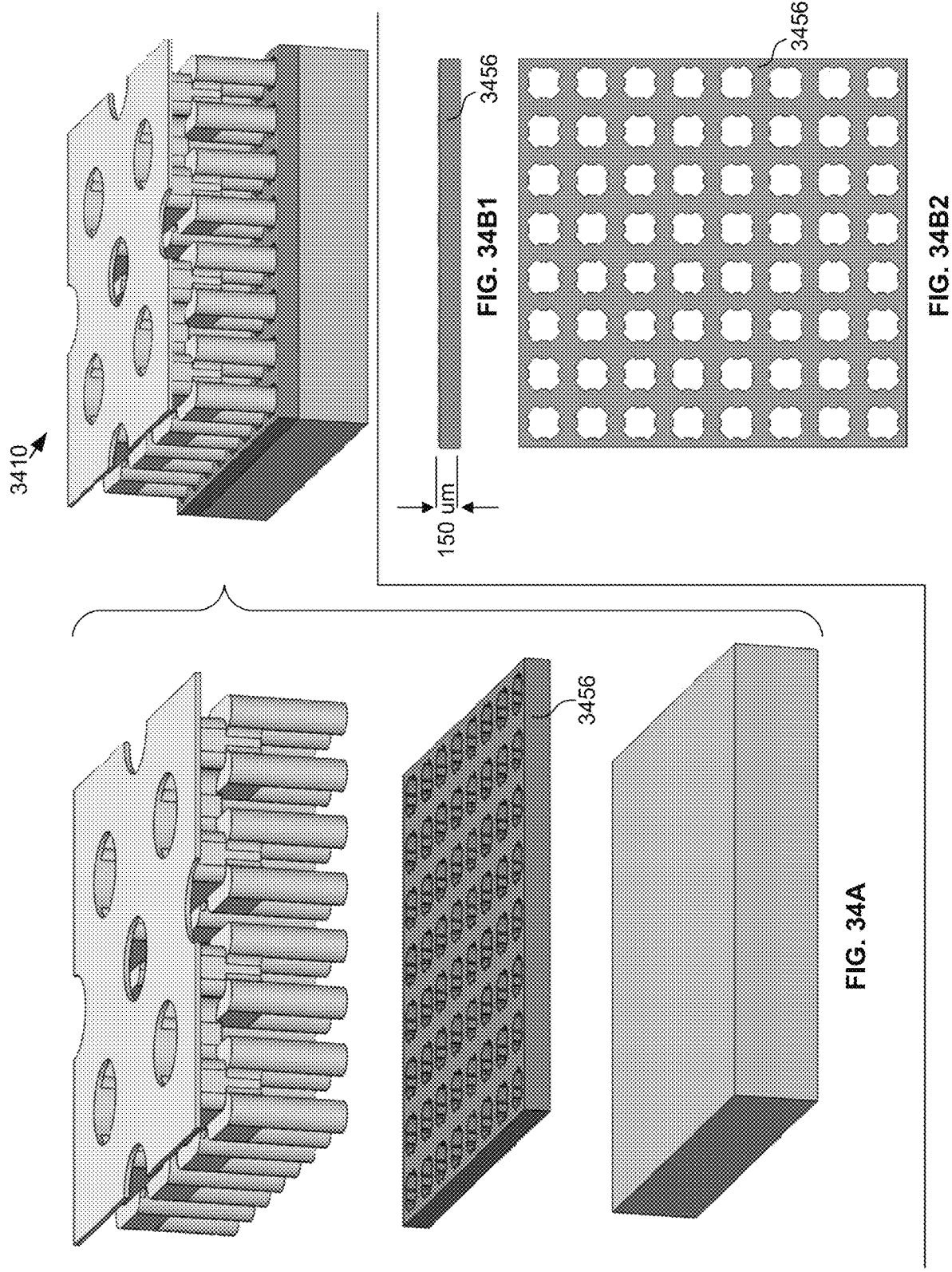

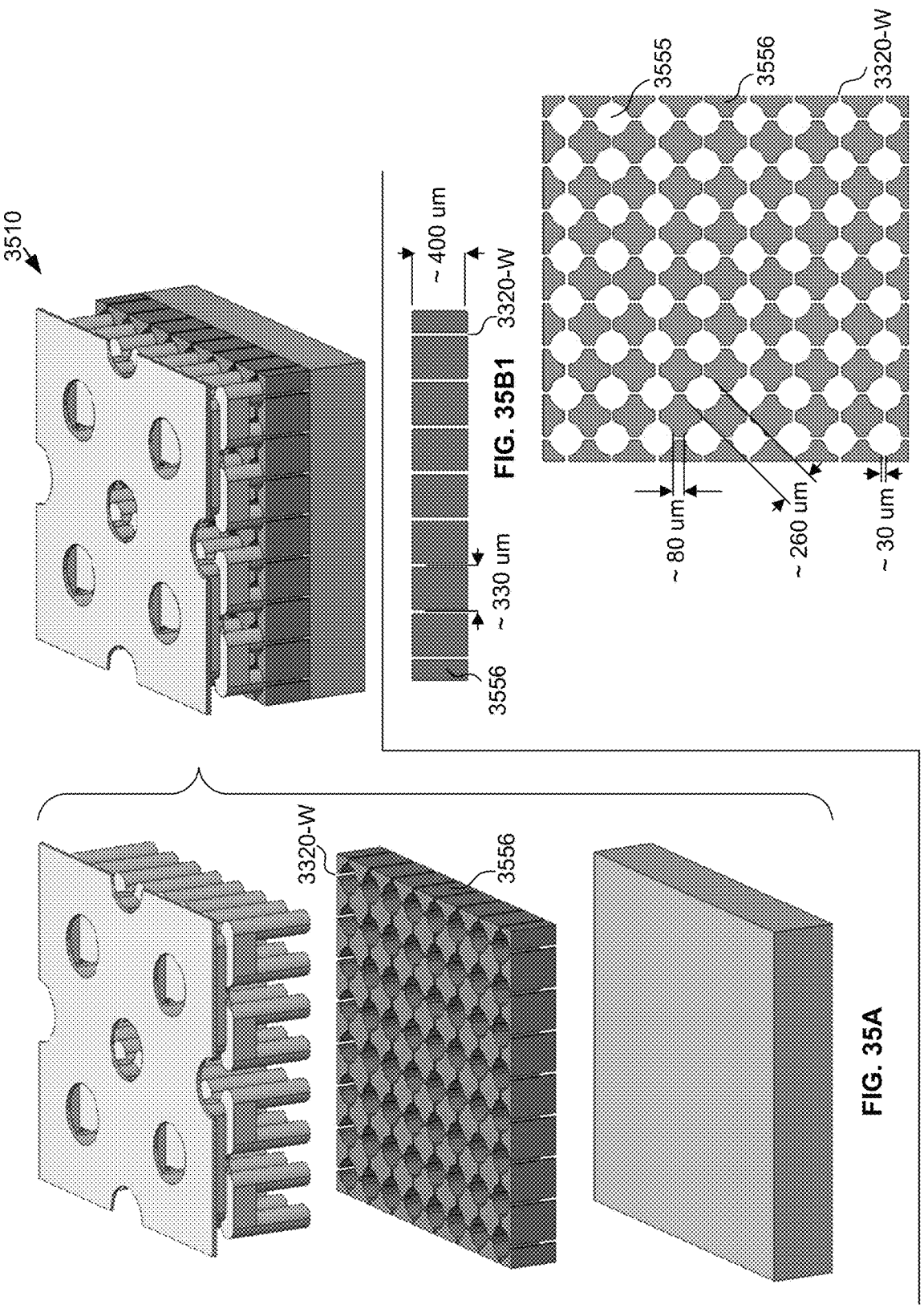

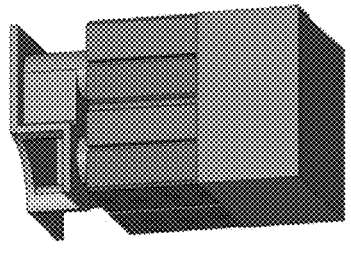
FIG. 37A5
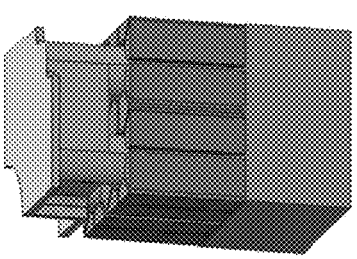
FIG. 37A4
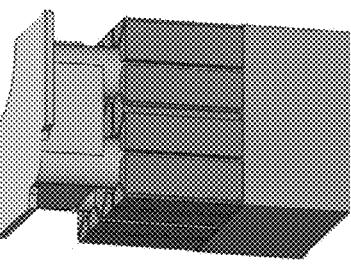
FIG. 37A3
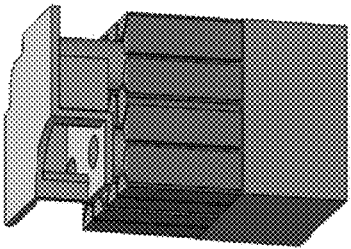
FIG. 37A2
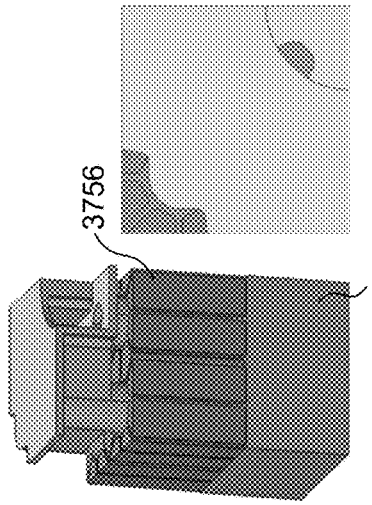
FIG. 37A1
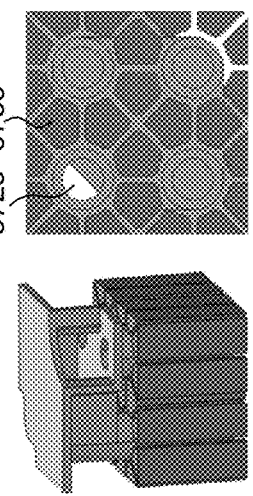
FIG. 37B6 / FIG. 37B5 / FIG. 37B4 / FIG. 37B3 / FIG. 37B2 / FIG. 37B1
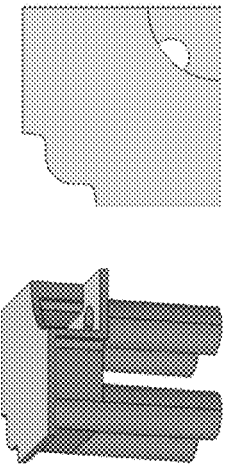
FIG. 37C6 / FIG. 37C5
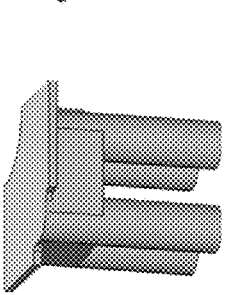
FIG. 37C4 / FIG. 37C3
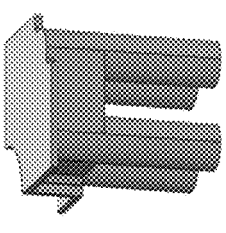
FIG. 37C2
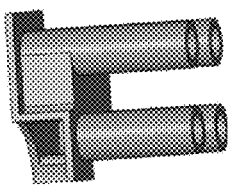
FIG. 37C1

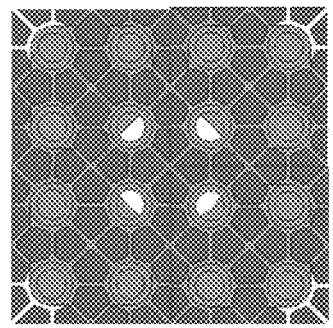
FIG. 37D1
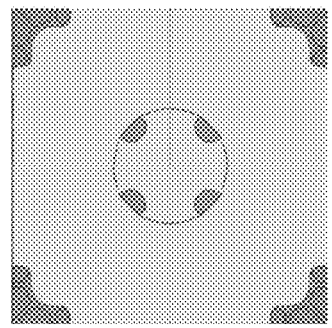
FIG. 37D2
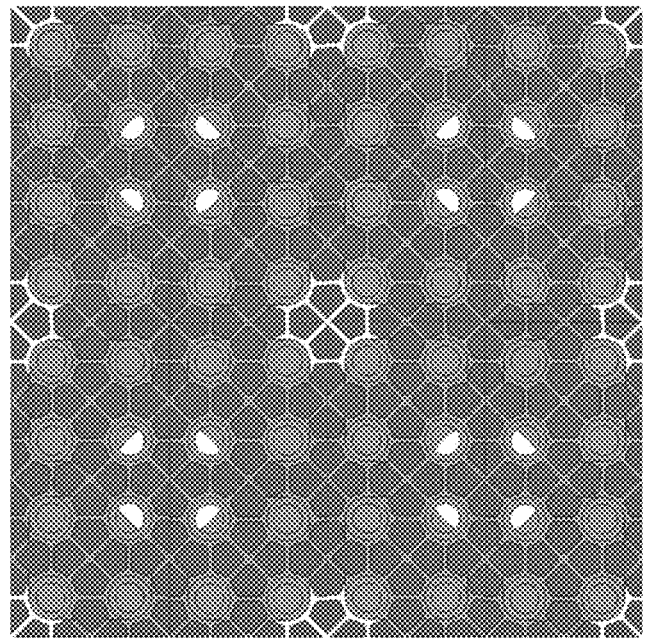
FIG. 37E1
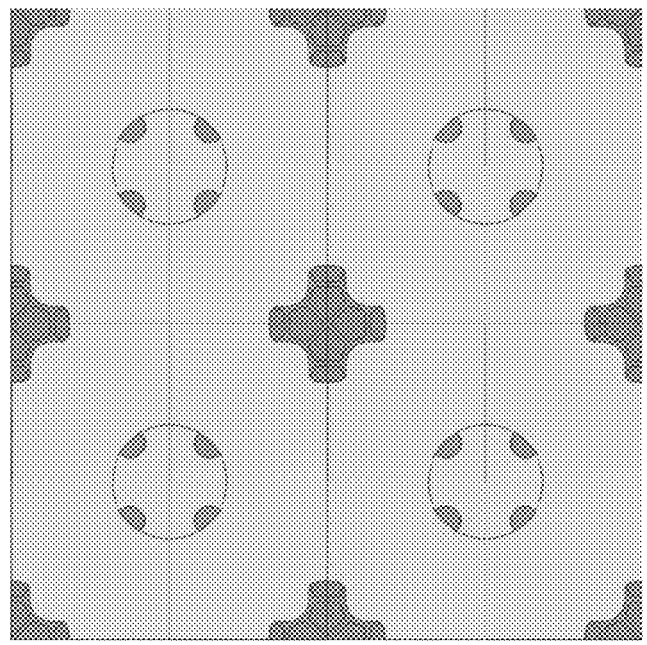
FIG. 37E2

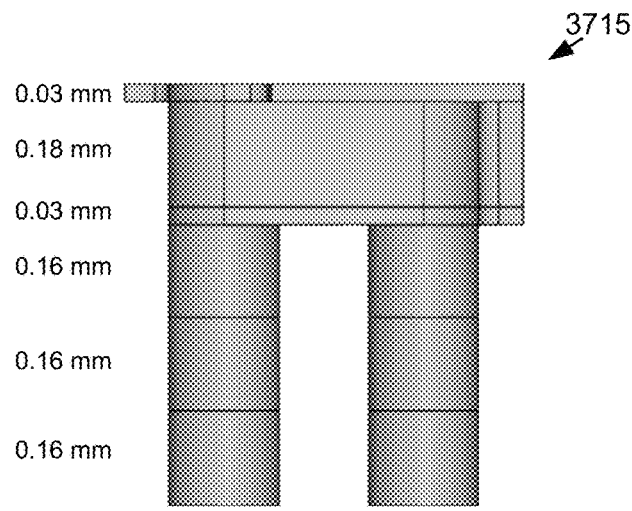
0.03 mm
0.18 mm
0.03 mm
0.16 mm
0.16 mm
0.16 mm
3715
FIG. 37F
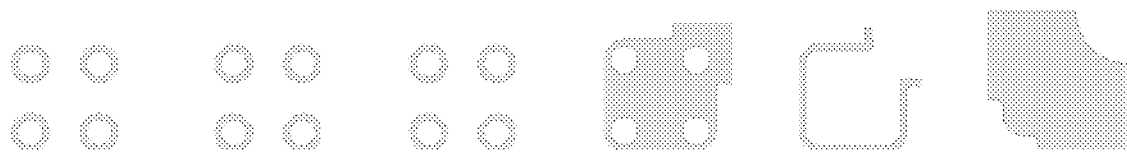
Top Views of Successive Layers
Side Views of Successive Layers
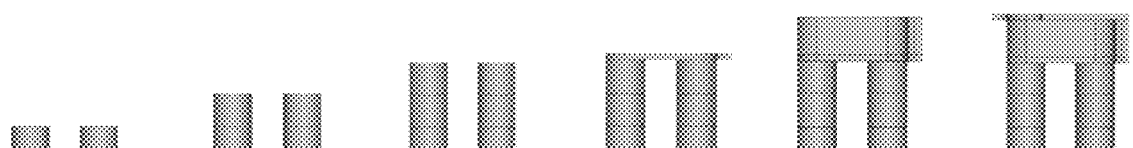
Side Views of Structure as Successive Layers are Added
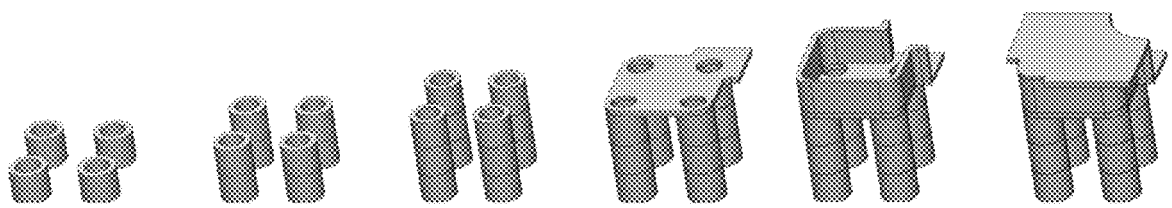
Isometric Views of Structure as Successive Layers are Added
| L1 | L2 | L3 | L4 | L5 | L6 |
|---|---|---|---|---|---|
| FIG. 37G1 | | FIG. 37G3 | | FIG. 37G5 | |
| | FIG. 37G2 | | FIG. 37G4 | | FIG. 37G6 |

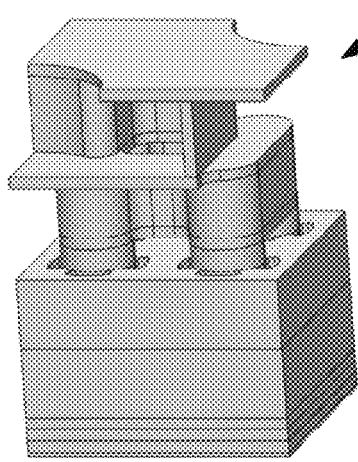
FIG. 38A1
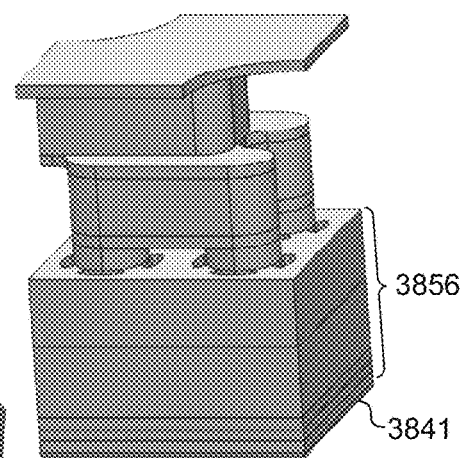
FIG. 38A2
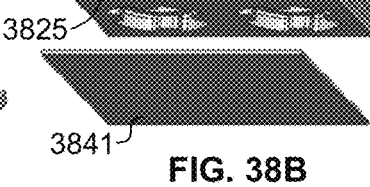
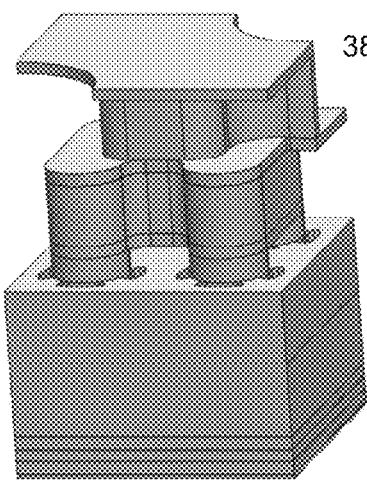
FIG. 38A3
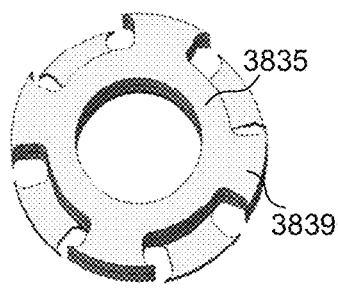
FIG. 38B
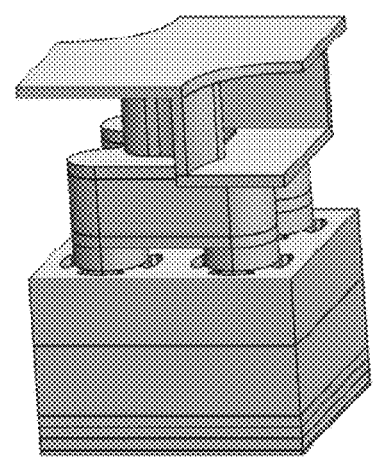
FIG. 38A4
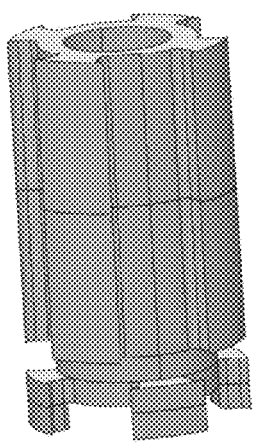
FIG. 38C3
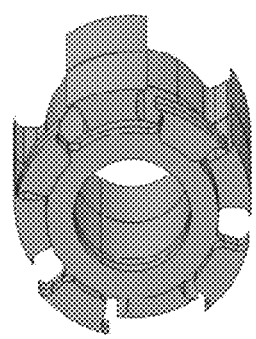
FIG. 38C1
FIG. 38C2
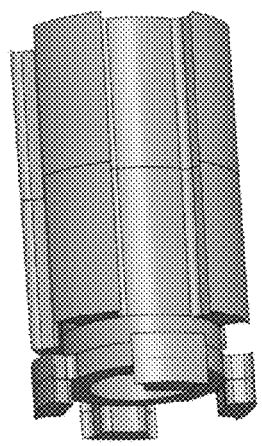
FIG. 38C4

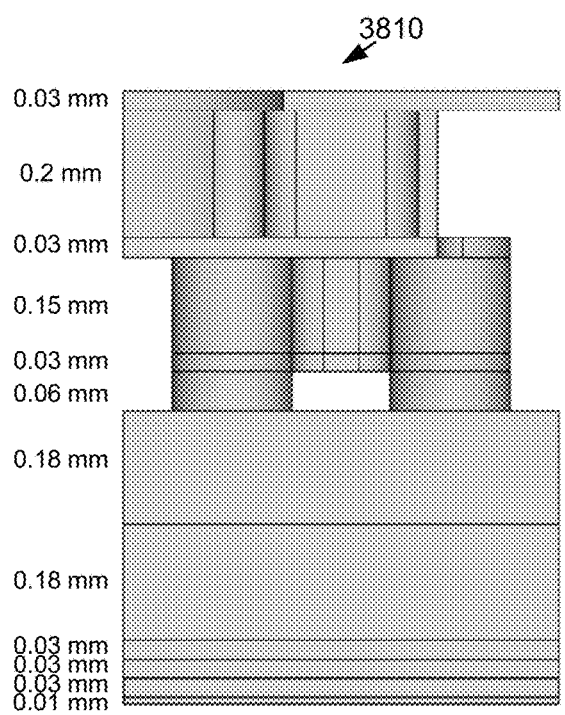
FIG. 38D
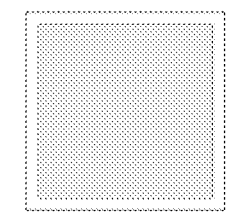
FIG. 38E1
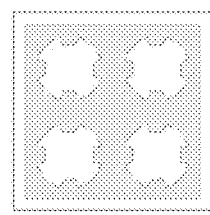
FIG. 38E2
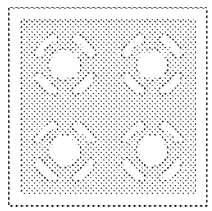
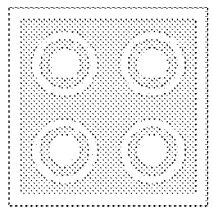
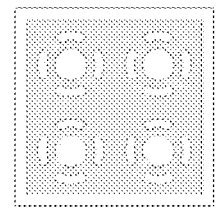
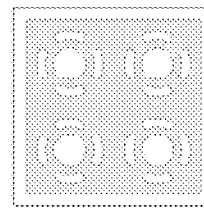
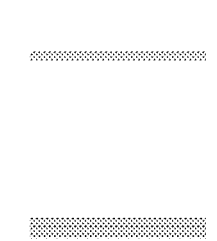
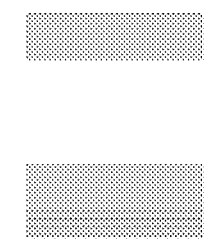
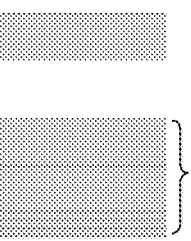
FIG. 38E3
FIG. 38E4
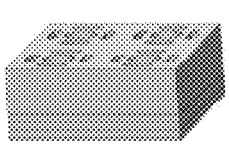
FIG. 38E5
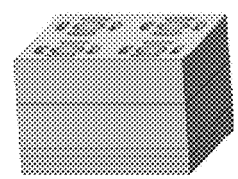
FIG. 38E6

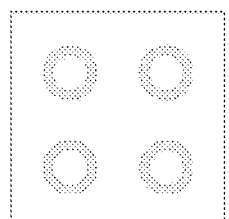 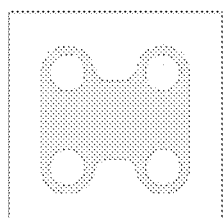 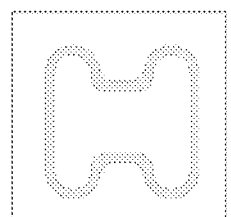
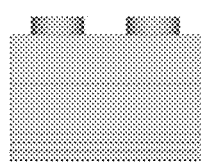 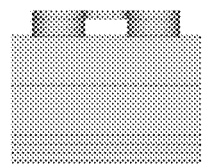 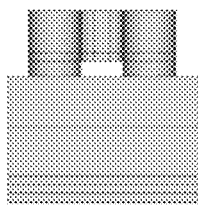
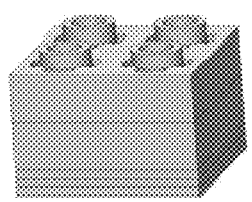 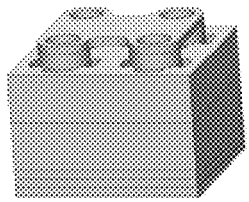 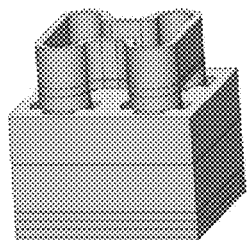
FIG. 38E7　　　　FIG. 38E8　　　　FIG. 38E9
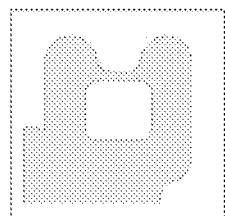 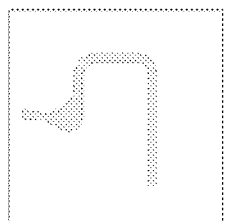 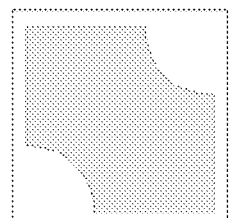
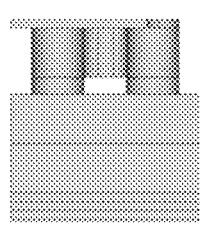 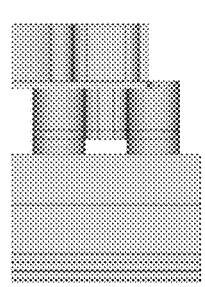 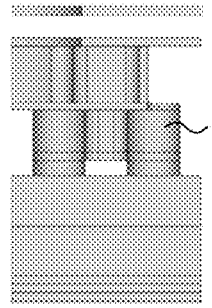
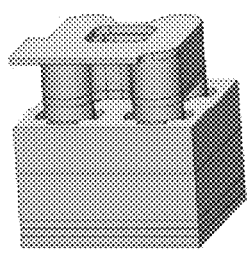 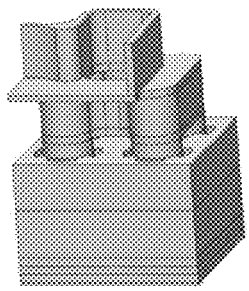 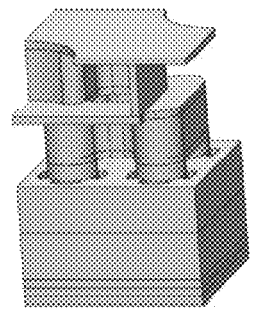
FIG. 38E10　　　　FIG. 38E11　　　　FIG. 38E12

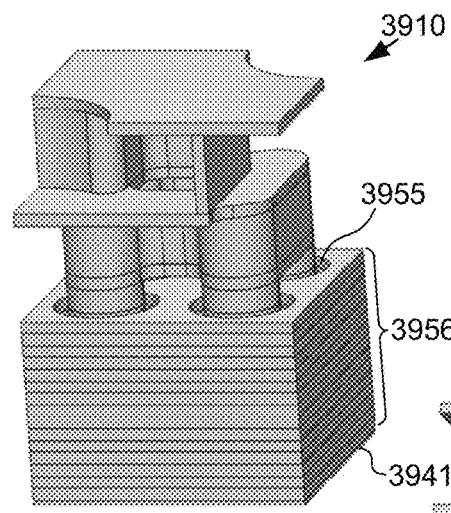
FIG. 39A1
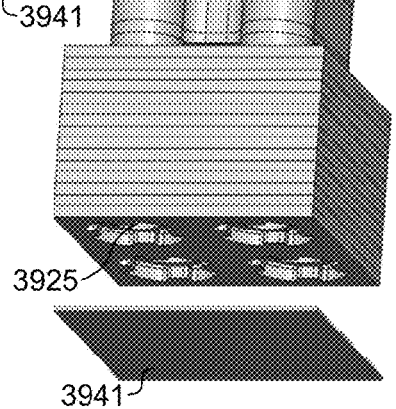
FIG. 39B
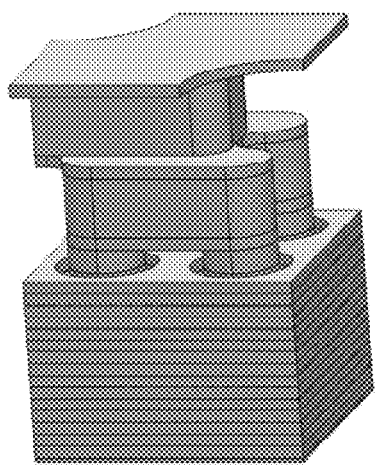
FIG. 39A2
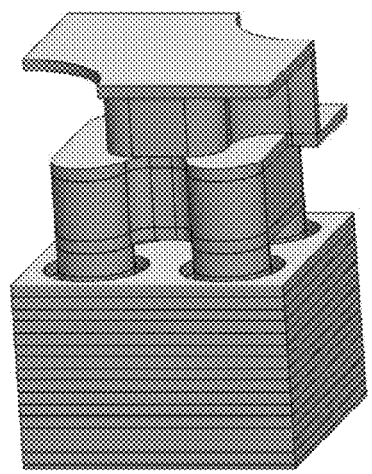
FIG. 39A3
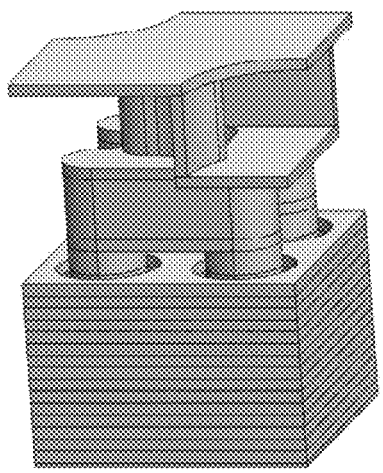
FIG. 39A4
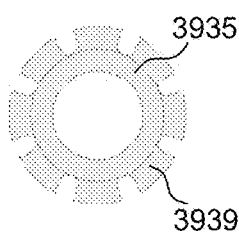
FIG. 39C1
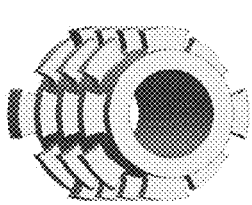
FIG. 39C2
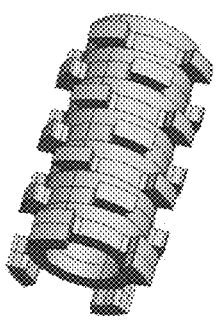
FIG. 39C3
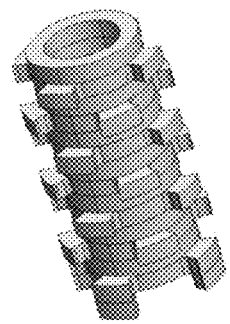
FIG. 39C4

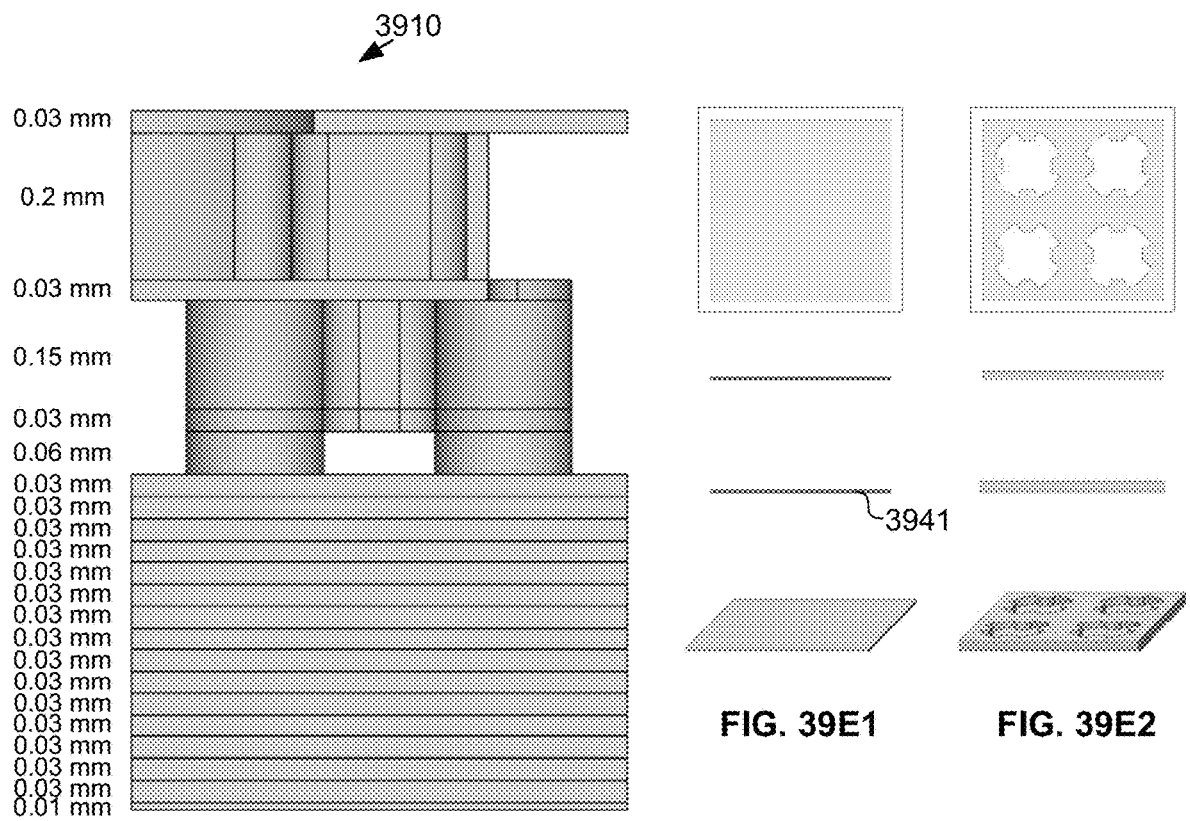
FIG. 39D   FIG. 39E1   FIG. 39E2
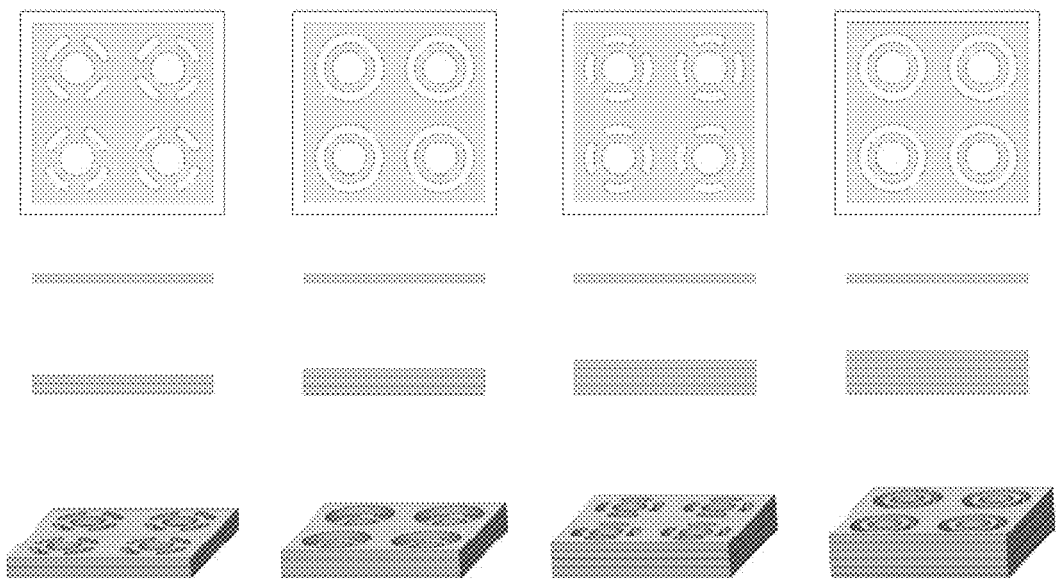
FIG. 39E3   FIG. 39E4   FIG. 39E5   FIG. 39E6

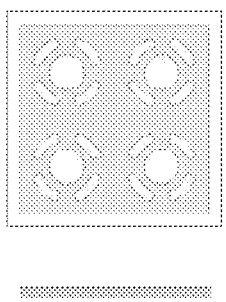 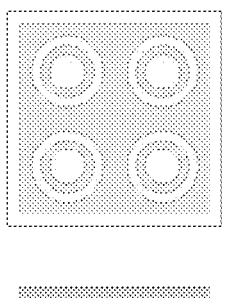 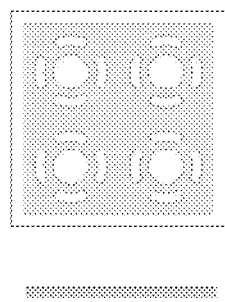 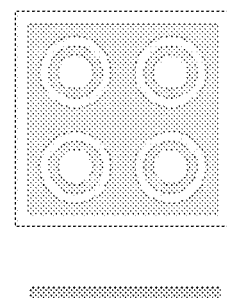
   
 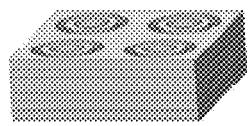 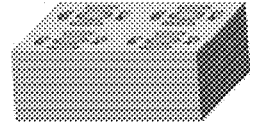 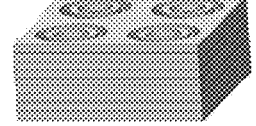
FIG. 39E7    FIG. 39E8    FIG. 39E9    FIG. 39E10
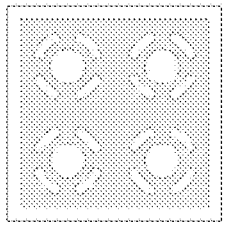 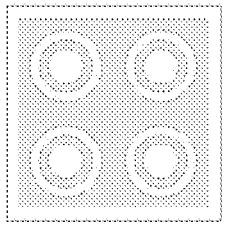 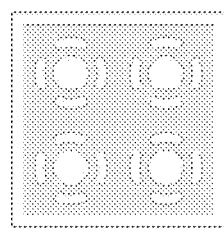 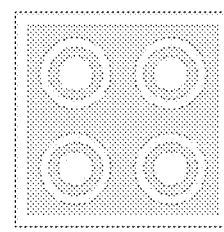
   
 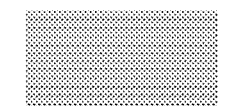  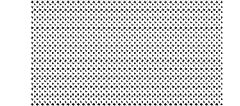
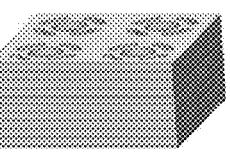 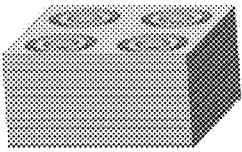 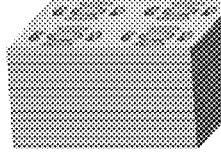 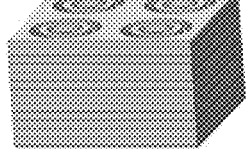
FIG. 39E11    FIG. 39E12    FIG. 39E13    FIG. 39E14

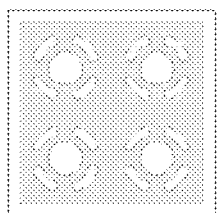 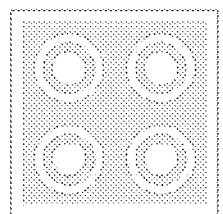 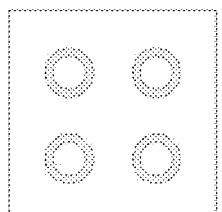 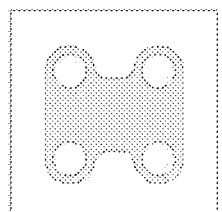
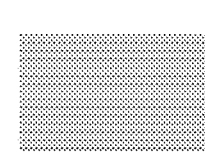  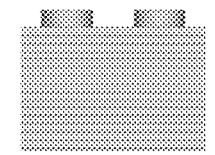 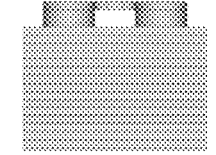
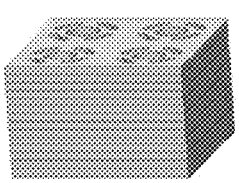 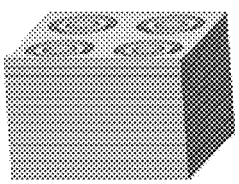 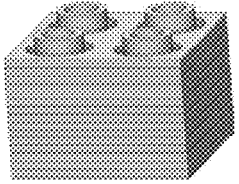 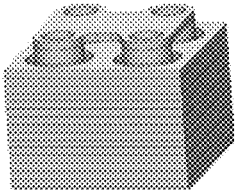
FIG. 39E15  FIG. 39E16  FIG. 39E17  FIG. 39E18
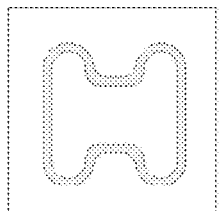 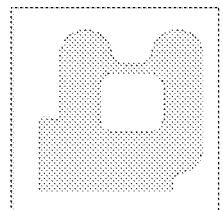 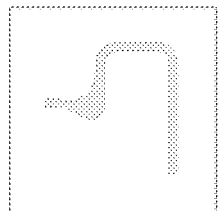 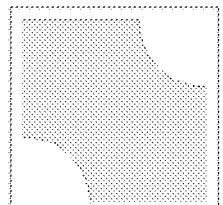
   
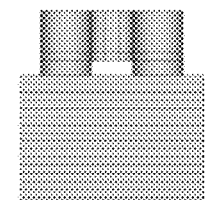 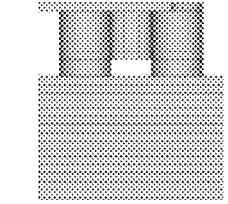 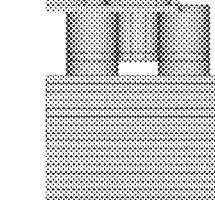 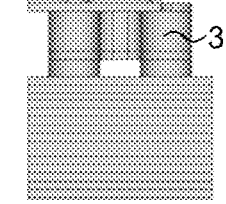
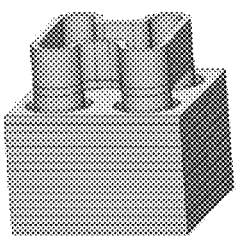 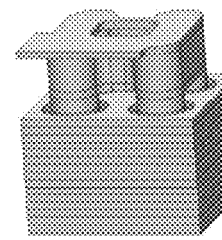 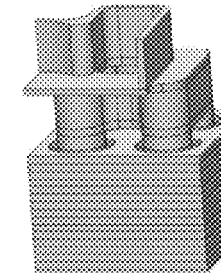 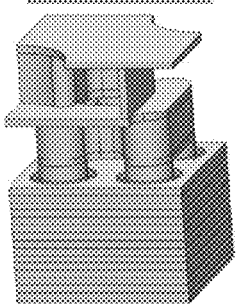
FIG. 39E19  FIG. 39E20  FIG. 39E21  FIG. 39E22

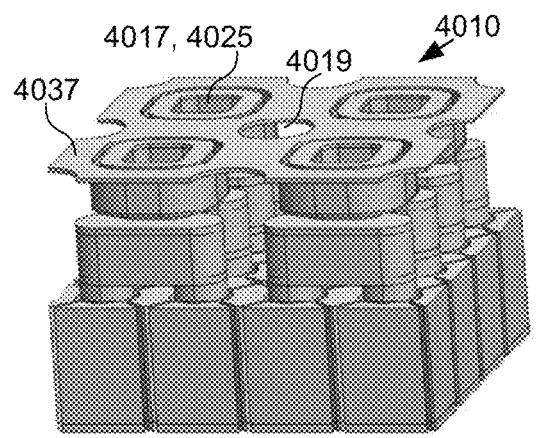
FIG. 40A1
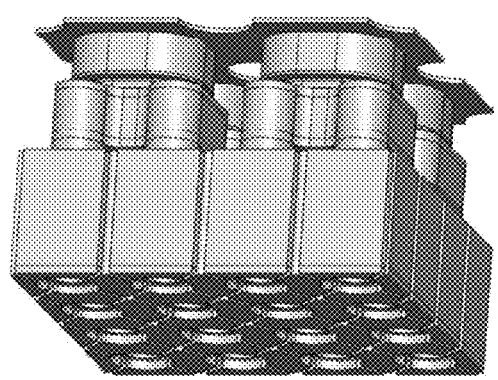
FIG. 40A2
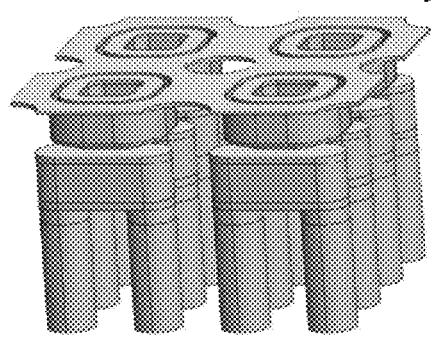
FIG. 40B1
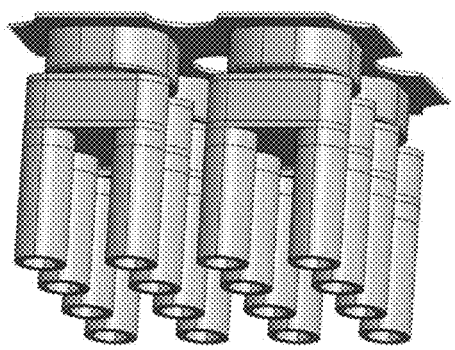
FIG. 40B2
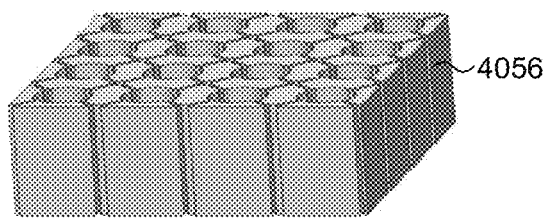
FIG. 40C1
FIG. 40D
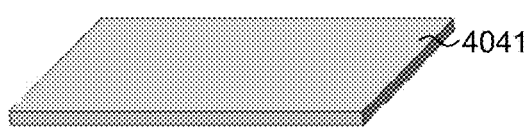
FIG. 40E
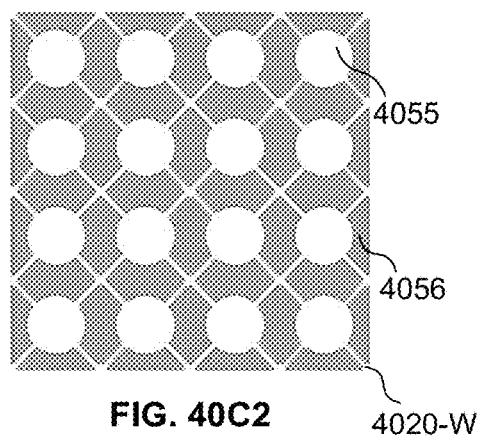
FIG. 40C2

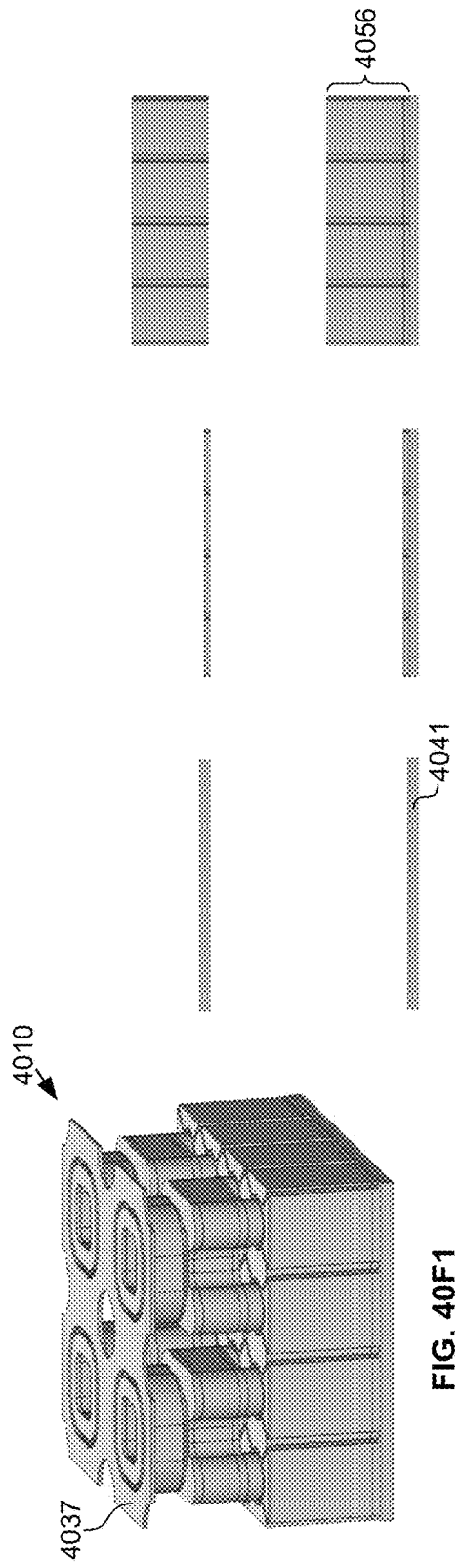
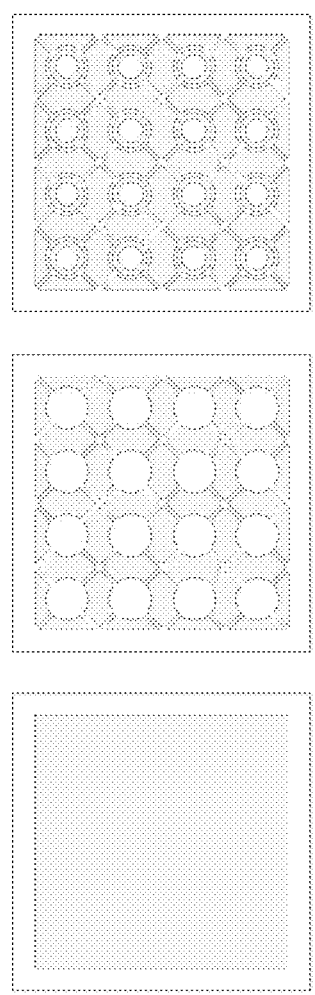
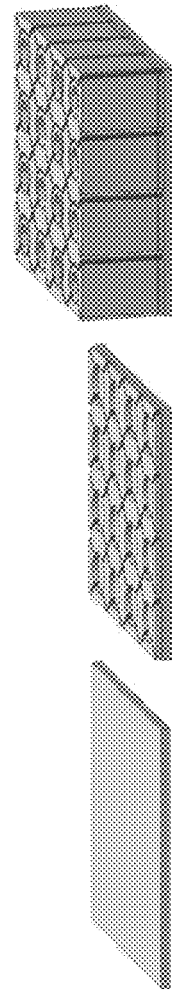
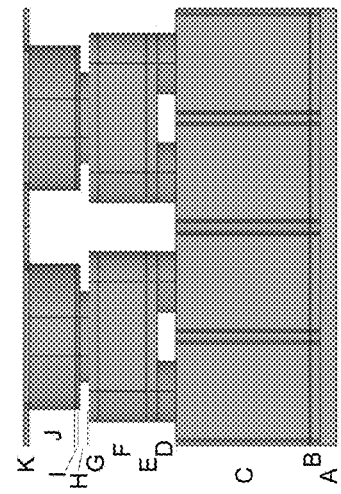
FIG. 40F1
FIG. 40F2
FIG. 40G1
FIG. 40G2
FIG. 40G3
Where:
A = 0.05 mm
B = 0.03 mm
C = 0.42 mm
D = 0.06 mm
E = 0.03 mm
F = 0.15 mm
G = 0.03 mm
H = 0.03 mm
I = 0.015 mm
J = 0.145 mm
K = 0.015 mm

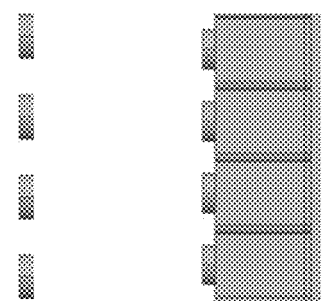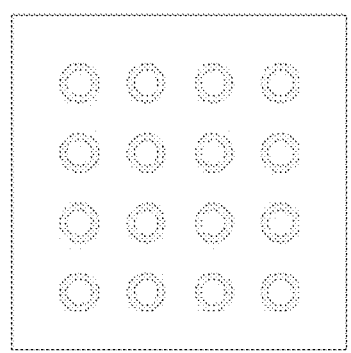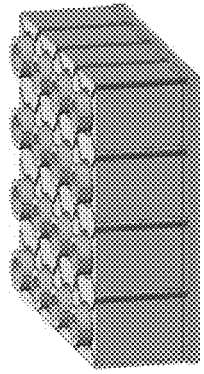
FIG. 40G4
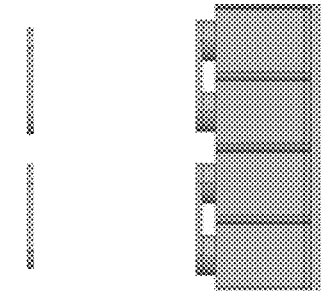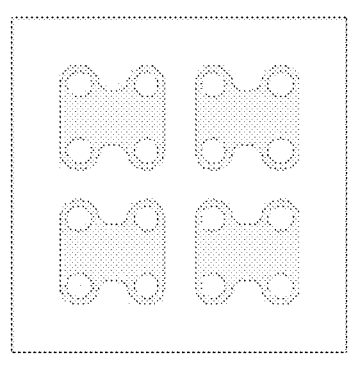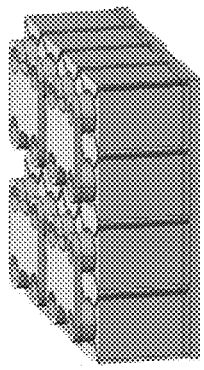
FIG. 40G5
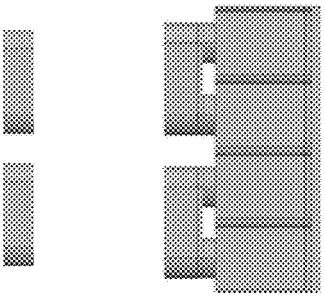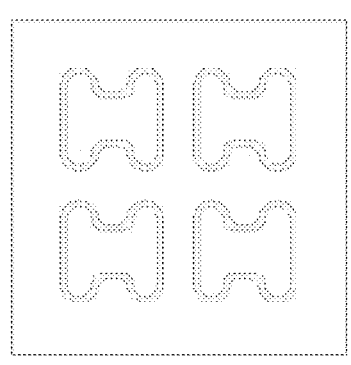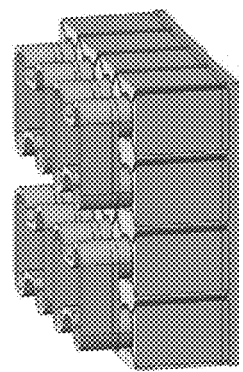
FIG. 40G6
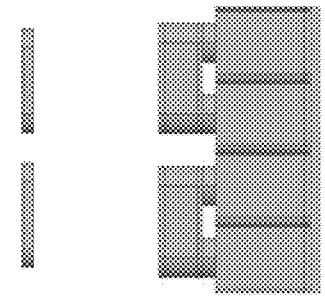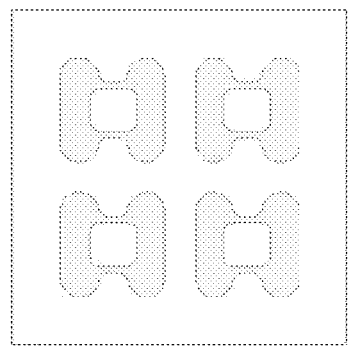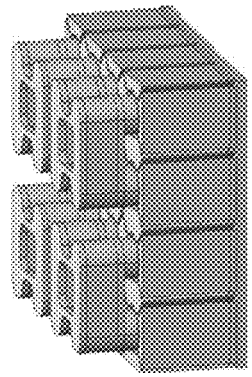
FIG. 40G7

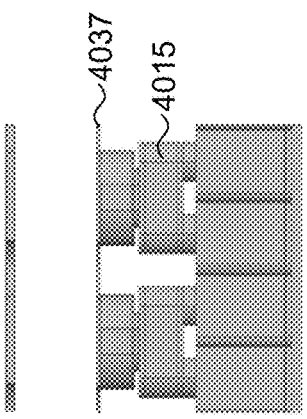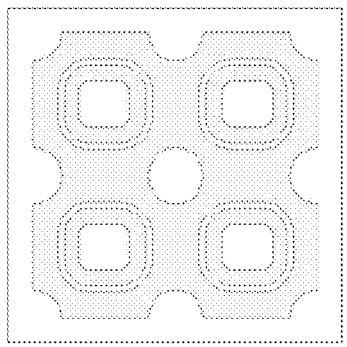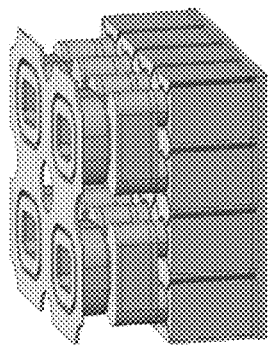
FIG. 40G11
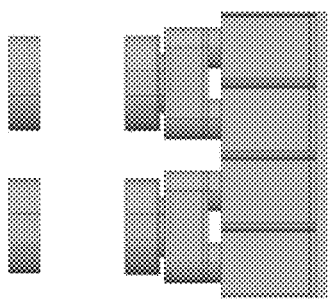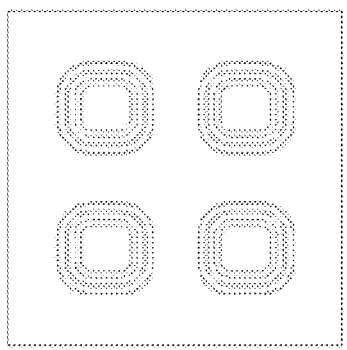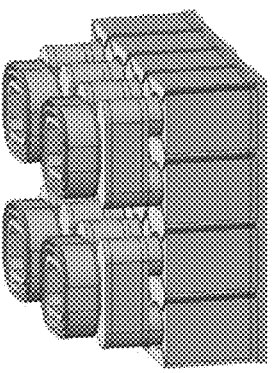
FIG. 40G10
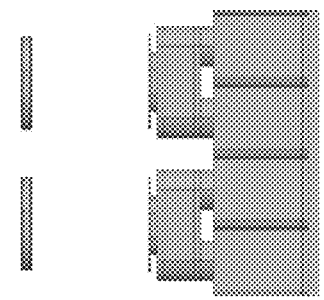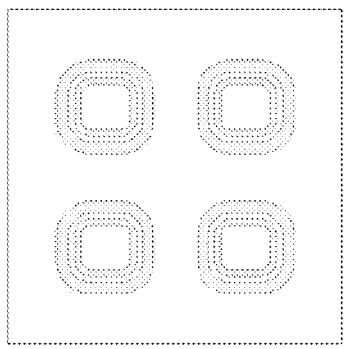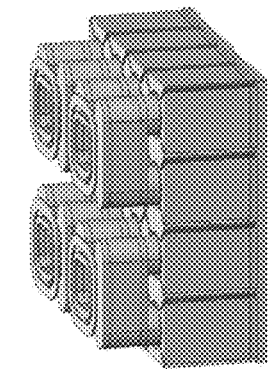
FIG. 40G9
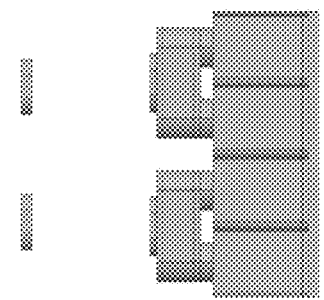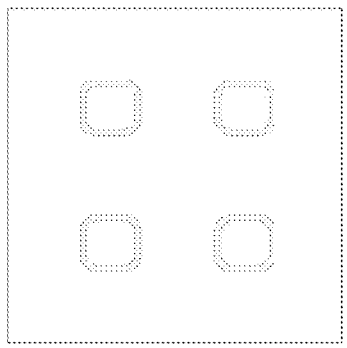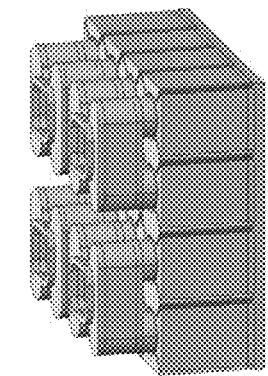
FIG. 40G8

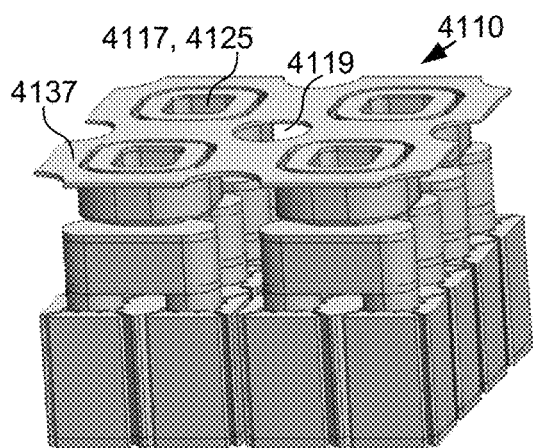
FIG. 41A1
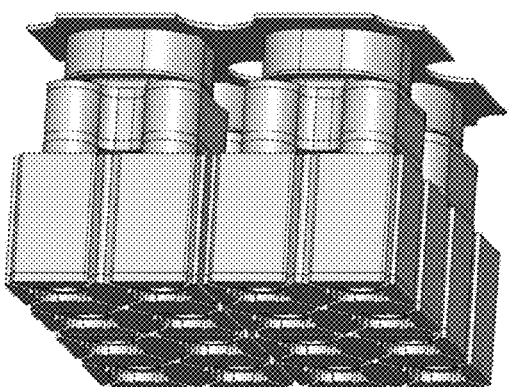
FIG. 41A2
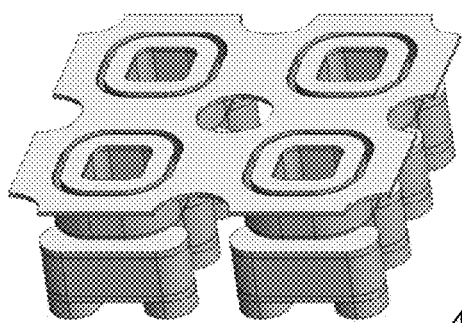
FIG. 41B
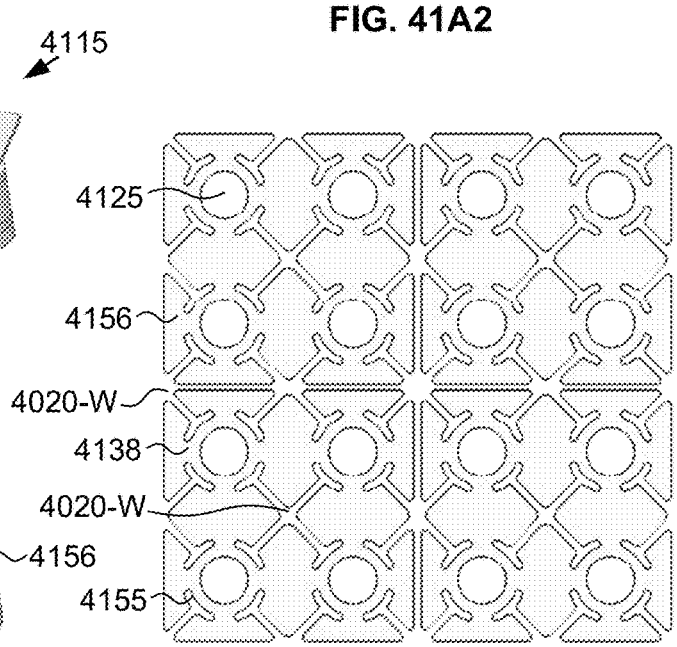
FIG. 41C2
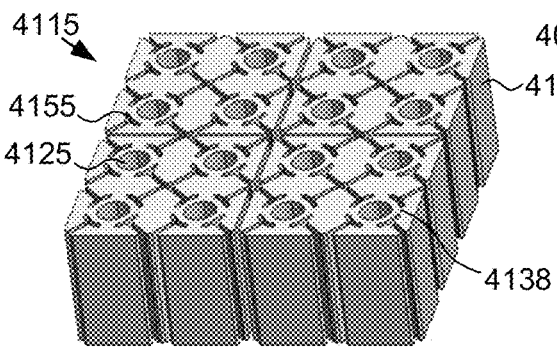
FIG. 41C1
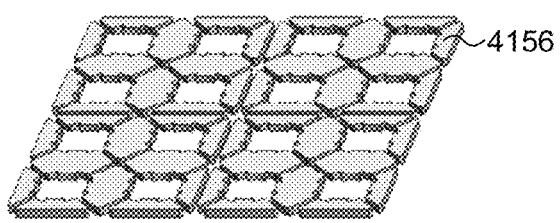
FIG. 41D
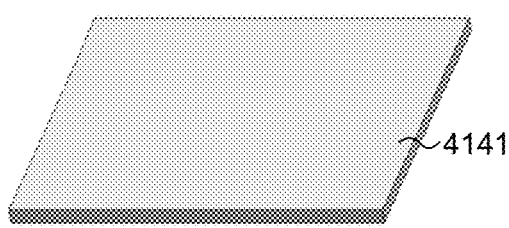
FIG. 41E

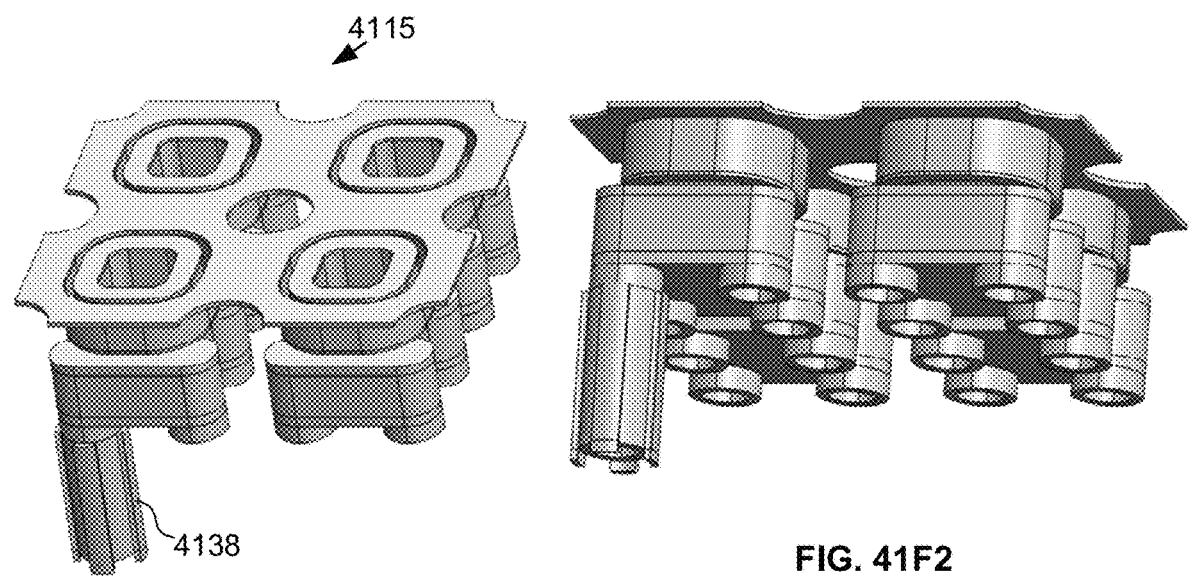
FIG. 41F1
FIG. 41F2
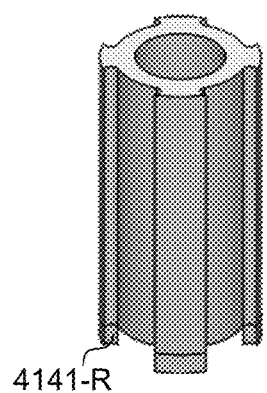
FIG. 41G1
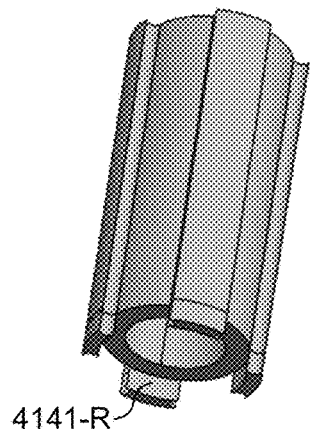
FIG. 41G2

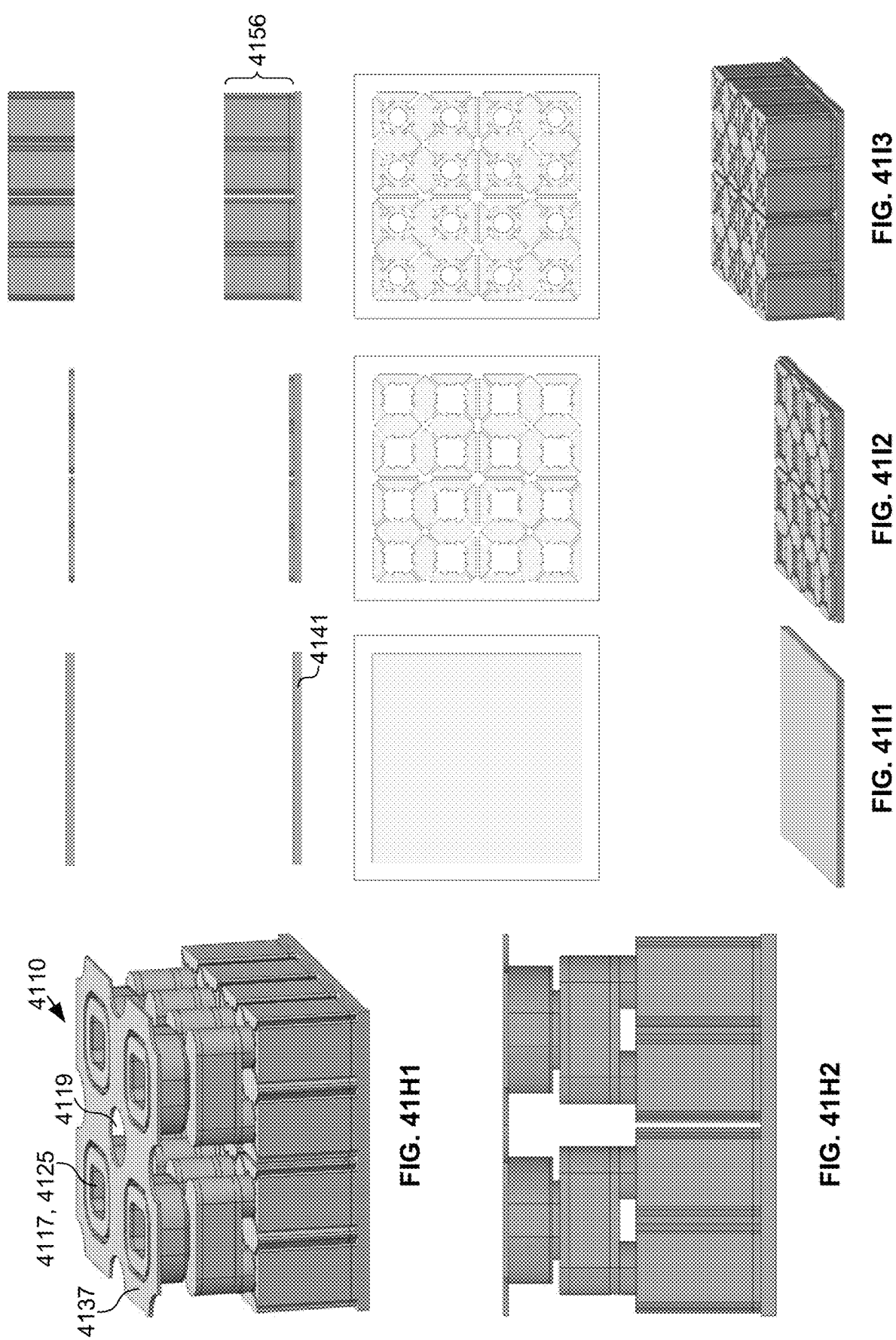

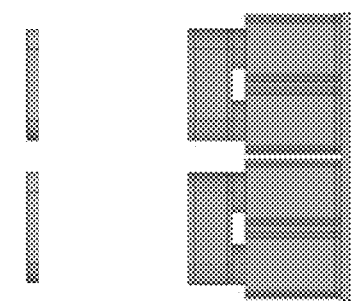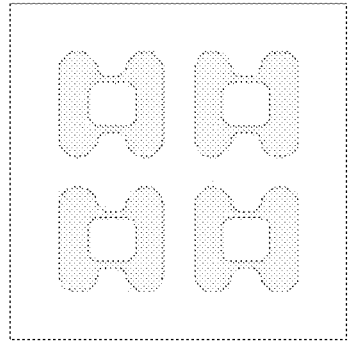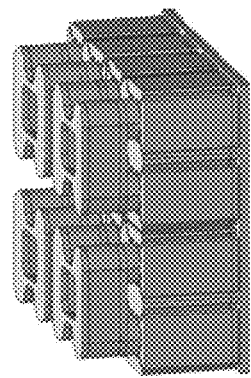
FIG. 41I7
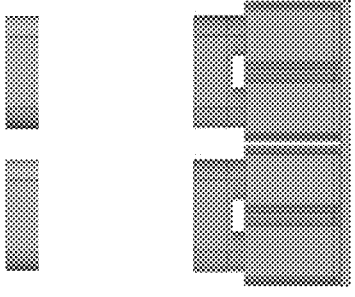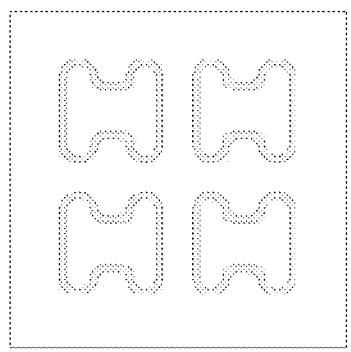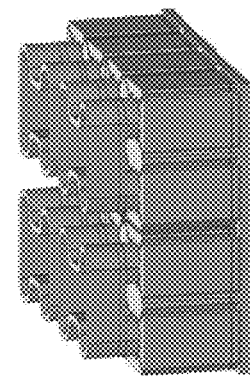
FIG. 41I6
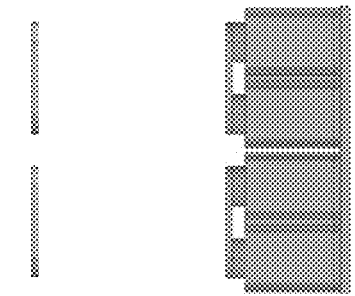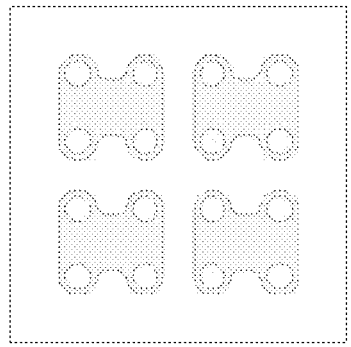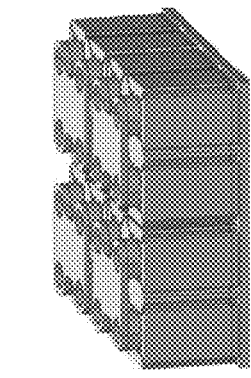
FIG. 41I5
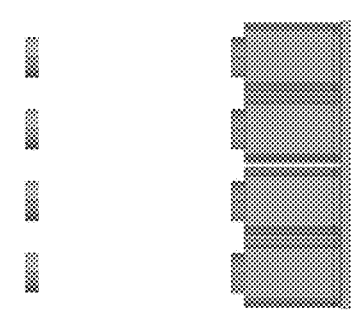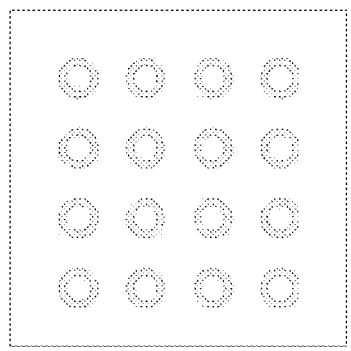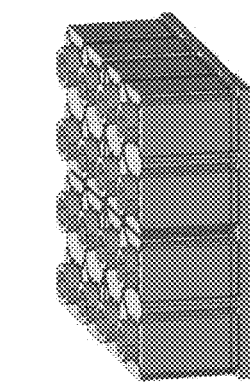
FIG. 41I4

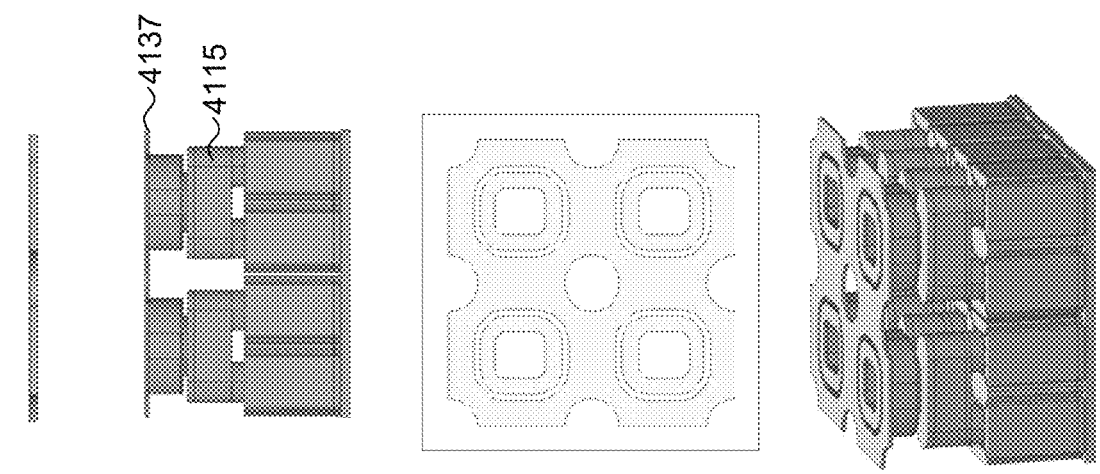
FIG. 41I11
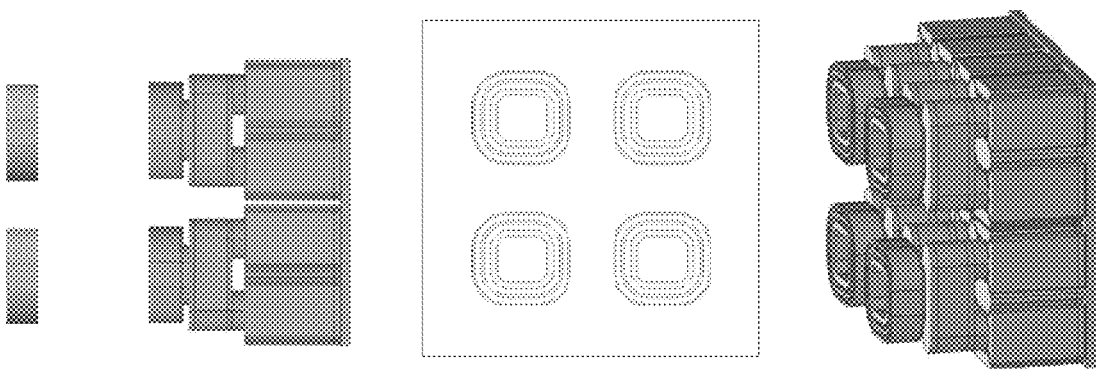
FIG. 41I10
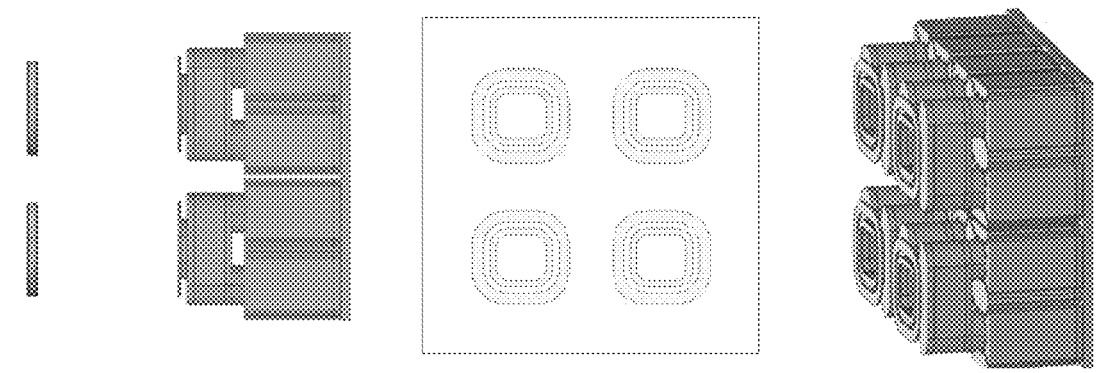
FIG. 41I9
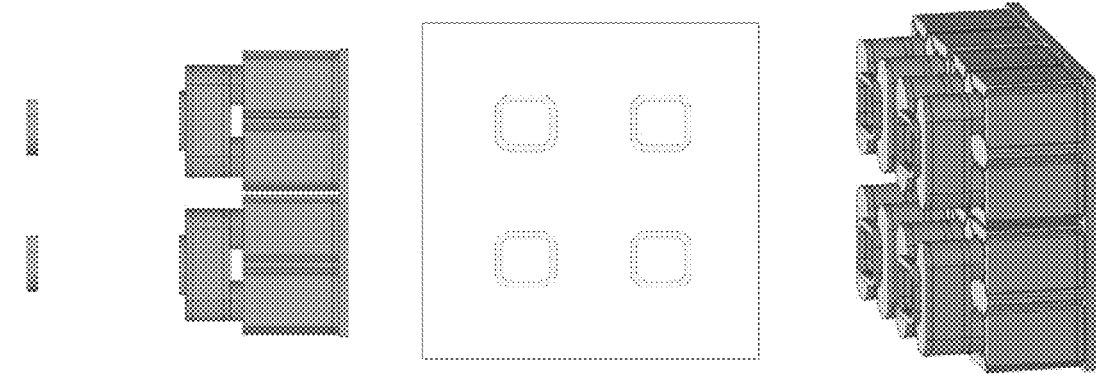
FIG. 41I8

MICRO HEAT TRANSFER ARRAYS, MICRO COLD PLATES, AND THERMAL MANAGEMENT SYSTEMS FOR SEMICONDUCTOR DEVICES, AND METHODS FOR USING AND MAKING SUCH ARRAYS, PLATES, AND SYSTEMS

RELATED APPLICATIONS

This application relates, as indicated, to the following applications with each being incorporated herein by reference:

| App. No. | Continuity Type | App. No. | Which was Filed | Which is now | Dkt No. Fragment |
| --- | --- | --- | --- | --- | --- |
| This application | claims benefit of | 63/162,826 | 2021 Mar. 18 | pending | 397-A |
| This application | is related to | 17/174,218 | 2021 Feb. 11 | pending | 349-E |
| 17/174,218 | is a CNT of | 16/840,305 | 2020 Apr. 3 | 10,957,624 | 349-D |
| 16/840,305 | is a CNT of | 16/373,569 | 2019 Apr. 2 | 10,665,530 | 349-C |
| 16/373,569 | is a CNT of | 15/951,481 | 2018 Apr. 12 | lapsed | 349-B |
| 15/951,481 | is a CNT of | 15/283,013 | 2016 Sep. 30 | 9,953,899 | 349-A |
| 15/283,013 | claims benefit of | 62/355,557 | 2016 Jun. 28 | expired | 339-E |
| 15/283,013 | claims benefit of | 62/321,840 | 2016 Apr. 13 | expired | 339-D |
| 15/283,013 | claims benefit of | 62/316,470 | 2016 Mar. 31 | expired | 339-C |
| 15/283,013 | claims benefit of | 62/274,056 | 2015 Dec. 31 | expired | 339-B |
| 15/283,013 | claims benefit of | 62/235,547 | 2015 Sep. 30 | expired | 339-A |

FIELD OF THE INVENTION

The present invention relates to the field of (1) microscale or millimeter scale active heat transfer devices or arrays (HTDs or HTAs) with single stage or multiple stage jetting structures that provide directed fluid flow to a primary heat transfer surface or impact surface for use in providing thermal management of semiconductors or other devices during fabrication, or testing, (2) cold plates incorporating such devices or arrays as well as inlet and outlet interfaces with single stage or multistage divisions that are in addition to any such stages that form part of an HTD or HTA wherein the cold plate provides for cooling or temperature moderation of a heat source, (3) systems incorporating such HTAs and/or cold plates that may additionally include pumps, heat exchangers, and/or filters as well as additional active or passive cooling or heating elements, and (4) electrochemical, multi-layer fabrication of micro-scale or mesoscale three-dimensional structures, parts, components, or devices where each layer is formed from a plurality of deposited materials and more specifically use of such methods in forming in whole or in part such microscale HTDs or HTAs.

BACKGROUND OF THE INVENTION

Thermal Management

Current and next generation high performance electronic devices are reaching such high heat flux levels that new liquid cooling strategies are required. To tackle this problem, liquid cooled micro-heat exchangers have been in development for some time, though they have not seen wide commercial penetration. One reason for this is that these next generation micro-cooling systems with complex inner geometries require equally complex manufacturing technologies in order to fabricate them. This being the case, many micro-cooling concepts have been conceptualized using CFD modelling tools, though they cannot be implemented without appropriate manufacturing technology to realize them physically.

An example of a thermal management cold plate can be found in a paper entitled "Direct Liquid Jet-Impingement Cooling with Micron Sized Nozzle Array and Distributed Return Architecture" by Thomas Brunschwiler, Hugo Rothuizen, Matteo Fabbri, Urs Kloter, Bruno Michel, R. J. Bezame, and Govindarajan Natarajan from the Thermal and Thermalmechanical Phenomena in Electronics Systems 2006, ITERM '06 conference.

A second example of a thermal management system for semiconductor devices and other sources can be found in U.S. Pat. No. 9,953,899 (Microfabrica Docket No. P-US349-A-MF).

A third example of a thermal management system can be found in a conference paper entitled, "A New Hybrid Heat Sink with Impinging Micro-Jet Arrays and Microchannel Fabrication Using High Volume Additive Manufacturing by A. J. Robinson, W, Tan, R. Kempers, J. Colenbrander, N. Bushnell, and R. Chen from the January 2017 $33^{rd}$ Thermal Measurement, Modeling & Management Symposium (SEMITHERM).

A fourth example of thermal management systems and an analysis of them can be found in the University of Sheffield thesis entitled "Evaluation of Thermal Management Solutions for Power Semiconductors by Manoj Balakrishnan and labeled with a date of May 2016.

Each of these patent applications and other publications are incorporated herein by reference as if set forth here in full.

Electrochemical Fabrication:

Electrochemical fabrication techniques for forming three-dimensional structures from a plurality of adhered layers have been, and are being, commercially pursued by Microfabrica® Inc. (formerly MEMGen Corporation) of Van Nuys, Calif. under the process names EFAB and MICA FREEFORM®.

Various electrochemical fabrication techniques were described in U.S. Pat. No. 6,027,630, issued on Feb. 22, 2000 to Adam Cohen.

A related method for forming microstructures using electrochemical fabrication techniques is taught in U.S. Pat. No. 5,190,637 to Henry Guckel, entitled "Formation of Microstructures by Multiple Level Deep X-ray Lithography with Sacrificial Metal Layers".

Electrochemical fabrication provides the ability to form prototypes and commercial quantities of miniature objects, parts, structures, devices, and the like at reasonable costs and in reasonable times. In fact, electrochemical fabrication, and in particularly multi-layer electrochemical fabrication, is an enabler for the formation of many structures that were hitherto impossible to produce. Electrochemical fabrication opens the spectrum for new designs and products in many industrial fields. Even though electrochemical fabrication offers this capability, and it is understood that electrochemical fabrication techniques can be combined with designs and structures known within various fields to produce new structures, certain uses for electrochemical fabrication provide designs, structures, capabilities and/or features not known or obvious in view of the state of the art.

A need exists in various fields for miniature devices having improved characteristics, improved operational capabilities, reduced fabrication times, reduced fabrication costs, simplified fabrication processes, greater versatility in device design, improved selection of materials, improved material properties, more cost effective and less risky production of such devices, and/or more independence between geometric configuration and the selected fabrication process.

SUMMARY OF THE INVENTION

Some embodiments of the invention are directed to heat transfer arrays (HTAs) that may be placed in contact with, or in proximity to, operating semiconductors, other operating heat sources, or heat sink materials in contact with such semiconductors or heat sources to provide enhanced cooling or heat dissipation. These heat transfer arrays may take the form of microjet arrays, hybrid microchannel microjet arrays, integrated fin and microjet arrays, and even hybrid microchannel and integrated fin and microjet arrays. In some embodiments, the HTAs may be accompanied by heating elements that can provide for two directional temperature control wherein the heating elements may be located between the HTA(s) and the heat source to be temperature modulated or in another position relative to the HTAs or the heat source. Such heating elements may provide general heating or area specific heating depending either on anticipated heat production by the source or measured temperature variations that are to be moderated. If necessary, such heating elements may be electrically isolated from any conductive material forming the HTA. In combination with appropriate inlet and outlet headers and or manifolds, these heat transfer arrays and optional heating elements might be called cold plates or active heat sinks. In combination with pumps, heat exchangers, appropriate functional connections (e.g. tubing, channels), optional filters, optional sensors (e.g. pressure, temperature, flow, and the like), and optional storage reservoirs, and the like, these cold plates (individually or in groups) may form thermal management control systems.

Some embodiments may provide heat transfer arrays that may be located side-by-side or in lateral proximity to each other to provide extended lateral cooling of a surface.

Some embodiments may provide heat transfer arrays that include N inlet splitting or passage dividing stages and R outlet passage recombination stages where N>R.

Some embodiments may provide heat transfer arrays and/or cold plates with inlets and outlets located vertically above the heat transfer array jetting elements.

Some embodiments may provide heat transfer arrays and/or cold plates having first inlet path-to-jet outlet orifice flow impedances, or average impedances, $Z_i$, and second post jetting-to-outlet flow impedances, or average impedances, $Z_o$, where the inlet flow impedance is greater than the outlet flow impedance, such as, for example, where $Z_i/(Z_o+Z_i)$ has a value greater than 0.55, 0.6, 0.7, 0.8, 0.9, or even 0.95.

Some embodiments provide heat transfer arrays or cold plates that are laterally scalable without inlet or outlet passage causing one or more lateral regions of a heat transfer array to have a significantly reduced heat transfer rate (RHTR) compared to the other heat transfer rates of the array or the overall average heat transfer rate (AHTR) of the array where the significantly less is defined as the ratio of RHTR/AHTR being less than 60%, 70%, 80%, or 90%.

Some embodiments provide heat transfer arrays or cold plates with one or more (1) wells with nearest neighbor flow path connections, (2) wells with second nearest neighbor flow path connections, (3) wells with a mixture of nearest and second nearest neighbor flow path connections, (4) well walls with non-flow channels that provide thermal expansion/contraction stress relief, (5) individual jets that direct flow into multiple wells, (6) jets with one configuration and wells with another, (7) Spacers on jets, on well walls, or on both, (8) spacers on a single jet or a well that provide lateral displacement inhibition in only one direction but not the opposite direction or in only one direction and not the perpendicular direction, (9) tabs on a jet that engage well walls to provide vertical positioning of the jets relative to the walls, (10) one or more tabs on a jet that provide balanced vertical force on the jet when encountering a well wall but where such balanced force is provided by tabs on a plurality of grouped jets, or (11) tabs that are attached to one of a jet wall or a corresponding well wall wherein the tabs provide a lateral restoring force to the relative position of the jet wall and the well wall when a displacement force is exerted on one relative to the other.

In some embodiments, heat transfer arrays and their formation take advantage of the unmatched heat transfer coefficients and surface temperature uniformity associated with impinging microjet arrays together with the high surface area per unit volume associated with microchannels as can be implemented using multi-layer, multi-material electrochemical deposition (i.e., electrodeposition or electroless deposition) methods. Heat transfer arrays and inlet and outlet header or manifold designs may be modeled using computational fluid dynamics (CFD), for example, ANSYS Fluent Version 16.2 in combination with the capabilities of Microfabrica's MICA FREEFORM® process. In some embodiments, an extreme target heat flux of 1000 W/cm2 was considered along with a maximum surface temperature of 65° C. and a maximum surface temperature variation of below 10° C. Hydraulically, pressure drop was considered along with an overall volumetric flow rate limitation of 0.5 L/min for a 4 mm×4 mm package. In some embodiments, the heat transfer array was simulated using single phase laminar flow solver in Fluent and simulation of inlet and outlet headers. The simulations were multi-physics in nature as they included the heat flow throughout the internal solid metallic structures as well as the thermal field within the fluid. The designs of some embodiments, as simulated achieved their design goals, with a surface average heat transfer coefficient of 360 kW/m²K, for a flow rate of 0.5 L/min, and pressure drop of 1 atm. With an imposed heat flux of 1000 W/cm2, this may translate into a maximum surface temperature less than 58° C. and a surface temperature variation as small as 6° C.

It is an object of some embodiments of the invention to provide improved micro-scale or millimeter scale thermal management devices including variations of liquid (e.g., water) cooled heat transfer arrays.

It is an object of some embodiments of the invention to provide for the fabrication of such heat transfer array devices using multi-layer, multi-material electrochemical fabrication methods.

It is an object of some embodiments of the invention to provide improved micro-scale or millimeter scale thermal management devices including heat transfer arrays that can better manage or tolerate stresses resulting from thermal contraction and expansion or to minimize the extent of differential expansion.

It is an object of some embodiments of the invention to provide improved micro-scale or millimeter scale thermal management devices including heat transfer arrays that provide more uniform heat transfer rates.

It is an object of some embodiments of the invention to provide improved micro-scale or millimeter scale thermal management devices including heat transfer arrays that are configured to provide more improved lateral tiling.

Other objects and advantages of various embodiments of the invention will be apparent to those of skill in the art upon review of the teachings herein. The various embodiments of the invention, set forth explicitly herein or otherwise ascertained from the teachings herein, may address one or more of the above objects alone or in combination, or alternatively may address some other object ascertained from the teachings herein. It is not necessarily intended that any specific objects be addressed by any single aspect or embodiment of the invention.

In a first aspect of the invention, a microjet heat transfer array, comprises: (a) a plurality of microjet structures for directing fluid from at least one group inlet onto at least one surface of a primary heat exchange region, wherein the primary heat exchange region is selected from the group consisting of: (1) a surface of a heat source or a plurality of separated surfaces of a heat source, (2) at least one surface in proximity to one or more heat source surfaces wherein a separation distance between the at least one surface onto which jetting occurs and a surface or a plurality of separate surfaces of a heat source is selected from the group consisting of (i) <=10 mm, (ii) <=5 mm, (iii) <=2 mm, (iv) <=1 mm, (v) <500 um, (vi) <=200 um, (vii) <=100 um, (viii) <=50 um, (ix) <=20 um, and x) <=10 um; (3) at least one surface of a solid material separated from a surface or a plurality of separate surfaces of a heat source by a gap that is occupied by at least one highly conductive transfer material that may be a different solid, a semi-liquid, or a liquid wherein a thickness of the gap is selected from the group consisting of (i) <=10 mm, (ii) <=5 mm, (iii) <=2 mm, (iv) <=1 mm, (v) <500 um, (vi) <=200 um, (vii) <=100 um, (viii) <=50 um, (ix) <=20 um, and x) <=10 um; and (4) at least one surface of a solid that is in intimate contact with a surface or a plurality of separate surfaces of a heat source; and (b) a plurality of post jetting flow paths to direct the fluid from the primary heat exchange region to at least one group outlet, wherein the at least one surface of the primary heat exchange region onto which jetting occurs is closer, in the jetting direction, to the surface or the plurality of separate surfaces of the heat source than are the plurality of post jetting flow paths.

In a second aspect of the invention, a hybrid microjet and microchannel heat transfer array, comprises: (a) a plurality of microjet structures for directing a heat transfer fluid from at least one group inlet onto at least one surface of a primary heat exchange region that is similar to that noted in the first aspect; and (b) a plurality of post jetting microchannel flow paths to direct the heat transfer fluid from the primary heat exchange region to at least one group outlet, wherein the at least one surface of the primary heat exchange region onto which jetting occurs is closer, in the jetting direction, to the surface or the plurality of separate surfaces of the heat source than are the microchannel flow paths.

Numerous variations of the first and second aspects of the invention exist and include, for example: (1) the array of the second aspect wherein the at least one surface on to which jetting occurs comprises a plurality of jetting well surfaces with each jetting well surface surrounded by walls that direct fluid away from the jetting well surface into the microchannel flow paths; (2) the array of the first variation wherein each of the plurality of jetting surfaces is configured to directly receive jetted fluid from a single jet orifice; (3) the array of the second aspect where each of the plurality of jetting surfaces is configured to directly receive jetted fluid from a group consisting of two or more jet orifices; (4) the array of any of first or second aspects or first to third variations wherein the jets have elongated cross-sectional configurations (i.e. in a plane perpendicular to a jetting direction) with a length to width aspect ratio selected from the group consisting of (i) <=10 to 1, (ii) <=5 to 1, (iii) <=3 to 1, or (iv) <=2 to 1; (5) the array of the fourth variation wherein the length of the elongated cross-sectional configurations have an orientation that extends parallel to a primary flow direction of the fluid as the fluid flows from an inlet to the plurality of microjets; (6) the array of the second aspect, or any of the first to fifth variations as they depend directly or indirectly from the second aspect wherein the microchannels direct fluid received from the jetting structures along paths that flow past outside walls of the microjet structures initially in a direction that is substantially anti-parallel to the direction of jetting and then in a direction that is substantially perpendicular to the direction of jetting; (7) the array of the first variation, or any of second to sixth variations as they depend from the first variation, wherein the inlet is spaced further from the surface on to which jetting occurs than does a flow path through the microchannels after the fluid leaves the jetting wells; (8) the array of any of the first or second aspects or first to seventh variations wherein the device is configured to interface with a heat source that comprises a semiconductor device; (9) the array of any of the first or second aspects or first to eighth variations wherein the device comprises a component selected from the group consisting of (A) an IC; (B) a microprocessor; (C) an SOC; (D) an RFIC, e.g. an RF transmitter or RF receiver; (E) an optical transmitter or receiver; (F) a power amplifier; (G) a GPU; (H) a CPU; (I) a DSP; (J) an ASIC; (K) an APU; (L) an LED; (M) a laser diode; (N) a power electronic device, e.g. a power inverter or a power converter; (0) a photonic device, (P) a propulsion system; (Q) a solar array, e.g. for a micro satellite; (R) a radiator, e.g. for a micro satellite; (S) an engine of a micro drone; (T) a spacecraft component such as an SSPA; (U) a traveling wave tube amplifier; (V) a package that holds one or more of the devices of (A)-(T), and (W) a stack or plurality of stacks of devices sandwiched between separated heat transfer arrays or interleaved with multiple heat transfer arrays; (10) the array of either of the first or second aspects any of variations (1)-(7) wherein the density of jets is varies spatially, at least in part, based on spatial heat generation of the semiconductor device, wherein the jetting structures are placed laterally closer together in the regions where average heat production is highest compared to areas where heat production is lowest; (11) the array of any variations (8), or (9) or (10) as they depend from variation (8), wherein the majority of the heat exchange from a solid to the fluid occurs via a surface of a first metal and wherein selected portions of the array are formed from a second metal of higher thermal conductive than the first metal such that heat conductivity as a whole is improved relative to the heat conductivity if the second metal were replaced with the first metal; (12) the array of either aspect (1) or (2) or variations (1) to (11) wherein regions on to which jetted fluid impinges are strengthened with a material different from that used to form the side walls of the jetting structures; (13) the array of either aspect (1) or (2) or variations (1) to (12) wherein the array comprises a plurality of adhered planar layers of at least one material where successive layers can be distinguished by stair-stepped configurations and wherein layers extend laterally in a cross-sectional dimension and a layer stacking axis is substantially parallel to a direction of fluid jetting; (14) the array of either aspect (1) or (2) or variations (1) to (13) wherein the heat to be removed requires a heat flux, from at least a portion of the primary heat transfer region, selected from the group consisting of (i) $>=200$ $W/cm^2$, (ii) $>=400$ $W/cm^2$ and (iii) $>=800$ $W/cm^2$); (15) the array of either aspect (1) or (2) or variations (1) to (14) wherein the temperature of the surface or the plurality of separate surfaces of the heat source are to be held to a temperature selected from the group consisting of (i) $<=100°$ C., (ii) $<=80°$ C., and (iii) $<=65°$ C.; (16) the array of either aspect (1) or (2) or variations (1) to (15) wherein a variation in temperature over the surface or the plurality of surfaces of the heat source is to be held at a temperature selected from the group consisting of (i) $<=20°$ C., (ii) $<=15°$ C., and (iii) $<=10°$ C.; (17) the array of either aspect (1) or (2) or variations (1) to (16) wherein a flow of the heat transfer fluid through the array is selected from the group consisting of (i) $<=2.0$ L/min per 4 mm×4 mm area covered by the array, (ii) $<=1$ L/min per 4 mm×4 mm area covered by the array, and (iii) $<=0.5$ L/min per 4 mm×4 mm area covered by the array; (18) the array of either aspect (1) or (2) or variations (1) to (17) wherein the heat source has a surface area covered by the array selected from the group consisting of (i) $<=900$ sq mm, (ii) $<=400$ sq mm, (iii) $<=100$ sq mm, (iv) $<=25$ sq. mm, (v) $<=20$ sq. mm, and (vi) $<=16$ sq. mm; (19) the array of aspect 2, and the first-eighteenth variations as they depend directly or indirectly from aspect 2 wherein at least a portion of the plurality of microjetting structures provide flow paths with a cross-sectional dimension in the range of 15 to 300 um and more preferably in the range of 30-200 um; (20) the array the second aspect or any of the first to nineteenth variations as they depend directly or indirectly from aspect 2 wherein at least a portion of the post jetting microchannels have a cross-sectional dimension in the range of 15-300 um and more preferably in the range of 30-150 um; (21) the array of either the first or second aspects or any of the first to twentieth variations wherein distal ends of a plurality of jetting structures are spaced from the at least one surface of the primary heat exchange region by length in the range of 15-200 um and preferably in the range of 30-100 um; (22) the array of either the first or second aspect or any of the first to twenty-first variations wherein a first height of at least a plurality of post jetting microchannels is in the range of 40 to 600 um and more preferably in the range of 80-300 um, and wherein the first height is measured along a portion of the microchannels that directs fluid flow in a direction substantially anti-parallel to a direction of flow of fluid through the jetting structures; (23) the array of either the first or second aspect and any of the first to twenty-second variations wherein a height of at least a plurality of the jetting structures is in the range of 300 um to 1 mm and more preferably in the range of 400-800 um; (24) the array of either the first or second aspect or any of the first to twenty-third variations wherein a height of at least a plurality of the jets is in the range of 300 um to 1 mm and more preferably in the range of 400-800 um wherein a second height of at least a plurality of post jetting microchannels is in the range of 300-2000 um and more preferably in the range of 600-1000 um, wherein the second height is measured along a portion of the microchannels that directs fluid flow in a direction substantially perpendicular to the direction of flow of fluid through the jetting structures; (25) the array of either the first or second aspect or any of the first to twenty-fourth variations wherein a jetting well height extends from the at least one surface of the primary heat exchange region to a height that is above a height at which fluid exits the jetting structures; (26) the array of either the first or second aspect or any of the first to twenty-fifth variations wherein the array is configured to use a heat transfer fluid that is a liquid; (27) the array of the twenty-sixth variation wherein the liquid comprises water; (28) The array of either the twenty-sixth or twenty-seventh variation wherein the water does not undergo a phase change during a process of cooling a semiconductor; (29) the array of either the first or second aspect and any of the first to twenty-eighth variations wherein a solid material separating two adjacent jetting wells comprises a core material surrounded at least partially by a shell material wherein the core material has a higher thermal conductivity than does the shell material and also has a lower yield strength; or (30) the array of either the first or second aspect or any of the first to twenty-ninth variations wherein the plurality of jetting structures function as fins that contact the at least one surface of the at least one primary heat exchange region whereby a lowest portion of the plurality of jetting structures is in solid-to-solid contact with the at least one surface of the primary heat exchange region while at least one opening exists in the jetting structures above the at least one surface of the primary heat exchange region such that the jetted fluid is free from an enclosing jetting channel within the jetting structure to impinge on the at least one surface of the primary heat exchange region.

In a third aspect of the invention, a microjet heat transfer array, comprises: (a) a plurality of fins with each fin providing an embedded microjet for directing fluid from at least one group inlet onto at least one surface of a primary heat exchange region that is similar to that noted in the first aspect; (b) a plurality of post jetting microchannel flow paths to direct the fluid from the primary heat exchange region to at least one group outlet, wherein the plurality of fins provide a solid conductive heat flow path from the at least one surface onto which jetting occurs.

Numerous variations of the third aspect exist including, for example: (1) the array of the third aspect wherein the surface onto which jetting occurs is closer, in the jetting direction, to the heat source than are the plurality of post jetting microchannel flow paths; (2) the array of the third aspect wherein each fin provides a plurality of conductive solid contact paths directly to the surface of the primary heat exchange region onto which jetting occurs; or (3) the array of the third aspect wherein each fin has an elongated cross-sectional configuration. Other variations are similar to those noted for the first and second aspects of the invention so long as those variations do not contradict or otherwise nullify the features of the third aspect.

In a fourth aspect of the invention, a micro cold plate, comprises: (a) at least one fluid inlet (e.g. a header or manifold); (b) at least one fluid outlet (e.g. a header or manifold); (c) a microjet heat transfer array similar to that of the first aspect.

In a fifth aspect of the invention, a micro cold plate, comprises: (a) at least one fluid inlet (e.g. a header or manifold); (b) at least one fluid outlet (e.g. a header or manifold); (c) a hybrid microjet and microchannel heat transfer array similar to that of the second aspect.

Numerous variations of the fourth and fifth aspects of the invention exist. Some such variations are analogous to the variations of the first and second aspects as well as to variations of those variations, mutatis mutandis, for example where the variation would apply to a cold plate as opposed to a heat transfer array.

In a sixth aspect of the invention, a micro cold plate, comprises: (a) at least one group fluid inlet; (b) at least one group fluid outlet; (c) a microjet heat transfer array similar to that of the third aspect.

Numerous variations of the sixth aspect of the invention exist. Some such variations are analogous to those noted above for the third aspect of the invention, mutatis mutandis, for example where the variation would apply to a cold plate as opposed to a heat transfer array. Other variations are similar to those noted for the fourth and fifth aspects of the invention so long as those variations do not contradict or otherwise nullify the features of the sixth aspect.

In a seventh aspect of the invention, a thermal management system for a semiconductor device, comprises: (1) at least one micro cold plate similar to that of the fourth aspect; (2) at least one flow path to move heated fluid, directly or indirectly, from the fluid outlet header or manifold of the at least one micro cold plate to a heat exchanger; (3) at least one flow path to move cooled fluid, directly or indirectly, from the heat exchanger back into the inlet header or manifold of the at least one micro cold plate; and (4) at least one pump functionally configured to direct the fluid through the at least one cold plate to the heat exchanger and back to the at least one cold plate.

In an eighth aspect of the invention, a thermal management system for a semiconductor device, comprises: (1) at least one micro cold plate similar to that of the fifth aspect; (2) at least one flow path to move heated fluid, directly or indirectly, from the fluid outlet header or manifold of the at least one micro cold plate to a heat exchanger; (3) at least one flow path to move cooled fluid, directly or indirectly, from the heat exchanger back into the inlet header or manifold of the at least one micro cold plate; and (4) at least one pump functionally configured to direct the fluid through the at least one cold plate to the heat exchanger and back to the at least one cold plate.

Numerous variations of the seventh and eighth aspects of the invention exist. Some such variations are analogous to the variations of the first and second aspects as well as to variations of those variations, mutatis mutandis, for example where the variations would apply to a system as opposed to a heat transfer array. Additional variations, include, for example: (1) a filter being located along the flow path between the outlet and the pump; (2) a filter being located along the flow path between pump and the inlet; (3) a filter being located along the flow path between pump and the heat exchanger; (4) the pump being mounted to a header or manifold of the cold plate; (5) the pump being spaced from the cold plate; (6) at least one temperature sensor and a control system for turning on the pump when a detected temperature is greater than a high temperature set point; (7) at least one temperature sensor and a control system for turning off the pump when a detected temperature is less than a low temperature set point; (8) the system comprises a plurality of microjet arrays with at least two of the arrays spaced from one another to remove heat from separated portions of a single integrated circuit; (9) the system comprises a plurality of microjet arrays with at least two of the arrays spaced from one another to remove heat from two different integrated circuits; (10) at least one pressure sensor to monitor fluid pressure in the flow paths; and (11) the micro cold plate comprises a single structure that provides both the inlet header or manifold and the outlet header or manifold.

In a ninth aspect of the invention, a thermal management system for a semiconductor device, comprises: (1) at least one micro cold plate, comprising: (a) at least one fluid inlet header or manifold; (b) at least one fluid outlet header or manifold; (c) a microjet and microchannel heat transfer array similar to that of the third aspect; (2) at least one flow path to move heated fluid, directly or indirectly, from the fluid outlet header or manifold of the at least one micro cold plate to a heat exchanger; (3) at least one flow path to move cooled fluid, directly or indirectly, from the heat exchanger back into the inlet header or manifold of the at least one micro cold plate; and (4) at least one pump functionally configured to direct the fluid through the at least one cold plate to the heat exchanger and back to the at least one cold plate.

Numerous variations of the ninth aspect of the invention exist. Some such variations are analogous to those noted above for the third aspect of the invention, mutatis mutandis, for example where the variation would apply to a system as opposed to a heat transfer array. Other variations are similar to those noted for the seventh and eighth aspects of the invention so long as those variations do not contradict or otherwise nullify the features of the ninth aspect.

In a tenth aspect of the invention, a method for the batch formation of a plurality of heat transfer arrays, comprises: (a) forming a plurality of successively formed layers wherein each successive layer comprises at least two materials and is formed on and adhered to a previously formed layer, one of the at least two materials being a structural material and the other of the at least two materials being a sacrificial material, and wherein the forming of each of the plurality of successive layers comprises: (i) depositing a first of the at least two materials; (ii) depositing a second of the at least two materials; (iii) planarizing the first and second materials to set a boundary level for the layer; and (b) after the forming of the plurality of successive layers, separating at least a portion of the sacrificial material from multiple layers of the structural material to reveal the plurality of heat transfer arrays, wherein each of the plurality of heat transfer arrays is similar to a heat transfer array of the first aspect.

In an eleventh aspect of the invention, a method for the batch formation of a plurality of heat transfer arrays, comprises: (a) forming a plurality of successively formed layers wherein each successive layer comprises at least two materials and is formed on and adhered to a previously formed layer, one of the at least two materials is a structural material and the other of the at least two materials is a sacrificial material, and wherein the forming of each of the plurality of successive layers comprises: (i) depositing a first of the at least two materials; (ii) depositing a second of the at least two materials; (iii) planarizing the first and second materials to set a boundary level for the layer; and (b) after the forming of the plurality of successive layers, separating at least a portion of the sacrificial material from multiple layers of the structural material to reveal the plurality of heat transfer arrays, wherein each of the plurality of heat transfer arrays, is similar to that of the second aspect.

Numerous variations of the tenth and eleventh aspects of the invention exist. Some such variations are analogous to the variations of the first and second aspects as well as to variations of those variations, mutatis mutandis, for example where the variations would apply to a method for fabricating a heat transfer array as opposed to a heat transfer array itself.

In a twelfth aspect of the invention, a method for the batch formation of a plurality of heat transfer arrays, comprises: (a) forming plurality of successively formed layers wherein each successive layer comprises at least two materials and is formed on and adhered to a previously formed layer, one of the at least two materials is a structural material and the other of the at least two materials is a sacrificial material, and wherein the forming of each of the plurality of successive layers comprises: (i) depositing a first of the at least two materials; (ii) depositing a second of the at least two materials; (iii) planarizing the first and second materials to set a boundary level for the layer; and (b) after the forming of the plurality of successive layers, separating at least a portion of the sacrificial material from multiple layers of the structural material to reveal the plurality of heat transfer arrays, wherein each of the plurality of heat transfer arrays is similar to that of the third aspect.

Numerous variations of the twelfth aspect of the invention exist. Some such variations are analogous to those noted above for the third aspect of the invention, mutatis mutandis, for example where the variation would apply to a method of fabrication as opposed to a heat transfer array. Other variations are similar to those noted for the tenth and eleventh aspects of the invention so long as those variations do not contradict or otherwise nullify the features of the twelfth aspect. Still further variations include, for example: (1) the array being configured to use a heat transfer fluid that is a liquid; (2) where the liquid of the first further variation comprises water; or (3) wherein the liquid of the first or second further variation does not undergo a phase change during a process of cooling a semiconductor.

In a thirteenth aspect of the invention, a method for the batch formation of a plurality of heat transfer arrays, comprises: (a) forming a plurality of successively formed layers wherein each successive layer comprises at least two materials and is formed on and adhered to a previously formed layer, one of the at least two materials is a structural material and the other of the at least two materials is a sacrificial material, and wherein the forming of each of the plurality of successive layers comprises: (i) depositing a first of the at least two materials; (ii) depositing a second of the at least two materials; (iii) planarizing the first and second materials to set a boundary level for the layer; and (b) after the forming of the plurality of successive layers, separating at least a portion of the sacrificial material from multiple layers of the structural material to reveal the plurality of heat transfer arrays, wherein the each of the plurality of heat transfer arrays, comprises features selected from the group consisting of: (1) a microjet array, (2) a plurality of microjet structures and microchannels that receive fluid after being jetted from jetting structures, and (3) a plurality of fins and microjet structures wherein the fins comprise at least a portion of the jetting structures including jetting channels and jetting orifices.

Numerous variations of the thirteenth aspect of the invention exist. Some such variations are analogous to those noted above for the first to ninth aspects of the invention, mutatis mutandis, for example where the variation would apply to a method of fabrication as opposed to a heat transfer array. Other variations are similar to those noted for the tenth to twelfth aspects of the invention so long as those variations do not contradict or otherwise nullify the features of the thirteenth aspect. Still further variations include, for example: (1) the method further comprising: (c) designing a 3D representation of the heat transfer array in 3D CAD, (d) dividing the representation into a plurality of stacked layer representations of successive cross-sections of the heat transfer array, and (e) providing further processing of the cross-sectional data to derive fabrication data for the heat transfer array, wherein the fabrication data is used in creating the successively formed layers; (2) wherein the array is configured to use a heat transfer fluid that is a liquid; (3) the liquid of the second further variation comprises water; (4) the array is configured such that the liquid of the second or third further variations does not undergo a phase change during a process of cooling a semiconductor; (5) the heat transfer array is formed primarily of one or more metals; and (6) a metal of the fifth further variation is deposited by electrodeposition.

In a fourteenth aspect of the invention, a method for the formation of a micro cold plate for semiconductor cooling, comprises: (a) forming a heat transfer array comprising: (1) forming a plurality of successively formed layers, wherein each successive layer comprises at least two materials and is formed on and adhered to a previously formed layer, one of the at least two materials is a structural material and the other of the at least two materials is a sacrificial material, and wherein each successive layer defines a successive cross-section of the three-dimensional structure, and wherein the forming of each of the plurality of successive layers comprises: (i) depositing a first of the at least two materials; (ii) depositing a second of the at least two materials; (iii) planarizing the first and second materials to set a boundary level for the layer; and (2) after the forming of the plurality of successive layers, separating at least a portion of the sacrificial material from multiple layers of the structural material to reveal the three-dimensional parts; (b) supplying a fluid inlet in the form of a header or manifold and a fluid outlet in the form of a header or manifold; and (c) attaching the microjet array to the fluid inlet and fluid outlet, wherein each of the heat transfer array, comprises features selected from the group consisting of: (1) a microjet array, (2) a plurality of microjet structures and microchannels that receive fluid after being jetted from jetting structures, and (3) a plurality of fins and microjet structures wherein the fins comprise at least a portion of the jetting structures including jetting channels and jetting orifices.

Numerous variations of the fourteenth aspect of the invention exist. Some such variations are analogous to those noted above for the first to ninth aspects of the invention, mutatis mutandis, for example where the variation would apply to a method of fabrication as opposed to a heat transfer array. Other variations are similar to those noted for the tenth to thirteen aspects of the invention so long as those variations do not contradict or otherwise nullify the features of the fourteenth aspect.

In a fifteenth aspect of the invention, a method for forming a thermal management control system for semiconductor cooling, comprises: (a) forming at least one heat transfer array using a process similar to that set forth in the fourteenth aspect; (b) supplying at least one fluid inlet in the form of a header or manifold and at least one fluid outlet in the form of a header or manifold; (c) providing at least one semiconductor device, at least one heat exchanger, and at least one pump; (d) attaching the at least one microjet array to the at least one fluid inlet and at least one fluid outlet; (e) functionally coupling the semiconductor device and the microjet array; (f) providing and functionally connecting at least one flow path to move heated fluid, directly or indirectly, from the fluid outlet header or manifold to a heat exchanger; (g) providing and functionally connecting at least one flow path to move cooled fluid, directly or indirectly, from the heat exchanger back into the inlet header or manifold; and (h) providing and functionally connecting at least one pump to direct the fluid through the at least one cold plate to the heat exchanger and back to the at least one cold plate, wherein each of the heat transfer array, comprises features selected from the group consisting of: (A) a microjet array, (B) a plurality of microjet structures and microchannels that receive fluid after being jetted from jetting structures, and (C) a plurality of fins and microjet structures wherein the fins comprise at least a portion of the jetting structures including jetting channels and jetting orifices.

Numerous variations of the fifteenth aspect of the invention exist. Some such variations are analogous to those noted above for the first to ninth aspects of the invention, mutatis mutandis, for example where the variation would apply to a method of fabrication as opposed to a heat transfer array. Other variations are similar to those noted for the tenth to fourteenth aspects of the invention so long as those variations do not contradict or otherwise nullify the features of the fifteenth aspect.

In a sixteenth aspect of the invention, a method of cooling a semiconductor device, comprises: (a) providing at least one heat transfer array, comprising a plurality of stacked and adhered layers comprising at least one metal wherein each of the at least one heat transfer array comprises features selected from the group consisting of: (1) a microjet array, (2) a plurality of microjet structures and microchannels that receive fluid after being jetted from jetting structures, and (3) a plurality of fins and microjet structures wherein the fins comprise at least a portion of the jetting structures including jetting channels and jetting orifices. (b) placing the heat transfer array in physical contact with or in proximity to the semiconductor device to be cooled to form a primary heat transfer region having at least one cooling fluid impingement surface; (c) pumping a cooling fluid into at least one inlet of the heat transfer array such that the cooling fluid is jetted onto the impingement surface to extract heat therefrom, then passing the heated cooling fluid to at least one outlet of the heat transfer array, while continuing to extract heat from the heat transfer array, and then on to a heat exchanger where heat is removed from the cooling fluid to produce cooled cooling fluid; and (d) circulating the cooled cooling fluid from the heat exchanger back into the at least one inlet array of the heat transfer array to repeat a flow cycle to draw heat from the at least one semiconductor device.

Numerous variations of the sixteenth aspect of the invention exist. Some such variations provide added features similar to those found in the previous aspects of the invention or in their variations. In some such variations the array is configured to use a heat transfer fluid that is a liquid, in others the liquid may be water, and in still others the cooling process may be provided to remove heat from a semiconductor device.

In a seventeenth aspect of the invention, a heat transfer array includes: (a) a plurality of microjet structures for directing fluid from at least one group inlet onto at least one surface of a primary heat exchange region, wherein the primary heat exchange region is selected from the group consisting of: (I) at least one surface of a heat source; (II) at least one surface in proximity to a heat source surface wherein a separation distance between the at least one surface onto which jetting occurs and at least one surface of a heat source is less than 10 millimeters; (III) at least one surface of a solid material separated from a surface of a heat source by a gap that is occupied by at least one highly conductive transfer material that is selected from the group consisting of: (A) a solid, (B) a semi-liquid, (C) a liquid, and (D) a gaseous material having a heat conductivity that is greater than that of aluminum; (b) a plurality of post jetting flow paths to direct the fluid from the primary heat exchange region to at least one group outlet comprising paths selected from the group consisting of: (I) flow paths that extend antiparallel to the jetting direction along a length that is greater than a width of the flow path that extends radially away from the jet, (II) flow paths that extend antiparallel to the jetting direction along a length that is greater than a height of a last stage of a multi-stage jet, (III) flow paths that extend through well walls that connect an interior of a jetting well to an interior of another jetting well, (IV) flow paths that extend through well walls that connect an interior of a jetting well to an interior of another jetting well wherein a width of a flow path connecting two such wells is less than a nominal diameter of one of the two such wells, and (V) flow paths that maintain the majority of the fluid from a given jet within a lateral extent from that jet that is no more than N lateral separation distances of neighboring jets before such fluid reaches a vertical separation from the jetting surface that is greater a height of the jetting channel of that jet, where N is selected from the group consisting of 1, 2, 3, 4, and 5.

Numerous variations of the seventeenth aspect of the invention existing and including for example: (a) a jetting configuration in combination with pre-jetting and post jetting fluid flow paths that provide the array with a uniform vertical heat conductivity across lateral dimensions of the heat transfer array with a possible exception of an external lateral wall region surrounding the array where uniformity has a maximum heat conductivity difference selected from the group consisting of: (I) less than 25%, (II) less than 20%, (III) less than 15%, (IV) less than 10%, and (V) less than 5%; (b) a configuration allowing two-dimensional side-by-side tiling of heat transfer arrays while maintaining a uniform vertical heat conductivity across the group of tiled arrays where uniformity has a maximum heat conductivity difference selected from the group consisting of: (I) less than 25%, (II) less than 20%, (III) less than 15%, (IV) less than 10%, and (V) less than 5%; (c) a number of inlet to jetting flow path splitting (or dividing levels) equal to N and a number of post jetting recombination stages equal to M, where N>M, and wherein a jet height is consider to be a height of associated with a final stage of the jet; (d) the at least one inlet comprises a plurality of inlets with at least a portion of the inlets being located above the jetting area of the plurality of microjet structures, wherein the at least portion of the inlets comprise an amount selected from the group consisting of: (I) a majority of the inlets, (II) more than 67% of the inlets, and (III) all the inlets; (e) the at least one inlet comprises a single inlet with the single inlet being located above the jetting area of the plurality of microjet structures; (f) the at least one outlet comprises a plurality of outlets with at least a portion of the outlets being located above the jetting area of the plurality of microjet structures, wherein the at least portion of the outlets comprise an amount selected from the group consisting of: (I) a majority of the inlets, (II) more than 67% of the inlets, and (III) all the inlets; (g) the at least one outlet comprises a single outlet with the single outlet being located above the jetting area of the plurality of microjet structures; (h) the HTA forming part of a cold plate that further comprises a manifold connected to the at least one inlet, with the manifold being located entirely above a region that is limited to all jetting structures, post jetting flow paths and intervening regions; (i) the HTA forming part of a cold plate that further comprises a manifold connected to the at least one outlet, with the manifold being located entirely above a region that is limited to all jetting structures, post jetting flow paths and intervening regions; (j) the heat transfer array having an inlet to jetting orifice flow impedance of I and a post jetting to exit impedance of J where I>J by an amount selected from the group consisting of: (1) at least 20%, (II) at least 50%, (II) at least 100%, (III) at least 200%, and (IV) at least 400%; (k) the heat transfer array having an average inlet to jetting orifice flow impedance (per jet) of I and an average post jetting to exit (per jet) impedance of J where I>J by an amount selected from the group consisting of: (I) at least 20%, (II) at least 50%, (III) at least 100%, (IV) at least 200%, and (V) at least 400%; (l) the heat transfer array is configured to be laterally scalable while providing uniform heat transfer rates from one side of the array to an opposite side of the array, where such rates per unit area within an average for the entire per unit area selected from the group consisting of: (I) within 5%, (II) within 10%, (III) within 20%, and (IV) within 30% wherein the unit area consists of no fewer than an area associated with 5% of plurality of jets; (m) the heat transfer array is configured such that the existence of a flow inlet region of the array does not cause any first portion of the heat transfer array to have a first heat transfer rate (HTR1) that is substantially different from a second heat transfer rate (HTR2) of a second similarly sized portion of the heat transfer array wherein substantially different is a difference in heat transfer rate that greater than D, where D is selected from the group consisting of: (I) 40%, (II) 30%, (III) 20%, (IV) 10%, and (V) 5%, and wherein the first and second portions include primary heat transfer regions that undergo jetting from a number of jets that is no less than an amount J where J is selected from the group consisting of (I) 20%, (II) 10%, and (III) 5% of the jets of the array; (n) the heat transfer array is configured such that the existence of a flow outlet region of the array does not cause any first portion of the heat transfer array to have a first heat transfer rate (HTR1) that is substantially different from a second heat transfer rate (HTR2) of a second similarly sized portion of the heat transfer array wherein substantially different is a difference in heat transfer rate that greater than D, where D is selected from the group consisting of: (I) 40%, (II) 30%, (III) 20%, (IV) 10%, and (V) 5%, and wherein the first and second portions include primary heat transfer regions that undergo jetting from a number of jets that is no less than an amount J where J is selected from the group consisting of no less than four jets and also no less (I) 20%, (II) 10%, and (III) 5% of the jets of the array; (o) the heat transfer array has wells into which jets provide fluid flow, wherein at least one condition exists that is selected from the group consisting of: (I) at least a portion of the wells have at least one nearest neighbor flow path connection; (II) at least a portion of the wells have at least one second nearest neighbor flow path connection; (III) at least a portion of the wells have a mixture of nearest and second nearest neighbor flow path connections; (IV) at least a portion of the well walls have non-flow channels that provide thermal expansion/contraction stress relief; (V) at least each of a portion of the jets direct a flow of fluid into a plurality of wells; (VI) at least a portion of the jets have configurations that are different from a configuration of their respective wells; (VII) at least a portion of the jets have configurations that are different from a configuration of other jets; (VIII) at least a portion of the wells have configurations that are different from a configuration of other wells; (IX) at least a portion of some jets each comprise at least one spacer on a side wall of the jets that sets a minimum spacing of other portions of such jets from their respective well walls; (X) at least a portion of some wells comprise walls that hold an inward extending spacer that sets a minimum spacing of the well walls from their respective jets; (XI) at least one spacer attached to a single jet that provides lateral displacement inhibition in only one direction but not in a direction selected form the group consisting or: (A) the opposite direction, and (B) a perpendicular direction; (XII) at least one spacer attached to a single well that provides lateral displacement inhibition of a respective jet in only one direction but not in a direction selected form the group consisting or: (A) the opposite direction, and (B) a perpendicular direction; (XIII) at least one tab connected to a jet that interacts with a well wall to provide a desired vertical spacing between a bottom of the jet and a jetting surface; (XIV) at least one tab connected to a jet that does not provide a balanced vertical force on the jet when encountering a well wall but where such a balanced forced is provided by tabs on a plurality of grouped jets; (XV) at least two deflectable tabs attached to at least one jet that provide a lateral restoring force when the at least one jet is misaligned with a defined location within at least one well; (XV1) at least two deflectable tabs attached to at least two partially opposing walls of at least one well which provide at least one respective jet with a lateral restoring force when the at least one respective jet is misaligned with a defined location with the at least one well; and (p) the separation distance is selected from the group consisting of an amount less than (I) 5 mm, (II) 2 mm, (III) 1 mm, (IV) 500 um, (V) <=200 um, (VI) <=100 um, (VII) <=50 um, (VIII) <=20 um, and (IX) <=10 um.

In an eighteenth aspect of the invention a micro cold plate, includes: (a) at least one fluid inlet selected from the group consisting of: (1) at least one header, and (2) at least one manifold; (b) at least one fluid outlet selected from the group consisting of: (1) at least one header, and (2) at least one manifold; (c) a heat transfer array according to the seventeenth aspect of the invention.

In a nineteenth aspect of the invention a micro cold plate, include: (a) at least one fluid inlet selected from the group consisting of: (1) at least one header, and (2) at least one manifold; (b) at least one fluid outlet selected from the group consisting of: (1) at least one header, and (2) at least one manifold; (c) a heat transfer array according to the seventeenth aspect of the invention and at least one of the variations of the seventh aspect of the invention noted above.

In a twenty-first aspect of the invention, a thermal management systems includes: (a) a micro cold plate according to the eighteenth aspect of the invention, (b) at least one flow path to move heated fluid, from the fluid outlet to at least one heat exchanger; (c) at least one flow path to move cooled fluid, directly or indirectly, from the at least one heat exchanger back into the fluid; and (d) at least one pump functionally configured to direct the fluid through the a loop including to, through, and out of the at least one cold plate and to, through, and out of the heat exchanger.

In a twenty-second aspect of the invention a thermal management system includes: (a) a micro cold plate according to the nineteenth aspect of the invention, (b) at least one flow path to move heated fluid, from the fluid outlet to at least one heat exchanger; (c) at least one flow path to move cooled fluid, directly or indirectly, from the at least one heat exchanger back into the fluid; and (d) at least one pump functionally configured to direct the fluid through the a loop including to, through, and out of the at least one cold plate and to, through, and out of the heat exchanger.

In other aspects of the invention, the heat transfer arrays may not be microscale or millimeter scale devices but instead macroscale devices that provide cooling of large scale structures and devices such as internal combustion engine blocks, jet engines, rocket engines, various high heat transfer components of engines, combustion chambers, power converters, electrical resistors, batteries, light sources, lasers, and the like. Such macroscale heat transfer arrays may be fabricated by various methods including traditional machining and assembly methods or additive fabrication methods such as stereolithography and casting, selective laser sintering, and other direct and indirect metal deposition methods. In some such embodiments, heat transfer array features, fluid channels, jet diameters, well sizes, fluid flow rates, and the like may be scaled with the device size or may retain micro-scale or millimeter scale dimensions as appropriate. In some such embodiments, the dimensions set forth herein for some devices' features may vary from those set forth while ratios of at least some dimensions may or may not scale.

Other aspects of the invention will be understood by those of skill in the art upon review of the teachings herein. These other aspects of the invention may provide various combinations of the aspects presented above as well as provide other configurations, structures, functional relationships, processes, and uses that have not been specifically set forth above.

BRIEF DESCRIPTION OF THE DRAWINGS

FIG. 2A provides a schematic view of a thermal management system (e.g., a cooling system) that includes a thermal management device in the form of a cold plate that includes at least one heat transfer array (HTA) and at least one inlet and outlet header or manifold along with a heat exchanger and a pump where fluid flow circulates from a pump to the inlet to the heat exchanger and then back to the pump via the outlet.

FIG. 2B provides a schematic view of a thermal management system (e.g., a cooling system) that includes a thermal management device in the form of a cold plate that includes at least one heat transfer array and at least one inlet and outlet header or manifold along with a heat exchanger and a pump where fluid flow is from an outlet of the cold plate to the pump to the heat exchanger and then back to an inlet of the cold plate.

FIG. 2C provides a schematic view of an alternative thermal management system (e.g., a cooling system) that includes a thermal management device (e.g., a cold plate that includes at least one heat transfer array in combination with at least one inlet and outlet header or manifold) and a directly mounted pump that receives cooling fluid from the cold plate or sends cooling fluid into the cold plate.

FIGS. 6A-6C illustrate side cross-sectional views of portions of three different heat transfer arrays showing two jets, a cooling fluid impact surface, and a portion of a fluid return path that moves fluid past the jets wherein the first HTA (FIG. 6A) shows the jets and impact surface and the well walls as each being formed from the same material, the second HTA (FIG. 6B) shows the jets and well walls are formed of the same material while the impact surface is formed of a different material, and the third HTA (FIG. 6C) shows the jets and well walls are formed of the same material while the impact surface is part of a separated structure (e.g. part of a device to be cooled or an interface material between the device to be cooled and the jetting and well structures).

FIG. 6D1 illustrates a side cross-sectional view of a portion of an HTA showing two jets, a cooling fluid impact surface or jetting surface, and a portion of a fluid return path that moves fluid past the jets wherein the cold plate includes jets formed from a first material, well walls formed from a second material, and an impact surface formed from a third material wherein the materials may be different.

FIGS. 6D2-6D5 show top views of four different versions of the structure of FIG. 6D1 showing different example configurations of fluid flow paths that might provide isolation of initial fluid return paths or connections between initial fluid return paths from different jets relative to one another (i.e., post jetting flow paths), wherein the fluid flow paths remain isolated until the tops of the well walls are exceeded (FIG. 6D2), wherein pairs of return paths have a passage that joins pairs of return paths to one another to provide further surface area for fluid to extract heat from the solid walls of the wells or fin structures (FIG. 6D3), wherein pairs of individual jets occupy combined well structures (FIG. 6D4), or wherein the individual return paths are joined to one another via crossed pairs of flow paths (FIG. 6D5).

FIG. 6E1 illustrates a side cross-sectional view of an HTA similar to that of FIG. 6D1 with the exception that the side-by-side pair of jets are not separated by a wall but have an opening between them that can act as a common fluid return path.

FIG. 6E2 to FIG. 6E7 illustrate six example top views of the heat transfer array portion of FIG. 6E1 with each example providing a two-by-two array of jets and with each having a different pattern of jetting well configurations and/or well connections that form part of post jetting group of fluid return paths with all sharing a common cross-sectional view as shown in FIG. 6E1, wherein FIG. 6E2 shows top and bottom side-by-side jet pairs having individual jetting wells that are connected by a single relatively narrow fluid flow path that is similar to that of FIG. 6D3 but rotated by 90° about an axis perpendicular to a plane of the top view; FIG. 6E3 shows each of the upper and lower pairs of side-by-side jets sharing a common well similar to that of FIG. 6D4 but rotated by 90° about an axis perpendicular to a plane of the top view; FIG. 6E4 shows that each jet of the two-by-two array has its own jetting well but with a relatively narrow fluid flow path (e.g. having a width less than ¼ of the corresponding width of the well and perhaps even less than ⅛ of the well width) connecting the closest edges of the wells to their nearest neighbors such that four connection paths join the four wells together; FIG. 6E5 shows that the four wells have similar connective paths as those shown in FIG. 6E4 but with the paths having moderate widths (e.g. between ¼ and ½ of the width of the individual wells) as opposed to relatively small widths; FIG. 6E6 illustrates a configuration where all four jets share a single well without any intermediate well wall or fin elements; and where FIG. 6E7 shows a configuration where all four jets have their own wells but with relatively narrow flow paths not only connecting nearest neighbors but also second nearest neighbors (i.e. the diagonal neighbors).

FIG. 6FI depicts a well structure similar to that of FIG. 6E1 but exemplifying a heat transfer array having four side-by-side jets and well structures as opposed to only having two, while FIG. 6F2 illustrates a cut view of the array of FIG. 6F1 at cutline F2-F2 where it can be seen that the exemplified array not only has four side-by-side jets but has a total of three rows of jets, thus forming a 4×3 array, wherein the jets have individual wells but also have additional flow paths that connect the second nearest neighbors to one another along diagonal paths without providing direct flow paths between the nearest neighbors.

FIG. 6GI depicts a well structure similar to that of FIG. 6F1 but without well walls or fins separating the wells at least along the vertical section line G2-G2 while FIG. 6G2 illustrates a cut horizontal view showing a cut line G1-G1 showing the line along which FIG. 6G1 was generated where it can be seen that the exemplified array not only has four side-by-side jets but has a total of four rows of jets, thus forming a 4×4 array and wherein the jets have individual wells but also have additional flow paths that connect the nearest neighbors and second nearest neighbors to one another such that diagonal flow paths and X and Y flow paths are provided.

FIG. 6HI illustrates jets and wells having different structural configurations from those shown in the previous examples wherein the wells are formed from neighboring hexagonal structures while jets are formed with spaced hexagonal structures, wherein the array include five side-by-side jets, and wherein jetting from a single jet does not dispense fluid into a single well but into a plurality of wells (e.g. 3 wells) wherein portions of jet walls extend vertically into the wells while other portions of the jet walls contact the well walls or reside above the well walls while FIG. 6H2 illustrates a cut horizontal view of the array of FIG. 6H1 at cutline H2-H2 of FIG. 6H1, where it can be seen that the exemplified array not only has five side-by-side jets but has a total of three rows of jets, thus forming a 5×3 array, and wherein the well count is three times that of the jet count.

FIG. 7A1 provides a vertical cross-section of part of a jetting array having a plurality of jets, a plurality of wells, and a jetting surface wherein these three primary features may be formed from different materials and wherein some well walls include hollow regions that may or may not allow fluid flow but can provide some level of stress relief during changes in temperature or when operational temperatures are significantly different from fabrication temperatures, particularly when the well structure(s) or well wall fins are formed from a different material than that of the jetting surface.

FIG. 7A2 provides a top view of the array of FIG. 7A1 where it can be seen that the array provides a 2×2 configuration of jets and wells, the wells do not include fluid flow paths that connect them, and the hollow regions shown in FIG. 7A1 do not extend to the top of the wells.

FIG. 7A3 and FIG. 7A4 provide two cut views of alternative array hollow structure configurations that meet the constraints shown in FIG. 7A1 and FIG. 7A2 wherein the hollow regions of FIG. 7A3 are provided in the form of a number of discontinuous segments that form a grid pattern bisecting the well walls or fin structures around the well depressions while FIG. 7A4 provide a similar pattern of hollow regions where the paths are continuous in nature as opposed to being discontinuous.

FIGS. 7B1-7B4 provide longitudinal and lateral cross-sectional views of part of a jetting array having hollow regions within portions of the fin or well walls as did FIGS. 7A1-7A4 but with those hollow regions having a different configuration relative to those of FIGS. 7A1-7A4, wherein FIG. 7B1 provides a vertical or longitudinal cross-section (in a X-Z plane) showing that in the plane of the cross-section, hollow regions exist within the outer well walls but not in the central well wall, while FIGS. 7B2 and 7B3 provide cut views of the array of FIG. 7B1 along cut lines 7B2-7B2 and 7B3-7B3, and FIG. 7B4 provides a cross-section view along cut line of 7B4-7B4 of FIG. 7B3.

FIGS. 8A1 and 8A2, respectively, provide a vertical cross-section view in an X-Z plane and a cut view in an X-Y plane looking upward along the Z axis wherein jet walls, jet flow paths, jetting surface(s), and solid elements that vertically join the bottom of the jet walls to the jetting surface exist, wherein the solid elements convert the jetting functionality to a combined jetting and fin functionality (i.e., the combined jet and solid elements, or finjets, take on a dual jetting and a solid heat conductive fin functionality).

FIG. 8B1 and FIG. 8B2 provide examples of the heat array configuration of FIGS. 8A1 and 8A2 in two different states of formation according to another embodiment of the invention wherein FIG. 8B1 shows the jetting surface and the well walls formed separately from the jets and the connective elements while FIG. 8B2 shows the state of the process after the two portions are vertically shifted to form the complete array of FIGS. 8A1 and 8A2.

FIG. 8C1 and FIG. 8C2 are similar to those of FIGS. 8A1 and 8A2 with the exception that the connective elements that join the jets and the jetting surface are wider than the jet walls themselves and provide contact to the well walls in addition to the jetting surface wherein in FIG. 8C2, it can be seen that the connective elements do not provide a ring-like structure as do the jet walls but instead define discrete contact regions around which jetted fluid can flow. In other embodiments, other configurations are possible including the jets, the well walls, and the connective elements all being formed from the same material.

FIG. 8D1 and FIG. 8D2 are similar to those of FIGS. 8A1 and 8A2 with two exceptions: (1) the narrower connective elements are individually centered relative to the jet walls that they contact and (2) instead of just two elements bridging the jetting gap between each jet and the jetting surface, four connective elements are used.

FIGS. 8E1 and 8E2 respectively provide a configuration to be assembled as a vertical cross-sectional view and a downward looking cut view (FIG. 8E1) and as a vertical cross-sectional fully assembled view (FIG. 8E2) wherein the connective elements are provided with a pattern that allows placement of the jets using reasonable assembly processes that will always result in appropriate vertical support for the jets along with adequate jetting, connecting, and post jetting flow paths even without perfect lateral alignment of the jets and the well by positioning and sizing the standoffs relative to one another to always allow support and fluid flow.

FIGS. 8F1 and 8F2 provide views of another jetting array configuration but with a different type of bridging structure or connective elements that join the jets to the well walls as opposed to joining or contacting the jets to the jetting surface wherein FIG. 8F1 provides a vertical cross-sectional view and FIG. 8F2 provides an upward looking horizontal, or lateral, cut view along the cut line in FIG. 8F1 wherein the connective elements provide for a desired lateral alignment of the jets and the well walls and may also provide for retained vertical alignment along with the jets and the well walls and may also provide improved stress tolerances during temperature variations particularly when the jetting surface and the well walls or jets are made of different materials with different coefficients of thermal expansion, and wherein a single bridging element is provided for each jet.

FIGS. 8G1 and 8G2 provide views of another jetting array configuration with bridging structures or connective elements similar to those of FIGS. 8F1 and 8F2 that join the jets to the well walls but where one jet of the pair has two such bridging structures oriented along one lateral axis while the other has two bridging or connective elements oriented along a perpendicular lateral axis as can be seen in FIG. 8G2 which is taken along the cut line shown in FIG. 8G1.

FIGS. 8H1 and 8H2 provide views of a jetting structure in a preassembly state and a post assembly state, respectively, wherein a jetting surface and well walls are shown laterally aligned but vertically separated from the jets and bridging elements as shown in FIG. 8H1 while the jetting surface, well walls, jets and bridging elements are shown after assembly from both a cross-section vertical perspective (lower portion of FIG. 8H2) and a top view (upper portion of FIG. 8H2).

FIGS. 8I1-8I3 provide three views of another embodiment of a small heat transfer array where jets and wells are provided with elements for constraining excess movement while still allowing some movement wherein FIGS. 8I1 and 8I2, respectively, provide vertical cross-sectional views of the array structure before and after loading of the jetting elements into vertical positions relative to a jetting surface, well walls, and laterally extending guidance tabs that inhibit lateral movement of the jets relative to the well walls beyond an amount predefined by the gaps between the jet walls and the end of the tabs while FIG. 8I3 provides an up-facing cut view of the structure along the cut line of FIG. 8I2.

FIGS. 8J1 and 8J2 provide two up-facing lateral views from the same perspective as noted in FIG. 8I3 but where the motion limiting/constraining tabs have different configurations as compared to those of FIGS. 8I1-8I3.

FIGS. 8K1 and 8K2 provide both a vertical cross-sectional view (FIG. 8K1) and an up-facing cut view along the cut line of FIG. 8K1 (FIG. 8K2) of an alternative embodiment where the movement limiting tabs of FIGS. 8I1-8J2 have been replaced by movement limiting spacers that are attached to the bottom of the jet structure but not the well walls wherein contact with the well walls would occur only upon excess lateral shifting of the jets relative to the well walls, wherein a single jet does not possess spacers that inhibit lateral movement in all directions but only in some directions, wherein a combination of connected jets with complementary spacers can provide excess motion inhibition in all directions for the group of jets as do the spacers for the pair of jets shown.

FIGS. 8L1 and 8L2 provide both a vertical cross-sectional view (FIG. 8L1) and an up-facing cut view along the cut line of FIG. 8L1 (FIG. 8L2) of an alternative embodiment where the movement limiting spacers of FIGS. 8K1-8K2 have been shifted slightly upward away of the bottom of the jets and attached to the well walls instead of the jet walls wherein the spacers limit lateral jet and well movement to an acceptable amount.

FIGS. 8M1 and 8M2 are similar to that of FIGS. 8L1 and 8L2 but where the movement limiting spacers extend the entire height of the well walls and have modified lateral positions but still inhibit relative lateral motion to an acceptable level.

FIGS. 8N1 and 8N3 provide three views of another embodiment of a small array configuration where jets and wells are provided with elements for biasing movement of jets laterally toward the center of wells during vertical loading of the jets into the well walls wherein FIG. 8N1 provides an illustration of a side cross-sectional view of the jets prior to vertical loading into well walls and where the well walls include compliant or elastic tab elements that can contact the jet walls during loading to provide centering alignment by an excess biasing force being exerted by bending of the alignment tabs on either side when the jets are loaded closer to that side than the other side and wherein FIG. 8N2 provides a side cross-sectional view after loading and automatic lateral centering along with cutting/viewing direction line of FIG. 8N3, while FIG. 8N3 provides an up facing view of the lateral (XY) features of the array along the cut line of FIG. 8N2 as well as providing a cut line showing the relationship between the structure of FIG. N3 and the cross-sectional view of FIG. 8N1.

FIGS. 8O1-8O3 provide similar images to those provided in FIGS. 8N1-8N3 with the exception that the alignment tabs are attached to the jets as opposed to the well walls.

FIG. 9A1 provides a cross-sectional side view of a jetting/support structure and surrounding support flange where the support structure includes a pair of longitudinally extended elements (e.g., rings) that are radially separated by a radially extending spacer to provide improved compliance in the positioning of the jet relative to one or more mounting structures (not shown) that support the jet in the region of the outer flange with the jet able to have additional compliant behavior due to the rings and spacer while FIG. 9A2 provides a top view of the structure of FIG. 9A1.

FIG. 9B provides a cross-sectional side view of an alternative jetting/support structure with alternative compliance enhancing features, wherein the enhancing features are formed as a pair of laterally extending disks, or flat ring-like features, that are spaced one from the other longitudinally by a spacer where the compliant features form part of the jet walls.

FIG. 9C provides a cross-sectional side view of an alternative jetting/support structure with compliance enhancing features that include a combination of the features of FIGS. 9A1 and 9B.

FIG. 9D provides another cross-sectional side cut view of an alternative jetting support/structure with compliance enhancing features that are similar to those of FIG. 9A but with the addition of a second pair of longitudinally extended elements and a second spacer.

FIG. 9E provides another cross-sectional side view of an alternative jetting support/structure with compliance enhancing features that are similar to those of FIG. 9B but with the addition of a second pair of laterally extended features and a second spacer.

FIGS. 9F-9H provide additional cross-sectional side views of alternative jetting/support structures but with dividing or splitting flow levels wherein the upper input level does not feed a single jet but directs fluid flow into a plurality of jets (e.g. four jets in FIG. 9F, three jets in FIGS. 9G and 9H) and where the added compliance enhancing elements or features are added to at least one location between the input level and the jets themselves.

FIGS. 9I-9K, respectively provide cross-sectional side views of partial multi-jet arrays with enhanced compliance structures joining each jet to their respective support structures where the three jetting/support structures are, respectively, similar to those of FIG. 9A1, FIG. 9B, and FIG. 9C.

FIG. 9L provides a cross-sectional side view of a partial jet array showing three jets using two different enhanced compliance enhancing support structures with the left and right most jet support structures being similar to that of FIG. 9A1 while the middle jet support structure is similar to that of FIG. 9B.

FIG. 9M provides a cross-sectional side view of a partial jet array showing three jetting structures with the left and right jets supported by structures like that of FIG. 9C providing enhanced compliance and with the middle jet support structure not including features to modify or enhance compliance.

FIGS. 9N1-9N3 provide cross-sectional side views of jetting/support structures similar to those of FIG. 9C along with a jetting surface and side walls (FIG. 9N1), a jetting surface, side walls, and well walls with fluid flow and/or stress relief passages (FIG. 9N2), a jetting surface, side walls, well walls with a different configuration of fluid flow and/or stress relief passages, and with solid connections between the jet side walls and well walls that provide for one or both of finjet functionality and positioning retention of lower portions of the jets relative to well walls (FIG. 9N3).

FIG. 9O1 provides a schematic side view representation of cross-sections of four segments that can be conceptually combined to form a multi-jet array wherein a left segment is provided with a left side wall, two intermediate segments without side walls, and a right segment with a right side wall, wherein each segment includes a jetting base and a single jet similar to that of FIGS. 9C and 9N1, and wherein the array does not include any well or fin structures around which jetted fluid flows.

FIG. 9O2 provides a schematic representation of the segments of FIG. 9O1 laterally shifted to depict the array resulting from the combination.

FIGS. 9Q1-9Q4 provide schematic side view representations of cross-sections of the jet array of FIG. 9O2 with addition of various well wall (or fin wall) configurations including various fluid flow and/or stress relief passages, wherein FIG. 9Q1 shows the well walls without lateral passages for either stress relief or fluid flow, FIG. 9Q2 shows the array with a single passage located between segments (i.e., four segments and thus three intermediate passages), FIG. 9Q3 shows a passage between the intermediate segments and the left and right side walls of the array, while FIG. 9Q4 shows that each segment includes a passage near but not at its own left and right ends.

FIG. 9R provides a cross-sectional side view of a jetting/support structure along with a jetting surface, side walls, and fluid flow line as did FIG. 9N1 but where the compliance enhancing structure is similar to that of FIG. 9A1 but with fluid flowing through the upper jet inlet with enhanced compliance being directed to three laterally displaced jets as opposed to a single jet.

FIG. 9S provides a schematic representation of three different jetting segments with each segment having a three-jet structure like that of FIG. 9R and where the left structure has left side wall, the right structure has a right side wall to form left and right ends of a complete jetting array while the middle structure or segment has no such side wall and can be replicated as many times as necessary to form an array of desired size.

FIGS. 9T1 and 9T2 provide segments similar to those of FIG. 9S in combination with the addition of various well wall (or fin wall) configurations including various fluid flow and/or stress relief passages, wherein FIG. 9T1 shows each jet dispensing fluid into its own well along with additional fin or well wall material existing between the various jetting structures and along with the side walls of the array while FIG. 9T2 shows similar fin or well wall structures but with passages located through the side wall and intermediate well walls to provide additional fluid flow passages and/or stress relief passages.

FIGS. 10A1-10A3 provide three different cross-sectional side views during different states of the assembly of jetting structures and associated jetting side wall structures with a jetting base and associated base side wall structures.

FIGS. 10B1-10B3 provide three different cross-sectional side views during assembly of jetting structures and associated jetting side wall structures with a jetting base and associated base side wall structures similar to that of FIGS. 10A1 to 10A3 with the exception that the edges of the jetting side wall structures slide past deflectable, lateral, inward facing extensions or tabs attached to the base side walls to potentially aid in lateral or vertical alignment.

FIG. 11A provides a side cross-sectional view of the left end of the jetting portion of a heat transfer array showing two jets (with additional jets potentially located in front of and behind the cross-section of the page), a jetting surface, exit channels running between the sides of the jets and fin or well walls to a lateral running exit channel located above the well walls and running past an upper portion of the jet walls.

FIG. 11B provides a side cross-sectional view of an intermediate portion of a heat transfer array showing two jets (with additional jets potentially located in front of and behind the cross-section of the page), a jetting surface, exit channels running between the sides of the jets and fin or well walls to a lateral running exit channel located above the well walls and running past an upper portion of the jets walls where one or more exit ports may exist.

FIG. 11C1 provides a side cross-sectional view of a heat transfer array having two jets shown laterally displaced (with potentially additional jets located in front of and behind the cross-section of the page), a jetting surface, exit channels running between the sides of the jets and fin or well walls to a lateral running exit channel located above the well walls and running past an upper portion of the jets above which a single centrally located fluid entry port and a single, right side fluid exit port is shown.

FIGS. 11C2 and 11C3 show two lateral cross-sectional views taken from cuts C2 and C3 respectively of FIG. 11C1 wherein FIG. 11C2 shows not only vertical flow paths around each jet (by the dotted elements) but also a lateral flow path to right while FIG. 11C3 shows the primary flow paths as being vertical as the fluid is moving primarily upward in the channels surrounding individual jets (i.e. channels that are bounded by the well or fin walls and the jet walls).

FIG. 11D provides a vertical cross-sectional view of a larger heat transfer array or cold plate having a total of eight laterally displaced jets, along with three progressively splitting vertical inlet levels, splitting respectively from 1 to M passages, 1 to N passages, and then 1 to P passages (with M=N=P=2 in this example) along with two outlet passages near the right and left edges of the array.

FIG. 11E1 shows a vertical cross-sectional view of a heat transfer array or cold plate that looks similar to that of FIG. 11D with the exception of moving the outlets slightly inward from the left and right edges and providing the array with a flat top while FIG. 11E2 provides a lateral cross-sectional view of the array along cut line E2 of FIG. 11E1 showing that the array is formed as a 3×8 array with the vertical cross-sectional view of FIG. 11E1 taken along cut line E1 of FIG. 11E2 wherein the splitting provided by the three vertical inlet levels is 1×24 where the levels (M, N, P) may for example be (2, 2, 6) or (2,6,2) or (6, 2, 2).

FIG. 11F1 provides a vertical cross-sectional view of a cold plate including a heat transfer array similar to that of FIG. 11E1 along with a manifold structure located on top of a transfer array wherein the array includes the three vertical inlet splitting levels and where the heat transfer array and manifold structure are separated by a seal level while FIGS. 11F2 and 11F3 provide lateral cross-sectional cuts at levels F2 and F3, respectively, of FIG. 11F1.

FIGS. 33A-33M provide various views of a portion of a heat transfer array and jetting surface (without side walls or array edge elements) wherein (a) it is assumed the array extends laterally beyond what is shown; (2) the array provides inlets and outlets on its upper surface in an alternating configurations so that lateral extension of the array in both X and Y dimensions is unobstructed, (3) the array includes one inlet for every 16 jets (ignoring potential XY array edge limitations), (4) each jet forces fluid into its own well or fin opening, (5) flow paths from inlets to jets undergo two levels of splitting with each level having a 1×4 split, (6) flow paths from jetting surfaces to outlets have an open configuration such that flow from each jet has a flow path into any outlet, and (7) the inlet-to-jet flow path provides a higher flow impedance than the jetting surface-to-outlet path.

FIGS. 34A-34B2 provide various views of an array structure similar to that of FIGS. 33A-33M with the exception that it uses a thinner (i.e. reduced height) well structure.

FIG. 35A provides an exploded view (left side) and combined view (right side) of a heat transfer array similar to that of FIGS. 33A-33E with the primary exception that the well structure is provided with four flow paths that connect individual wells with one another (nearest-neighbor-to-nearest-neighbor).

FIGS. 35B1-35B2 provide a side view and top view of the well structure of FIG. 35A along with a number of sample dimensions.

FIGS. 37A1-37G6 provide various views of a heat transfer array segment, or elements of such a segment, wherein the array structure only includes single stage (1×4) split along with a segmented well structure and a jetting surface structure.

FIGS. 38A1-38E12 provide various views of a four jet portion of a heat transfer array having two (1×4) vertical splitting levels along with a well structure and a jetting surface structure, or portions of such a four jet portion wherein the wells and jets are joined to each other along a substantial portion of their lengths with a gap and offset jetting surface contact structure at the bottom so as to force jetted fluid to move not only radially and vertically to an outlet passage but instead to move radially, vertically a short distance than circumferentially and then vertically again.

FIGS. 39A1-39E22 provide various views of a four jet portion of a heat transfer array having two (1×4) vertical splitting levels along with a well structure and a jetting surface structure, or portions of such a four jet portion, wherein the wells and jets are joined to each other via bridging element that is part of every other layer with successive bridges being circumferentially rotated so as to force jetted fluid to move not only radially and vertically to an outlet passage but instead to move radially and then back and forth vertically and circumferentially a number of times while traversing the height of the well or fin wall.

FIGS. 40A1-40G11 provide various views of a 16 jet portion of a heat transfer array having a single (1×4) vertical flow path split between an inlet and the jets and wherein above the split structure a compliance enhancing vertically extending recess exists in a connection plate that joins neighboring inlet and outlet openings to reduce a risk of thermal expansion differences resulting in damaging levels of stress being be transmitted between jets and well walls and or thermal expansion differences causing heat transfer efficiency losses as a result of jets and wells being misaligned.

FIGS. 41A1-41I11 provide various views of a 16 jet portion of a heat transfer array having a single (1×4) vertical flow path split between an inlet and the jets and wherein (1) above the split structure, a compliance enhancing vertically extending recess exists in a connection plate that joins neighboring inlet and outlet openings to reduce a risk of thermal expansion differences resulting in damaging levels of stress being transmitted between jets and well walls and/or thermal expansion differences causing heat transfer efficiency losses as a result of jets and wells being misaligned, (2) individual well jets are fixedly joined by a plurality of bridge elements (e.g. four) that extend the length of the wells other than at the junction of the jetting surface and the wells and that divide the post jetting path for each well into a plurality of isolated flow paths (e.g. four), (3) diagonal paths connecting the isolated post jetting flow paths from four wells to one another, and to one another, and (4) extended flow paths that join selected central portions of diagonal flow paths together that result in groups of wells having higher levels of stress separation from one another than do individual wells.

DETAILED DESCRIPTION OF PREFERRED EMBODIMENTS

Electrochemical Fabrication in General

Figure 1A:
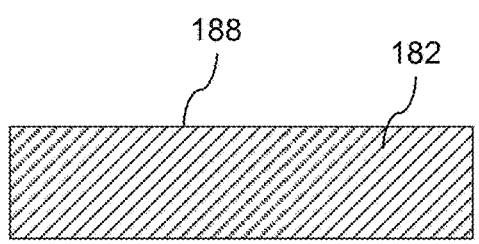
FIGS. 1A-1F schematically depict the formation of a first layer of a structure being formed using a particular electrochemical fabrication embodiment wherein adhered mask plating is used during deposition of a first material and where the blanket deposition of a second material overlays both the openings between deposition locations of a first material and the first material itself.
Figure 1B:
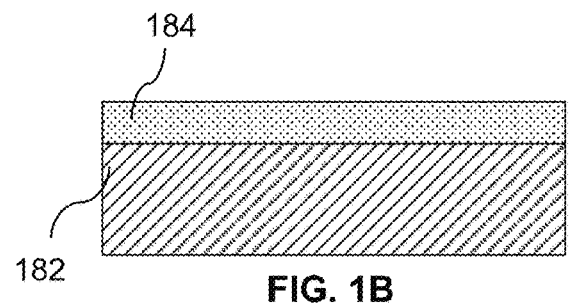
Figure 1C:
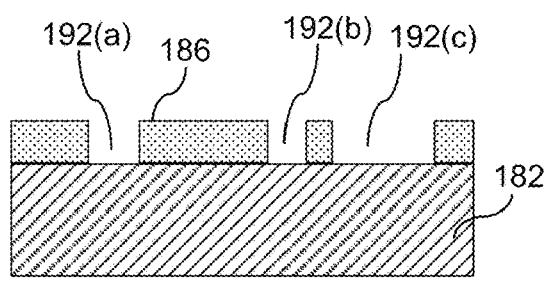
Figure 1D:
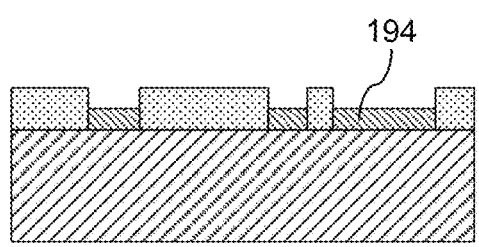
Figure 1E:
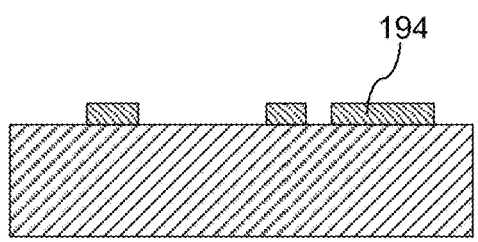
Figure 1F:
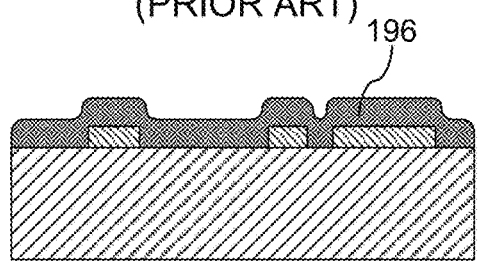
Figure 1G:
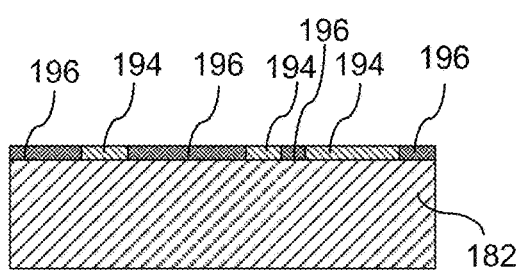
FIG. 1G depicts the completion of formation of the first layer of FIGS. 1A-1F resulting from planarizing the deposited materials to a desired level.
Figure 1H:
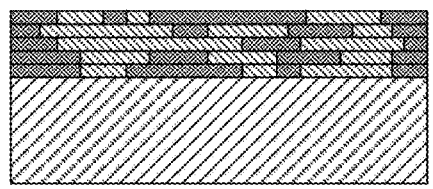
FIGS. 1H and 1I respectively depict the state of the process after formation of the multiple layers of the structure and after release of the structure from the sacrificial material.
Figure 1I:
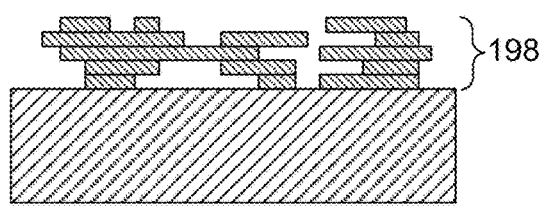

FIGS. 1A-1I illustrate side views of various states in an example multi-layer, multi-material electrochemical fabrication process. FIGS. 1A-1G illustrate various stages in the formation of a single layer of a multi-layer fabrication process where a second metal is deposited on a first metal as well as in openings in the first metal so that the first and second metals form part of the layer. In FIG. 1A, a side view of a substrate 182 having a surface 188 is shown, onto which patternable photoresist 184 is deposited, spread, or cast as shown in FIG. 1B. In FIG. 1C, a pattern of resist is shown that results from the curing, exposing, and developing of the resist. The patterning of the photoresist 184 results in openings or apertures 192(*a*)-192(*c*) extending from a surface 186 of the photoresist through the thickness of the photoresist to surface 188 of the substrate 182. In FIG. 1D, a metal 194 (e.g., nickel) is shown as having been electroplated into the openings 192(*a*)-192(*c*). In FIG. 1E, the photoresist has been removed (i.e., chemically, or otherwise stripped) from the substrate to expose regions of the substrate 182 which are not covered with the first metal 194. In FIG. 1F, a second metal 196 (e.g., silver) is shown as having been blanket electroplated over the entire exposed portions of the substrate 182 (which is conductive) and over the first metal 194 (which is also conductive). FIG. 1G depicts the completed first layer of the structure which has resulted from the planarization of the first and second metals down to a height that exposes the first metal and sets a thickness for the first layer. In FIG. 1H, the result of repeating the process steps shown in FIGS. 1B-1G several times to form a multi-layer structure is shown where each layer consists of two materials. For most applications, one of these materials is removed as shown in FIG. 1I to yield a desired 3-D structure 198 (e.g., component or device) or multiple such structures.

In some variations, the structure may be separated from the substrate. For example, release of the structure (or multiple structures if formed in a batch process) from the substrate may occur when releasing the structure from the sacrificial material particularly when a layer of sacrificial material is positioned between the first layer of the structure and the substrate. Alternative methods may involve, for example, the use of a dissolvable substrate that may be separated before, during or after removal of the sacrificial material, machining off the substrate before or after removal of the sacrificial material, or use of a different intermediate material that can be dissolved, melted or otherwise used to separate the structure(s) from the substrate before, during, or after removal of the sacrificial material that surround the structure(s).

Various embodiments of various aspects of the invention are directed to formation of three-dimensional structures from materials, some, or all, of which may be electrodeposited or electroless deposited (as illustrated in FIGS. 1A-1I and as discussed in various patents and patent applications incorporated herein by reference). Some of these structures may be formed from a single build level (e.g. a planarized layer) that is formed from one or more deposited materials while others are formed from a plurality of build levels, each including at least two materials (e.g. two or more layers, more preferably five or more layers, and most preferably ten or more layers). In some embodiments, layer thicknesses may be as small as one micron or as large as fifty microns. In other embodiments, thinner layers may be used while in still other embodiments, thicker layers may be used, while in still other embodiments, layer thickness may be varied during formation of different levels of the same structure. In some embodiments, microscale structures have lateral features positioned with 0.1-10 micron level precision and minimum feature sizes on the order of microns to tens of microns. In other embodiments, structures with less precise feature placement and/or larger minimum features may be formed. In still other embodiments, higher precision and smaller minimum feature sizes may be desirable. In the present application, meso-scale and millimeter-scale have the same meaning and refer to devices that may have one or more dimensions that may extend into the 0.1-50 millimeter range, or larger, and features positioned with a precision in the micron to 100 micron range and with minimum feature sizes on the order of several microns to hundreds of microns.

The various embodiments, alternatives, and techniques disclosed herein may form multi-layer structures using a single patterning technique on all layers or using different patterning techniques on different layers. For example, various embodiments of the invention may perform selective patterning operations using conformable contact masks and masking operations (i.e. operations that use masks which are contacted to but not adhered to a substrate), proximity masks and masking operations (i.e. operations that use masks that at least partially selectively shield a substrate by their proximity to the substrate even if contact is not made), non-conformable masks and masking operations (i.e. masks and operations based on masks whose contact surfaces are not significantly conformable), adhered masks and masking operations (masks and operations that use masks that are adhered to a substrate onto which selective deposition or etching is to occur as opposed to only being contacted to it), and/or selective patterned deposition of materials (e.g. via extrusion, jetting, or controlled electrodeposition) as opposed to masked patterned deposition. Conformable contact masks, proximity masks, and non-conformable contact masks share the property that they are preformed and brought to, or in proximity to, a surface which is to be treated (i.e. the exposed portions of the surface are to be treated). These masks can generally be removed without damaging the mask or the surface that received treatment to which they were contacted or located in proximity to. Adhered masks are generally formed on the surface to be treated (i.e. the portion of that surface that is to be masked) and bonded to that surface such that they cannot be separated from that surface without being completely destroyed or damaged beyond any point of reuse. Adhered masks may be formed in a number of ways including: (1) by application of a photoresist, selective exposure of the photoresist, and then development of the photoresist, (2) selective transfer of pre-patterned masking material, and/or (3) direct formation of masks from computer-controlled depositions of material. In some embodiments, adhered mask material may be used as a sacrificial material for the layer or may be used only as a masking material which is replaced by another material (e.g., dielectric or conductive material prior to completing formation of a layer where the replacement material will be considered the sacrificial material of the respective layer. Masking material may or may not be planarized before or after deposition of material into voids or openings included therein.

Patterning operations may be used in selectively depositing material and/or may be used in the selective etching of material. Selectively etched regions may be selectively filled in or filled in via blanket deposition, or the like, with a different desired material. In some embodiments, the layer-by-layer build up may involve the simultaneous formation of portions of multiple layers. In some embodiments, depositions made in association with some layer levels may result in depositions to regions associated with other layer levels (i.e., regions that lie within the top and bottom boundary levels that define a different layer's geometric configuration) . Such use of selective etching and/or interlaced material deposition in association with multiple layers is described in U.S. patent application Ser. No. 10/434,519, by Smalley, filed May 7, 2003, which is now U.S. Pat. No. 7,252,861 and which is entitled "Methods of and Apparatus for Electrochemically Fabricating Structures Via Interlaced Layers or Via Selective Etching and Filling of Voids". This referenced application is incorporated herein by reference.

Temporary substrates on which structures may be formed may be of the sacrificial-type (i.e. destroyed or damaged during separation of deposited materials to the extent they cannot be reused) or non-sacrificial-type (i.e. not destroyed or excessively damaged, i.e. not damaged to the extent they may not be reused, e.g. with a sacrificial or release layer located between the substrate and the initial layers of a structure that is formed). Non-sacrificial substrates may be considered reusable, with little or no rework (e.g., by replanarizing one or more selected surfaces or applying a release layer, and the like) though they may or may not be reused for a variety of reasons.

Definitions of various terms and concepts that may be used in understanding the embodiments of the invention (either for the devices themselves, certain methods for making the devices, or certain methods for using the devices) will be understood by those of skill in the art. Some such terms and concepts are discussed herein while other such terms are addressed in the various patent applications to which the present application claims priority and/or which are incorporated herein by reference (e.g., U.S. patent application Ser. No. 16/840,305).

Thermal Control and Heat Transfer Arrays, Cold Plates, Systems, and Methods

In various embodiments of the invention, heat transfer arrays may be formed using the multi-layer, multi-material electrochemical methods, and other methods, set forth herein with any desired orientation relative to a stacking axis of the layers that form the device. However, in some embodiments, it is preferred that the formation orientation be such that the bottom part or bottom surface of the heat transfer array (i.e. the part in contact with or in closest proximity to the semiconductor device or other device or devices to be thermally managed) be formed parallel to the plane of the layers that are being stacked. In some embodiments, it is preferred that the primary jetting direction of fluid from the jetting structures be substantially perpendicular to the planes of the layers (i.e. substantially parallel to the stacking axis, i.e. preferable within 20 degrees of the stacking axis, more preferably within 10 degrees of the stacking axis, and even more preferable within 5 degrees of the stacking axis). In general, as used herein, the jetting direction is considered to be downward, regardless of the physical orientation of the jetting array during use. This terminology is not intended to convey a direction relative to a gravitational field unless specifically and unambiguously indicated as such. In some embodiments, the jets may have jetting directions that are intentionally not parallel to the stacking axis. In some embodiments, the heat transfer arrays may not have a bottom or at least may not have contiguous bottoms, but instead, the base of the array may be a semiconductor device (e.g. the back side of the wafer on which the active components are formed or a protective layer formed on the wafer material), other heat source, or other material or a material stack (not formed along with the other array structures) which act as an interface between the heat transfer array and the heat source. In some embodiments, the heat transfer array may have a rectangular configuration while in other embodiments, it may have a different configuration, e.g. a configuration that matches a shape and a size of a semiconductor chip or hot spots on the chip that are to undergo thermal management. In some embodiments, an individual heat transfer array may be formed as a single monolithic device while in other embodiments, heat transfer arrays may be formed as multiple elements that are bonded or otherwise joined one to another after formation. In some embodiments, multiple heat transfer arrays may be held apart from one another and even used in conjunction with multiple semiconductor devices. In some embodiments, heat transfer arrays may be formed with etching holes that allow removal of a sacrificial material after all layers have been formed or after formation of only a portion of the layers. Such etching holes may be filled in or sealed after the layer formation process or after etching but during the layer formation process. In other embodiments, a top or lid and/or base or bottom may be formed separately to allow efficient removal of sacrificial material. Other embodiments may not require special openings to remove sacrificial material. Various methods exist to handle sacrificial material removal and/or multi-component device assembly as are set forth in some of the patents and patent applications incorporated herein by reference.

Reference numbers are included in many of FIGS. 2A to 41I11 wherein like numbers are used to represent similar structures or features in the different embodiments. In particular, when the FIGS. of the various embodiments use reference numbers, the reference numbers are provided in a 3 or 4 digit format which may be followed by letters, dashes, and/or additional numbers, wherein the first digit or first two digits (from the left) represent the FIG. number while the final digits to the right along with any trailing letters, dashes, or numbers represent a particular general structure or feature. When two or more figures include a reference having the same left most digits (and following letters, dashes, and additional numbers), it is intended indicate a similarity of the features indicated. The following table sets forth these right most digits and a general description of the structure or feature being represented.

Table of Reference Numbers for Structures/Features

| No. | Description |
|---|---|
| 00 | Thermal management system |
| 05 | Cold plate (heat sink, cold plate device) |
| 10 | Heat transfer array (or heat transfer device) |
| 15 | Heat transfer array manifold or header (branching flow paths) |
| 17 | Heat transfer array inlet |
| 17-H | Inlet height |
| 17-S | Inlet staging |
| 17-U | Stairstep - upper surface |
| 19 | Heat transfer array outlet |
| 19-H | Outlet height |
| 19-L | Stairstep - lower surface |
| 19-U | Stairstep - upper surface |
| 20 | Fluid flow path |
| 20-A | Above well exit flow (post jetting) |
| 20-B | Base flow path (post jetting) |
| 20-I | Inlet fluid flow path |
| 20-J | Jetting flow path |
| 20-O | Flow from array outlet |
| 20-P | Pre-jetting flow path |
| 20-V | Vertical channel flow (post jetting) |
| 20-W | Well-to-well flow (post jetting) |
| 25 | Jets |
| 27 | Jet - orifice |
| 28 | Jet - exit orifice |
| 29 | Jet - entrance orifice |
| 32 | Jet - jetting or flow channel |
| 35 | Jet - wall |
| 35-E | Jet - wall exterior surface |
| 35-G | Jet - guidance structure |
| 35-I | Jet - wall interior surface |
| 37 | Jet support structure |
| 37-C | Compliant structure - combination vertical and horizontal |
| 37-F | Compliant structure - flange |
| 37-H | Compliant structure - horizontal, radial, or lateral |
| 37-V | Compliant structure - vertical or longitudinal |
| 38 | Well wall-to-well wall bridge |
| 39 | Jet-to-well wall bridge (or connector) |
| 40 | Jet array |
| 41 | Impact regions, jetting floor, primary heat transfer surface |
| 41-C | Central region |
| 41-R | Rib or bridge structure continuing to and directly contacting jetting surface |
| 41-S | Side region |
| 42 | Jetting height (from bottom of jet to impact surface) |
| 45 | Fin |
| 45-J | Jet - impact surface fin |
| 45-N | Non-well, non-jet impact surface fin |
| 45-W | Well wall impact surface fin |
| 47 | Compliant guidance or alignment tabs or elements |
| 47-G | Tabs or elements attached to base or well guidance structure |
| 47-J | Guidance tabs or elements attached to jet wall |
| 47-W | Guidance tabs or elements attached to well wall |
| 48 | Spacers or tabs for limiting motion |
| 48-J | Spacer attached to jet wall |
| 48-T | Spacer attached to top of well wall |
| 48-W | Spacer attached to well wall |
| 55 | Wells |
| 56 | Well - walls (internal walls) |
| 56-C | Central well wall |
| 56-G | Well - guidance structure |
| 56-O | Outer well wall |
| 56-U | Well - wall upper surface |
| 56-P | Well - wall protrusion |
| 57 | Well cavities, recesses, holes, or hollow regions |
| 58-A | Above well channel |
| 58-V | Well channel - vertical |
| 58-W | Well-to-well channel, breaks or connection |
| 59 | Well wall height |
| 60 | Corner |
| 60-E | Corner - exterior |
| 60-I | Corner - interior |
| 61 | Non-well stress propagation inhibitors |

-continued

Table of Reference Numbers for Structures/Features

| No. | Description |
|---|---|
| 63 | Jet-to-well alignment or position holding structure |
| 64 | Structural material |
| 64-J | Structural material for jet side wall |
| 64-W | Structural material for well wall |
| 65 | Core material |
| 66 | Shell material |
| 67 | Secondary structural material |
| 69 | Heat transfer array to manifold seal |
| 69-L | Heat transfer array to manifold seal level or layer |
| 70 | Heat transfer array to manifold/header contact or bonding surface |
| 71 | Baffle plate or jetting inlet surface |
| 72 | Baffle elements (or baffle fins) |
| 73 | Heat transfer array to heat source sealing or bonding |
| 73-L | Lip or protrusion on heat transfer array inlet and/or outlet (to improve sealing) |
| 74 | Heat exchanger |
| 75 | Cold plate manifold or header (branching flow paths) |
| 76 | Manifold - walls |
| 77 | Cold plate manifold - inlet |
| 77-C | Inlet chamber |
| 79 | Cold plate manifold - outlet |
| 79-C | Outlet chamber |
| 80 | Pump |
| 85 | TMS - thermal interface |
| 90 | Thermal interface/heat spreader |
| 93 | Heat source |
| 94 | Cool area |
| 95 | Hot spots |
| 96 | Heat transfer array position |
| 97 | Semiconductor |
| 98 | Non-semiconductor |
| 99 | Other |

FIGS. 2A-2B provide two schematic variations of thermal management systems 200-A and 200-B (e.g. cooling systems) respectively. The systems include a thermal management device in the form of a cold plate 205 that includes at least one thermal transfer array, and inlet and outlet headers or manifolds. The systems further include a heat exchanger 274, a pump 280 and a thermal interface material 290 for effectively coupling the cold plate of a thermal management system to a heat source 293 (e.g. a semiconductor chip or group of chips). The primary difference between the two systems is that the flow of fluid between the pump, the heat exchanger, and the cold plate are reversed. In FIG. 2A, the system 200-A moves fluid from the pump to the heat exchanger and then to the cold plate while in FIG. 2B, the system 200-B moves fluid from the pump to the cold plate and then to the heat exchanger. In this example system, thermal interface materials include thermal grease, solder, a thermal pad, or no material at all. The fluid pump may take a variety of forms including, for example, a centrifugal pump, a membrane pump, a piston pump, or a rotary pump. In this example, the heat exchanger may take any conventional form such as a finned array with a fan, a radiator, a thermal electric device, a liquid-to-liquid heat exchanger, a liquid-to-air heat exchanger, an evaporative cooler, and the like. The heat transfer array may take a number of different forms including a microjet array, a microchannel array, a hybrid microjet microchannel array, an integrated fin microjet array, a microchannel and integrated fin and microjet array. As used herein, an integrated fin and microjet array refers to the jetting paths and orifices extending through the fins and the fins providing openings near their distal ends to allow jetting to occur while still having intimate contact between the fins and the heat transfer surface or surfaces (i.e. the fins form end parts of the jet channels which contact the heat transfer surface while providing openings for the fluid to pass through). Fluid pipes or flow paths between components may take any of a variety of forms including, for example, copper pipes, flexible plastic pipes, relatively large channels in solid blocks of material, and the like.

FIG. 2C provides a schematic view of an alternative thermal management system 200-C (e.g. a cooling system) that includes a thermal management device (e.g. a cold plate 205 that includes a heat transfer array in combination with separately formed inlet and outlet headers or manifolds). As with the embodiment of FIGS. 2A-2B, the system includes a heat exchanger 274, but in this embodiment, the system includes a pump 280 that is joined to or is part of the thermal management device or cold plate (e.g. a pump directly on top of the device with an impeller that drives liquid into and/or pulls liquid out of the heat transfer array). In this embodiment, as well as in that of FIGS. 2A-2B, the thermal management device is effectively coupled to a heat source 293 via a thermal interface material 290. In some variations, inclusion of a separate thermal interface material may not be necessary (for example, when a surface of the heat source acts a jetting impingement surface or it is bonded to a material or material stack that functions as the jetting surface). Still other embodiments are possible that could include additional components such as sensors, different configurations of elements as well as different numbers of heat exchangers, pumps, and filters as well as different numbers of serial or parallel configurations of HTAs that may have pumps, filters, or heat exchangers functionally located there between.

Figure 3A:
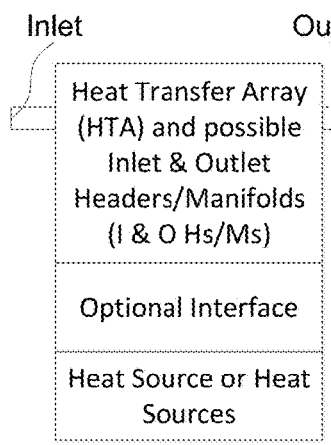
FIG. 3A to FIG. 3T provide a number of example relationships between cold plates (and associated inlets and outlets) and heat sources according to different embodiment variations.
Figure 3B:
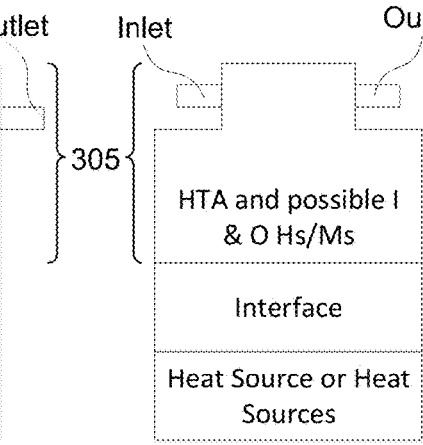
Figure 3C:
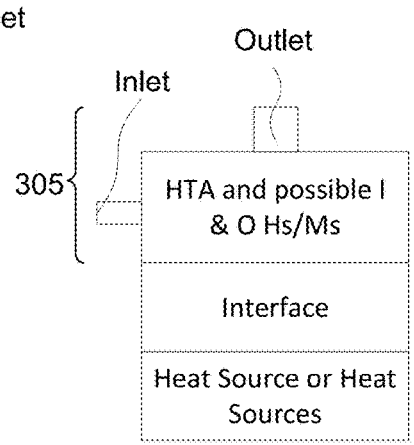
Figure 3D:
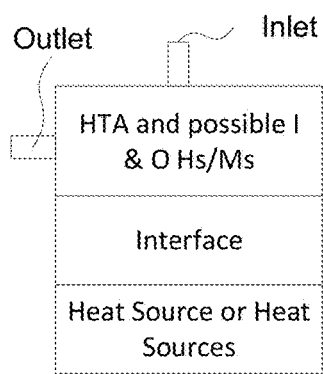
Figure 3E:
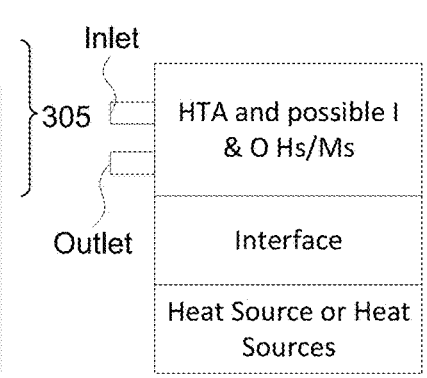
Figure 3F:
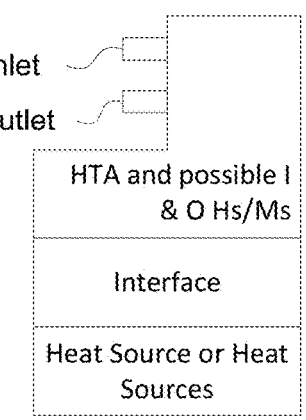
Figure 3G:
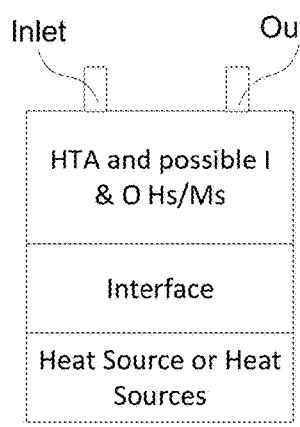
Figure 3H:
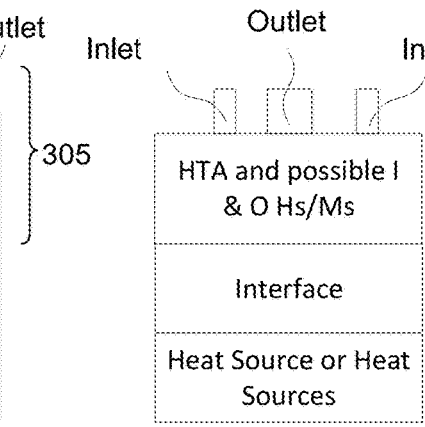
Figure 3I:
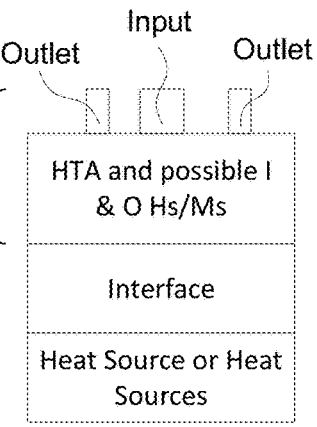
Figure 3J:
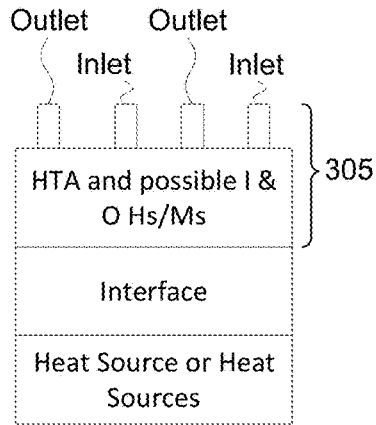
Figure 3K:
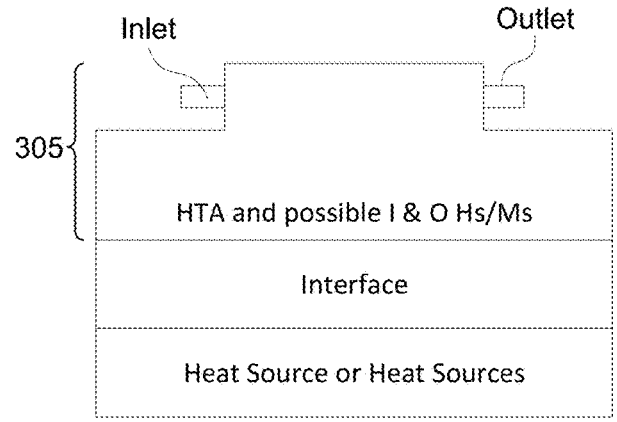
Figure 3L:
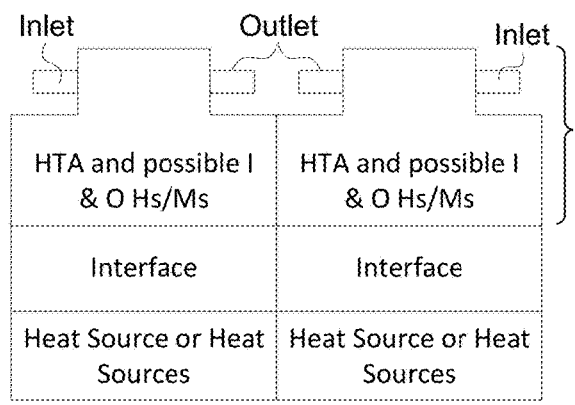
Figure 3M:
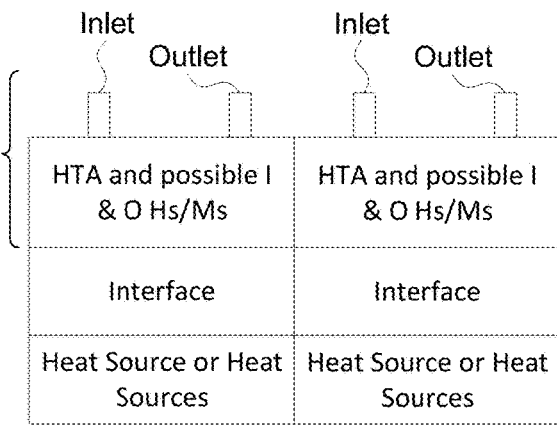
Figure 3N:
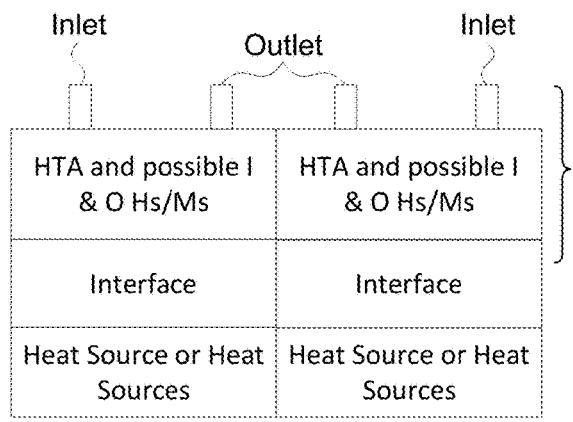
Figure 3O:
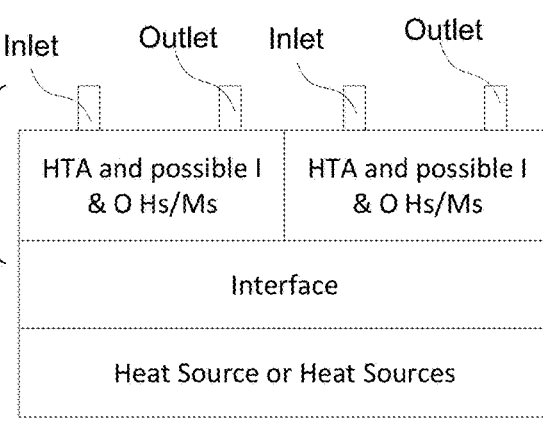
Figure 3P:
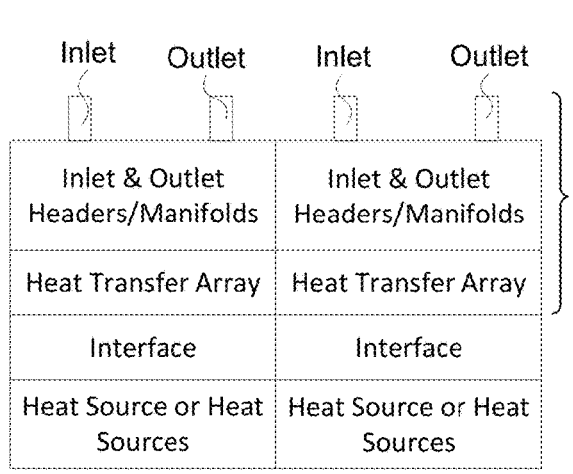
Figure 3Q:
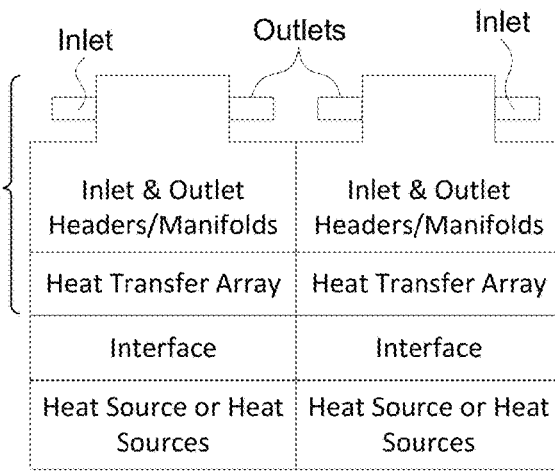
Figure 3R:
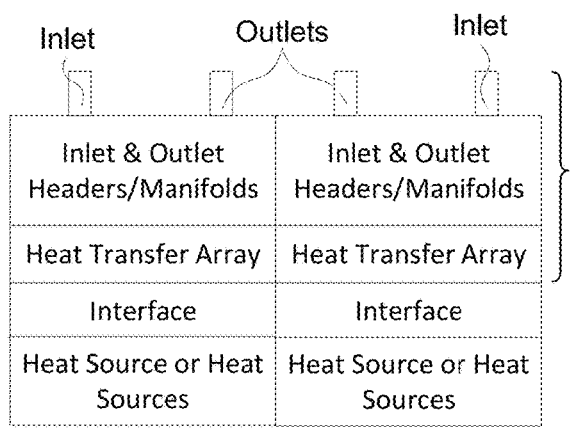
Figure 3S:
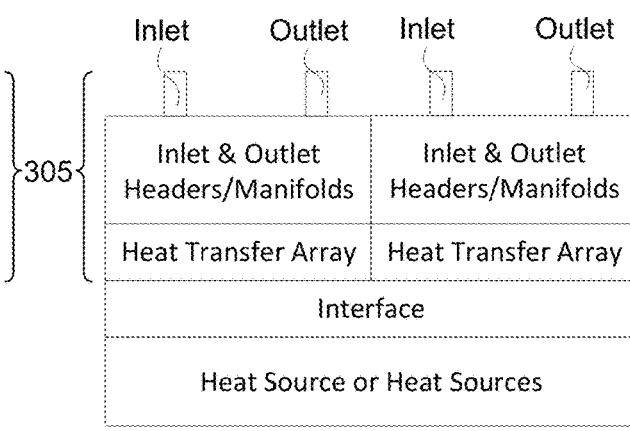
Figure 3T:
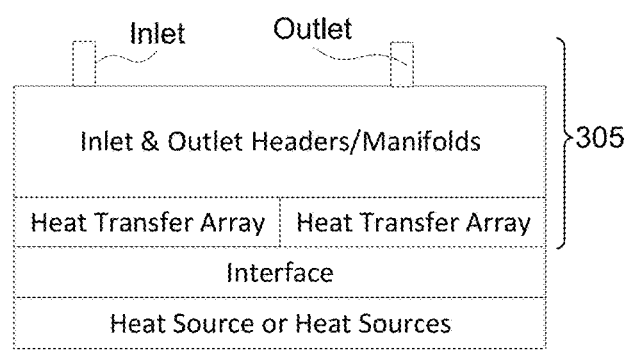

FIG. 3A to FIG. 3T provide a number of example relationships between cold plates 305 (and associated inlets 317 and outlets 319) and heat sources 393 according to different embodiment variations where the inlet and outlet may be located on opposite sides of the HTA or opposite sides of a manifold or header (FIGS. 3A and 3B); one of the inlet or outlet on top and the other on the side (FIGS. 3C and 3D); both inlet and outlet on the same side or on an indented or inset side (FIGS. 3E and 3F); both inlet and outlet on top (FIG. 3G); multiple inlets or outlets along with a single one of the other on top (FIGS. 3H and 3I); multiple inlets and multiple outlets on top (FIG. 3J); the inlet and outlet may be located on opposite sides of an inset or HTA, manifold or header (FIG. 3K); an inlet and an outlet located on the top or on inset sides of each of multiple adjacent cold plates or HTAs that sit on their own interface materials which in turn sit on their own heat source(s) or sit on a shared interface and heat source and wherein the inlets and outlet may have the same or opposite relative positions (FIGS. 3M-3S); or where an inlet or an outlet may sit on a manifold that is shared by multiple HTAs that in turn share a common interface and a common heat source (FIG. 3T). Numerous other embodiments are possible that use different numbers of inlets, outlets, headers, manifolds, HTAs, interfaces, and heat sources as well as locate the inlets and outlet in different locations.

Figure 4A:
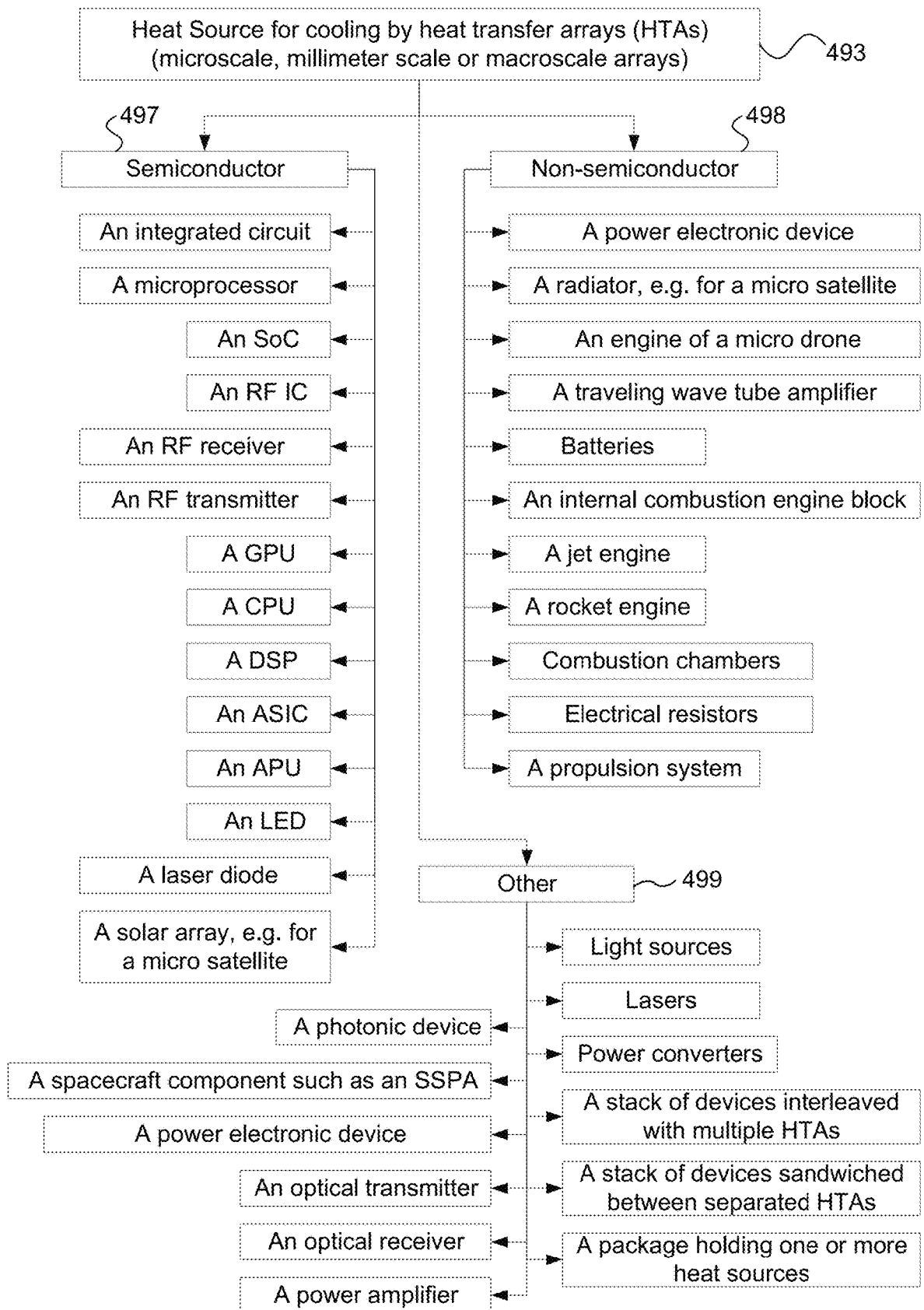
FIG. 4A provides a listing of example heat sources that may be cooled, or otherwise undergo thermal control using heat transfer arrays, cold plates, or thermal management systems of the present invention.

FIG. 4A provides a listing of example heat sources 493, divided into a listing of example semiconductor devices 497 and a listing of example non-semiconductor devices 498, that may be cooled, or otherwise undergo thermal control using heat transfer arrays, cold plates, or thermal management systems of the various embodiments of the present invention. In some embodiments, other heat source or devices may be cooled or otherwise have their temperatures controlled.

Figure 4B:
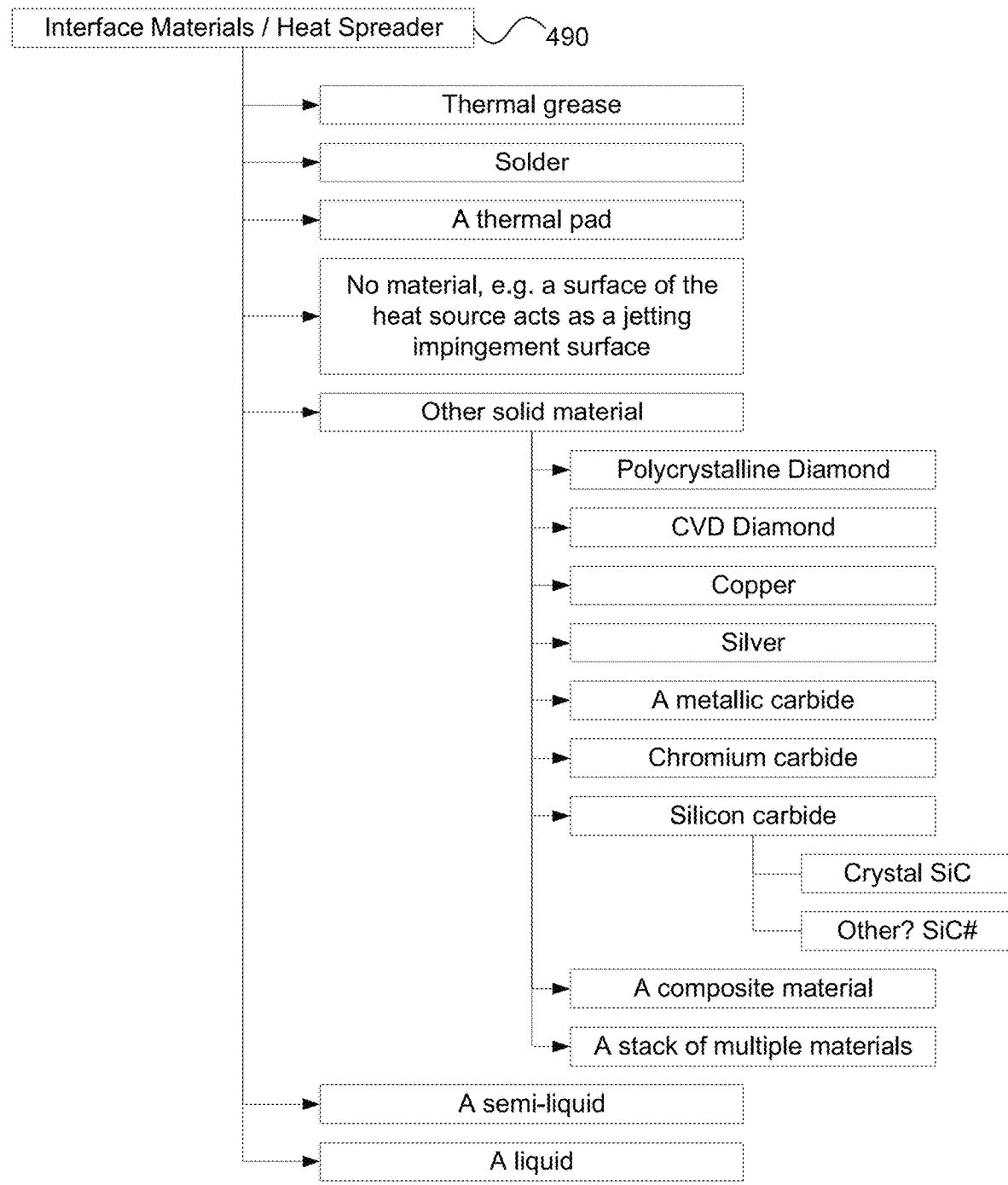
FIG. 4B provides a block diagram listing example interface or heat spreading materials that may be used as part of thermal management systems according to embodiment variations of the invention.

FIG. 4B provides a block diagram listing example interface or heat spreading materials 490 that may be used as part of thermal management systems according to embodiment variations of the invention. In some embodiments, such heat spreading materials may be incorporated into an HTA while in other embodiments, other heat spreading material may be used.

Figure 5:
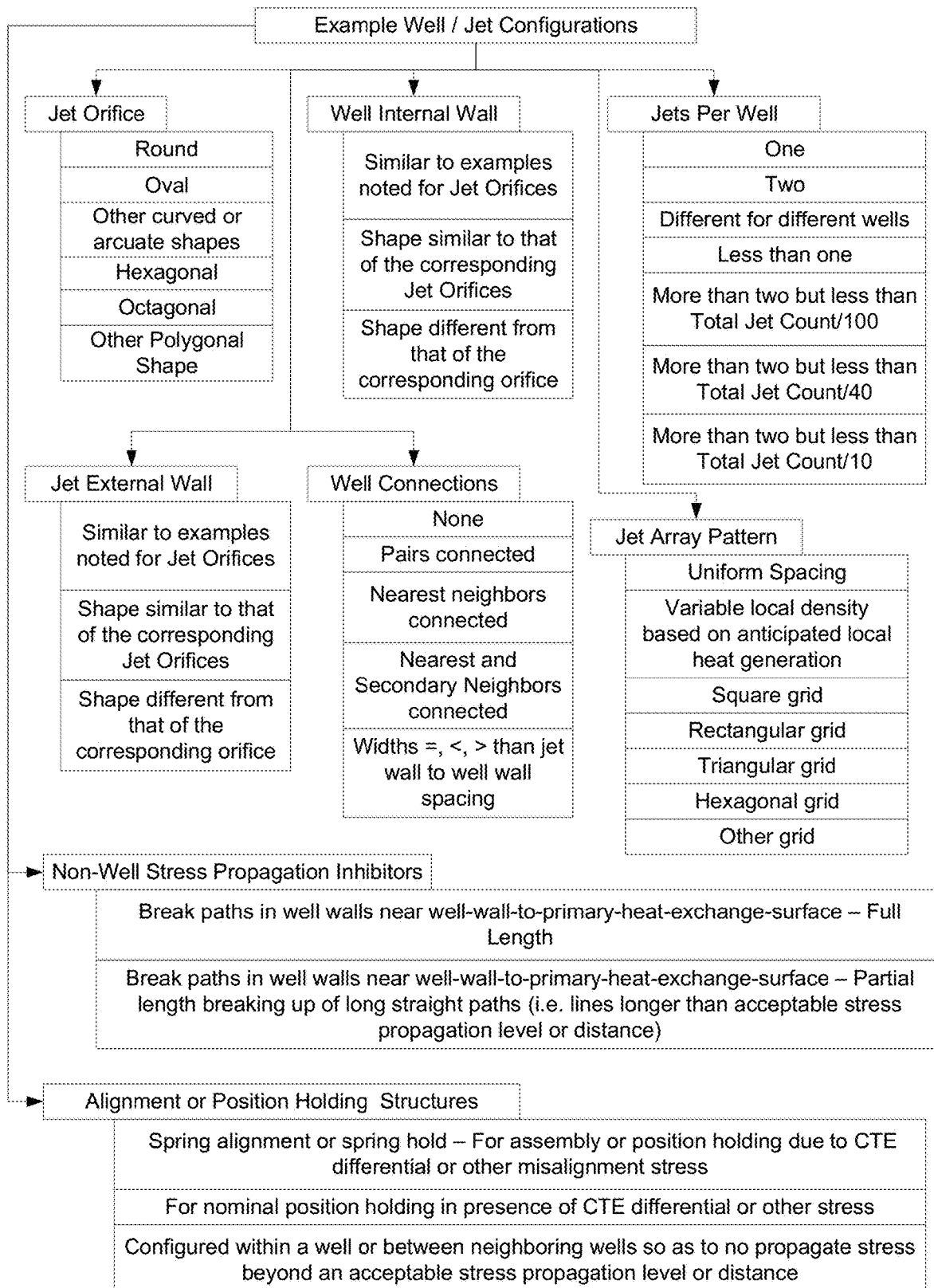
FIG. 5 provides a block diagram setting forth eight example jet and well configuration categories along with a number of example variations for each such category that are associated with features of some heat transfer array embodiments of the present invention.

FIG. 5 provides a block diagram setting forth eight example jet and well configuration categories along with a number of example variations for each such category that are associated with features of some heat transfer arrays of some embodiments of the present invention. In other embodiments, other variations may be used.

FIGS. 6A-6C illustrate side cross-sectional views of portions of three different heat transfer arrays (HTAs) 610-A, 610-B, and 610-C (each shows two jets 625, a cooling fluid impact surface 641 and a portion of a fluid return path 620 that moves fluid past the jets) wherein the first HTA 610-A (FIG. 6A) shows the jets and impact surface and the well walls 656 as each being formed from the same material, the second HTA 610-B (FIG. 6B) shows the jets and well walls are formed of the same material while the impact surface is formed of a different material, and the third HTA 610-C (FIG. 6C) shows the jets and well walls are formed of the same material while the impact surface is part of a separate structure (perhaps part of a device to be cooled or an interface material between the device to be cooled and the jetting and well structures. As with the other examples shown herein, the illustrated features may be used in arrays of different sizes and different configurations and/or on different portions of different arrays.

FIG. 6D1 illustrates a side cross-sectional view of a portion of an HTA 610-D1 (which shows two jets 625, a cooling fluid impact surface 641 or jetting surface and a portion of a fluid return path 620 that moves fluid past the jets) wherein the cold plate 605 includes jets formed from a first material, well walls 656 formed from a second material, and an impact surface formed from a third material wherein the materials may be similar materials or different materials.

FIGS. 6D2-6D5 show top views of four different example configurations 610-D2 to 610-D5 that yield the same cross-sectional configuration illustrated in the structure 610-D1 of FIG. 6D1 showing fluid flow paths that might provide isolation of initial fluid return paths or connections between initial fluid return paths from different jets relative to one another (i.e., post jetting flow paths), wherein the fluid flow paths 620 remain isolated until the tops of the well walls are exceeded (FIG. 6D2), wherein each well of the left pair and of the right pair have a passage that joins them such that the combined return paths provide more surface area for fluid to extract heat from the solid walls of the wells or fin structures (FIG. 6D3), wherein pairs of individual jets 625 occupy combined well structures 655 (FIG. 6D4), or wherein the four individual return paths are joined to one another via crossed pairs of flow paths (FIG. 6D5).

FIG. 6E1 illustrates a side cross-sectional view of a portion of a heat transfer array or cold plate 610-E1 similar to that of FIG. 6D1 with the exception that the side-by-side pair of jets 625 shown have at least one common return path 620-V.

FIG. 6E2 to FIG. 6E7 illustrate six example top views 610-E2 to 610-E7 of the heat transfer array portion of FIG. 6E1 with each example providing a two-by-two array of jets and with each having a different jetting well configuration and/or well connections 655 that form part of post jetting group of fluid return paths with all sharing a common cross-sectional view as shown in FIG. 6E1 wherein FIG. 6E2 shows top and bottom side-by-side pairs having individual jetting wells 655 that are connected by a single relatively narrow fluid flow path that is similar to that of FIG. 6D3 but rotated by 90° about an axis perpendicular to a plane of the top view; FIG. 6E3 shows each of the upper and lower pairs of side-by-side jets 625 sharing a common well 655 similar to that of FIG. 6D4 but rotated by 90° about an axis perpendicular to a plane of the top view; FIG. 6E4 show that each jet 625 of the two-by-two array 640 has its own jetting well 655 but with a relatively narrow fluid flow path (e.g. having a width less than ¼ of the corresponding width of the well and perhaps even less than ⅛ of the well width) connecting the closest edges of the wells to their nearest neighbors such that four connection paths join the four wells together; FIG. 6E5 shows that the four wells 655 have similar connective paths as those shown in FIG. 6E4 but with the paths having moderate widths (e.g. between ¼ and ½ of the width of the individual wells) as opposed to relatively small widths; FIG. 6E6 illustrates a configuration where all four jets 625 share a single well 655 without any intermediate well wall or fin elements; and where FIG. 6E7 shows a configuration where all four jets 625 have their own wells 655 but with relatively narrow flow paths not only connecting nearest neighbors but also second nearest neighbors (i.e. the diagonal neighbors).

FIG. 6FI depicts a well structure similar to that of FIG. 6E1 but exemplifying a heat transfer array 610-F having four side-by-side jets 625 and well structures 656 as opposed to only having two, while FIG. 6F2 illustrates a cut view of the array of FIG. 6F1 at cutline F2-F2 where it can be seen that the exemplified array not only has four side-by-side jets but has a total of three rows of jets, thus forming a 4×3 jet array 640, wherein the jets have individual wells 655 but also have additional flow paths that connect the second nearest neighbors to one another along diagonal paths without providing direct flow paths between the nearest neighbors.

FIG. 6GI depicts a well structure similar to that of FIG. 6F1 but exemplifying a heat transfer array 610-G without well walls or fins separating the wells 655 at least along the vertical section line G2-G2 while FIG. 6G2 illustrates a cut horizontal view showing a cut line G1-G1 showing the line along which FIG. 6G1 was generated where it can be seen that the exemplified array not only has four side-by-side jets but has a total of four rows of jets, thus forming a 4×4 jet array 640, and wherein the jets have individual wells 655 but also have additional flow paths that connect the nearest neighbors and second nearest neighbors to one another such that diagonal flow paths and X and Y flow paths are provided.

FIG. 6H1 illustrates jets 625 and wells 655 having different structural configurations from those shown in the previous examples wherein the wells are formed from neighboring hexagonal structures while jets are formed with spaced hexagonal structures, wherein the array includes five side-by-side jets, and wherein jetting from a single jet does not dispense fluid into a single well but into a plurality of wells (e.g. three wells) wherein portions of jet walls extend vertically into the wells while other portions of the jet walls contact the well walls or reside above the well walls while FIG. 6H2 illustrates a cut horizontal view of the array of FIG. 6H1 at cutline H2-H2 of FIG. 6H1, where it can be seen that the exemplified array not only has five side-by-side jets but has a total of three rows of jets, thus forming a 5×3 jet array 640, and wherein the well count is three times that of the jet count. In alternative embodiments, the array of jets and/or the array of wells may be formed with a combination of fitted hexagonal and triangular structures or structures with other polygonal or smooth surface configurations wherein the jets and the wells may have different configurations. In some variations, the jet walls may not extend into the well but end above the well walls.

While FIGS. 6A to 6H2 provided various examples of how jets and wells may be configured and how well-to-well flow paths may or may not exist, in other embodiments, other configuration patterns are possible and may extend across arrays of different sizes or be selectively applied to different regions of a single array depending on the functional requirements of those different regions which in turn may be based on special attributes of the sources that are to be temperature controlled. For example, in some embodiments, different jets may extend into different wells to different depths or not at all, well heights may be different in different regions, jet diameters or gaps between well walls and jet walls may be different in different regions and well-to-well heights and widths may vary along their lengths or be different in different regions. In some variations, well-to-well connections may take on curved or even angled configurations.

FIG. 7A1 provides a vertical cross-section of part of a jetting array 740-A having a plurality of jets 725, a plurality of wells 755, and a jetting surface 741 wherein these three primary features may be formed from different materials and wherein some well walls include hollow regions 757 that may or may not allow fluid flow but can provide some level of stress relief during changes in temperature or when operational temperatures are significantly different from fabrication temperatures particularly when the well structure(s) or fins are formed from a different material than that of the jetting surface and especially material with different thermal coefficient of thermal expansion.

FIG. 7A2 provides a top view of the array 740-A of FIG. 7A1 where it can be seen that the array provides a 2×2 configuration of jets 725 and wells 755, the wells do not include fluid flow paths that connect them, and the hollow regions 757 shown in FIG. 7A1 do not extend to the top of the wells.

FIGS. 7A3 and FIG. 7A4 provide two cut views of the array 740-A of FIG. 7A2 illustrating two example hollow structure configurations wherein the hollow regions 757 of FIG. 7A3 are provided in the form of a number of discontinuous segments that form a grid pattern bisecting the well walls 756 or fin structures around the well depressions while FIG. 7A4 provides a similar pattern of hollow regions 757 but with the paths being continuous in nature as opposed to being discontinuous.

FIGS. 7B1-7B4 provide cross-sectional views of part of a jetting array 740-B having hollow regions 757 within portions of the fin or well walls 756 as did FIGS. 7A1-7A4 but with those hollow regions having a different configuration relative to those of FIGS. 7A1-7A4, wherein FIG. 7B1 provides a vertical cross-section (in an X-Z plane) showing that in the plane of the cross-section hollow regions exist within the outer well walls 756-O but not in the central well wall 756-C, while FIGS. 7B2 and 7B3 provide cut views of the array 740-B of FIG. 7B1 along cut lines 7B2-7B2 and 7B3-7B3 respectively, and FIG. 7B4 provides a cross-section view along cut line of 7B4-7B4 of FIG. 7B3.

In contrast to FIGS. 6A to 6H2, FIG. 7A1 to 7B4 does not focus on well-to-well flow paths but on gaps that can be formed in the solid structure of well walls to provide stress relief regions to minimize or reduce stress build up that might otherwise occur as temperature varies between operational and non-operational states which may be particularly problematic when different regions of a heat transfer array are formed of different materials or when the heat transfer array is joined or mounted on material having significantly different thermal properties (e.g. CTEs). In some variations, the stress relief gaps may hold a static material, or a flowable material, that may aid in heat transfer wherein the material would preferably limit or eliminate the propagation of stress through it. As noted with regard to well-to-well flow passages of FIGS. 6A to 6H2, other alternative configurations are possible and may be implemented in different embodiments. In some such alternatives, arrays may include both stress relief gaps and flow passages or the flow passages may be configured to enhance stress relief.

FIGS. 8A1 and 8A2, respectively, provide a vertical cross-section view in an X-Z plane and a cut view in an X-Y plane looking upward along the Z axis wherein jet walls 835, jet flow paths 820, jetting surface(s) 841, and solid elements 845-J that vertically join the bottom of the jet walls to the jetting surface exist, wherein the solid elements convert the jetting functionality to a combined jetting and fin functionality (i.e., the combined jet and solid elements, or finjets, take on a dual jetting and a solid heat conduction or fin functionality). Different features of the array are shown with different hatching patterns to illustrate that they may be formed from different materials. The solid conductive elements or connective elements 845-J that join the jet walls 835 and the jetting surface 841 are shown having a width that is narrower than that of the jet walls themselves. In other embodiments, the connective elements and the fins may be formed of the same material and/or they have the same widths or the connective elements may be wider than the jet walls, while in other embodiments, other configurations may exist.

FIGS. 8B1 and 8B2, provide examples of the heat transfer array configuration 810 of FIGS. 8A1 and 8A2 in two different states of formation according to another embodiment of the invention wherein FIG. 8B1 shows the jetting surface 841 and the well walls 856 formed separately from the jets 825 and the connective elements 845-J while FIG. 8B2 shows the state of the process after the two portions are vertically shifted to form the complete array of FIGS. 8A1 and 8A2. In some variations, the connective elements may be bonded to the jetting surface while in other embodiments, they may only be contacted. In still other embodiments, other formation methods may be used including, for example: (1) other assembly methods, (2) formation in a final configuration, without assembly using an electrochemical fabrication method or other method, and (3) formation of jets, connective elements, and well walls together followed by subsequent bonding or contacting to a jetting surface.

FIGS. 8C1 and 8C2 are similar to FIGS. 8A1 and 8A2 with the exception that the connective elements 845-J that join the jets 825 and the jetting surface 841 are wider than the jet walls 835 themselves and provide contact to the well walls 856 in addition to the jetting surface 841. In FIG. 8C2, it can be seen that the connective elements 845-J do not provide a ring-like structure as do the jet walls 835 but instead define discrete contact regions around which jetted fluid can flow or leave the jet. In other embodiments, other configurations are possible including the jets, the well walls, and the connective elements all being formed from the same material.

FIGS. 8D1 and 8D2 are also similar to those of FIGS. 8A1 and 8A2 with two exceptions: (1) the narrower connective elements 845-J are individually centered relative to the jet walls 835 that they contact and (2) instead of just two elements bridging the jetting gap between each jet and the jetting surface (i.e. bridging the vertical or Z direction distance between the lower portion of the jet and the jetting surface), four connective elements are used. In other embodiments, different numbers of connective elements may be used and/or the bridging elements may have different configurations or be located in different positions.

FIGS. 8E1 and 8E2 respectively illustrate a jet-well-bridge configuration that may be assembled. FIG. 8E1 provides both a vertical cross-sectional view (upper portion of the figure) and a downward looking cut view (lower portion of the figure) while FIG. 8E2 provides a vertical cross-sectional fully assembled view wherein the connective elements 845-W are provided with a pattern that allows placement of the jets 825 using an assembly process that provides reasonable positioning but not necessarily highly precise positioning that will always result in appropriate vertical support for the jets along with adequate jetting, connecting, and post jetting flow paths even without perfect lateral alignment of the jets 825 and the wells 855. In other embodiments, other configurations may be used that provide for both improved assembly and desired jet to connective elements placement.

FIGS. 8F1 and 8F2 provide views of another jetting array configuration 840-F but with a different type of bridging structure or connective elements 839 that join the jets 825 to the well walls 856 as opposed to joining or contacting the jets to the jetting surface 841 (as was shown in FIGS. 8A1 to 8E2) wherein FIG. 8F1 provides a vertical cross-sectional view and FIG. 8F2 provides an upward looking horizontal, or lateral, cut view along the cut line in FIG. 8F1 wherein the connective elements 839 provide for a desired lateral alignment of the jets 825 and the well walls 856, may also provide for retained vertical alignment along (e.g. when the connective elements are bonded to, or formed monolithically) with the jets and the well walls, and may also provide improved stress tolerances during temperature variations (e.g. during use vs. non-use) particularly when the jetting surface and the well walls or jets are made of different materials with different coefficients of thermal expansion (CTEs), and wherein a single bridging element 839 is provided for each jet. In other embodiments, other bridging structure configurations are possible.

FIGS. 8G1 and 8G2 provide views of another jetting array configuration 840-G with bridging structures or connective elements 839 similar to those of FIGS. 8F1 and 8F2 that join the jets 825 to the well walls 856 but where one jet of the pair has two such bridging structures 839 oriented along one lateral axis while the other has two bridging or connective elements 839 oriented along a perpendicular lateral axis as can be seen in FIG. 8G2. In other embodiments, other configurations are possible and include bridging elements oriented along different axes, bridging elements located at different vertical heights, and even bridging elements connecting only some jet walls to well walls and not others (especially when the jets themselves are connected to one another at their upper ends (not shown in the present example as may be the case when jets are part of a branched or splitting network).

FIGS. 8H1 and 8H2 provide views of a jetting structure 840-H in a preassembly state and a post assembly state, respectively. In FIG. 8H1 a jetting surface 841 and well walls 856 are shown laterally aligned but vertically (or longitudinally) separated from the jets 825 and bridging elements 839 (FIG. 8H1) and jetting surface 841, well walls 856, jets 825 and bridging elements 839. FIG. 8H2 shows the components after assembly from both a cross-section vertical perspective (lower portion of FIG. 8H2) and a top view (upper portion of FIG. 8H2). Prior to assembly, the well walls 856 and the jetting surface 841 are mated or formed together as are the jets 825 and the bridge elements 839 wherein the bridge or connective elements 839 are configured to engage the tops of the well walls 856. In this type of configuration, as that of FIGS. 8G1 and 8G2, enhanced stress reduction across larger array configurations may be provided. In other variations, the well walls and the connective elements provide not only constraints on positioning along perpendicular axes, but they may also provide configurations, such as notches in the well walls or additional tabs below the connective elements to provide rigid or more compliant constraints on relative lateral movement. In some variations, vertical movement constraints and/or horizontal movement constraints may not be provided on every jet or well wall but only on selected jets and well walls to meet both positioning and compliance requirements.

FIGS. 8I1-8I3 provide three views of another embodiment of a small heat transfer array 810-I where jets 825 and wells 855 are provided with elements 848-T for constraining excess movement while still allowing some movement wherein FIGS. 8I1 and 8I2 provide vertical cross-sectional views of the array structure before (FIG. 8I1) and after (FIG. 8I2) loading of the jetting elements into vertical positions relative to a jetting surface 841, well walls 856, and laterally extending spacers or tabs 848-T that inhibit lateral movement of the jets relative to the well walls beyond an amount predefined by the gaps between the jet walls and the end of the tabs while FIG. 8I3 provides an up-facing cut view of the structure along the cut line of FIG. 8I2.

FIGS. 8J1 and 8J2 provide two up-facing lateral views from the same perspective as noted in FIG. 8I3 but where the motion limiting/constraining tabs 848 have different configurations as compared to those of FIGS. 8I1-8I3.

FIGS. 8K1 and 8K2 provide both a vertical cross-sectional view (FIG. 8K1) and an up-facing cut view along the cut line of FIG. 8K1 (FIG. 8K2) of an alternative embodiment where the movement limiting tabs of FIGS. 8I1-8J2 have been replaced by movement limiting spacers 848 which may be attached to the bottom of the jet structure 825 but not the well walls 856 as spacers 848-J wherein contact with the well walls would occur only upon excess lateral shifting of the jets relative to the well walls, wherein a single jet does not possess spacers that inhibit lateral movement in all directions but only in some directions, wherein a combination of connected jets with complementary spacers can provide excess motion inhibition in all directions for the group of jets as do the spacers for the pair of jets shown. In alterative embodiments, a single jet may provide spacers that provide inhibition of excessive lateral movement in all directions while in other alternatives, more than two jets may be grouped with complementary spacers to provide a desired level of movement inhibition. In embodiments where jets may expand more than wells, spacers limiting expansive motion (e.g. spacers not located between the jets) may be more relevant than spacers limiting contraction while in opposite situations (either due to excessive well expansion or excessive jet spacing contraction), spacers may be more important on regions between the jets. In still other alternatives, spacers 848-W may be located on the well walls instead of, or in addition to, spacers 848-J being on the jet walls.

FIGS. 8L1 and 8L2 provide both a vertical cross-sectional view (FIG. 8L1) and an up-facing cut view along the cut line of FIG. 8L1 (FIG. 8L2) of an alternative embodiment where the movement limiting spacers 848-W of FIGS. 8K1-8K2 have been shifted slightly upward away of the bottom of the jets 825 and attached to the well walls 856 instead of the jet walls 835 wherein the spacers may limit lateral jet and well movement to an acceptable amount.

FIGS. 8M1 and 8M2 are similar to that of FIGS. 8L1 and 8L2 but where the movement limiting spacers 848-W extend the entire height of the well walls 856 and have modified lateral positions but still inhibit relative lateral motion to an acceptable level. In some alternative embodiments, the spacers may be limited to more than half the height of the well walls but less than their whole height while in other embodiments, they may be limited to fractions of the height of the well walls, e.g. less than $\frac{1}{10}$, less than $\frac{1}{5}$, less than $\frac{1}{3}$ or less than $\frac{1}{2}$. In still other embodiments, spacers may be located at different vertical heights and even in a stacked manner with intermediate flow paths which force the vertical flow from jetting surface to the upper surface of the well to take on a lateral flow component (e.g. in a radial direction or in a circumferential direction) to cause breakup of the laminar flow in favor of turbulent flow to cause additional heat transfer from the well or fin walls to the flowing fluid.

FIGS. 8N1 and 8N3 provide three views of another embodiment of a small array configuration where jets 825 and wells 855 are provided with elements 847-W for biasing movement of jets laterally toward the center of wells during vertical loading of the jets into the well walls wherein FIG. 8N1 provides an illustration of a side cross-sectional view of the jets prior to vertical loading into well walls and where the well walls include compliant or elastic tab elements 847-W that can contact the jet walls 835 during loading to provide centering alignment by an excess biasing force being exerted by bending of the alignment tabs 847-W on either side when the jets are located closer to one side than the other side and wherein FIG. 8N2 provides a side cross-sectional view after loading and automatic lateral centering along with cutting/viewing direction line of FIG. 8N3. FIG. 8N3 provides an up facing view of the lateral (XY) features of the array along the cut line of FIG. 8N2 as well as providing a cut line showing the relationship between the structure of FIG. 8N3 and the cross-sectional view of FIG. 8N1. The elastic/compliant nature and the length of the tabs 847-W of FIGS. 8N1-8N3 provide guided loading along with guided alignment and potentially position maintenance as well as a heat flow connection between the well walls and the jet walls along with providing flow path splitting elements that may lead to enhanced turbulent flow and heat transfer. In other embodiments, fewer tabs may be provided while in still other embodiments, additional tabs may be provided that may or may not force or encourage additional lateral (e.g. circumferential) flow along the primary vertical flow path. In some embodiments, the tabs may induce a clockwise or counterclockwise flow in the fluid as it proceeds from the bottom of the well walls to the top of the well walls.

FIGS. 8O1-8O3 provide similar images to those provided in FIGS. 8N1-8N3 with the exception that the alignment tabs 847 are attached to the jets 825 as alignment tabs 847-J as opposed to being attached to the well walls 856. In other embodiments, other alignment tab configurations may be used to obtain similar functionality as well as additional functionalities such as vertical positioning of the jets relative to the well walls or jetting surface. For example, in some such alternatives, tabs may be provided on both the jets and the well walls while in other alternatives, some tabs may provide for contact and deflection upon loading while other tabs may not. Some tabs may simply function as lateral movement stops and or turbulent flow enhancers.

While FIGS. 8A1-8O3 have illustrated various examples of tabs, spacers, alignment structures and flow diverters, still other alternatives exist and may be implemented in other embodiments for one or more different purposes. These features may be implemented individually or in combination on larger arrays, in selected areas of larger arrays, or for selected groups of jets or wells on larger arrays. In some embodiments, one or more of these features may be implemented in conjunction with other feature enhancement discussed herein. The features of any of FIGS. 8A1-8O3 may be primarily provided, for example, for stress relief purposes while in other embodiments, the features may be implemented to maintain a desired level of flow uniformity or flow disparity between various jets, while in other embodiments, a combination of these purposes may be the motive for implementation.

FIG. 9A1 provides a cross-sectional side view of a jetting/support structure 937-A and surrounding support flange 937-F where the support structure 937 includes a larger width plate or disk-like structure and a smaller width plate or disk-like structure separated by a pair of longitudinally extended elements 937-V (e.g., in this embodiment, they are rings) that are radially separated by a radially extending spacer 937-H to provide improved compliance in the positioning of the jet 925 relative to one or more mounting structures (not shown) that support the jet in the region of the outer flange 937-F with the jet able to have additional or enhanced compliant behavior due to the rings 937-V and spacer 937-H while FIG. 9A2 provides a top view of the structure 937 of FIG. 9A1. In other embodiments, the plate or disk-like structures, the flange, the support structure, the rings and spacer, and/or the jet configuration may take other forms such as, for example, circular or other smooth curved configurations, or other polygonal configurations. The rings and spacer may have different longitudinal heights, different radial spacing, and even sloped or stair-stepped configurations.

FIG. 9B provides a cross-sectional side view of an alternative jetting/support structure 937-B that includes a plate or disk-like structure that joins to a jet channel via alternative compliance enhancing features, wherein the enhancing features are formed as a pair of laterally extending disks, or flat ring-like features 937-H, that are spaced one from the other longitudinally by a spacer 937-V where the compliant features form part of the jet walls 935. As with the embodiment of FIG. 9A1, other embodiment configurations are possible.

FIG. 9C provides a cross-sectional side view of an alternative jetting/support structure 937-C with compliance enhancing features that include both the features of FIGS. 9A1 and 9B.

FIG. 9D provides another cross-sectional side cut view of an alternative jetting support/structure 937-D with compliance enhancing features that are similar to those of FIG. 9A but with the addition of a second pair of longitudinally extended elements 937-V and a second spacer 937-H.

FIG. 9E provides another cross-sectional side view of an alternative jetting support/structure 937-E with compliance enhancing features that are similar to those of FIG. 9B but with the addition of a second pair of laterally extended features 937-H and a second spacer 937-V.

FIGS. 9F-9H provide additional cross-sectional side views of alternative jetting/support structures 937-F to 937-H similar to that of FIG. 9D but with stepped, branching, or splitting flow levels wherein the shown upper input level does not feed a single jet 925 but directs fluid flow into a plurality of jets 925 or an array (or subarray) of jets 940 (e.g. four jets in FIG. 9F, three jets in FIGS. 9G and 9H) and where the added compliance elements or features are added to one location (FIG. 9F) or multiple locations (FIG. 9G) between the input level and the jets themselves.

FIGS. 9I-9K, respectively provide cross-sectional side views of partial multi-jet arrays 940 with enhanced compliance structures joining each jet 925 to their respective support structures where the three example jetting/support structures 937-I to 937-K are, respectively, similar to those of FIG. 9A1. FIG. 9B, and FIG. 9C.

FIG. 9L provides a cross-sectional side view of a partial jet array 940 using two different enhanced compliance supporting structures, wherein three example jetting/support structures 937-L of the array are shown with the left and right most jet/support structures being similar to that of FIG. 9A1 while the middle jet/support structure is similar to that of FIG. 9B.

FIG. 9M provides another alternative example multi-jet configuration depicting a cross-sectional side view of a partial jet array 940 using a single type of enhanced compliance structure but only for a portion of the jet support structures wherein three jetting/support structures 937-M of the array are shown with the left and right most jet/support structures being similar to that of FIG. 9C while the middle jet/support structure does not include additional features to modify compliance.

FIGS. 9N1-9N3 provide cross-sectional side views of jetting/support structures 937-N similar to those of FIG. 9C along with a jetting surface 941 and side walls or array walls (FIG. 9N1), a jetting surface, side walls, and well walls 956 with fluid flow 920 and/or stress relief passages 957 (FIG. 9N2), a jetting surface, side walls, well walls with a different configuration of fluid flow and/or stress relief passages, with solid connections 939 between the jet side walls and well walls that provide for one or both of finjet functionality and positioning retention of the lower portions of the jets relative to well walls (FIG. 9N3). The fluid flow paths and flow directions in these examples are shown using solid pointed arrows.

FIG. 9O1 provides a schematic side view representation of cross-sections of four segments that can be conceptually combined to form a multi-jet array 940 wherein a left segment is provided with a left side wall, two intermediate segments without side walls, and a right segment with a right side wall, wherein each segment includes a jetting base 941 and a single jet 925 similar to that of FIGS. 9C and 9N1, and wherein the array does not include any well or fin structures around which jetted fluid flows.

FIG. 9O2 provides a schematic representation of the segments of FIG. 9O1 laterally shifted to depict the array 940 resulting from the example combination.

FIGS. 9Q1-9Q6 provide schematic side view representations of cross-sections of the jet array 940 of FIG. 9O2 with addition of various well wall 956 (or fin wall) configurations including various fluid flow 920 and/or stress relief passages 957, wherein FIG. 9Q1 shows the well walls without lateral passages for either stress relief or fluid flow, FIG. 9Q2 shows the array with a single passage located between segments (i.e., four array segments and thus three intermediate passages), FIG. 9Q3 shows a passage between the two intermediate array segments and the left and right side walls of the array (i.e. in some well walls but not in all well walls), FIG. 9Q4 shows that each array segment includes a passage near but not at its own left and right ends, thus resulting in two passages in some of the well walls or fin elements, FIG. 9Q5 shows well and passage configurations similar to that of FIG. 9Q4 but with the exception that the lower ends of the jet walls are joined to well walls via bridging elements; while FIG. 9Q6 depicts wells with passages but with passages in the well walls capped such that the passages may remain fluid free, hold a different fluid or other material, or allow fluid to flow via entrance and exit regions (not shown), thus resulting in two passages in some of the well walls or fin elements, FIG. 9Q5 shows well and passage configurations similar to that of FIG. 9Q4 but with the exception that the lower ends of the jet walls are joined to well walls via bridging elements; while FIG. 9Q6 depicts wells with passages but with passages in the well walls capped such that the passages may remain fluid free, hold a different fluid or other material, or allow fluid to flow via entrance and exit regions (not shown).

FIG. 9R provides a cross-sectional side view of a jetting/support structure 937-R along with a jetting surface 941 and side walls as did FIG. 9N1 but where the compliance enhancing structure is similar to that of FIG. 9A1 but with fluid flowing through the upper jet inlet 917 with enhanced compliance being directed to three laterally displaced jets as opposed to being fed through a single jet where fluid flow paths are shown with solid lines with arrowheads if they include the plane of the page while they are shown with dashed lines if they are outside the plane of the page.

FIG. 9S provides a schematic representation of three different jetting or array segments with each segment having a three-jet structure 937-R like that of FIG. 9R and where the left structure has a left side wall to form a left end of a complete jetting array, the right structure has a right side wall to form a right end of a complete jetting array while the middle structure or segment has no such side wall and can be replicated as many times as necessary to form a middle region of an array of desired size.

FIGS. 9T1 and 9T2 provide segments similar to those of FIG. 9S in combination with the addition of various well wall (or fin wall) configurations including various fluid flow and/or stress relief passages, wherein FIG. 9T1 shows each jet 925 dispensing fluid into its own well 955 along with the existence of additional fin or well wall material 964-W existing between the various jetting structures and along with the side walls of the array while FIG. 9T2 shows similar fin or well wall structures but with passages located through the sidewall and intermediate well walls 956 to provide additional fluid flow passages and/or stress relief passages. As with other figures herein, fluid flow paths are shown with solid lines with arrowheads if they include the plane of the page while they are shown with dashed lines if they are outside the plane of the page.

FIGS. 10A1-10A3 provide three different cross-sectional side views during different states of the assembly of a small array. In FIG. 10A1, jetting structures 1025 with associated jetting guidance structures 1035-G are provided along with separate jetting base 1041 with associated well walls and guidance structure 1056-G wherein the state of the process is shown prior to deforming the jetting guidance structures 1035-G and prior to bringing the jetting structures 1025 and the base or well structure 1055 vertically together. FIG. 10A2 shows the state of the process after bending the jetting guidance structures 1035-G laterally inward to form sloped jetting guidance structures that can be aligned and inserted into an opening defined by the base or well guidance structures 1056-G so as to provide fine lateral alignment of the jetting and base or well structures when vertical shifting occurs. FIG. 10A3 shows the state of the process after vertically shifting the positions of the jetting structures 1025 with respect to the base or well structures 1055 and with such shifting being accompanied by one or more of: (1) enhanced lateral positioning of the jets and the well structures due at least in part to the sloped configuration of the jetting guidance structures, (2) the vertical positioning of the jetting structures and jetting guidance structures being at least partially dictated by the increased lateral width of the jetting guidance structures relative to the lateral width of the base or well guidance structures as vertical insertion occurs, and/or (3) ease of at least initial vertical insertion resulting from the sloped configuration of the jetting guidance structures.

FIGS. 10B1-10B3 provide three different cross-sectional side views showing various states of assembly of jetting structures 1025 and associated jetting guidance structures 1035-G with a jetting base 1041 and associated base or well guidance structures 1056-G similar to that of FIGS. 10A1 to 10A3 with the exception that the edges of the jetting guidance structures 1035-G slide past deflectable, lateral, inward facing, potentially elastic extensions or tabs 1047-G attached to the base or well guidance structures 1056-G to potentially aid in lateral or vertical alignment.

FIGS. 10A1-10B3 provided two examples of how assembly processes may be facilitated by use of sloped features and/or deflectable elements or elastic elements. Such enhancements may be implemented in different manners as will be apparent to those of skill in the art upon review of the teachings herein and may be applied to the formation of arrays of different sizes, different jet and well configurations. In some embodiments, the separate guidance structures may be merged with well walls and/or jets. In some embodiments, the guidance structures may also function as sealing elements and/or heat transfer elements.

FIG. 11A provides a side cross-sectional view of the left end of a jetting portion of a heat transfer array 1110 showing two jets 1125 with potentially additional jets located in front of and behind the cross-section of the page, a jetting surface 1141, exit channels 1158-V running between the sides of the jets and fin or well walls 1156 to a lateral running exit channel 1158-A located above the well walls and running past an upper portion of the jet walls 1135. As with other figures herein, fluid flow paths are shown with solid lines with arrowheads if they include the plane of the page while they are shown with dashed lines if they are outside the plane of the page.

FIG. 11B provides a side cross-sectional view of an intermediate portion of a heat transfer array 1110 showing two jets 1125 with potentially additional jets located in front of and behind the cross-section of the page, a jetting surface 1141, exit channels 1158-V running between the sides of the jets and fin or well walls 1156 to a lateral running exit channel 1158-A located above the well walls and running past an upper portion of the jet walls 1135 where one or more exit ports may exist.

FIG. 11C1 provides a side cross-sectional view of a small heat transfer array 1110 having two jets 1125 shown laterally displaced with potentially additional jets located in front of and behind the cross-section of the page, a jetting surface 1141, exit channels 1158-V running between the sides of the jets and fin or well walls 1156 to a lateral running exit channel 1158-A located above the well walls and running past an upper portion of the jets above which a single centrally located fluid entry port 1117 and a single, right side fluid exit port 1119 is shown.

FIGS. 11C2 and 11C3 show two lateral cross-sectional views taken from cuts C2 and C3 respectively of FIG. 11C1 wherein FIG. 11C2 shows not only vertical flow paths 1120-V around each jet 1125 (by the dotted elements which were out of the plane of the page in FIG. 11C1 but are within the plane of the page in this figure) but also a lateral flow path 1120-W to right while at the cross-sectional position of C3-C3 as shown in FIG. 11C3, the primary flow paths are vertical as the fluid is moving primarily upward in the channels 1158-V surrounding individual jets 1125 (i.e. channels bounded by the well or fin walls and the jet walls).

FIG. 11D provides a vertical cross-sectional view of a larger heat transfer array 1110-D or cold plate having a total of eight laterally displaced jets, along with three progressively splitting vertical inlet levels 1117-S, splitting respectively from 1 to M passages, 1 to N passages, and then 1 to P passages (with M=N=P=2 in this example) along with two outlet passages 1119 near the right and left edges of the array.

FIG. 11E1 shows a vertical cross-sectional view of a heat transfer array 1110-E or cold plate that looks similar to that of FIG. 11D with the exception of moving the outlets 1119 slightly inward from the left and right edges and providing the array with a flat top while FIG. 11E2 provides a lateral cross-sectional view of the array along cut line E2 of FIG. 11E1 showing that the array, or this example, is actually formed as a 3×8 array 1140 with the vertical cross-sectional view of FIG. 11E1 taken along cut line E1 of FIG. 11E2 wherein the splitting provided by the three vertical inlet levels is 1×24 where the levels (M, N, P) may for example be (2, 2, 6) or (2,6,2) or (6, 2, 2).

FIG. 11F1 provides a vertical cross-sectional view of a cold plate 1105-F including a heat transfer array 1110-F below the seal level 1169-L similar to that of FIG. 11E1 along with a manifold structure 1115 located on top of a transfer array that includes the three vertical inlet splitting or staging levels 1117-S where the heat transfer array and manifold structure are separated by a seal 1169 at level 1169-L while FIGS. 11F2 and 11F3 provide lateral cross-sectional cuts at level F2 and F3 of FIG. 11F1. In some variations of the embodiments of FIGS. 11A to 11F3, the manifold and array structures may be formed by different fabrication methods relative to that used to form the HTA (e.g. the manifold may be formed by subtractive machining while the array may be formed by additive fabrication, e.g., using a multi-material, multi-layer, electrochemical fabrication method). In some variations, a distinction between manifold and array portions may occur between vertical splitting levels (one or more forming part of the manifold and one or more forming part of the array) or below all of the splitting levels. In some variations, different numbers of jets may form part of the array, different numbers of splitting levels may exist, different splits per level may exist, a different number of input ports and/or output ports may exist on the array or on the manifold, and/or input ports and output ports may exist in different relative locations or at different vertical locations, and lateral outlet passages may be made at different level in the HTA including limiting them to levels above the top of the final jetting stage.

Figure 11G:
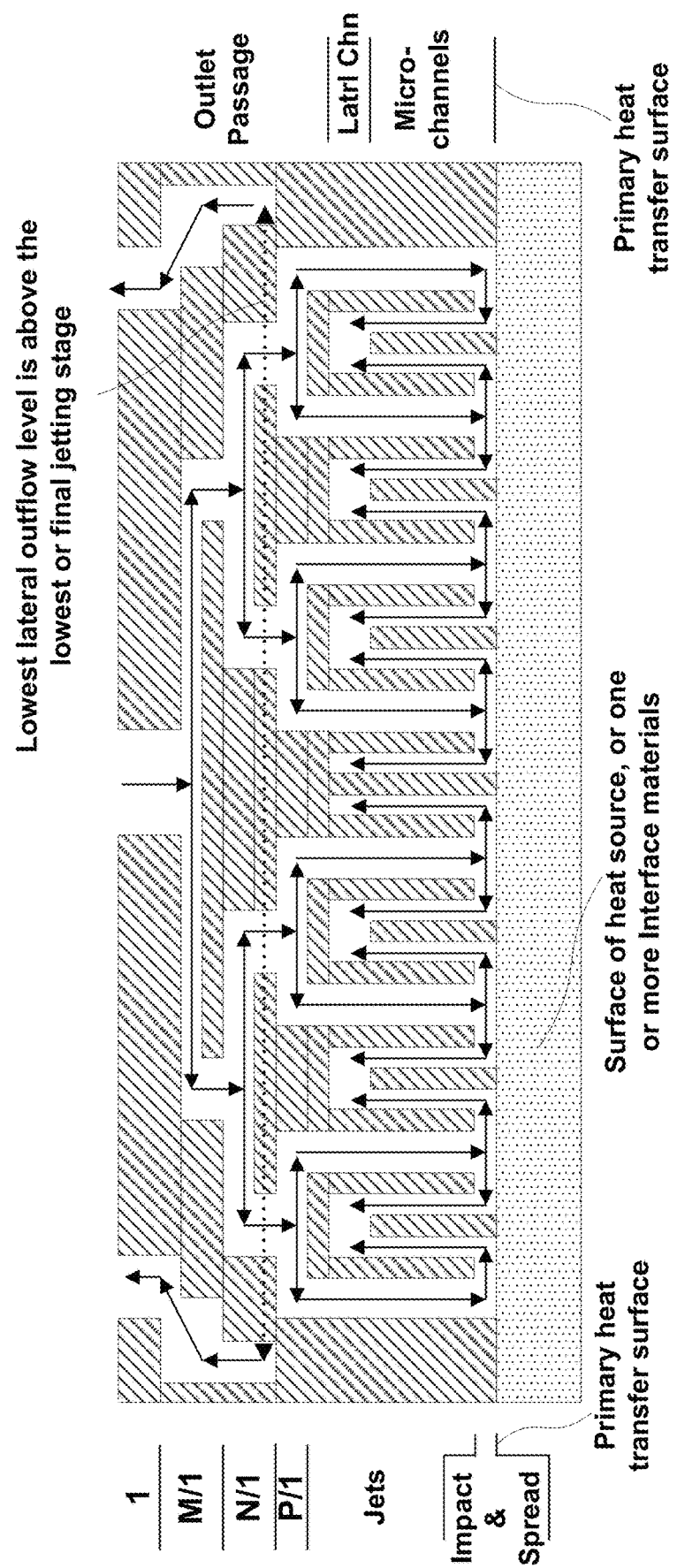
FIG. 11G is similar to FIG. 11E1 with the exception that the lowest lateral outflow level (other than possible flow paths that may exist within the well walls themselves) does not coexist with the jet channels (or the jet walls or at least the last stage of the jets) but is located above the final stage of the jets.

FIG. 11G is similar to FIG. 11E1 with the exception that the lowest lateral outflow level (other than possible flow paths that may exist within the well walls themselves) does not coexist with the jet channels (or the jet walls or at least the last stage of the jets) but is located above the final stage of the jets.

While FIGS. 11A-11G provided a number of embodiment variations related to HTAs and cold plates, numerous other variations will be apparent to those of skill in the art upon review of the teachings here.

Figure 12A:
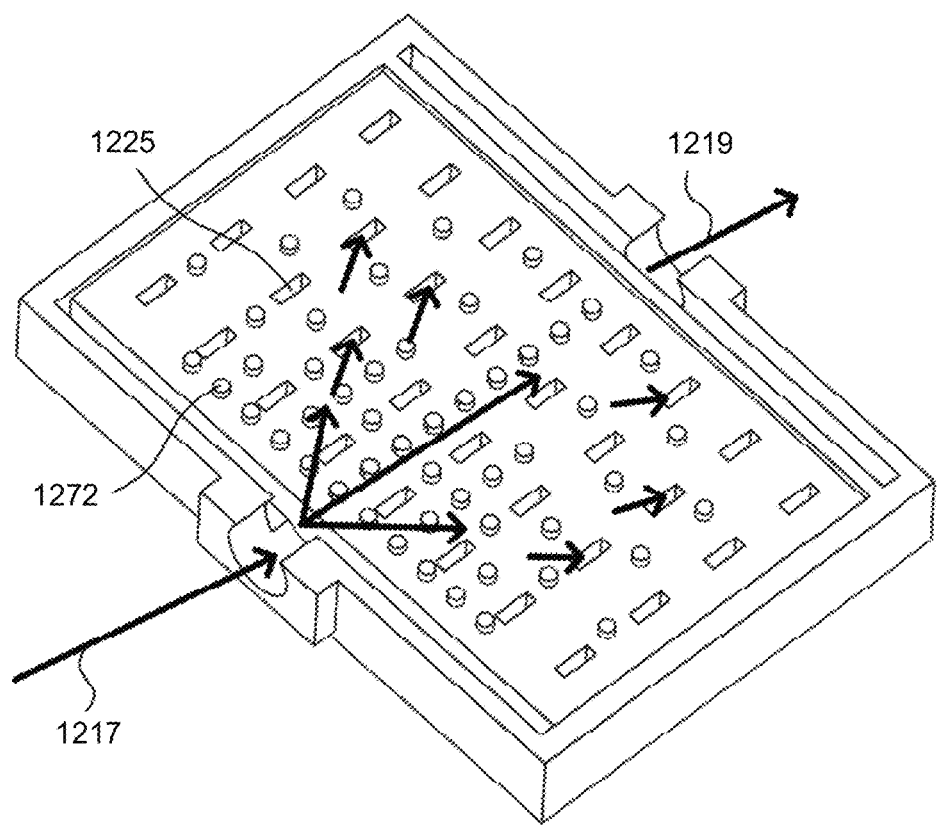
FIG. 12A provides a perspective view of an example cold plate with its cover removed that includes an integrated microchannel and microjet array (heat transfer array) wherein the heat source (not shown) is to be positioned below the array and wherein cooling fluid (e.g. water) flows in from the left side of the device over the baffle plate and then into the slot jets to extract heat from the source and then finally flows out through the outlet on the right side of the device.

FIG. 12A provides a perspective view of an example cold plate with its cover removed that includes an integrated microchannel and microjet array (heat transfer array) wherein the heat source (not shown) is to be positioned below the array and wherein cooling fluid (e.g. water) flows into an inlet 1217 from the left side of the device over the baffle plate and then into the slot jets 1225 to extract heat from the source and then finally flows out through the outlet 1219 on the right side of the device. In this embodiment, the baffle plate includes a plurality of cylindrical flow redirection elements (fin array) 1272 that provide an enhanced fluid flow pattern before the fluid enters the jetting structures.

Figure 12B:
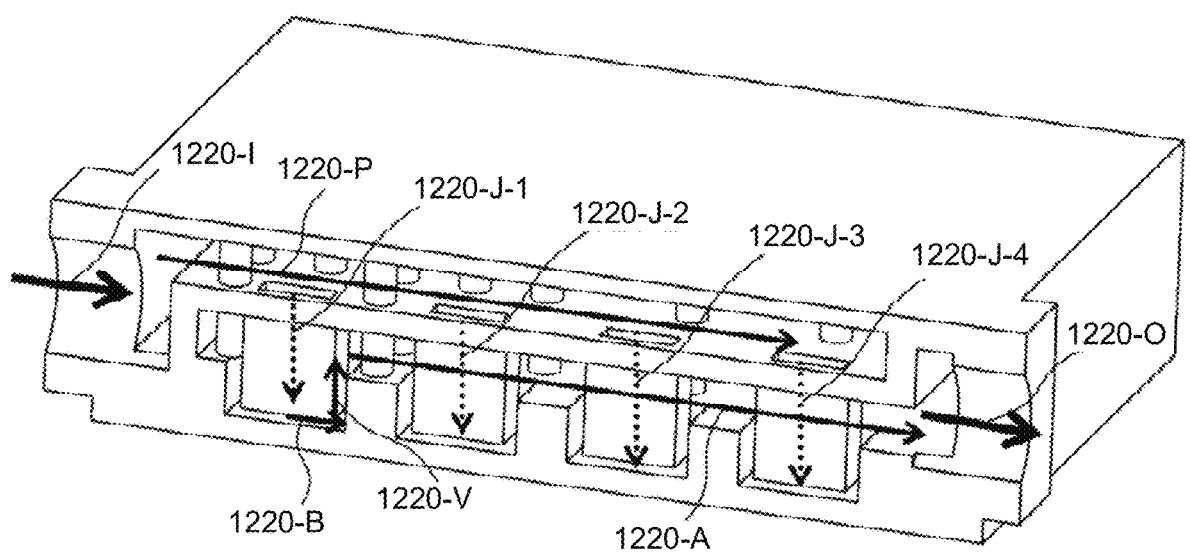
FIG. 12B provides a cut perspective view of the cold plate with an integrated heat transfer array and inlet/outlet system such that the inlet, the baffle plate, baffle elements, jets, and post jetting flow channels and outlet can be seen.

FIG. 12B provides a cut perspective view of the cold plate with an integrated heat transfer array and inlet/outlet system such that the inlet, the baffle plate, the baffle elements, the jets, and the post jetting flow channels and the outlet can be seen. In this example, the inlet includes an inlet orifice, a relatively large spreading region adjacent thereto and a baffle plate flow region, while the outlet includes an outlet orifice and a relatively large collecting region adjacent thereto, while the heat transfer array portion of the device includes the jets, jetting wells, and the post jetting flow paths (and associated structures) that travel around the sides of the jets as a fluid moves toward the outlet. In some variations of this embodiment, the heat transfer array portion of the cold plate may be fabricated using a multi-layer, multi-material electrodeposition method while the other parts of the cold plate may be fabricated via other methods (e.g. machining via water, laser, physical cutting tools, abrasive cutting tools, etching, or the like) and thereafter mating via bonding or clamping is made to occur in combination with appropriate sealants. In other variations, the whole device may be made monolithically via multi-layer, multi-material electrodeposition methods using a single metal or plurality of different metals and possibly other materials.

Arrows in FIG. 12B show fluid flow 1220-I through the inlet, flow 1220-P past the structures on the baffle plate, flow 1220-J-1 to 1220-J-4 through the jets, flow 1220-B along the base of the array (in the jetting wells) at the point of closest contact with the heat source, flow 1220-V from the jetting well out of the local jetting channels, flow 1220-A through the post jetting channel, and flow 1220-O out of the outlet. In some alternative embodiments, the transfer array may not have a solid bottom, or base, but instead fluid may be directed directly onto the upper surface of the heat source (e.g. silicon or other semiconductor surface). In still other embodiments, the base may take the form of a series of separate impact plates that are located above the heat source surface in the region where direct perpendicular impact will occur but are non-existent where largely horizontal or tangential fluid flow over the heat source would occur.

In some embodiments, the array of FIG. 12B may be formed from a plurality of layers built up using a multi-layer, multi-material electrochemical fabrication process as described above wherein a direction of layer stacking may be parallel to a direction of jetting. In other embodiments, layer stacking directions may be different.

In some preferred embodiments, though not necessarily all embodiments, the jetting structures also act as fins, or worded another way, some of the fin structures have embedded jets. In the depicted embodiments, the jetting impact surfaces are closer to a heat source surface (e.g. a semiconductor surface or other heat source surface) than is the primary exit path, channel, or level. These jetting surfaces may be considered to be located at the bottom of jetting wells with each jet having its own well and with the fluid exit path being above the floor of the jetting wells. In some embodiments, it is possible to have multiple jets (e.g. 2, 3 or 4 jets) share a jetting well while still having the primary fluid exit path being above the floor of the jetting wells. In some embodiments, the lower surface of the jet side walls (excluding bridging material that provides fin functionality) is located below (i.e. closer to the floor of the jetting wells than is the primary fluid exit channel) while in other embodiments, the lower extent of the jet side walls may be located above a primary fluid exit channel.

In some embodiments, jetting may occur directly on a heat source surface (e.g. a silicon or other surface of the semiconductor that is being cooled) while other embodiments may jet onto a floor of the transfer array which has been bonded to the semiconductor surface or to an independent jetting surface that has been transferred to the semiconductor surface or deposited directly thereon. Such an independent jetting surface may be located only in jetting well regions, in portions of jetting wells where substantially perpendicular impact of jetted fluid is to occur (e.g. within 15 degrees of perpendicular, within 10 degrees, within 5 degrees, or even within 1 or 2 degrees) or may be located as a complete coating applied to the semiconductor surface. In some embodiments, the semiconductor surface may be the back side of a semiconductor (i.e. the side opposite to where semiconductor device formation occurs). In some embodiments, the semiconductor surface may undergo etching or planarization to reduce its thickness prior to locating, applying or forming the transfer array (i.e. the microchannel, microjet array) thereon. In some embodiments, the reduction in thickness may be uniform while in other embodiments, the reduction in thickness may be non-uniform and may actually be used to form flow channels or jetting wells that may be used by the transfer array. In some embodiments, thinning may be followed by deposition of one or more materials to provide enhanced surface properties. In some embodiments, for example, semiconductor thickness may start in the range of 500-700 microns (ums) and be thinned to 400 microns, 300 microns or even less. In some embodiments, mounting the transfer array onto the semiconductor may occur by direct bonding, clamping the devices together with an intermediate thermal transfer material (e.g. solid or flowable) that may provide some thermal expansion stress relief. In still other embodiments, bonding or attachment to a semiconductor may not occur, but instead, the cooling device may be bonded or attached to another part of a semiconductor package such as a PCB, a PWB, or an integrated heat spreader (IHS) to which the semiconductor device is attached. Some embodiments that make use of an intermediate thermal grease may target a thickness of between 25-50 microns while bonding that occurs via solder may target solder thicknesses in the range of 25-75 microns. Some embodiments may use o-ring seals, solder, or other sealants when bringing separately formed elements into hermetic configuration. Some embodiments may make use of ultrasonic or diffusion bonding to ensure proper sealing.

Figure 12C:
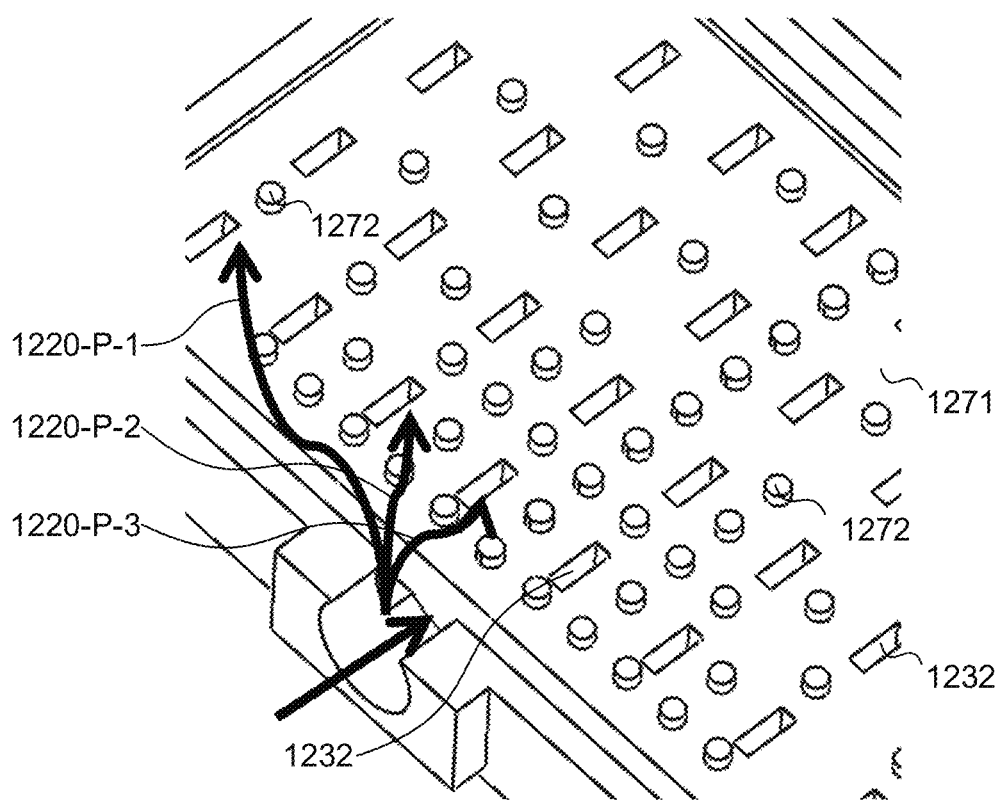
FIG. 12C provides a perspective view of an example cold plate similar to that of FIGS. 12A-12B where a portion of the baffle plate and fluid flow lines can be seen along with fluid flow paths through an inlet region as the fluid moves around baffle elements into jetting orifices.

FIG. 12C provides a perspective view of a device similar to that of FIGS. 12A-12B where a portion of the baffle plate 1271 is shown along with fluid flow lines 1220-P-1 to 1220-P-3 showing some possible fluid flow paths through an inlet layer or region around the baffle elements 1272 as the fluid progresses toward individual jet orifices 1232. The baffle elements may take on a variety of different forms to aid in efficiently channeling the fluid flow.

Figure 12D:
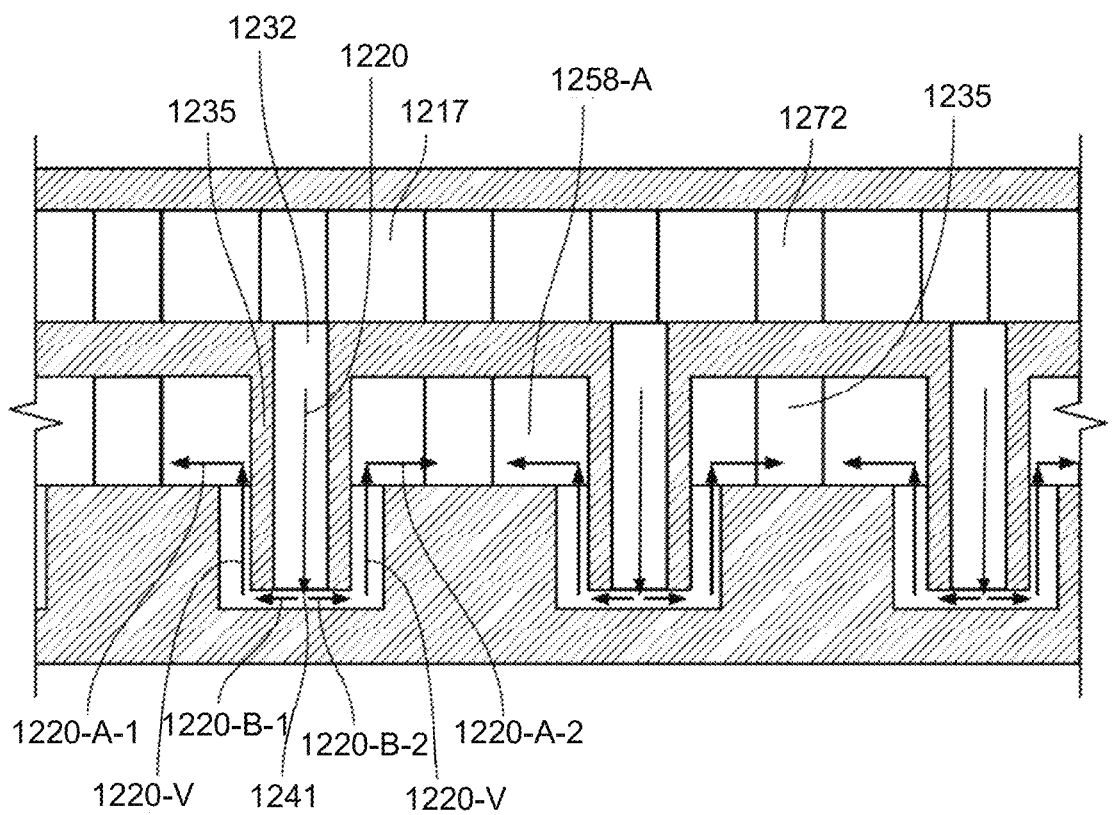
FIG. 12D provides a cut side view of a portion of a device similar to that of FIGS. 12A-12C where an upper inlet cavity can be seen along with several jet elements, inside channels of the jets, jetted fluid impact regions or surfaces, wells, post jetting flow channels, and an intermediate outlet cavity, and wherein a heat source, to be cooled or otherwise temperature controlled, would be located below the impact surface which is sometimes referred to as the primary heat transfer surface or region even though heat transfer and even a majority of heat transfer may occur from other regions with which the fluid interacts.
Figure 21:
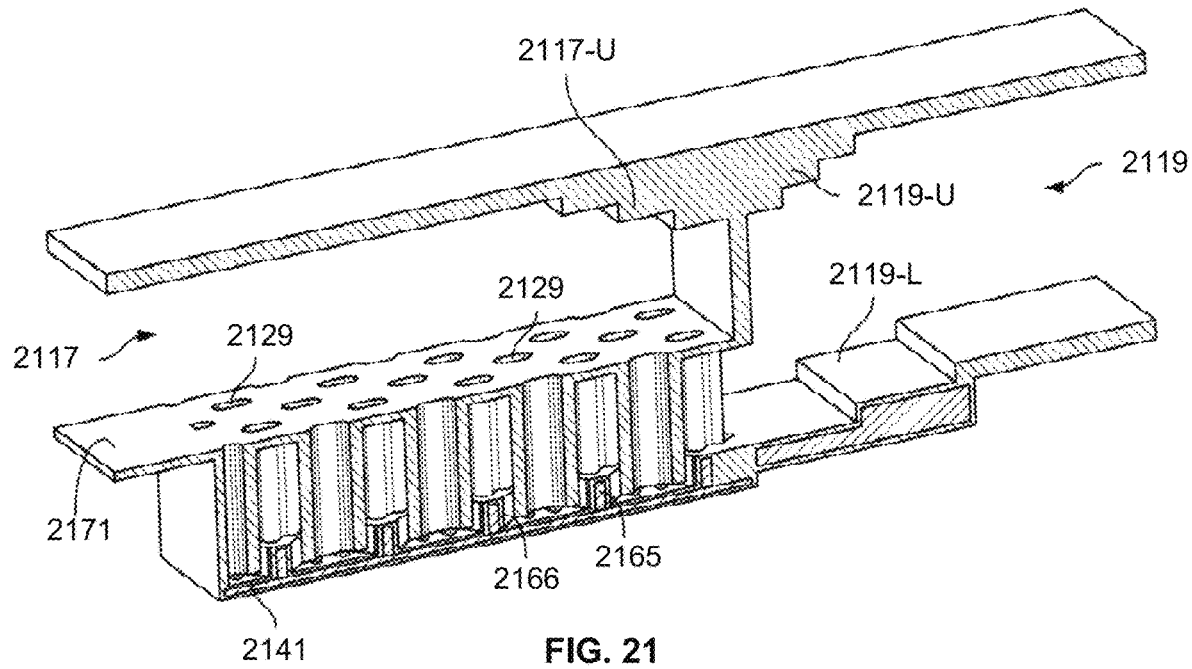
FIG. 21 provides a cut view (sliced in a plane containing the stacking axis of layers and an axis connecting a side inlet and a side outlet) of a cold plate according to another embodiment of the invention wherein a heat source to be cooled would be located below the cold plate and wherein the cold plate does not include any baffle elements in the inlet region.

FIG. 12D provides a cut side view of several of the jet elements having walls 1235 and orifices 1232 similar to the devices of FIGS. 12A-12C such that the inside channel (i.e. orifice or nozzle) 1232 of the jet, the flow path through jetting channel 1220 and the fluid impact region 1241 below the jets are visible with the post jetting fluid initially following flow paths 1220-B-1 and 1220-B-2. The fluid inlet channel 1217 can be seen above the jet orifice entry level where the fluid flow 1220-P of FIG. 12B would exist as the fluid flows past baffle elements 1272. The fluid exit channel 1258-A can also be seen with arrows 1220-A-1 and 1220-A-2 showing examples of where the fluid flow 1220-A of FIG. 12B would exist as it flows past baffles or solid fins 1235. Fluid flows in the jetting channel 1220-J and in microchannel 1220-V are anti-parallel and substantially perpendicular to a plane of the surface onto which jetting occurs, though some relatively small component of flow may be parallel to the surface that receives jetted material. Conversely, fluid flows 1220-B-1 and 1220-B-2 and 1220-A-1 and 1220-A-2 are substantially parallel to the surface onto which jetting occurs, though some relatively small component of flow may be perpendicular to the surface that receives jetted material. FIG. 12D also shows that the fluid flow 1220-A-1 and 1220-A-2, or 1220-A of FIG. 12B, through the exit layer, or region, is spaced between the inlet layer, or region, and the top of fluid wells into which jetting occurs. The bottom of the jet walls are spaced vertically between the surface onto which jetting occurs and a level of the top of the wells (which forms the lower boundary of the exit layer) such that jetted material after impingement must flow horizontally or laterally, as shown by arrows 1220-B-1 and 1220-B-2, a small distance prior to changing to a vertical flow direction through microchannel 1220-V between the jet walls and the well walls before again turning back to a horizontal, or lateral, flow direction as shown by arrows 1220-A-1 and 1220-A-2, or simply 1220-A of FIG. 12B in the exit layer or channel 1258-A. The primary heat transfer region is considered to be the region at the bottom of the jetting wells, though heat is extracted by the flowing liquid as it moves past the well walls, over the tops of the wells and around the baffles or fins in region 1258-A. In some embodiments, as can be seen in FIG. 21, a portion, or portions of the jet side walls may extend down and contact, bond to, or be formed integral with the surface of jetting fluid impingement, thus making jetting structures in such embodiments also function as heat flow fins from which pre-jetted liquid and post-jetted liquid can absorb heat to further enhance heat transfer.

Figure 12E:
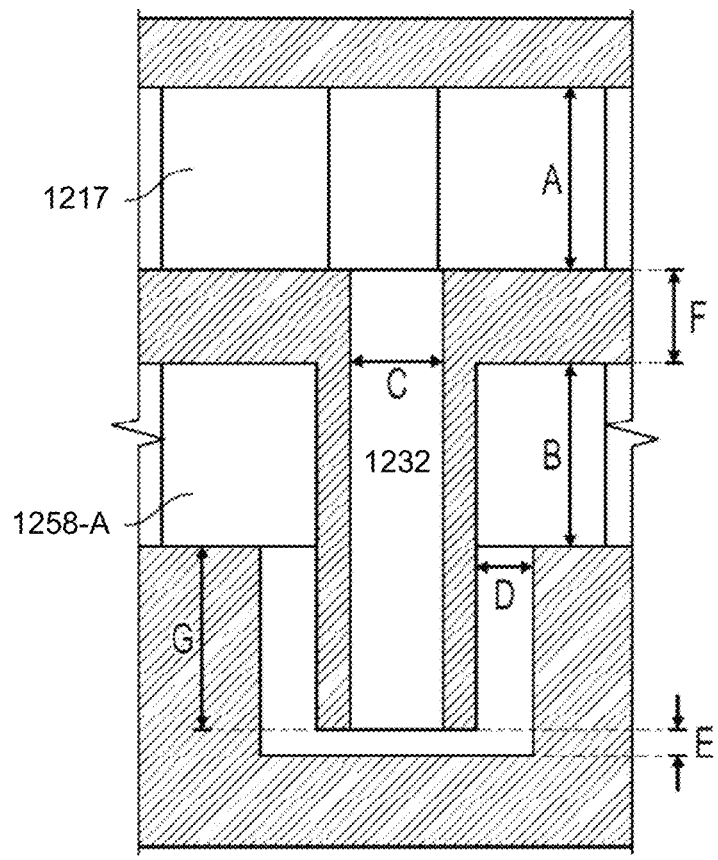
FIG. 12E provides a cut view of a single microjet region of a device along with some sample dimensional ranges that might be used in some embodiments.

FIG. 12E provides a cut view of a single microjet region of a device along with some sample dimensional ranges that might be used in some embodiments. In other embodiments, the dimensions may vary away from the ranges indicated herein.

Figure 12F:
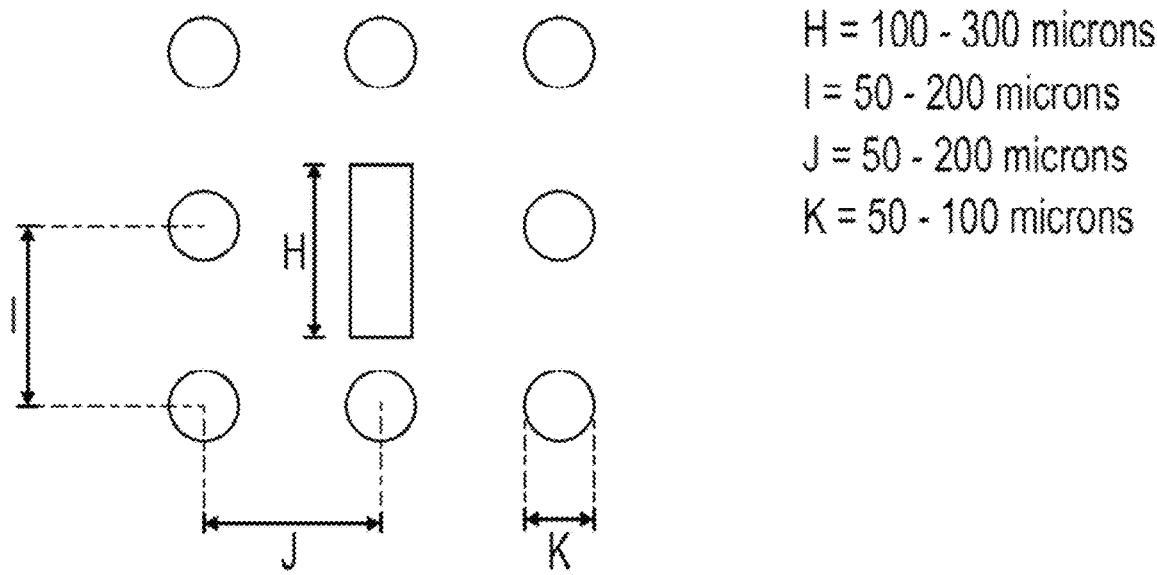
FIG. 12F provides a cut top view of the baffle plate along with some sample dimensions for the jet, baffles, and spacing between baffle elements.

FIG. 12F provides a cut top view of the baffle plate along with some sample dimensions for the jet, baffles, and spacing between baffle elements. In some embodiments, jet dimensions, baffle size and configuration, and baffle spacing as well as spacing between jets may vary depending on where these structures are located relative to the inlet, sidewalls, back wall, or the like.

In some embodiments, jets may change dimensions vertically along the flow path (e.g. by widening or narrowing at desired locations). In some embodiments, small corner regions may be filled in to minimize locations where fluid stagnation or low flow may exist so as to further enhance heat transfer. Such regions may exist in the inlet layer, the exit layer, or even the regions where well floors and well walls meet. In other embodiments, surface texturing may be added to key heat transfer regions to further enhance surface area contact and thus heat transfer.

Figure 13:
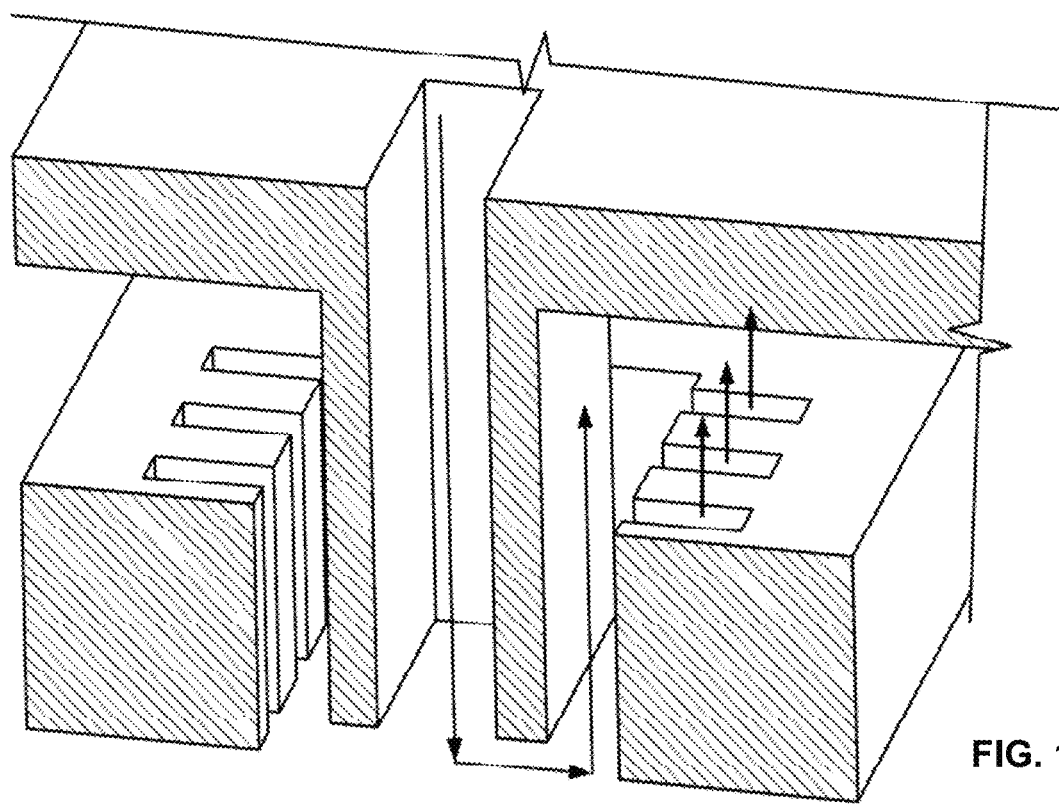
FIG. 13 provides another perspective cut view of a single jet region where the post jetting flow regions along the well walls include solid fin elements and channels to provide additional surface area for optimizing heat transfer.

FIG. 13 provides another perspective cut view of a single jet region where the post jetting flow regions along the well walls include solid fin elements and channels to provide additional surface area for optimizing heat transfer.

Figure 14:
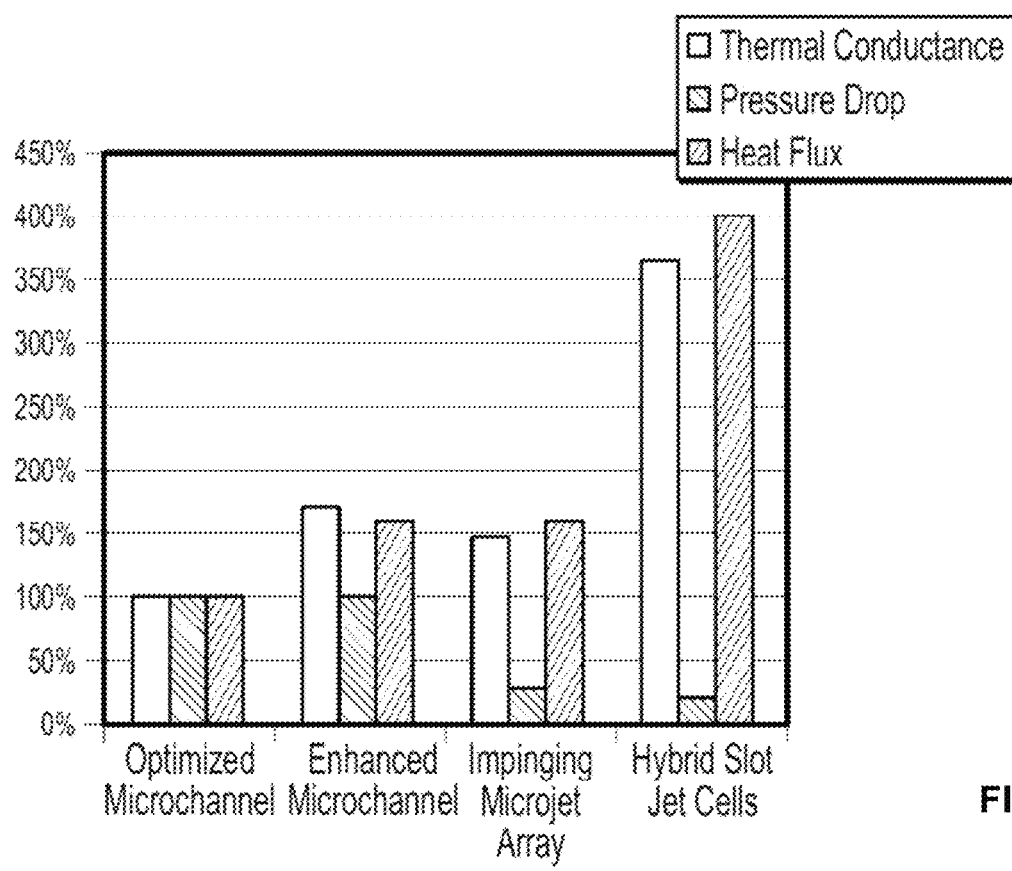
FIG. 14 provides a chart illustrating the anticipated performance enhancement that may be achievable by some embodiments of the present invention where microchannels or optimized microchannels and microjet arrays are combined for improved thermal conductance, decreased pressure drop across the heat transfer array, and improved heat flux through the heat transfer array.

FIG. 14 provides a chart illustrating the anticipated performance enhancement that may be achievable by some embodiments of the present invention where microchannels or optimized microchannels and microjet arrays are combined for improved thermal conductance, decreased pressure drop across the heat transfer array, and improved heat flux through the heat transfer array.

Figure 15:
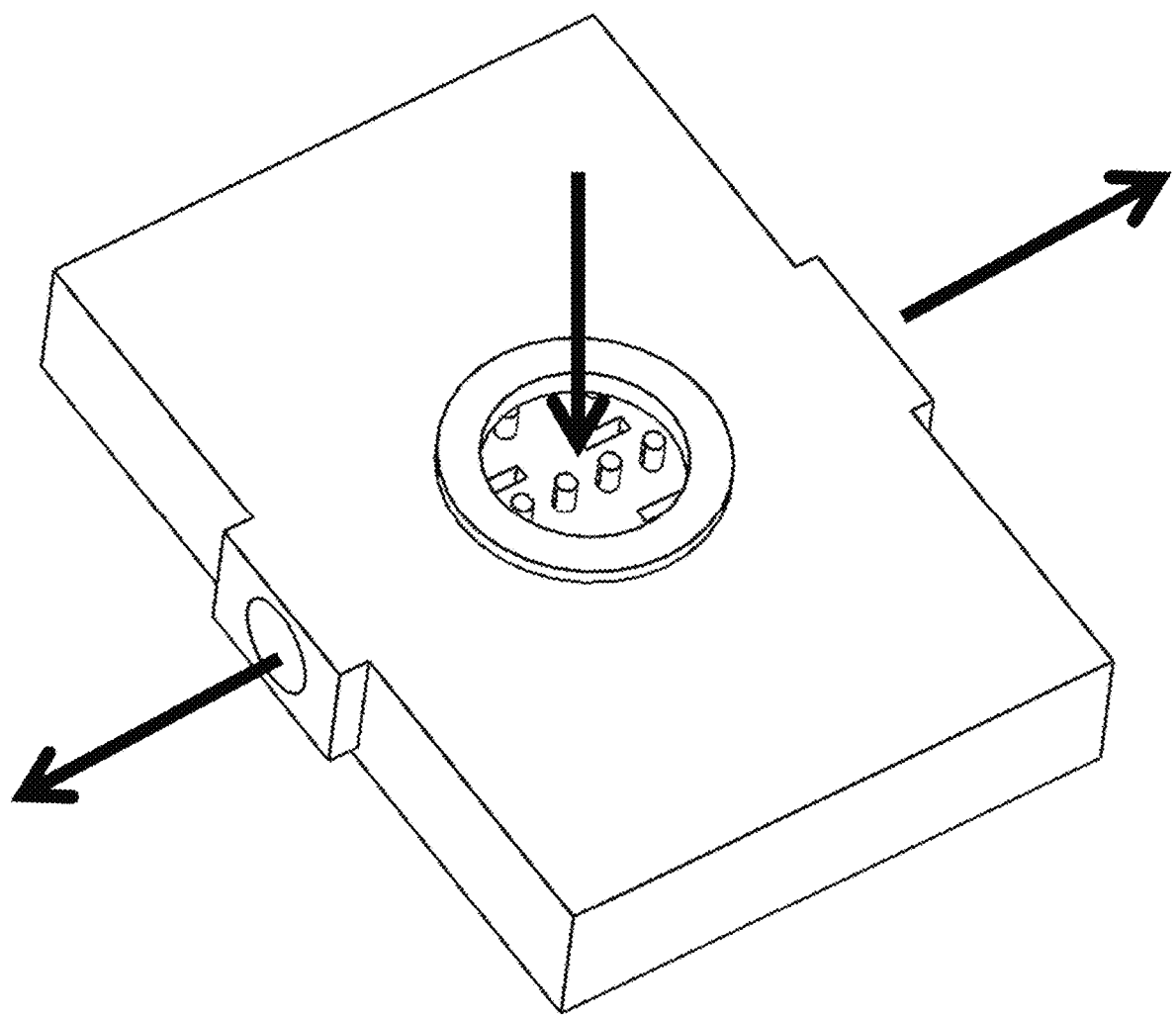
FIG. 15 provides a perspective view of the top of an alternative cold plate (i.e. heat transfer array and inlet/outlet combination) with the cover in place and with the inlet moved from the left side to the top and with the single outlet of FIG. 12A modified into two outlets with one on the left and one on the right.

FIG. 15 provides a perspective view of the top of an alternative cold plate (i.e. heat transfer array and inlet/outlet combination) with the cover in place and with the inlet moved from the left side to the top and with the single outlet of FIG. 12A modified into two outlets with one on the left and one on the right. In other alternatives, the positions of the outlet(s) and inlet(s) may be reversed or the numbers of them changed.

Figure 16:
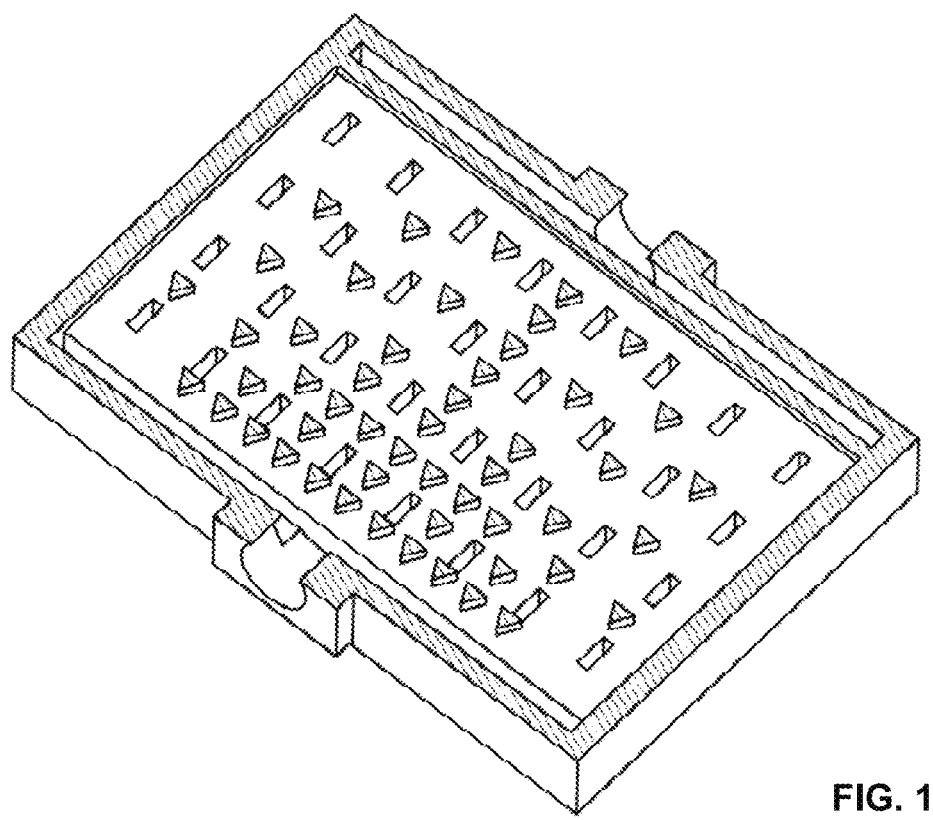
FIG. 16 provides a perspective view of the top of another alternative cold plate, with the cover removed, and with the cylindrical baffle elements replaced by triangular elements with an apex, i.e. vertex, of the triangles splitting the incoming fluid flow into desired flow paths.

FIG. 16 provides a perspective view of the top of another alternative cold plate, with the cover removed, and with the cylindrical baffle elements replaced by triangular elements with an apex, i.e. vertex, of the triangles splitting the incoming fluid flow into desired flow paths. In other embodiments, other baffle configurations are possible and may include wing shaped elements, diamonds, rectangles, ovals, or the like. In still other embodiments, the baffle elements may be located behind jet openings as opposed to in front of them. In still other embodiments, more than one type of baffle element may be employed wherein the type used may be dependent on the location of the baffle relative to the jetting orifices. In some alternative embodiments, baffle elements may not only include varying configurations in the plane of layer formation but also in the stacking direction of layer formation (e.g. a baffle behind a jet orifice may include a vertically curved or stair stepped structure that helps redirect horizontal fluid flow into vertical fluid flow over a jetting orifice). In some alternative embodiments, a back plate may have a curved shape that redirects fluid flow smoothly back to a front side of the cold plate so that it may make another flow pass past the orifices as opposed to forming pockets of low flow or stagnated fluid. In still other embodiments, the inlet layer may have a reduced baffle/fin count or even be baffle/fin free so as to provide the overall cold plate with a reduced pressure drop.

Figure 17:
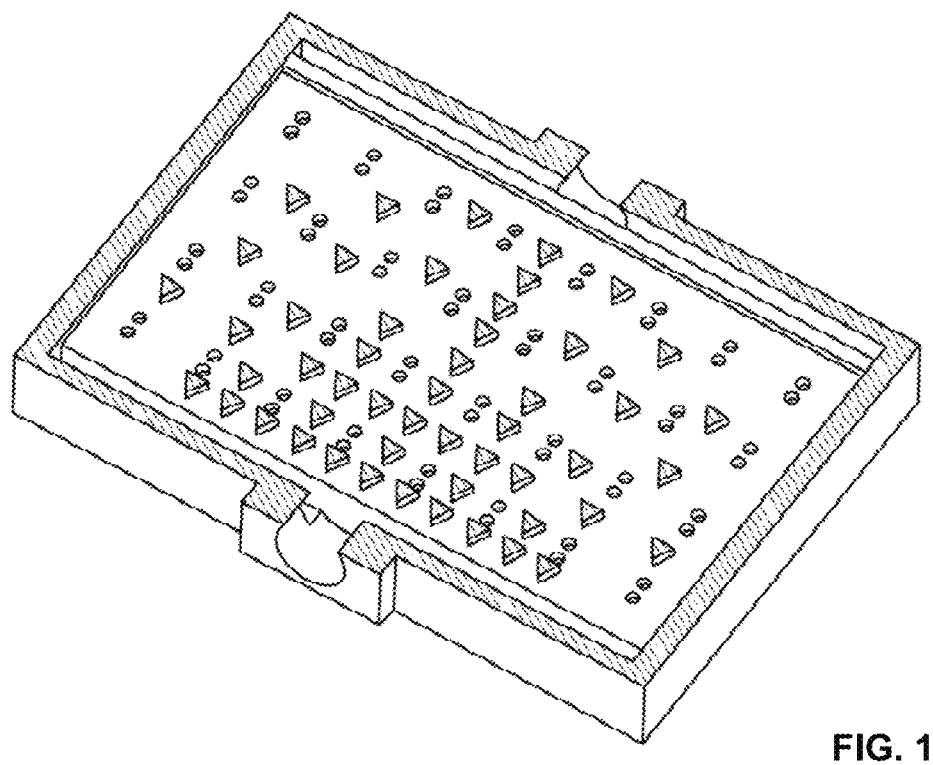
FIG. 17 provides a perspective view of the top of another alternative cold plate, with the cover removed, and with the rectangular jets replaced by pairs of cylindrical jetting orifices.

FIG. 17 provides a perspective view of the top of another alternative cold plate, with the cover removed, and with the rectangular jets replaced by pairs of cylindrical jetting orifices. In other embodiments, other orifice configurations are possible as well as opening configurations that allow flow of fluid from the jetting cavity or well back to the exit channel (to be discussed hereinafter).

Figure 18:
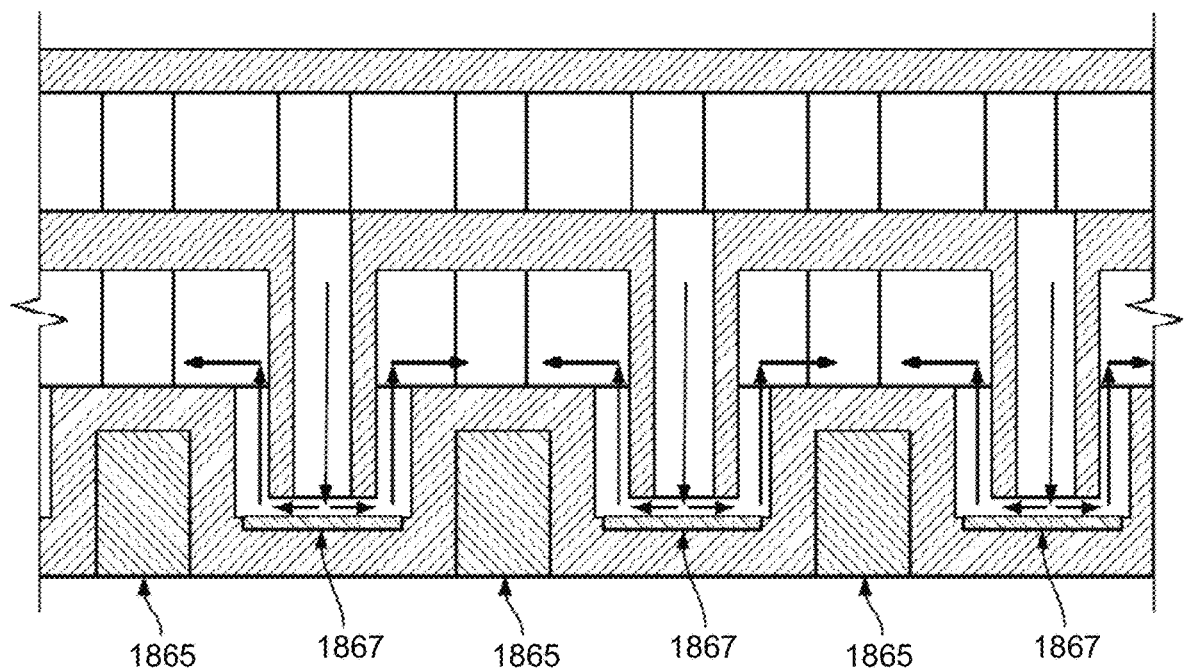
FIG. 18 provides a cut view of the jetting channels for three jets showing fluid flow paths similar to those shown in FIG. 12D but with a different, or secondary structural, material covering the jetting impact regions and a tertiary structural material replacing selected portions of the basic structural material.

FIG. 18 provides a cut view of the jetting channels for three jets showing fluid flow paths similar to those shown in FIG. 12D. However, in the embodiment of FIG. 18, two changes have been made: (1) the material covering the jetting impact regions has been changed from a first, or basic, structural material (e.g. nickel, a nickel alloy, palladium, or the like) to a different, or secondary structural, material 1867 and (2) selected portions of the basic structural material have been replaced with a core, or tertiary structural, material 1865. The secondary structural material may be a harder material such as, for example, rhodium as set forth in the figure, so as to limit any wear or erosion that might otherwise result from the concentrated fluid impingement. The tertiary material may be a material of higher conductivity (e.g. copper, silver, or gold) than the basic structural material (e.g. nickel, a nickel alloy, palladium, or the like) but may be lacking in some other important property (e.g. hardness, durability, strength, incompatibility with an etchant that may be used to remove a sacrificial material, or the like). In some embodiments, the tertiary material and the sacrificial material may be the same material, and thus the tertiary material may require protection by a shell of the basic structural material to keep it from being removed during sacrificial material etching. In some embodiments, the secondary material and/or tertiary material may be added to the primary build material in any manner desired (e.g. performed plugs that are inserted into position as layers are formed or after layer formation if access is available, deposits that are made after layer formation is completed, deposits made during an interpretation to the layer formation process, or deposits made as part of a multi-layer, multi-material formation process). In some embodiments, the roles of the secondary and tertiary material may be filled by the same material. In some embodiments, only a basic structural material and a secondary material may be used (i.e. no tertiary material) while in other embodiments, the basic material may be used with just the tertiary material (i.e. no secondary material). While in still other embodiments, one or more additional specialized materials may be added for various purposes either alone or in combination with other materials.

Figure 19:
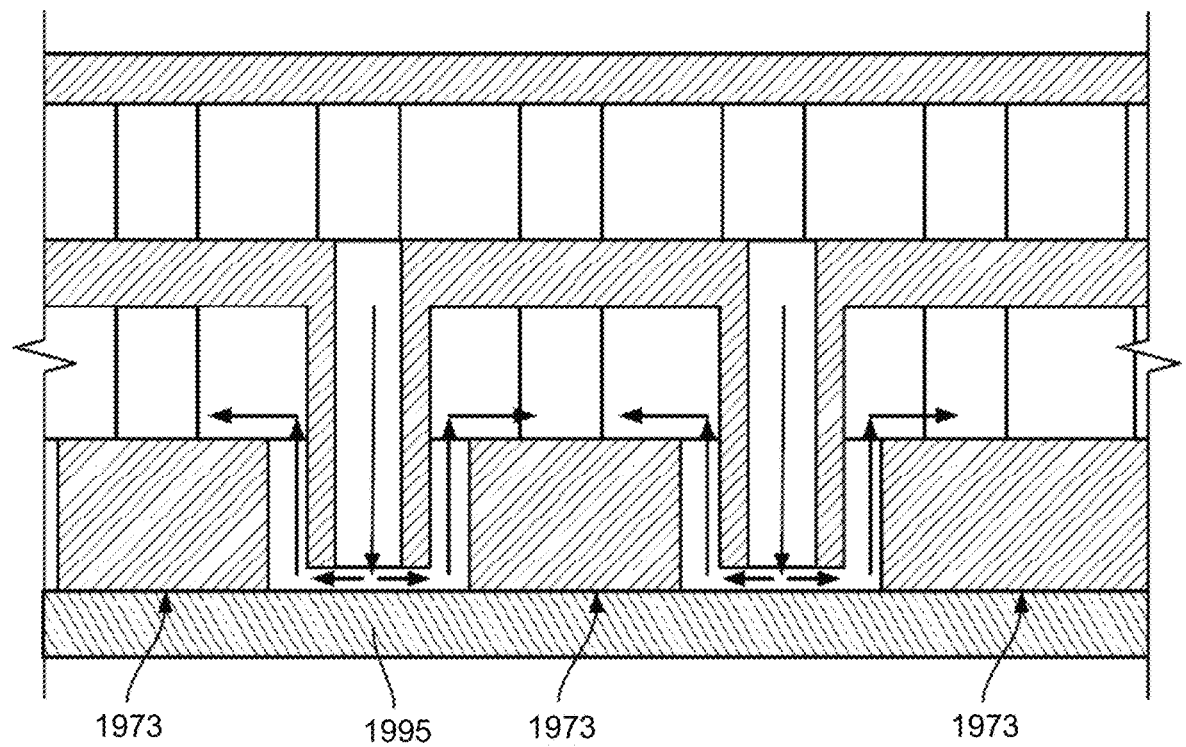
FIG. 19 provides a cut view of the jetting walls, jetting channels, and jetting wells for three jets showing fluid flow paths similar to those shown in FIG. 12D but with no heat transfer array structural material in the jet impact region but instead a surface of a heat source.

FIG. 19 provides a cut view of the jetting walls, jetting channels, and jetting wells for three jets showing fluid flow paths similar to those shown in FIG. 12D, however the embodiment of FIG. 19 indicates that there is no heat transfer array structural material in the jet impact region, thus allowing the jetted fluid to impact directly onto the material of the heat source. In such situations, as well as in embodiments where a heat transfer array base exists, the heat transfer array and the heat source 1995 may be bonded or sealed 1973 to one another in any appropriate manner (e.g. soldering, conductive epoxy, pressure fitting with a softer highly conductive metal, clamping with o-ring seals, ultrasonic bonding, diffusion bonding, brazing, or the like). In other embodiments, the heat transfer array may carry with it an impact surface of a desired size, shape and material that can be bonded or seated against the heat source while still providing at least a portion of the surrounding area as a direct fluid impact zone. In other embodiments, an impact pad of a desired material may be formed on or attached to the heat source prior to mounting the heat transfer array.

Figure 20:
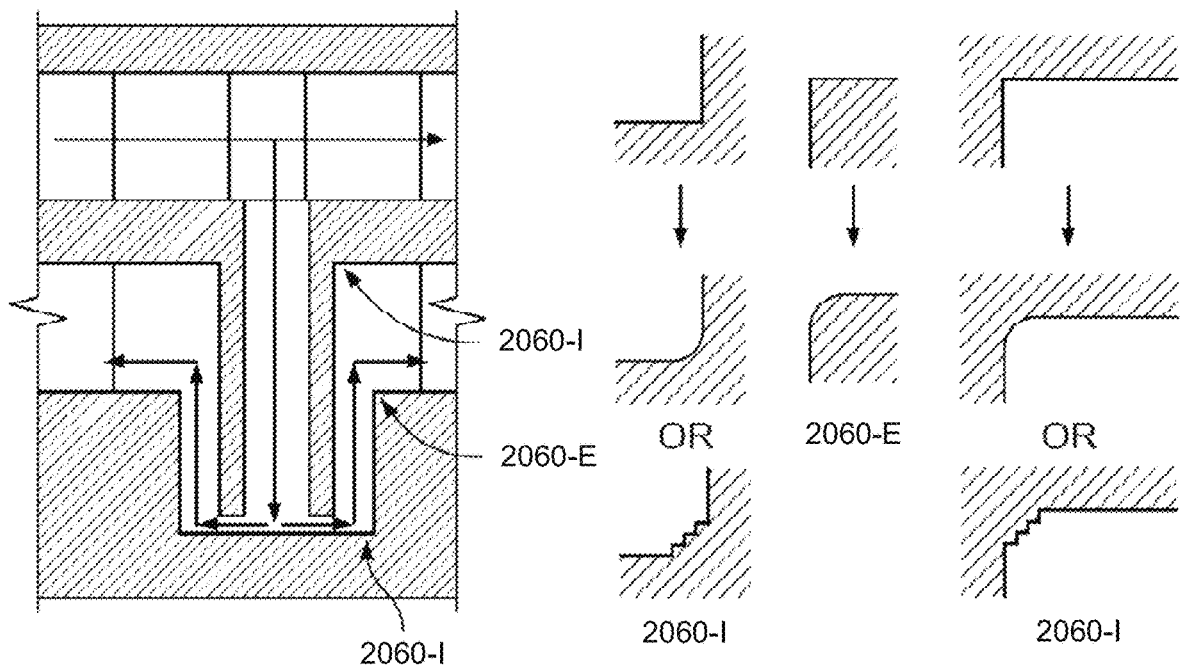
FIG. 20 provides a cut view of a jetting location and illustrates how corners may be rounded, filleted, or reconfigured to have smaller stair-stepped features so as to minimize pockets or regions of reduced fluid flow which may otherwise decrease heat transfer.

FIG. 20 provides a cut view of a jetting location and illustrates how corners 2060-I, 2060-E, and 2060-I may be rounded, filleted, or reconfigured to have smaller stair-stepped features, which may be provided by techniques set forth in U.S. Pat. No. 7,198,704, so as to minimize pockets or regions of reduced fluid flow which may enhance heat transfer.

FIG. 21 provides a cut view (sliced in a vertical plane defined by the stacking axis of the layers of the device and an axis connecting a side inlet and a side outlet) of a cold plate according to another embodiment of the invention showing: (1) an inlet region 2117 which may be considered part of a header or manifold, (2) an outlet region 2119 which may, at least in part, be considered part of a header or manifold, (3) a cap above the inlet and the outlet regions defining a top of a header or manifold, (4) a lateral dividing wall between the inlet and outlet regions, (5) a horizontal jet inlet surface 2171 defining a bottom of a header or manifold on the inlet side and including a plurality of jet channel entrance ports 2129, (6) a heat exchange base 2141 having a core material 2165 encased in a shell material 2166 and providing a plurality of individual jetting surfaces and primary heat transfer regions within jetting wells, (7) a plurality of microjets extending from the jet inlet surface to a position spaced from floors of the jetting wells and including spaced apart extensions or bridging elements that contact the impingement surface (or merging with it) of the heat exchange base within each jetting well to provide heat conduction fin functionality, (8) post-jetting fluid channels located between the side walls of the jets and the well walls, and (9) an exit region above the jetting wells where exiting fluid can move laterally between the inlet region and the upper surfaces of the wells past jet sidewalls and any additional solid fins or baffles. In many respects, the device is similar to those of the prior figures, but some differences exist. The device of this embodiment does not include any baffle elements in the inlet region. It includes oblong smooth surfaced jets having elongated cross-sectional dimensions parallel to the axis extending from the inlet to the outlet, a stair stepped structure 2117-U connecting the cap and a right-most inlet chamber wall (i.e. a sloping down structure on the back wall of the inlet chamber), a stair stepped lower surface 2119-L, and stair stepped upper surface 2119-U of an outlet (i.e. a sloping surface that may help direct fluid out of the heat transfer array while reducing regions of stagnation or slow flowing fluid traps).

Figure 22A:
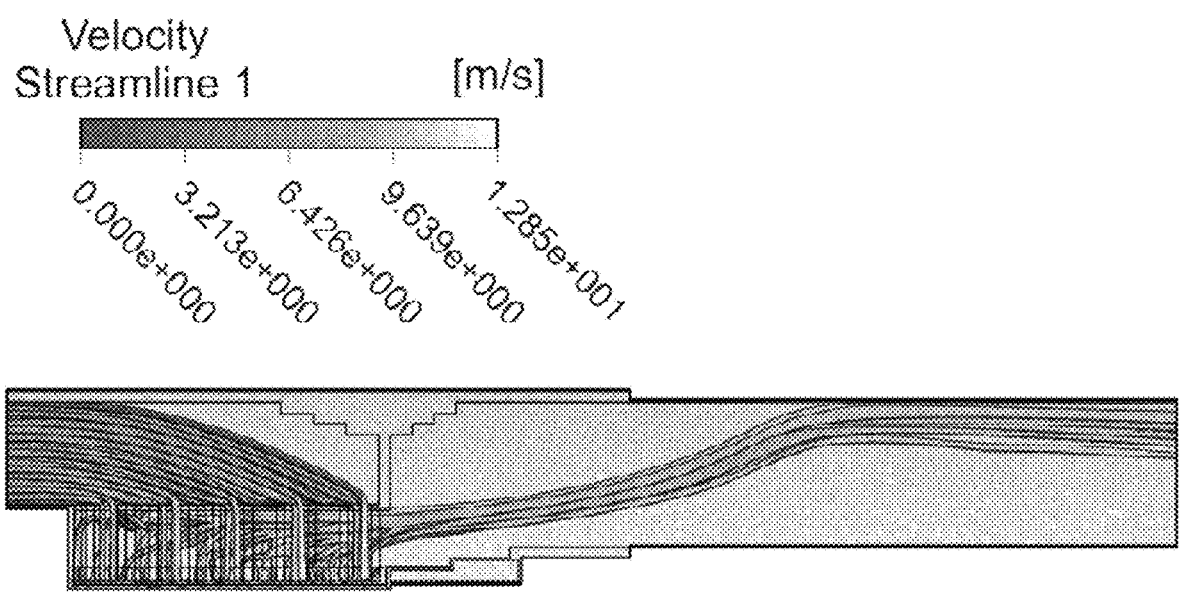
FIGS. 22A-22B provide fluid flow illustrations as derived from an ANSYS Fluent simulation.
Figure 22B:
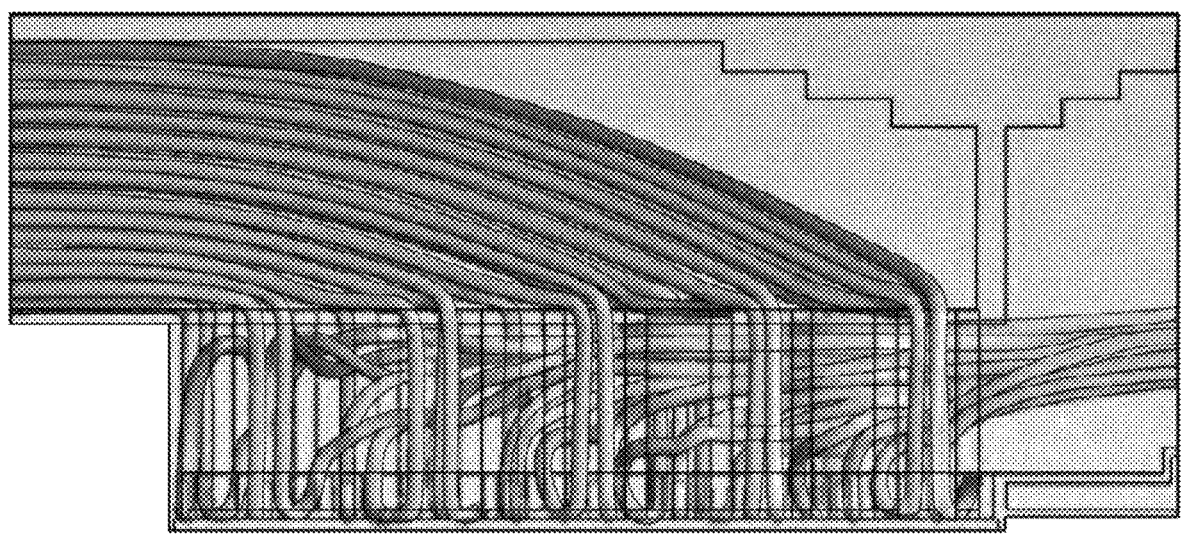

FIGS. 22A and 22B provide fluid flow illustrations as derived from an ANSYS Fluent simulation. FIG. 22B provides a close up of the fluid flow movements in the region of the microjets while FIG. 22A provides a view of the entire flow from inlet to outlet. The shading (original drawings were in color) in these images relate to the flow speed of the heat transfer fluid with darkest shading representing the lowest flow rate and lightest shading representing the highest flow rate.

Figure 23:
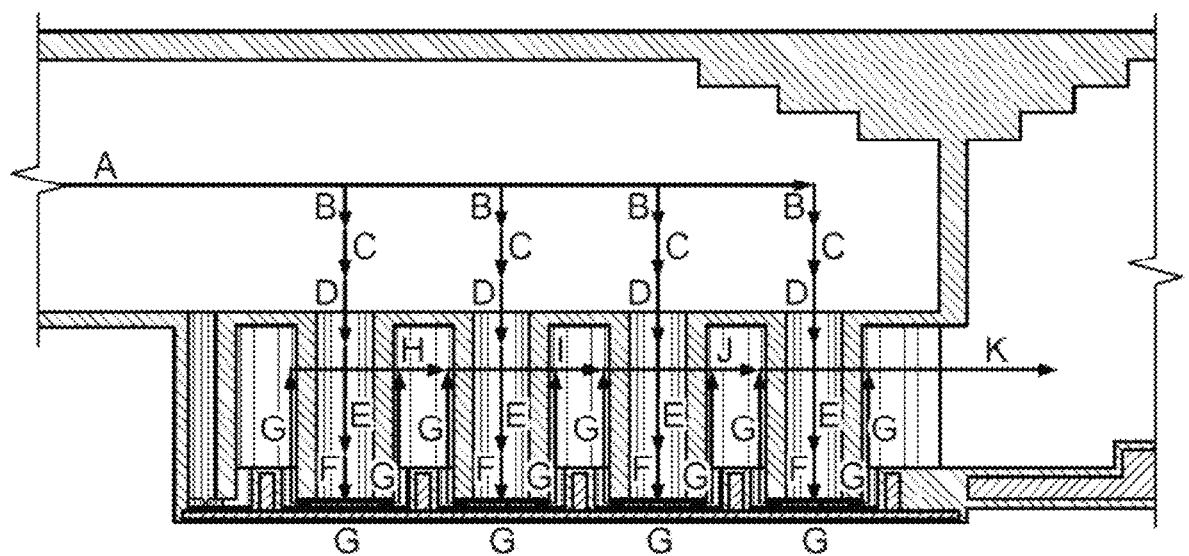
FIG. 23 provides a cut view of the device of FIGS. 21 to 22B showing a schematic illustration of fluid flow from the inlet through the jets, to the impact region, through the post jetting channels, to the exit channel and then to the outlet.

FIG. 23 provides a cut view of the device of FIGS. 21 to 22B showing a schematic illustration of fluid flow from the inlet through the jets, to the impact region, through the post jetting channels, to the exit channel and then to the outlet. The coloring code to reference letter associated with the fluid flow lines indicates how the liquid (e.g. water) is heating up as it flows from left to right where A-B (originally blue) represents cool liquid and C-F (originally yellow), G-H (originally orange), and I-K (originally brown) represent warmer liquid.

Figure 24A:
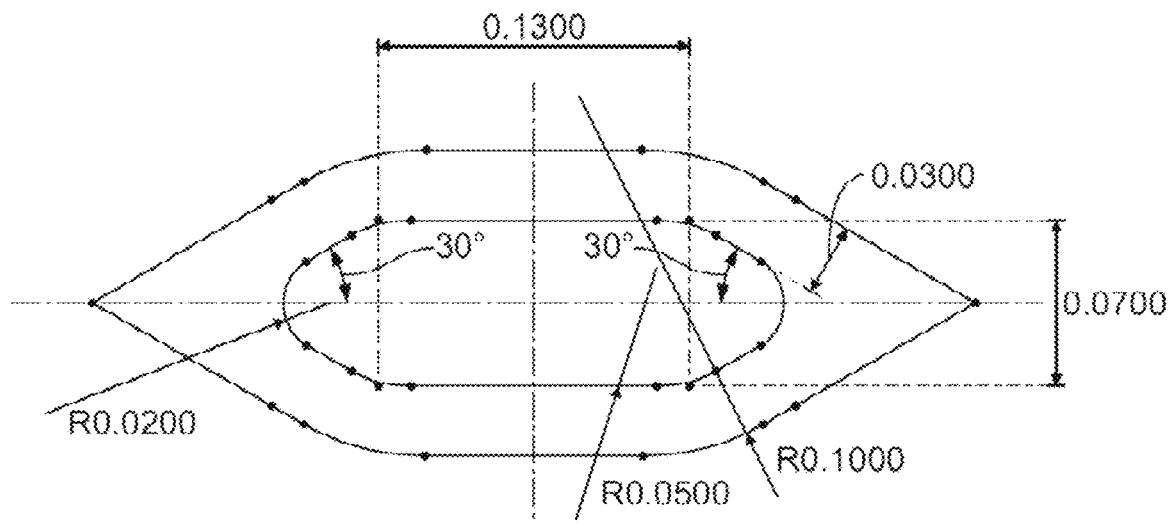
FIG. 24A provides sample dimensions of a jetting orifice in millimeters while FIG. 24B provides sample dimensions for features surrounding the jetting orifice which is surrounded by a wall of structural material of the jet having leading and trailing surfaces with sharp blade-like configurations.
Figure 24B:
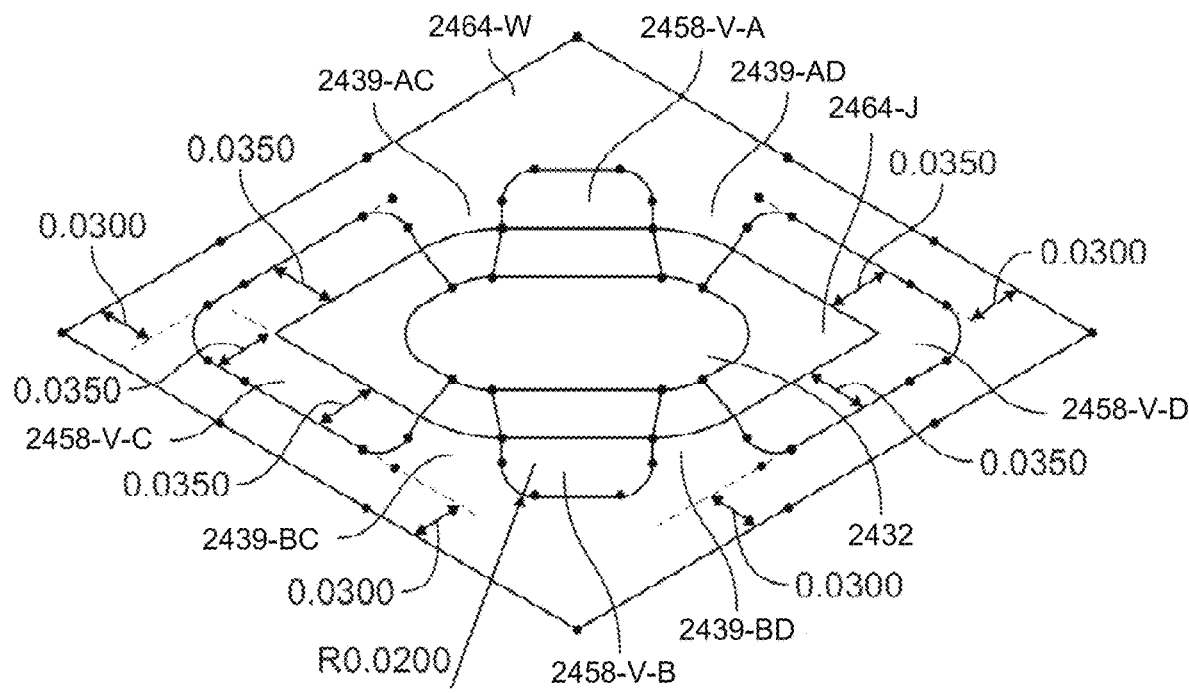
FIGS. 24C-24D provide perspective sectioned views of a single example jet and part of a surrounding well wall at two different cut heights so as to further illustrate, the relationship between fin/jet side walls, fin bridging elements, and well side walls.
FIGS. 24E-24F provide a top view and a perspective view, respectively, of a single well region which is cut vertically below the level of the jet side walls so that the entire jetting surface region, bridging elements, and well walls can be seen.
FIGS. 24G-24H, respectively, provide a perspective view of a single integrated jet/fin element (similar to those of FIGS. 24A-24F) from a heat transfer region, that contacts or is in proximity to a heat source, to an inlet portion of the jet as well as a vertically extending cut view through such an integrated jet/fin structure so that at least a portion of the bridge elements can be seen.
FIGS. 24I and 24J provide perspective views of two adjacent integrated jet/fins and wells to illustrate how, in at least one embodiment, such elements may be positioned relative to each other.

FIG. 24A provides sample dimensions of a jetting orifice in millimeters while FIG. 24B provides sample dimensions for features surrounding the jetting orifice 2432 (e.g. jet side walls, bridging elements that connect the lower portion of the jet to well side walls, channels for moving fluid from the jetting region along the jet side walls and well side walls to a primary exit channel located above the jetting well). The jet orifice is surrounded by a wall of structural material 2464-J forming the jet side walls wherein the jet side walls, in this example, provide leading and trailing surfaces with sharp blade-like configurations. As the jet side walls enter a jetting well, the jet side walls, in this example, are spaced from well side walls by four gaps or channels 2458-V-A to 2458-V-D that define vertically extending post-jetting channels that feed the heat transfer fluid (e.g. water) from the impact area or floor of the jetting well to a primary exit channel. The four post-jetting channels are in turn spaced from one another by four regions of structural material or solid conductive material bridges 2439-AC, 2439-AD, 2439-BC, and 2439-BD that connect the jet side wall material 2464-J to well side wall material 2464-W. These bridges provide a direct metal conductive path between the heat source and the jet side walls, thus providing the jetting structures with direct heat conductive fin functionality. In such embodiments, the bridges may extend a portion of the jet side walls completely to the jet impact floor while in other embodiments, the bridges may make a solid conductive connection between the jet side walls and the floor via the well side walls or via a somewhat laterally offset path (i.e. a path between a theoretical vertical jet side wall that is extended completely to the floor and a theoretical vertical well wall that is extended to the floor in absence of the bridge material). In such embodiments, the jetting structure may be said to have fin functionality or alternatively, these fin structures may be said to have embedded jets or jet functionality. Such systems may be thought of as having a higher level of integration than those systems that have jets that do not provide fin functionality or those systems that have fins but without jetting functionality.

Figure 24C:
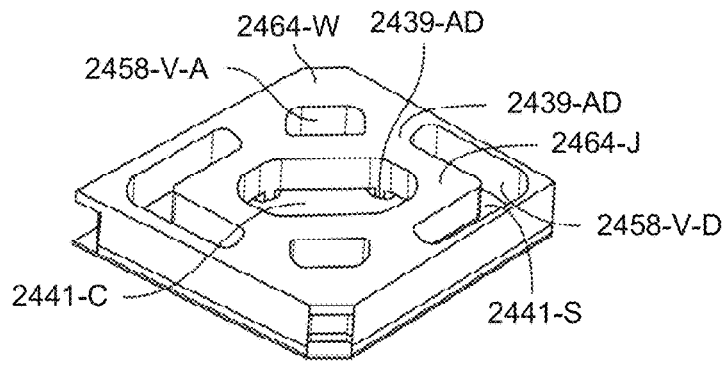
Figure 24D:
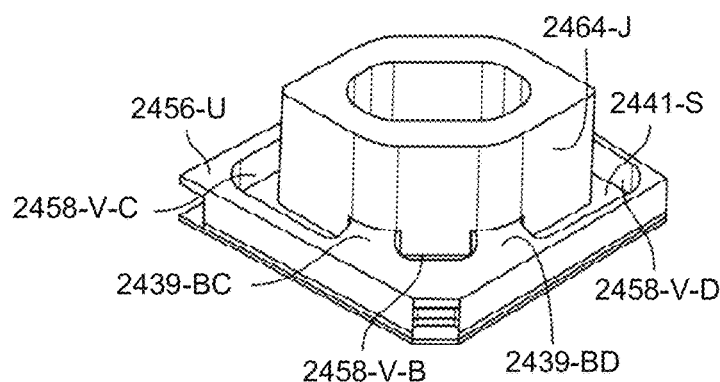

FIGS. 24C and 24D provide perspective sectioned views of a single example jet and part of a surrounding well wall at two different cut heights so as to further illustrate, the relationship between fin/jet side walls, fin bridging elements, and well side walls. As shown in FIG. 24C bridging elements 2439-AD and 2439-AC can be seen (only 2439-AD is labeled) at the lower end of the jet wall material 2464-J and between the jet wall material 2464-J and the well side wall material 2464-W. In practice, these three differently labeled elements may range from physically distinct materials or they may all be made from a single common material. This bridging material provides a solid conductive direct bridge from the jet wall to the jetting floor near the central region of the jetting floor 2441-C or the side region of the jetting floor 2441-S (which, for example is located below gap 2458-V-D as shown) and semi-directly from the jet wall to the jetting floor near side region 2441-S via the well side walls. FIG. 24D provides a perspective sectioned view with an extended portion of the jet side wall material 2464-J shown extending above an upper surface 2456-U of the well side wall material into a primary exit channel region. FIG. 24D also labels additional bridging elements 2439-BC and 2439-BD and post jetting channels 2458-V-B, 2458-V-C, and 2458-D with labels similar to those used in FIG. 24B.

Figure 24E:
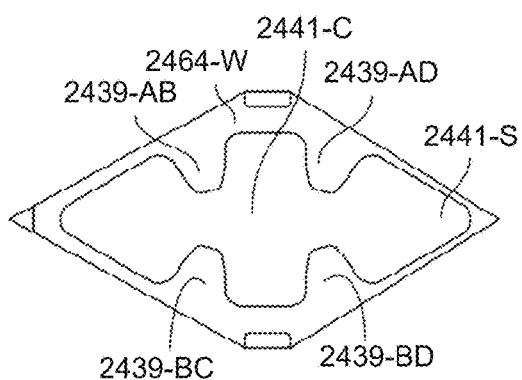
Figure 24F:
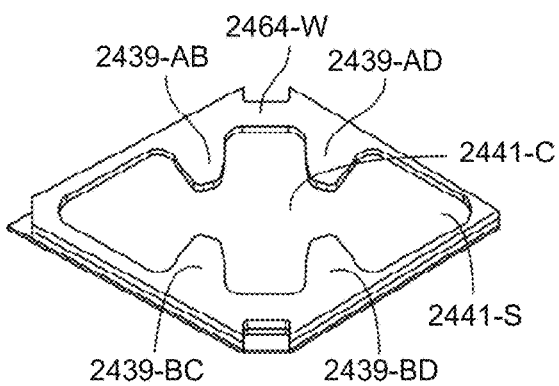

FIGS. 24E and 24F provide a top view and a perspective view, respectively, of a single well region which is cut at a vertical level below the lower level of the jet side walls so that the entire jetting surface region 2441-C, and 2441-S and joining regions; bridging elements 2439-AD, 2439-AB, 2439-BC, and 2439-BD; and well walls 2464-J can be seen.

Figure 24G:
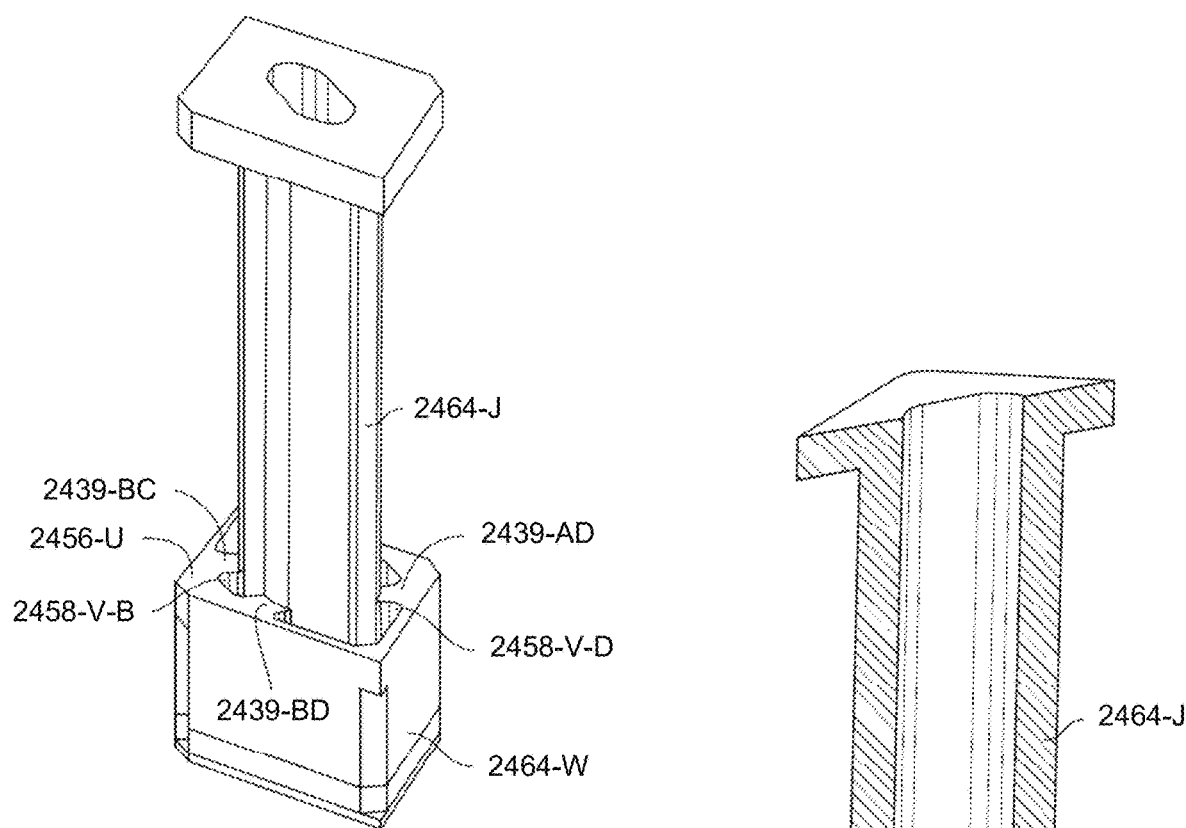
Figure 24H:
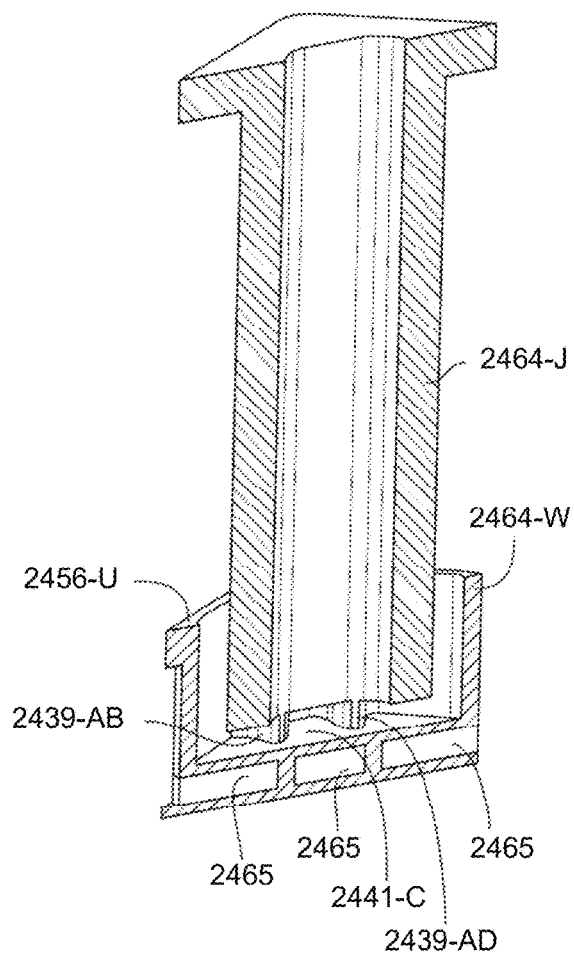

FIG. 24G provides a perspective view of a single integrated jet/fin element similar to the structure of FIGS. 24A-24F wherein the jet/fin element extends from a heat transfer region (at the bottom of the figure), that contacts or is in proximity to a heat source (not shown), to an inlet portion of the jet (at the top). FIG. 24H provides a vertically extending perspective section view of the integrated jet/fin structure of FIG. 24G so that at least a portion of the bridge elements 2439-AB and 2439-AD can be seen. FIG. 24H also shows the interior of a jet along with jet walls 2464-J, well walls 2464-W, the upper surface of the wells 2456-U, central jetting surface or floor region 2441-C, and regions 2465 which represent volumes of solid conductive material that may be formed of a different material than that which forms the surface of the floor 2441-C. In embodiments where different materials may be used, floor material may be selected based on a desire to optimize durability of the floor material and thermal conductivity (e.g. nickel cobalt (Ni—Co), palladium (Pd), or rhodium (Rh)) while filler material 2465 may be selected with a larger emphasis on thermal conductivity (e.g. copper (Cu)) to improve overall heat transfer.

Figure 24I:
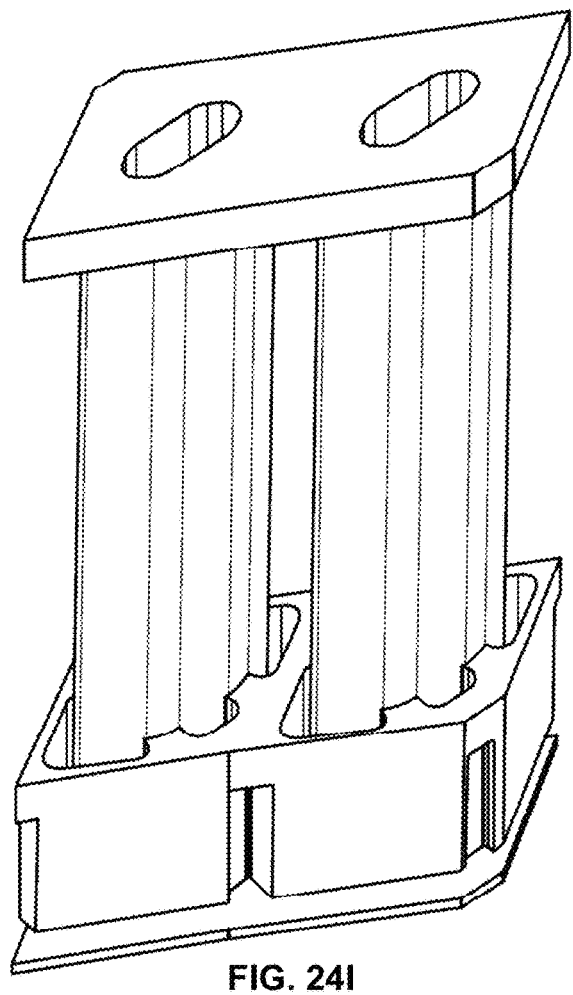
Figure 24J:
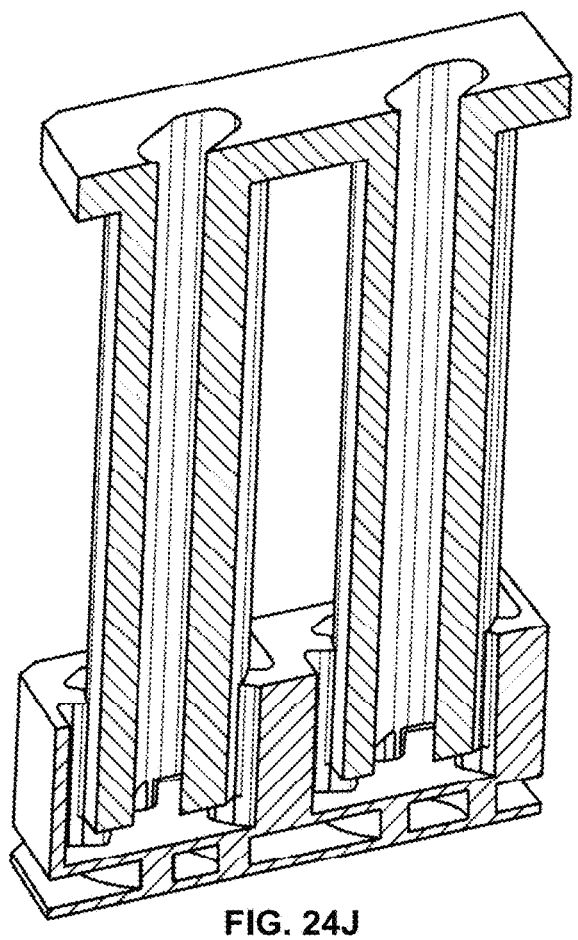

FIGS. 24I and 24J are similar to FIGS. 24G and 24H, respectively, with the exception that instead of showing views of a single integrated jet/fin and well, they show two adjacent integrated jet/fins and wells to illustrate how, in at least one embodiment, such elements may be positioned relative to each other.

In other embodiments, variations of the configurations shown in FIGS. 24A-24J may exist. Such variations may include different dimensional configurations, different configurations of bridging elements, bridging element patterning not extending the entire length of the outer surfaces of a jet element, different numbers of bridging elements and post jet channels existing per jet, different orientations of elements, different spacing or positions for adjacent jets, different patterns for incorporating different materials, and the like.

Figure 25:
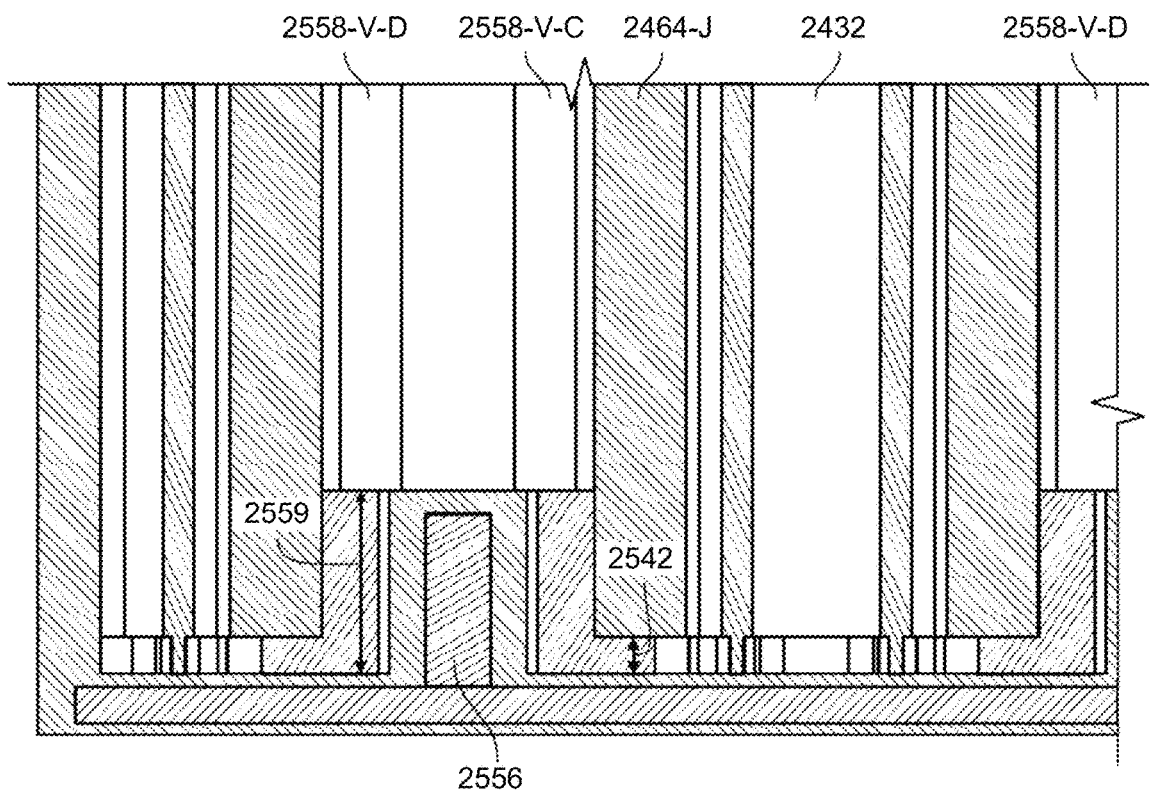
FIG. 25 provides a cut view of a jetting channel surrounded by a jet wall and fluid return channels along with a height of a solid fin, or well wall, whose upper surface forms the bottom of the exit channel.

FIG. 25 provides a cut view of a jetting channel 2432 surrounded by the jet wall 2464-J and fluid return channels 2558-V-C and 2558-V-D along with a height 2559, for example between 0.080 mm to 0.300 mm, of a solid fin 2556, or well wall, whose upper surface forms the bottom of the exit channel. A height 2542, for example 0.030 mm to 0.100 mm, of the impact region or jetting floor is also shown. In other embodiments, other dimensional ranges may be possible.

Figure 26:
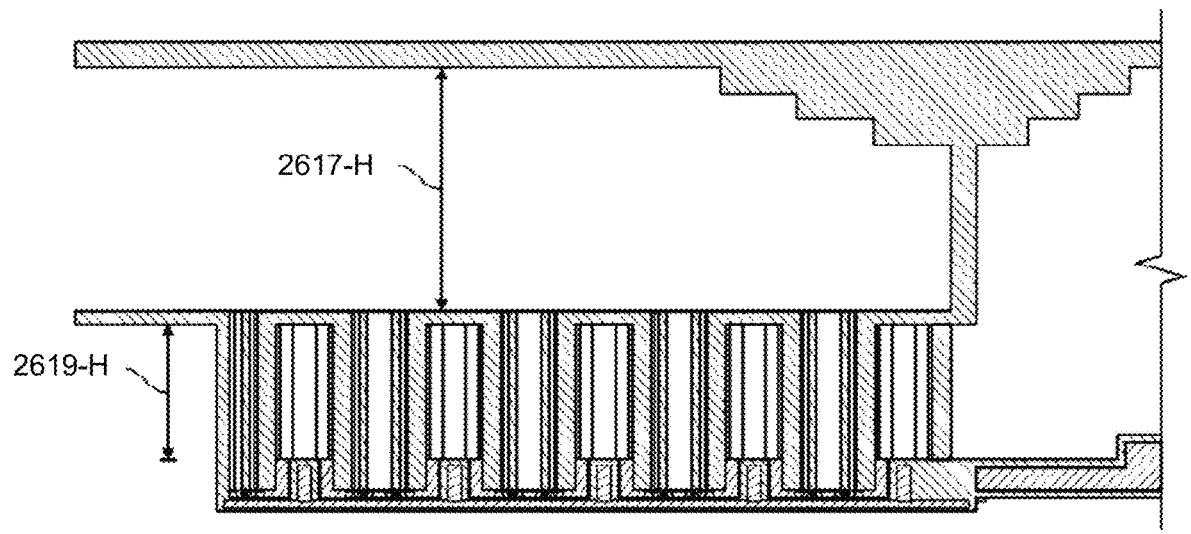
FIG. 26 provides a cut view of the cold plate of FIGS. 21-25 (with inlet and outlet headers and the heat transfer array) with sample dimensions for the inlet passage (or header) and the exit passage (or header) heights.

FIG. 26 provides a cut view of the cold plate of FIGS. 21-25 (with inlet and outlet headers and the heat transfer array) with references showing sample dimensions for the inlet passage (or header) and the exit passage (or header) heights. In some embodiments, the dimensions of inlet header height 2617-H, 0.3 mm or more, and exit manifold height 2619-H, 0.3 mm or more, are set to be at least three times the hydraulic diameter of the jet as defined by the inner contour of the jet of FIG. 24A. Hydraulic diameter is defined by the definition Dh=4*A/P, where A=cross section area of flow channel, P=perimeter length of flow channel. In embodiments where the header or manifold has a large enough flow path, a reduced need for differential tailoring of jet dimensions and jet spacing may exist to get uniform heat removal. Such differential treatment may still be required based on semiconductor hot spot location or level of hot spot heat generation. In some embodiments, outlet location may be varied from the right side configuration depicted in the present embodiment based on the particular heat removal requirements of particular application. For example, the outlet may surround the inlet, multiple smaller outlets may be used in combination with a single inlet, or a single outlet may be used in combination with multiple inlets.

Figure 27:
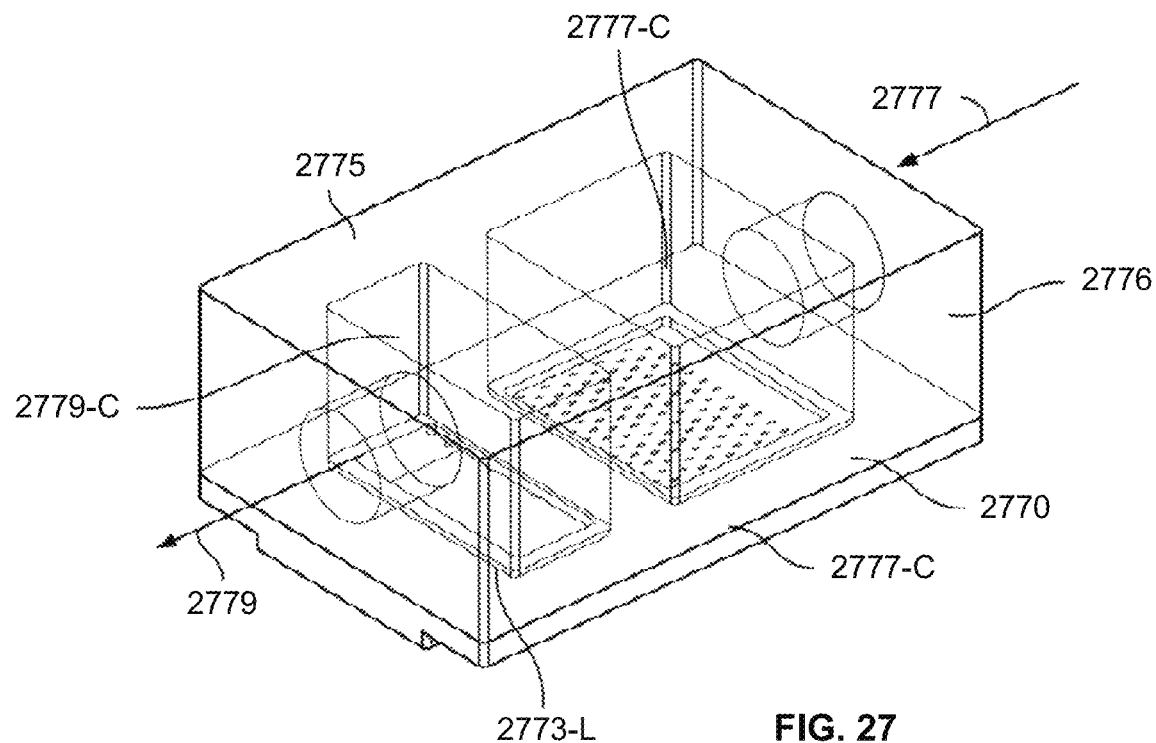
FIG. 27 provides a perspective view of another cold plate embodiment having an inlet and outlet header structure and a heat transfer array where the two can be independently formed and joined, bonded or otherwise mated at an array bonding surface.

FIG. 27 provides a perspective view of another cold plate embodiment having an inlet and outlet header structure 2775 with walls 2776, a fluid inlet 2777, a fluid outlet 2779, and a heat transfer array 2710 where the two can be independently formed and joined, bonded or otherwise mated at an array bonding surface 2770. The inlet chamber 2777-C and outlet chamber 2779-C of the header and/or the array may include a lip 2773-L near a bonding material location such that the lip can help ensure that any bonding material (e.g. solder) does not enter the chambers. In some embodiments, one or both bonding surfaces of the array and header may be coated with a bonding material (e.g. solder, such as gold tin (AuSn) eutectic or tin and silver (SnAg) eutectic, high temperature epoxy, or the like) prior to being brought into contact. Upon contact or upon other activation (e.g. heating, ultrasonic vibration, pressure, light exposure (e.g. if the header is transparent or the like)), bonding may be made to occur. In other embodiments, bonding may occur without use of an intermediate bonding agent such as by laser welding, ultrasonic bonding, diffusion bonding, o-ring sealing with clamping, or like). In some embodiments, selected portions of surfaces of one or both the header and the array may be treated (e.g. roughened, smoothed, chemically activated, applied with surface coatings, or the like) to enhance bonding or wetting of the surface or surfaces in certain locations. In other embodiments, such treatments may be used to discourage bonding or flow of a bonding material. For example, the lip area may be configured, conditioned, coated, or otherwise treated to reduce flow of bonding material so as to keep bonding material from entering the channels. As another example, selected portions of a surface of a heat transfer array that may be formed from a material that is not particularly friendly to solder wetting (e.g. nickel cobalt (NiCo), tungsten titanium (TiW)) may receive a coating of a more wettable material (e.g. palladium (Pd)) onto which solder may be placed and bonding may occur while other portions of the micro-array (e.g. the lip, or area around the lip) may forego such coating.

In some embodiments, not shown, instead of a single elevated lip around the channel openings of the micro array, multiple concentric lips, or lips of other configurations may be formed on the micro-array surface and possibly one or more corresponding notches formed in the bonding surface of the header or manifold such that upon mounting and flowing of a bonding agent, some overlap or interlacing of surface features occurs. In some embodiments, the micro-array may be made to have recesses while the header may be made to have or more protrusions. In some embodiments, the regions between all successive lips may be filled with bonding or sealing material, while in other embodiments, only regions between a portion of the lips may receive bonding or sealing material. In some embodiments, the header may be formed in any of a variety of ways (e.g. by molding or by CNC machining) from aluminum, copper or any other suitable material. The heat transfer array or portions of the array may also be formed in a number of different manners such as by electrochemical multi-material, multi-layer methods as set forth herein. The array may be formed from a plurality of multi-material layers (including one or more structural materials on each layer and one or more sacrificial materials on each layer where the structural or sacrificial materials may be different on different layers). Structural materials may include, for example, nickel cobalt for strength, rhodium for wear resistance, copper for enhanced heat flow, palladium for strength or enhanced wettability, tungsten titanium (TiW) or epoxy or other material for use as a solder mask, a solder flux, or other bonding material or bonding promoter deposited as part of the layer formation process. Seed layers and dielectric materials (e.g. plastics or ceramics) may also be incorporated into the formation process as desired.

Figure 28:
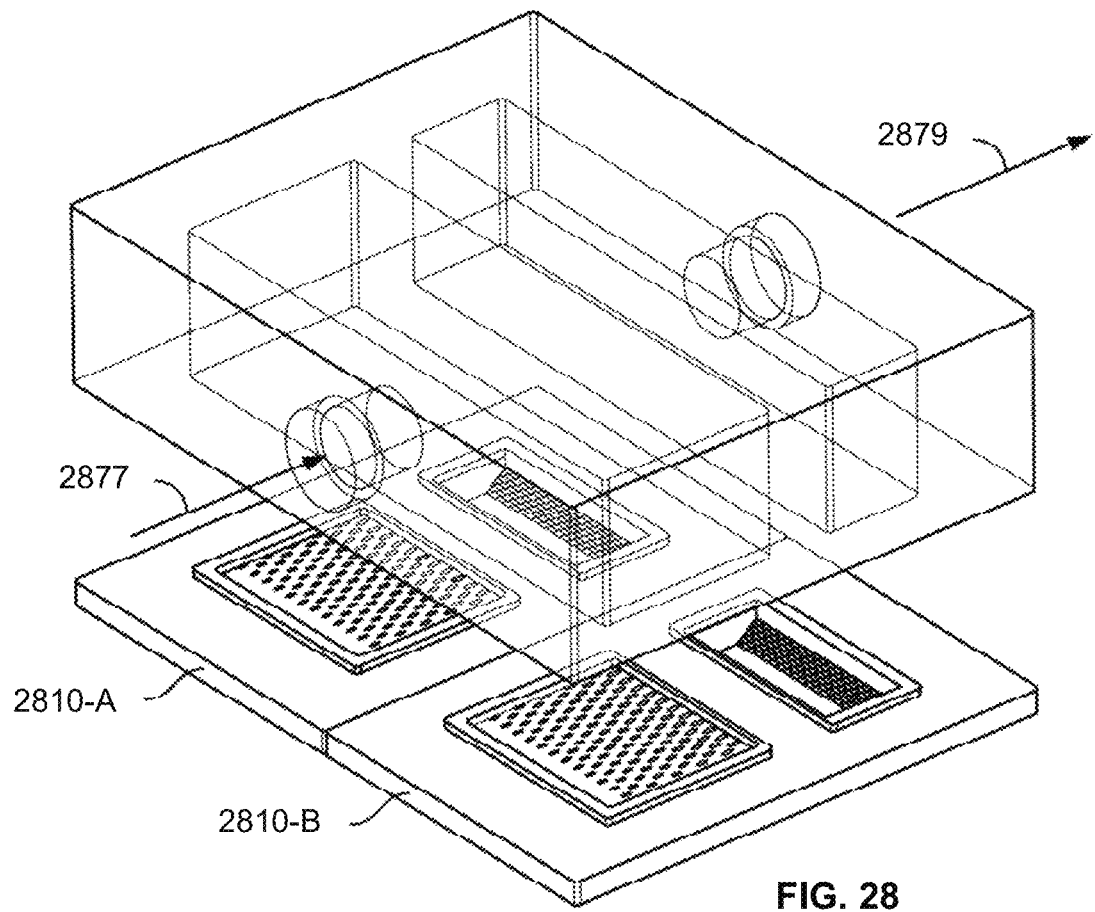
FIG. 28 provides an image of a structure including a single inlet providing manifold distribution of cooling fluid to two heat transfer arrays and outlets of the two heat transfer arrays being merged via a manifold into a single outlet.

FIG. 28 provides an image of a structure including a single inlet 2877 providing manifold distribution of cooling fluid to two heat transfer arrays 2810-A and 2810-B and outlets of the two heat transfer arrays being merged via a manifold into a single outlet 2879.

Figure 29:
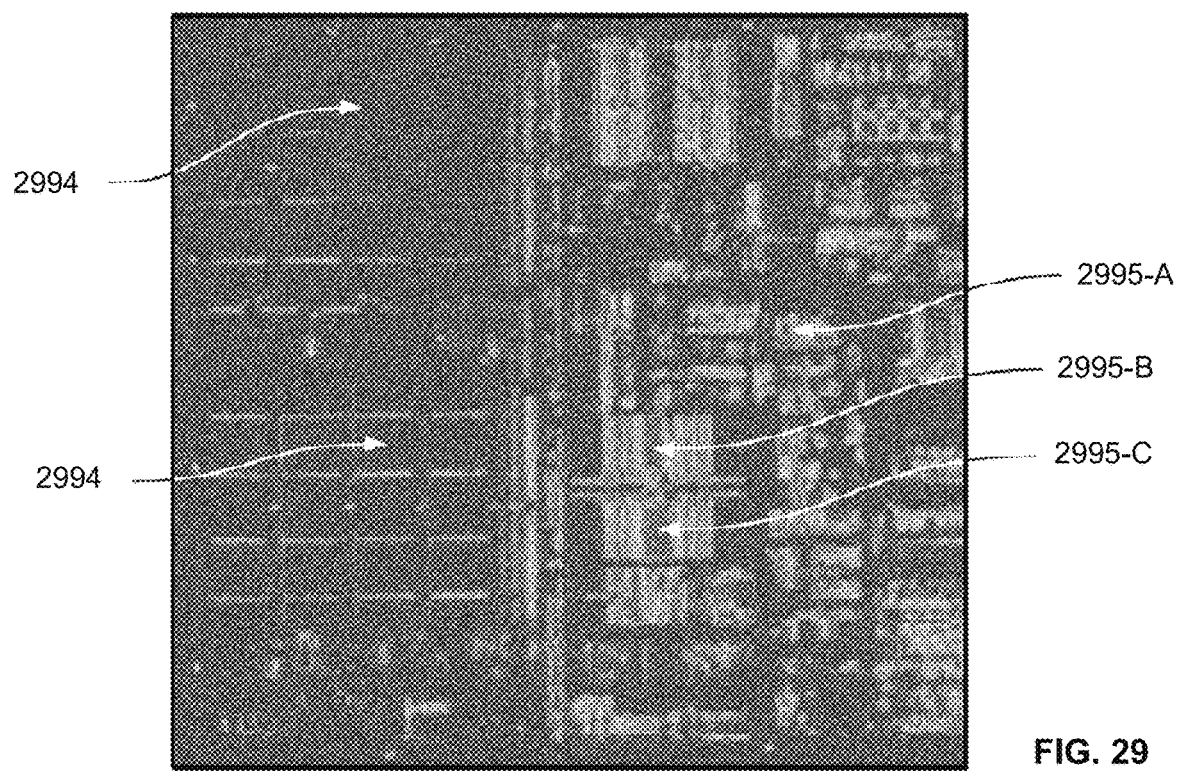
FIG. 29 provides an image of the temperature/heat profile across the X&Y dimensions of an example semiconductor device while in use.

FIG. 29 provides an image of the temperature/heat profile across the X&Y dimensions of an example semiconductor device while in use, showing relatively cool areas 2994 and hot spots 2995-A, 2995-B, and 2995-C where heat transfer arrays might be most useful. As shown, the device is not uniformly heated but has a heterogeneous temperature profile. Heat distribution across the device may be improved by use of a conductive heat spreader, but heat removal from certain areas of the device may be better handled by use of one or more heat transfer arrays as set forth herein. Of course, if the heat transfer array is the same size as the semiconductor chip or larger, it may simply cover the whole chip; however, if a single microjet array is smaller than the chip, then selective location of the heat transfer array or use of multiple arrays may be most beneficial.

Figure 30A:
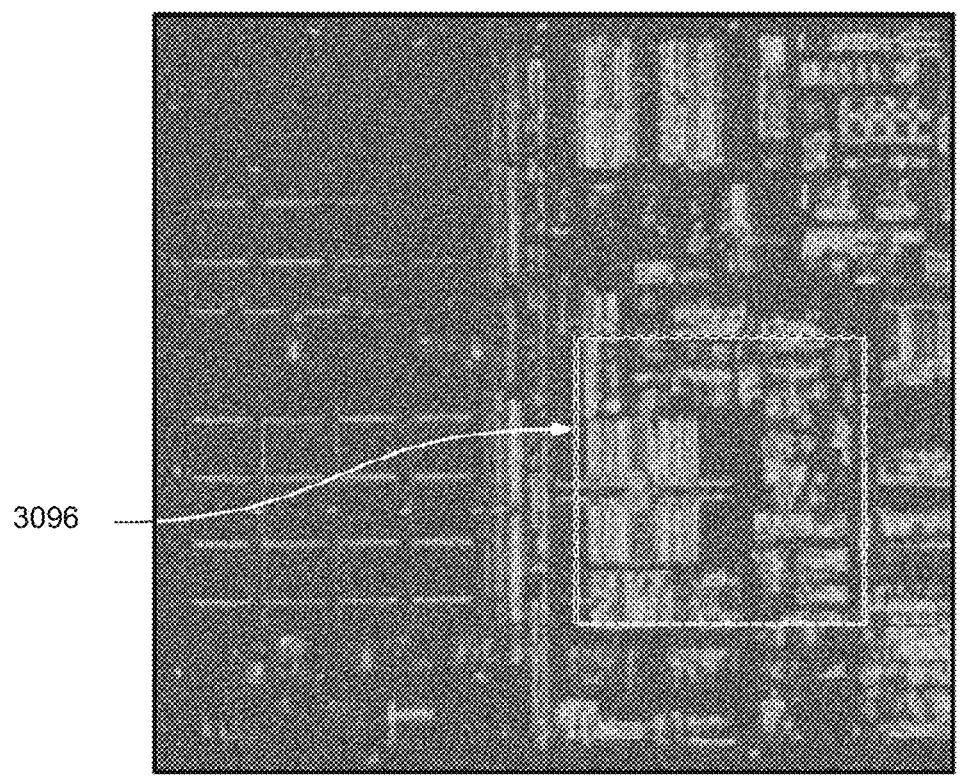
FIG. 30A provides an outline of an example heat transfer array positioned for cooling a chip of the type having a heat profile as shown in FIG. 29.
Figure 30B:
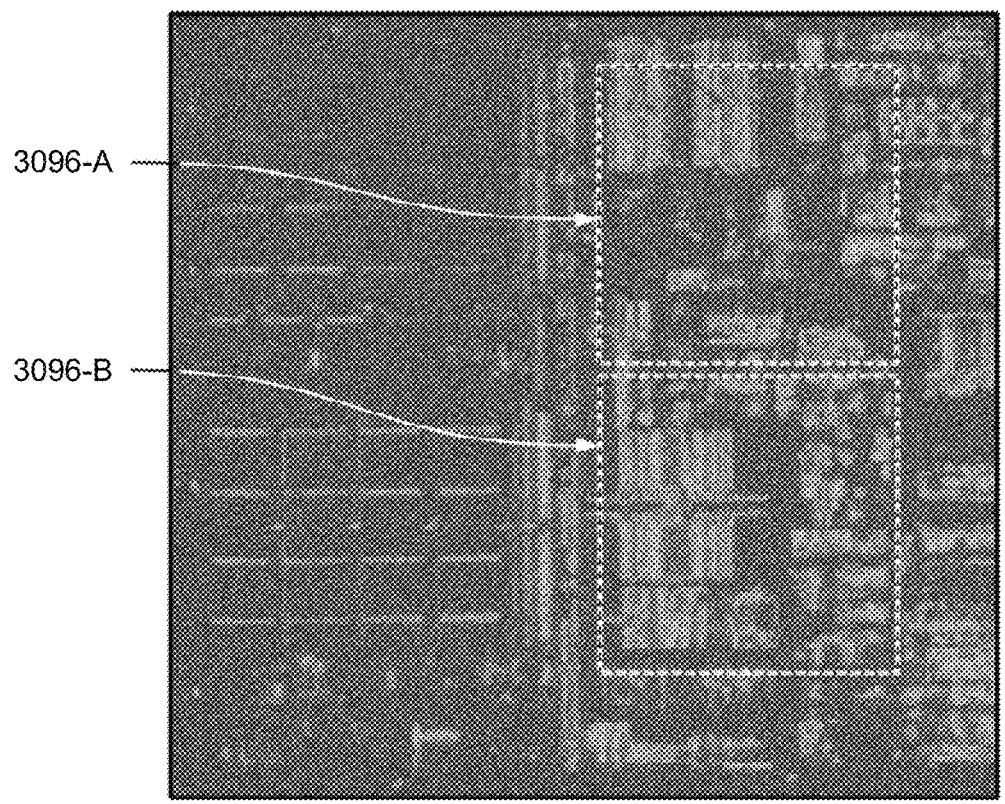
FIGS. 30B-30C illustrate possible joined (FIG. 30B) and separated (FIG. 30C) locations if two heat transfer arrays will be used either with separate headers or with a single generic or custom manifold.
Figure 30C:
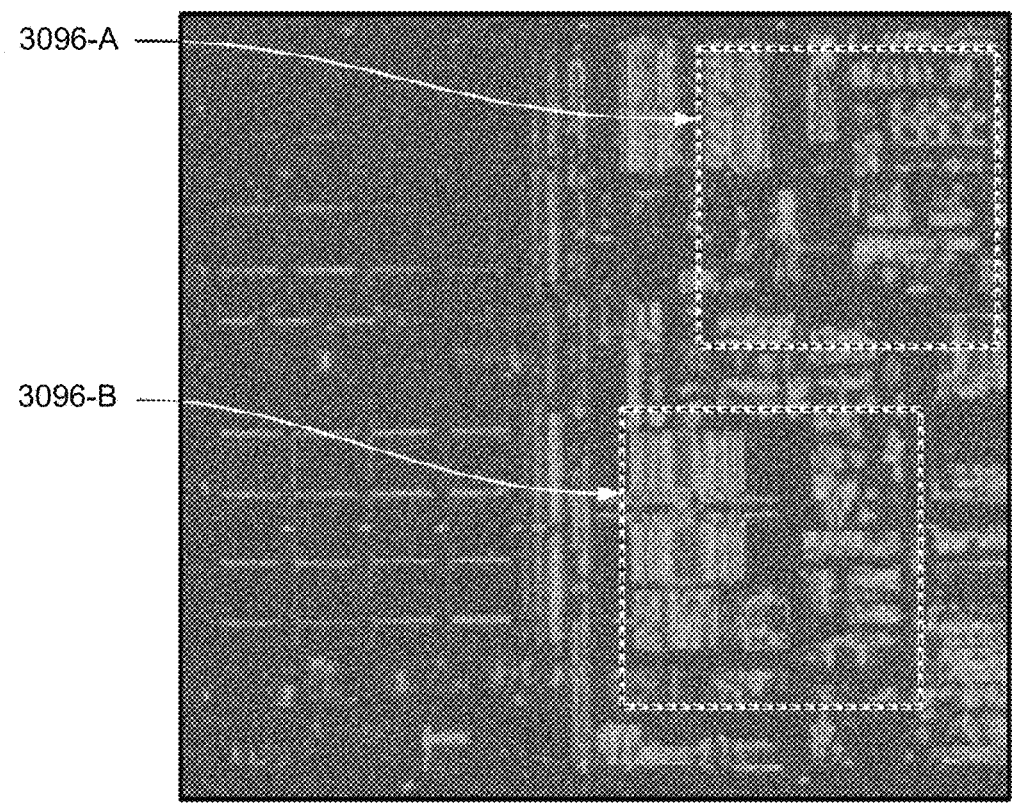

FIG. 30A provides an outline of an example heat transfer array position 3096 for cooling a chip of the type having a heat profile as shown in FIG. 29. FIGS. 30B and 30C illustrate possible joined heat transfer arrays at locations 3096-A and 3096-B (FIG. 30B) and separated heat transfer arrays at locations 3096-A and 3096-B (FIG. 30C). The two heat transfer arrays may be used either with separate headers or with a single generic or custom manifold. In other embodiments, different numbers of heat transfer arrays, heat transfer array configurations, header numbers and configurations, and manifold numbers and configurations can be used as appropriate to get the temperature profile of device to be held in an acceptable temperature range.

Figure 31A:
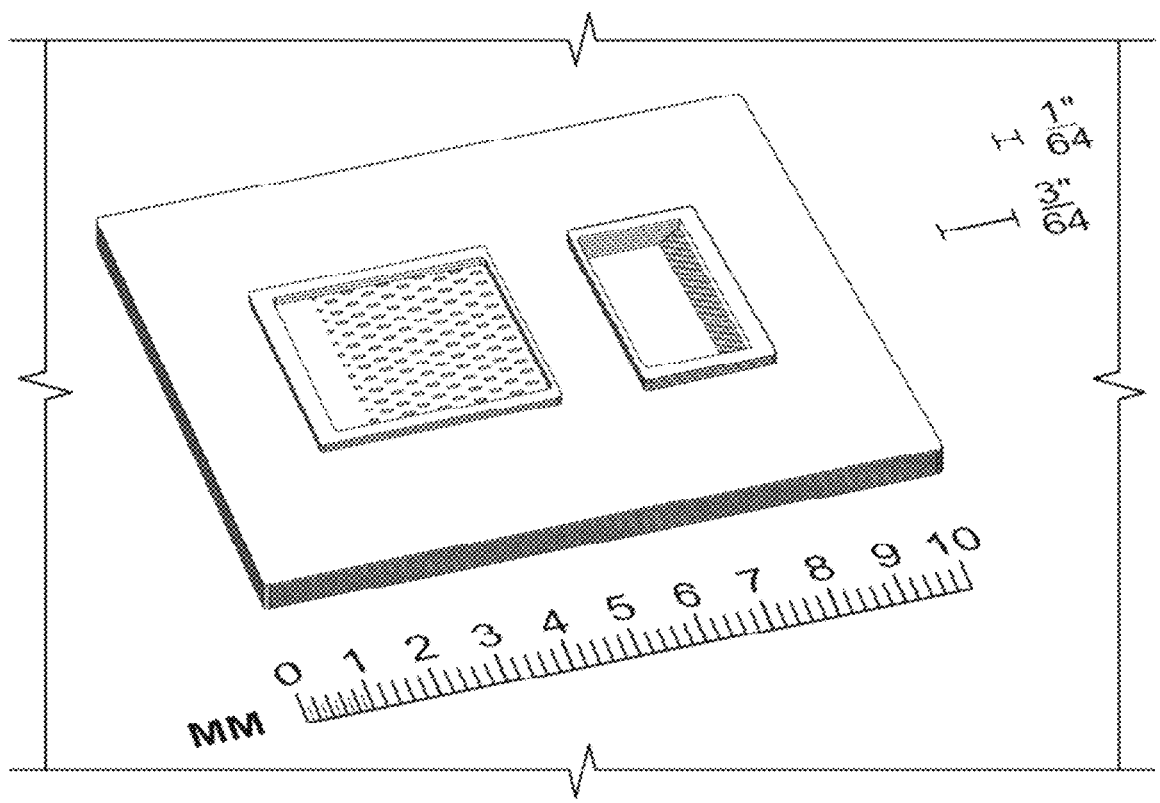
FIG. 31A provides an image of actual heat transfer array of the type set forth in FIGS. 21-27 as fabricated using Microfabrica's MICA FREEFORM® fabrication process while FIG. 31B provides a close up view of the jet entry ports as seen from the array inlet.
Figure 31B:
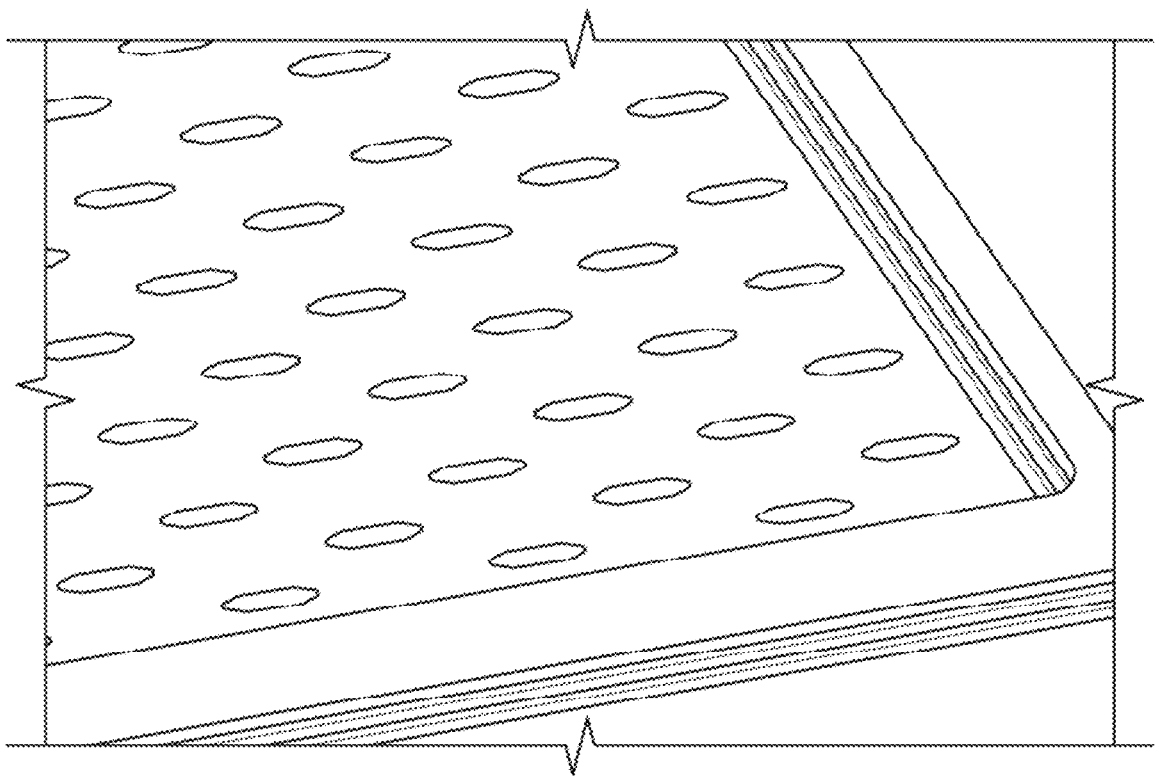

FIG. 31A provides an image of actual heat transfer array of the type set forth in FIGS. 21-27 as fabricated using Microfabrica's MICA FREEFORM® fabrication process while FIG. 31B depicts a close-up view of the jet entry ports as seen from the array inlet.

Figure 32A:
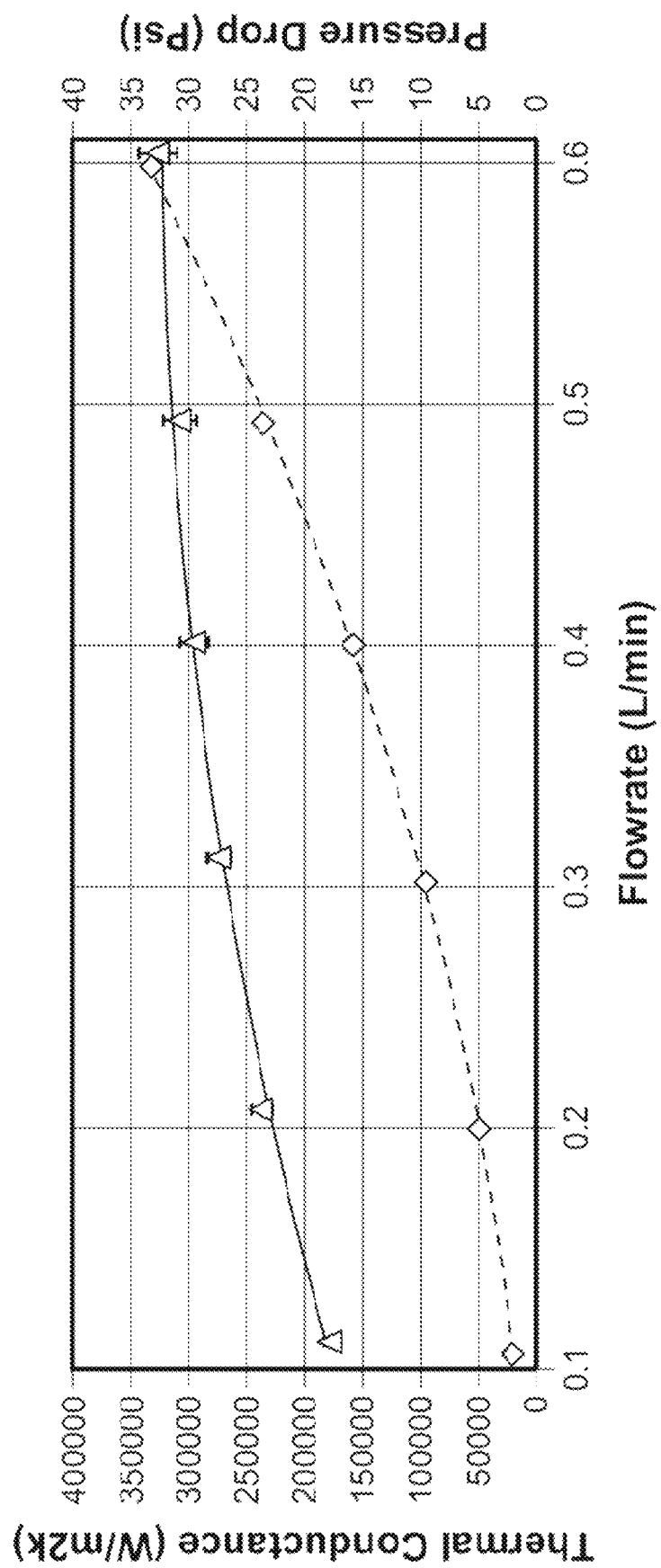
FIG. 32A provides a plot of experimental data obtained from testing a device like that of FIGS. 31A and 31B.
Figure 32B:
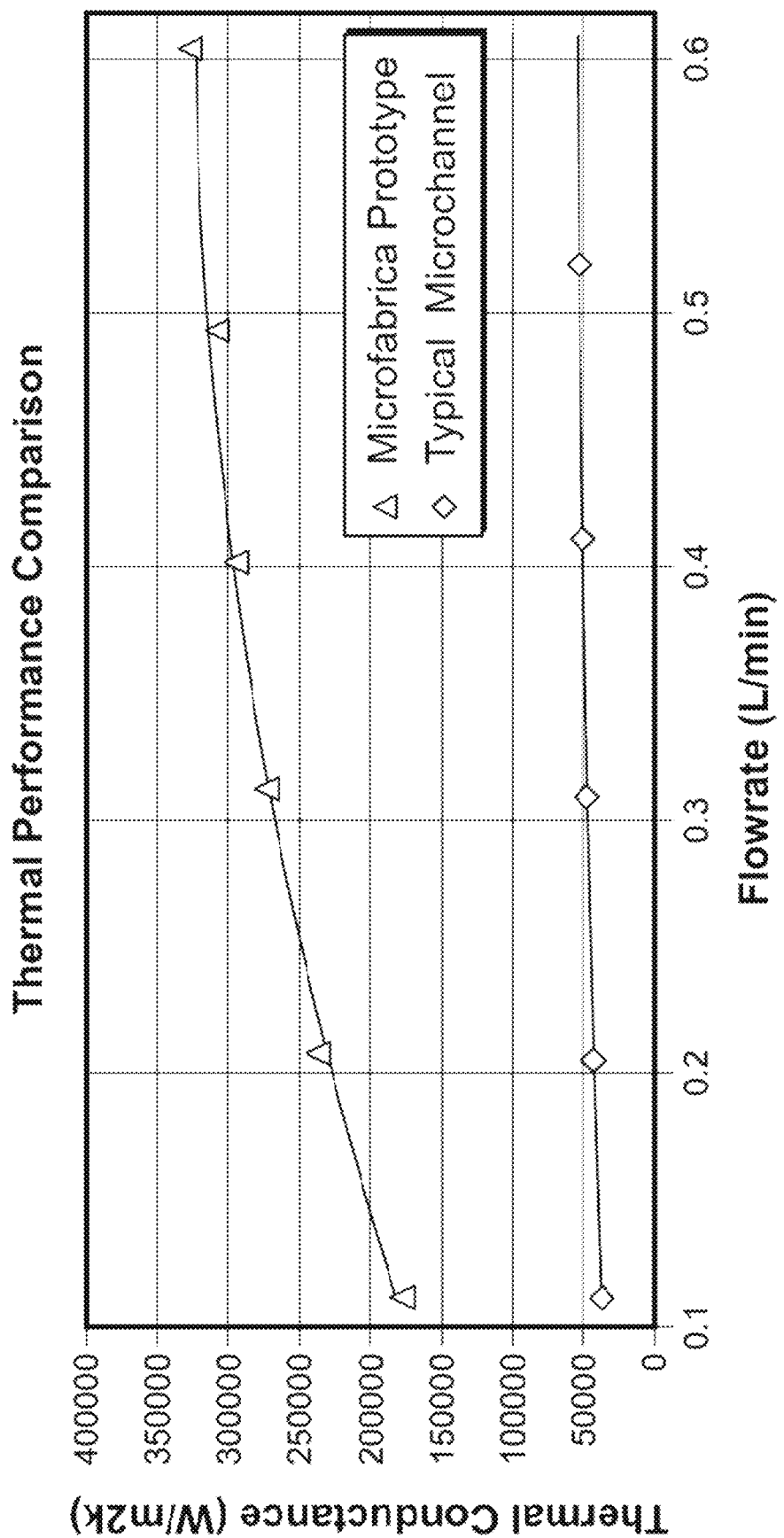
FIG. 32B provides a plot comparing thermal performance of the device of FIGS. 31A and 31B against a typical microchannel device wherein the Y-axis provides the thermal conductance in W/M2K while the X-axis set forth the flowrate in L/min.

FIG. 32A depicts a plot of experimental data obtained from testing a device like that of FIGS. 31A and 31B. This plot depicts (1) the thermal conductance of the heat transfer array in $W/M^2K$ versus water flow rate (L/min) via the top line (with triangles) and pressure drop (PSI) versus flowrate (L/min) via the lower line (with diamonds). In these experiments, the surface temperature of the semiconductor device was held at 65° C. with a water inlet temperature of 20° C. FIG. 32B provides a plot comparing thermal performance of the device of FIGS. 31A and 31B against a typical microchannel device wherein the Y-axis provides the thermal conductance in $W/M^2K$ while the X-axis set forth the flowrate in L/min. The plot indicates that the testing of a device shown in FIGS. 31A and 31B yielded a 6× improvement (line with triangles) in thermal conductance compared to a typical microchannel device at 0.5 liters per minute (LPM) with less than a 50% increase in pumping power compared to a typical microchannel device (line with diamonds).

FIGS. 33A-33E provide five different isometric views of an interior portion of a heat transfer array 3310 and jetting surface 3341 according to another embodiment of the invention wherein (a) it is assumed the array extends laterally beyond what is shown; (2) the array provides inlets 3317 and outlets 3319 on its upper surface in an alternating configurations so that lateral extension of the array in both X and Y dimensions is unobstructed, (3) the array includes one inlet for every 16 jets (ignoring potential XY array edge limitations), (4) each jet forces fluid into its own well or fin opening, (5) flow paths from inlets to jets undergo two levels of splitting with each level having a 1×4 split, (6) flow paths from jetting surfaces to outlets have an open configuration such that flow from each jet has a flow path into any outlet, and (7) the inlet-to-jet flow path provides a higher flow impedance than the jetting surface-to-outlet path.

FIGS. 33F1, 33F2, and 33G provide isometric views of the three primary elements of the heat transfer array 3310: (1) the array of jets 3340 and associated inlet ports and vertical splitting levels, (2) the wells 3355 and associated well walls (or fins) 3356 into which the jets are positioned while in an operational state, and (3) a substrate or component which provides a jetting surface 3341 or surface that is the direct recipient of fluid which is expelled from the jetting orifices, wherein the jetting surface is separated from the jets and wells in the partially exploded view of FIG. 33F1, the jets are separated from the wells and jetting surface in the partially exploded view of FIG. 33F2, and all three elements are shown separated in the fully exploded view of FIG. 33G. In some embodiments, the elements may be formed together in their operational positions (e.g. the jetting surface may be a substrate on which the jetting wells and jets and flow passages are formed using a multi-layer electrochemical fabrication process) while in other embodiments, one or more of the elements may be formed separately and all elements assembled after their individual formation (e.g. the jets and inlet flow passage may be formed by a multi-layer electrochemical formation process, the wells may be machined using a subtractive process, and the jetting surface may be a plate of a target material or multi-component structure formed by any appropriate process whereafter all elements are assembled in the desired configuration).

FIG. 33H shows the jetting and inlet flow structure 3315 and the well structure of 3356 FIG. 33F with a front right portion and a left portion removed to show the hollow structure of the jets and the relationship between the bottoms of the jets and bottom of the wells.

FIG. 33I shows a lateral cross-sectional slice through the well structure 3356 and the jets 3325 showing the rings of the jet walls 3335 located in the openings in the well structure along with an expanded view of one well 3355 and jet 3325 such that it can be seen that the jet walls do not contact the well walls, that the well walls have four protruding sections 3356-P that provide a smaller gap between the well walls and the jet structures in some locations. In alternative embodiments, different features may be provided, for example: (1) the jet structures may contain protruding elements or even flexible protruding elements that help provide centering of the jet within a well, (2) the well walls may have circular configurations without protrusions or indents, (3) the jets and the wells may contact one another at one or more lateral positions, and/or at one or more vertical levels, (4) the jets and/or wells may have other curved configurations or polygonal configurations, and (5) the dimensions may be different than those exemplified, for example, gaps, jet walls, jet channels, and spacing between wells may range from ones to tens to even hundreds of microns or more, with dimensional relationship being independent of one another, or with substantial fixed ratios or ratios that are held within certain tolerances such as between 1.5 to 1, 2 to 1, 3 to 1, 4 to 1, or even more. For example in some embodiments the indicated values may be smaller or larger by some amount such as up to 25% or even 50% smaller or more and up to 50% or even 100% larger or more.

FIG. 33J provides a side cut view of the heat transfer array 3310 and jetting surface 3341 of FIGS. 33A-33H while illustrating additional example dimensions. Like the dimensions of FIG. 33J, in other embodiments, the dimensions illustrated in FIG. 33J may be greater or smaller than those shown or may within the indicated values by some amount such as up to 25% or 50% smaller or more and up to 50% or even 100% larger or more.

FIGS. 33K1-33K2 provide two different isometric views of the jetting and inlet structure 3315 of the heat transfer array (or array portion) 3310 of FIGS. 33A-33J array while FIG. 33K3 provides a side view of the jetting and inlet structure 3315 showing heights of different portions of the structure where each such labeled portion may be formed with one or more layers of a given lateral configuration. In some embodiments, the structures may be made with more or even potentially with fewer layers. For example in some embodiments the indicated values may be smaller or larger by some amount such as up to 25% or even 50% smaller or more and up to 50% or even 100% larger or more.

FIGS. 33K4-1 to 33K4-8 each provide four different views of the jetting and inlet structure 3315 at different states in the process of forming the structure from the buildup of the eight stacked layers shown in FIG. 33K3, wherein the "-1" figure shows state after formation of the first layer, the "-2" figure shows state after formation of the second layer, and so on for each of the "-3" to "-8" figures, and wherein (a) an upper most portion of each figure provides a top view of the structural material portion of the just formed layer, (b) the next lower portion provides a side view of the structural material portion of the just formed layer, (c) the next lower portion provides a side view of the structural material of the already formed stack of layers, and (d) the lowest portion provides an isometric view of the structural material of the already formed stack of layers. From these figures, the channeling that provide fluid flow paths to and through the jet can readily be seen and understood by those of skill in the art.

FIGS. 33L1-33L3 shows various views of the well structure 3356 of the array of FIGS. 33A-33E with some sample dimensions. In other embodiments, other dimensions may be used that are compatible with jetting array structural dimensions and an overall lateral dimension of the array. For example in some embodiments the indicated values may be smaller or larger by some amount such as up to 25% or even 50% smaller or more and up to 50% or even 100% larger or more.

FIGS. 33M1-33M2 shows various views of the jetting surface structure 3341 of the array 3310 of FIGS. 33A-33E with some sample dimensions. In other embodiments, other dimensions may be used that are compatible with jetting array structural dimensions and an overall lateral dimension of the array as well as a thickness appropriate for the heat transfer requirement of the application in which the heat transfer array will be used. For example in some embodiments the indicated values may be smaller or larger by some amount such as up to 25% or even 50% smaller or more and up to 50% or even 100% larger or more.

Figure 33N:
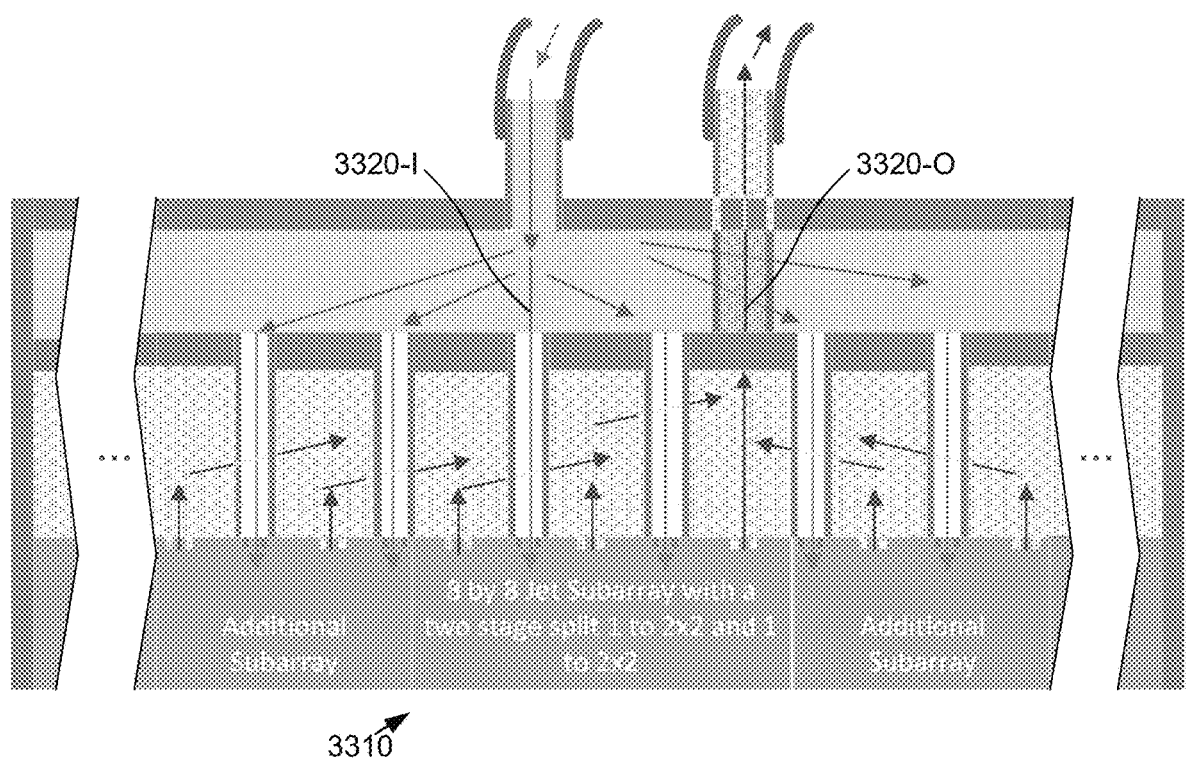
FIG. 33N provides an illustration of the array portion of FIGS. 33A-33M in combination with additional array structures or lateral extensions that end in left and right side walls (as well as front and back side walls—not shown) along with a manifold structure and/or additional layers of a heat transfer array that provides inlet fluid paths to every other opening on the top of the array plate of FIGS. 33A-33M, along with space into which outlet fluid leaving the jets can move, all in combination with a single inlet and outlet on top of the structure.

FIG. 33N provides an illustration of the array portion 3310 of FIGS. 33A-33M in combination with additional array structures or lateral extensions that end in left and right side walls (as well as front and back side walls—not shown) along with a manifold structure and/or additional layers of a heat transfer array that provides inlet fluid paths 3320-I to every other opening on the top of the array plate of FIGS. 33A-33M, along with space into which outlet fluid 3320-O leaving the jets can move, all in combination with a single inlet and outlet on top of the structure. Numerous other variations of the embodiment shown in FIGS. 33A-33N, are possible and will be apparent to those of skill in the art and include different numbers of jets and wells, different patterns and spacing for the jets and wells, different lengths of the jets, different heights of the wells, different amounts of vertical overlap of the jets and the wells, different inlet and outlet configurations and the like.

FIGS. 34A-34B2 provide various views of an array structure 3410 similar to that of FIGS. 33A-33M with the exception that the embodiment of FIGS. 34A-34B2 uses a thinner (i.e. reduced height) well structure 3456. FIG. 34A provides an exploded view (left side) and combined view (right side) of a heat transfer array 3410 similar to that of FIGS. 33A-33M with the thinner well structure 3456. FIGS. 34B1-34B2 provide a side view and top view of the well structure 3456 of FIG. 34A along with a sample dimension.

FIG. 35A provides an exploded view (left side) and combined view (right side) of a heat transfer array 3510 similar to that of FIGS. 33A-33E with the primary exception that each well structure 3556 is provided with four lateral flow paths 3320-W that connect individual wells 3555 with one another (nearest-neighbor-to-nearest-neighbor). The embodiment of FIGS. 35A-35B2 provides one or more enhancements: (1) additional flow paths for jetted fluid flow, (2) additional surface area for the transfer of heat from the wells or fins to a cooling fluid, and (3) the provision of gaps that can limit the propagation of stress from one side of the array/well structure to the other which may be of significance when the well structure and the jetting surface have different coefficients of thermal expansion.

FIGS. 35B1-35B2 provide a side view and top view of the well structure 3556 of FIG. 35A along with a number of sample dimensions. In other embodiments, other dimensions, either smaller or larger, may be used. For example in some embodiments the indicated values may be smaller or larger by some amount such as up to 25% or even 50% smaller or more and up to 50% or even 100% larger or more. While in still other embodiments, additional or different flow path connects may be used such that some or all wells have more than four flow paths, some or all wells have less than four flow paths, or some wells have no flow paths while others are provided with such flow paths. In other embodiments, other configurations of well openings may be used along with changes to the orientation or number of flow paths. In still other embodiments, the flow paths may not be straight.

Figure 36C:
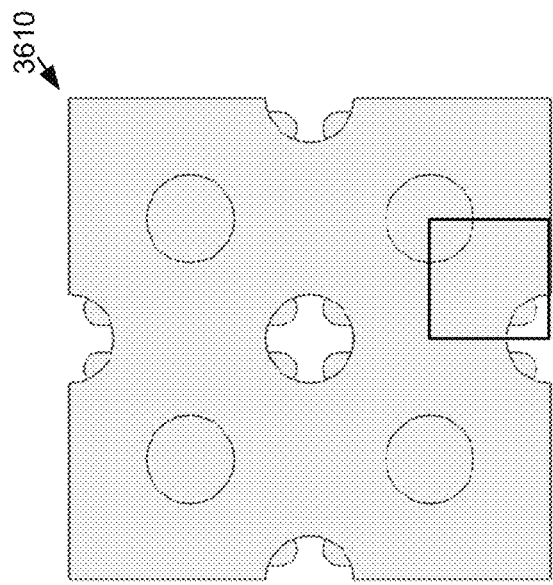
FIGS. 36A-36D illustrate a single four jet segment portion of a jetting structure and associated inlet flow path structure which is similar to that of jetting structure of FIGS. 33A-33E in combination with a jetting surface structure, and a well structure that provides eight connective flow paths to each well (i.e. four connecting to the nearest neighbors and four connecting to the next nearest neighbors).
Figure 36D:
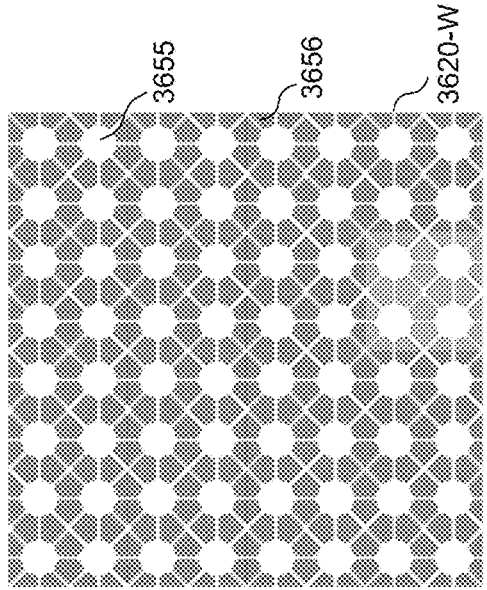
Figure 36A:
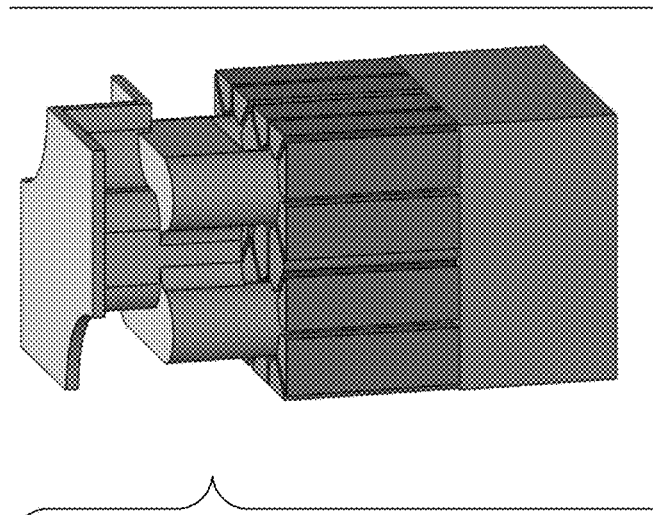
Figure 36B:
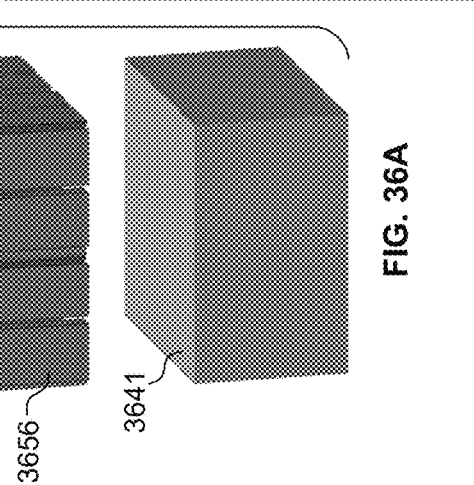

FIGS. 36A-36D illustrate a single four jet segment portion of a jetting structure and associated inlet flow path structure 3615 which is similar to that of the jetting structure of FIGS. 33A-33E in combination with a jetting surface structure 3641, and a well structure 3656 that provides eight connective flow paths 3620-W to and from each well 3655 (i.e. four connecting to the nearest neighbors and four connecting to the next nearest neighbors). The left side of FIG. 36A provides an exploded isometric view while the right side of FIG. 36A provides an assembled view or fully configured state, FIG. 36B provides a top view of the well structure 3656 to better show the connective flow paths 3620-W as well as to show a lack of inward protruding structures that existed in the embodiment of FIG. 33I, FIG. 36C provides a top view of the upper portion of a heat transfer array 3610 of FIGS. 33A-33E with a rectangular section marked near the lower right corner that illustrates the position of the array portion shown in FIG. 36A to that of the array structure of FIGS. 33A-33E, and FIG. 36D showing an extension of the well structure of FIG. 36A expanded to the same number of jets and wells as illustrated in the array segment of FIGS. 33A-33E.

FIGS. 37A1-37A6 provide a number of views of a heat transfer array segment 3710 wherein the array structure only includes single stage (1×4) split along with segmented well structure 3756 and a jetting surface structure 3741 with FIGS. 37A1 and 37A2 showing an isometric view and a top view of the structure in a first rotational orientation (about a vertical axis or Z axis that extends in a layer stacking direction), while FIGS. 37A3 to 37A5 show the same structure as that of FIG. 37A1 but at different vertical orientations whereby by combination of the four illustrated views would provide a complete inlet and associated 16 jetting structures, and wherein the FIG. 37A6 shows the structure tilted so that the bottom of the jetting surface structure can be seen.

FIGS. 37B1-37B6 provide similar views to those shown in FIGS. 37A1-37A6 with the exception that the jetting surface structure has been removed so as to better illustrate the relationship between the jets 3725 and the wells 3755 wherein a recession of the bottom of the jets compared to the bottom of the wells can be seen in FIG. 37B6, the lack of inward facing protrusions on wells can be more clearly seen as compared to those existing in FIGS. 33I, and a better understanding of the flow path splitting structure can be appreciated.

FIGS. 37C1-37C6 provide similar views to those shown in FIGS. 37A1-37A6 and 37B1-37B6 with the exception that only the jetting structure and inlet path structure 3715 is shown.

FIGS. 37D1-37D2 illustrate the top and bottom views, respectively, of a combination of the four structural elements of FIGS. 37A1, 37A3, 37A4, and 37A5 that produce an array 3710-D with a single full inlet, four partial outlets at the corners, and total of 16 jets.

FIGS. 37E1-37E2 illustrate top and bottom views, respectively, of four copies of the combination of the four structural elements of FIGS. 37A1, 37A3, 37A4, and 37A5 as used to produce a heat transfer array or partial heat transfer array 3710-E with one full center outlet, four full intermediate inlets, four edge half outlets, and four corner quarter edge outlets, along 64 jets, 64 wells and associated connection paths.

FIG. 37F provides a side view of the jetting and inlet structure 3715 showing heights of different portions of the structure of FIGS. 37C1 to 37C6 where each such labeled portion may be formed with one or more layers of a given lateral configuration. In some embodiments, the structures may be made with more or even potentially with fewer layers and other dimensional changes may be made in a manner similar to that noted above with regard to FIGS. 33A-33N FIGS. 37G1 to FIG. 37G6 each provide four different views of the jetting and inlet structure 3715 at different states in the process of forming the structure from the buildup of the six stacked layers shown in FIG. 37F, wherein the "G1" figure shows state after formation of the first layer, the "G2" figure shows state after formation of the second layer, and so on for each of the "G3" to "G6" figures, and wherein (a) an upper most portion of each figure provides a top view of the structural material portion of the just formed layer, (b) the next lower portion provides a side view of the structural material portion of the just formed layer, (c) the next lower portion provides a side view of the structural material of the already formed stack of layers, and (d) the lowest portion provides an isometric view of the structural material of the already formed stack of layers.

FIGS. 38A1-38A4 provide four different isometric views of a four jet portion of a heat transfer array 3810 having two (1×4) vertical splitting levels along with a well structure 3856 and a jetting surface structure 3841 wherein the wells and jets are joined to each other along a substantial portion of their vertical lengths with a gap and offset jetting surface contact structure at the bottom so as to force jetted fluid to move not only radially and vertically to an outlet passage but in addition, to move radially, vertically a short distance than circumferentially, and then vertically again (e.g. to provide more forced fluid to fin contact and thus more heat transfer).

FIG. 38B shows an exploded view of the structure of FIGS. 38A1 to 38A4 with the jetting surface structure 3841 separated from the jets 3825 and well walls 3856.

FIGS. 38C1-38C4 show several isometric views of portions of a jetting structure 3835 including structural elements 3839 that form a bridge between a circular jet wall and a circular well wall.

FIG. 38D provides a side view of the jetting and inlet structure, jetting surface structure, and the well structure showing heights of different portions of the structure of FIG. 38A1 to 38A4 where each such labeled portion may be formed with one or more layers of a given lateral configuration. In some embodiments, the structures may be made with more or even potentially with fewer layers.

FIGS. 38E1-38E12 each provide four different views of the structure 3810 of FIG. 38D including the jetting and inlet structure 3815, the well structure 3856, and jetting surface structure 3841 (as appropriate) at different states in the process of forming the structure from the buildup of the twelve stacked layers shown in FIG. 38D, wherein the "E1" figure shows the state after formation of the first layer, the "E2" figure shows state after formation of the second layer, and so on for each of the "E3" to "E12" figures, and wherein (a) an upper most portion of each figure provides a top view of the structural material portion of the just formed layer, (b) the next lower portion provides a side view of the structural material portion of the just formed layer, (c) the next lower portion provides a side view of the structural material of the already formed stack of layers, and (d) the lowest portion provides an isometric view of the structural material of the already formed stack of layers.

FIGS. 39A1-39A4 provide four different isometric views of a four jet portion of a heat transfer array 3910 having two (1×4) vertical splitting levels along with a well structure 3956 and a jetting surface structure 3941 wherein the wells 3955 and jets 3925 are joined to each other via bridging element 3939 that is part of every other layer with successive bridges being circumferentially rotated (i.e. rotated in Θ in a R, Θ, Z coordinate system centered on the middle of a jet, where Z extends along the build axis) so as to force jetted fluid to move not only radially and vertically to an outlet passage but instead to move radially and then back and forth vertically and circumferentially a number of times while traversing the height of the well or fin wall (e.g. to provide more forced fluid to fin contact and possibly more turbulent flow and thus more heat transfer).

FIG. 39B shows an exploded view of the structure of FIGS. 39A1 to 39A4 with the jetting surface structure 3941 separated from the jets 3925 and well walls 3956.

FIGS. 39C1-39C4 provide a top view (FIG. 39C1) and several isometric views of a jetting structure 3935 including structural elements 3939 that form a bridge between a circular jet wall and a circular well wall where the back and forth rotation of the bridge elements can be seen. The depiction in FIGS. 39C1 to 39C4 is somewhat artificial and that the bridging elements are no more part of the jet structure than the well structure but instead all three configurations are part of a single monolithic structure.

FIG. 39D provides a side view of the jetting and inlet structure 3915, jetting surface structure 3941, and the well structure 3956 showing heights of different portions of the structure of FIGS. 39A1 to 39A4 where each such labeled portion may be formed with one or more layers of a given lateral configuration. In some embodiments, the structures may be made with more or even potentially with fewer layers.

FIGS. 39E1-38E22 each provide four different views of the structure 3910 of FIG. 39D including the jetting and inlet structure 3915, the well structure 3956, and jetting surface structure 3941 (as appropriate) at different states in the process of forming the structure from the buildup of the twenty-two stacked layers shown in FIG. 39D, wherein the "D1" figure shows state after formation of the first layer, the "D2" figure shows state after formation of the second layer, and so on for each of the "D3" to "D22" figures, and wherein (a) an upper most portion of each figure provides a top view of the structural material portion of the just formed layer, (b) the next lower portion provides a side view of the structural material portion of the just formed layer, (c) the next lower portion provides a side view of the structural material of the already formed stack of layers, and (d) the lowest portion provides an isometric view of the structural material of the already formed stack of layers.

FIGS. 40A1-40A2 provide two different isometric views of a 16 jet portion of a heat transfer array 4010 having a single (1×4) vertical flow path split between an inlet and the jets 4025 and wherein above the split structure a compliance enhancing vertically extending recess (or ring like notch or channel) exists in a connection plate 4037 that supports the jets 4025 and that joins neighboring inlet 4017 and outlet 4019 openings to reduce a risk of thermal expansion differences resulting in damaging levels of stress being transmitted between jets and well walls and/or thermal expansion differences causing heat transfer efficiency losses as a result of jets and wells being misaligned.

FIGS. 40B1 and 40B2 provide different isometric views of the jet and inlet path structure 4015 of FIGS. 40A1 and 40A2.

FIG. 40C1 provides an isometric view of the well structure 4056 of FIGS. 40A1 and 40A2 while FIG. 40C2 provides a top view of the well structure with its diagonal flow paths 4020-W connecting the wells 4055 diagonally.

FIG. 40D provides an isometric view of a lower portion of the well structure 4056 of FIGS. 40A1 and 40A2 which is substantially identical to that of FIG. 40C1 with the exception that it is formed as a thinner layer. FIG. 40E provides an isometric view of a jetting surface structure 4041.

FIGS. 40F1 and 40F2 provide an isometric view of the heat transfer array portion 4010 shown in FIGS. 40A1 and 40A2 along with the mounted jetting surface structure 4037 while FIG. 40F2 provides a side view of the structure 4010 of FIG. 40F1 along with dimensional labels.

FIGS. 40G1-40G11 each provide four different views of the structure 4010 of FIG. 40F including the jetting and inlet structure 4015, the well structure 4056, and jetting surface structure 4041 (as appropriate) at different states in the process of forming the structure from the buildup of the eleven stacked layers shown in FIG. 40F, wherein the "G1" figure shows state after formation of the first layer, the "G2" figure shows state after formation of the second layer, and so on for each of the "G3" to "G11" figures, and wherein (a) an upper most portion of each figure provides a top view of the structural material portion of the just formed layer, (b) the next lower portion provides a side view of the structural material portion of the just formed layer, (c) the next lower portion provides a side view of the structural material of the already formed stack of layers, and (d) the lowest portion provides an isometric view of the structural material of the already formed stack of layers.

FIGS. 41A1-41A2 provides two different isometric views of a 16 jet portion of a heat transfer array 4110 having a single (1×4) vertical flow path split between an inlet and the jets 4125 and wherein (1) above the split structure, a compliance enhancing vertically extending recess exists in a connection plate 4137 that supports the jets 4125 and that joins neighboring inlet 4117 and outlet 4119 openings to reduce a risk of thermal expansion differences resulting in damaging levels of stress being transmitted between jets and well walls and/or thermal expansion differences causing heat transfer efficiency losses as a result of jets and wells being misaligned, (2) individual well jets 4125 are fixedly joined by a plurality of bridge elements 4138 (e.g. four) that extend the length of the wells 4155 other than at the junction of the jetting surface and the wells and that divide the post jetting path for each well into a plurality of isolated flow paths (e.g. four), (3) diagonal paths 4120-W connecting the isolated post jetting flow paths from four wells to one another, and to one another, and (4) extended flow paths 4120-W that join selected central portions of diagonal flow paths together that result in groups of wells having higher level of stress separation from one another than do individual wells.

FIG. 41B provides an isometric view of the jet and inlet path structure 4115 that is above the well structure 4156 while FIG. 41C1 provides an isometric view of the combined jet 4125 and well structure 4156 and FIG. 41C2 provides a laterally extending cross-section of the well/jet combination so that the jet flow paths, return paths adjacent the jet walls and the connecting paths, and groups of wells/jets can be seen.

FIG. 41D provides an isometric view of a lower portion of the well structure of FIGS. 40A1 and 40A2 where jet walls do not exist immediately above the jetting surface.

FIG. 41E provides an isometric view of a jetting surface 4141 that is not shown in FIGS. 41A1 and 41A2 but is mounted to, or otherwise made to join, the lower portion of the wells of FIGS. 41A1 and 41A2.

FIGS. 41F1 and 41F2 provide an isometric view of the structure 4115 of FIG. 41B along with a single jetting structure showing the bridging elements 4138 that effectively join a circular jet to the side walls of a circular well while FIGS. 41G1 and 41G2 show two different enlarged isometric views of a ribbed jetting structure where the lower ends of the jets end prior to contacting the jetting surface while ribs or bridge structures 4141-R continue to the jetting surface 4141 and make direct contact therewith.

FIGS. 41H1 and 41H2 respectively provide an isometric view and a side view of the structure 4110 of FIGS. 41A1 and 41A2 combined with the jetting structure of FIG. 41E.

FIGS. 41I1-41I11 each provide four different views of the structure of FIGS. 41H1 and 41H2 including the jetting and inlet structure 4115, the well structure 4156, and jetting surface structure 4141 (as appropriate) at different states in the process of forming the structure from the buildup of the eleven stacked layers shown in FIG. 40H2, wherein the "I1" figure shows state after formation of the first layer, the "I2" figure shows state after formation of the second layer, and so on for each of the "I3" to "I11" figures, and wherein (a) an upper most portion of each figure provides a top view of the structural material portion of the just formed layer, (b) the next lower portion provides a side view of the structural material portion of the just formed layer, (c) the next lower portion provides a side view of the structural material of the already formed stack of layers, and (d) the lowest portion provides an isometric view of the structural material of the already formed stack of layers.

In some embodiments, devices (e.g. microjet and microchannel portions of the cold plate, i.e. the heat transfer array portion) may be fabricated by an additive layer process such as a multi-layer, multi-material process as set forth herein. Such devices may undergo post processing treatment or undergo one or more breaks in the middle of layer processing to modify the structural or surface configuration of the structures being formed or to apply additional processing steps that might not be effectively implementable after layer formation is complete (e.g. use of a high pressure abrasive particle flow to smooth sharp corners in fluid channels, application of coatings or surface treatments while access to such surfaces is not blocked by material forming subsequent layers, use of partial sacrificial material removal processes to make post layer formation of sacrificial material easier).

Some alternative embodiments may be created by selecting features associated with one or more embodiments or aspects and combining them with one or more features from one or more other embodiments or aspects.

Features of some embodiments include: (1) heat transfer arrays with multilevel microchannels that are integrated with microjet arrays where the two elements are connected via multiple levels to maximize heat transfer capability and efficiency; (2) corrosion and erosion may be minimized by using high strength electrodepositable materials (e.g. nickel cobalt (NiCo), palladium, rhodium, or the like in selected areas); (3) corrosion and erosion may be minimized or at least effectively managed by local thickening at impingement areas; (4) dimensions of features in a heat transfer array may be uniquely optimized for fluid flow, for example, slot jet dimensions and fin dimensions may vary from jet-to-jet and from inlet-to-outlet to optimize or at least bring heat transfer to a desired level of efficiency or effectiveness; and (5) heat transfer arrays and cold plates may be optimized to the unique requirements of specific heat sources by changing dimensions, directions of fluid flow, locations of inlets and outlets, and the like. In some embodiments, the fluid impingement surface or surfaces struck by flow from jets may act as the largest single area or areas of heat transfer while not necessarily providing for the majority of the heat transfer. For convenience, such area or areas may be termed primary heat transfer region(s) or area(s), though other regions such as regions between jet walls and well walls or within well channels may provide less, comparable, or even more total heat transfer. The relative contribution of each such region to heat transfer and to fluid pressure drop (or flow resistance) depends on surface area, fluid flow rate, temperature differential, flow turbulence, and the like. Modulation of variables such as, for example, number of jets, number of inlets, number of outlets, number of splitting chambers, size of splitting chambers, number of splitting levels, jet configuration, jet height, jet length, jet diameter, impact surface height, impact surface area, return channel width, return channel height, return channel length, locations of flow deflectors, variations in surface texture, surface and interior material properties, inclusion of stress relief structures, and the like, may be used to achieve a desired balance of fluid flow, fluid pressure differential, and heat flow or extraction capability. These parameters are not fixedly linked but can be independently adjusted using the design flexibility enabled by multi-layer electrochemical fabrication methods. To provide active temperature control from two temperature directions, some heat transfer arrays and/or some cold plates may incorporate heating elements (e.g. electrical heating elements) as well as cooling elements. In some embodiments, well-to-well flow paths or other flow paths may be provided to allow fluid flow from multiple jets to reach any specific area and/or to allow multi-path outflow of fluid from any given area to mitigate risk of array function failure due to blocked passages or a relatively small number of jets or other array elements (e.g. to maintain array functionality even in view of a 5%, 10%, 20% or even possibly 30% jet failure).

As noted previously, in some embodiments the bottom of each jet at one or more locations, e.g. at four locations, connect structurally to the surface onto which jetting occurs. This means that not only do the jets remove heat from the floor onto which jetting occurs via a flow of jetted fluid but also via heat conduction upward from the floor through the material of the jet wall. This means that the jet, in addition to functioning as a jet, also functions as a fin. Said another way, in these embodiments, these fin structures are hollow, and in addition to providing fin functionality, they also form jetting structures so as to provide overall improved heat removal and more effective use of volumetric space. These jets/fins also provide further heat removal, for example, via conducted heat by the portions of the jets/fins (portions below the top of the walls of the jetting wells) releasing conducted heat to the incoming jet stream via the interior surface of the jet structure and to the exiting jet stream via the external surface of the jetting/fin structure. In some embodiments, the upper surfaces of the jets may also remove further conducted heat via the flow of exhausted jetted fluid via the fluid flowing through a fluid exit path, channel, level or layer. Similarly the fins located between the jets that define the jetting wells also conduct heat away from the heat source via contact with exiting jetted fluid along their side walls and along their upper surfaces as well as along any supporting columns or jet side walls that extend upward therefrom. In some embodiments, like some of those shown, the fins (that also function as jets) are elongated to help with fluid flow by reducing flow resistance while at the same time providing more surface area for transferring heat from the side walls to the incoming and exiting fluid.

In some alternative embodiments, more than one inlet may be used, more than one outlet may be used, more than a single inlet level (e.g. in the Z-direction, e.g. direction parallel to an axis of layer stacking) and outlet level may be used.

In some embodiments, fluid flow through a whole thermal management system may involve transport of a trapped fluid from a primary heat pick up location, i.e. jetting impingement surface and primary heat transfer region, to an exit channel of a header or manifold, to a conventional heat exchanger (e.g. that removes heat by transferring to another fluid such as air or to a larger sink), to an optional filter (e.g. with a pore size of 10s of microns, to micron level or finer), to a pump, to an optional filter (e.g. micron level filter or finer), to an inlet of a header or manifold and back to the primary heat transfer location.

In some embodiments, a hybrid microjet and microchannel heat transfer array is provided to take advantage of the high convection performance of the microjet and the high surface area of a microchannel. In some embodiments, the microjet may include fin functionality. In some embodiments, cold plates are miniaturized by using a micro additive manufacturing process (such as those described herein) alone or in combination with traditional manufacturing to produce micro heat transfer arrays in high volume. In some embodiments, multilayer microchannels with microjets connecting the multiple layers creates 3-D flow behavior that generates high convection coefficients and heat transfer at all surfaces. In some embodiments, high strength materials like nickel cobalt (NiCo), or palladium, or anti-corrosion combinations of materials may be used to minimize corrosion and the generation of particles that can jam the fluid system and cause failure of pumps or jets. In some embodiments, volumes with high fluid velocities or turbulent flow may be reinforced (with hard materials such as rhodium) to minimize erosion of the surface over time. In some embodiments, composite material construction may be used to allow for optimizing strength, conductivity, and surface properties as needed.

Various embodiments of the invention may provide thermal management for various devices and the heat transfer arrays may be used to move heat generated by a variety of devices including for example: (1) an IC; (2) a microprocessor; (3) an SOC; (4) an RFIC, e.g. an RF transmitter or RF receiver; (5) an optical transmitter or receiver; (6) a power amplifier; (7) a GPU; (8) a CPU; (9) a DSP; (10) an ASIC; (11) an APU; (12) an LED; (13) a laser diode; (14) a power electronic device, e.g. a power inverter or a power converter; (15) a photonic devices, (16) a propulsion system; (17) a solar array, e.g. for a micro satellite; (18) a radiator, e.g. for a micro satellite; (19) an engine of a micro drone; (20) a spacecraft component such as an SSPA; (21) a traveling wave tube amplifier; (22) a package that holds one or more of the devices of (1)-(21), and (23) a stack or plurality of stacks of devices sandwiched between separated arrays or interleaved with multiple arrays.

FURTHER COMMENTS AND CONCLUSIONS

Structural or sacrificial dielectric materials may be incorporated into various embodiments of the present invention in a variety of different ways. Such materials may form a third or higher material on selected layers or may form one of the first two materials deposited on some layers. Additional teachings concerning the formation of structures on dielectric substrates and/or the formation of structures that incorporate dielectric materials into the formation process and possibility into the final structures are set forth in a number of patent applications filed Dec. 31, 2003. The first of these filings is U.S. Patent Application No. 60/534,184, which is entitled "Electrochemical Fabrication Methods Incorporating Dielectric Materials and/or Using Dielectric Substrates". The second of these filings is U.S. Patent Application No. 60/533,932, which is entitled "Electrochemical Fabrication Methods Using Dielectric Substrates". The third of these filings is U.S. Patent Application No. 60/534,157, which is entitled "Electrochemical Fabrication Methods Incorporating Dielectric Materials". The fourth of these filings is U.S. Patent Application No. 60/533,891, which is entitled "Methods for Electrochemically Fabricating Structures Incorporating Dielectric Sheets and/or Seed layers That Are Partially Removed Via Planarization". A fifth such filing is U.S. Patent Application No. 60/533,895, which is entitled "Electrochemical Fabrication Method for Producing Multi-layer Three-Dimensional Structures on a Porous Dielectric". Additional patent filings that provide teachings concerning incorporation of dielectrics into the an electrochemical fabrication process include U.S. patent application Ser. No. 11/139,262, filed May 26, 2005, now U.S. Pat. No. 7,501,328, by Lockard, et al., and which is entitled "Methods for Electrochemically Fabricating Structures Using Adhered Masks, Incorporating Dielectric Sheets, and/or Seed Layers that are Partially Removed Via Planarization"; and U.S. patent application Ser. No. 11/029,216, filed Jan. 3, 2005 by Cohen, et al., now abandoned, and which is entitled "Electrochemical Fabrication Methods Incorporating Dielectric Materials and/or Using Dielectric Substrates". These patent filings are each hereby incorporated herein by reference as if set forth in full herein.

Some embodiments may employ diffusion bonding or the like to enhance adhesion between successive layers of material. Various teachings concerning the use of diffusion bonding in electrochemical fabrication processes are set forth in U.S. patent application Ser. No. 10/841,384 which was filed May 7, 2004 by Cohen et al., now abandoned, which is entitled "Method of Electrochemically Fabricating Multilayer Structures Having Improved Interlayer Adhesion" and which is hereby incorporated herein by reference as if set forth in full.

The patent applications and patents set forth below are hereby incorporated by reference herein as if set forth in full. The teachings in these incorporated applications can be combined with the teachings of the instant application in many ways: For example, enhanced methods of producing structures may be derived from some combinations of teachings, enhanced structures may be obtainable, enhanced apparatus may be derived, and the like.

| US Pat App No., Filing Date US App Pub No., Pub Date US Patent No., Pub Date | Inventor, Title |
|---|---|
| 10/434,103 - May 7, 2004 2004-0020782 - Feb. 5, 2004 7,160,429 - Jan. 9, 2007 | Cohen, "Electrochemically Fabricated Hermetically Sealed Microstructures and Methods of and Apparatus for Producing Such Structures" |
| 10/434,294 - May 7, 2003 2004-0065550 - Apr. 8, 2004 | Zhang, "Electrochemical Fabrication Methods With Enhanced Post Deposition Processing" |
| 10/607,931 - Jun. 27, 2003 2004-0140862 - Jul. 22, 2004 7,239,219 - Jul. 3, 2007 | Brown, "Miniature RF and Microwave Components and Methods for Fabricating Such Components" |
| 10/697,597 - Dec. 20, 2002 2004-0146650 - Jul. 29, 2004 | Lockard, "EFAB Methods and Apparatus Including Spray Metal or Powder Coating Processes" |
| 10/830,262 - Apr. 21, 2004 2004-0251142 - Dec. 16, 2004 7,198,704 - Apr. 3, 2007 | Cohen, "Methods of Reducing Interlayer Discontinuities in Electrochemically Fabricated Three-Dimensional Structures" |
| 10/841,006 - May 7, 2004 2005-0067292 - May 31, 2005 | Thompson, "Electrochemically Fabricated Structures Having Dielectric or Active Bases and Methods of and Apparatus for Producing Such Structures" |
| 10/841,100 - May 7, 2004 2005-0032362 - Feb. 10, 2005 7,109,118 - Sep. 19, 2006 | Cohen, "Electrochemical Fabrication Methods Including Use of Surface Treatments to Reduce Overplating and/or Planarization During Formation of Multi-layer Three-Dimensional Structures" |
| 10/841,347 - May 7, 2004 2005-0072681 - Apr. 7, 2005 | Cohen, "Multi-step Release Method for Electrochemically Fabricated Structures" |
| 10/949,744 - Sep. 24, 2004 2005-0126916 - Jun. 16, 2005 7,498,714 - Mar. 3, 2009 | Lockard, "Three-Dimensional Structures Having Feature Sizes Smaller Than a Minimum Feature Size and Methods for Fabricating" |
| 10/995,609 - Nov. 22, 2004 2005-0202660 - Sep. 15, 2005 | Cohen, "Electrochemical Fabrication Process Including Process Monitoring, Making Corrective Action Decisions, and Taking Appropriate Actions" |

-continued

| US Pat App No., Filing Date US App Pub No., Pub Date US Patent No., Pub Date | Inventor, Title |
|---|---|
| 11/028,957 - Jan. 3, 2005 2005-0202667 - Sep. 15, 2005 — | Cohen, "Electrochemical Fabrication Methods Incorporating Dielectric Materials and/or Using Dielectric Substrates" |
| 11/029,218 - Jan. 3, 2005 2005-0199583 - Sep. 15, 2005 7,524,427 - Apr. 28, 2009 | Cohen, "Electrochemical Fabrication Methods Incorporating Dielectric Materials and/or Using Dielectric Substrates" |
| 11/029,221 - Jan. 3, 2005 2005-0215023 - Sep. 29, 2005 7,531,077 - 03 Jan. 2005 | Cohen, "Electrochemical Fabrication Process for Forming Multilayer Multimaterial Microprobe Structures" |
| 11/506,586 - Aug. 8, 2006 2007-0039828 - Feb. 22, 2007 7,611,616 - Nov. 3, 2009 | Cohen, "Mesoscale and Microscale Device Fabrication Methods Using Split Structures and Alignment Elements" |
| 11/733,195 - Apr. 9, 2007 2008-0050524 - Feb. 28, 2008 — | Kumar, "Methods of Forming Three-Dimensional Structures Having Reduced Stress and/or Curvature" |
| 12/345,624 - Dec. 29, 2008 — 8,070,931 - Dec. 6, 2011 | Cohen, "Electrochemical Fabrication Method Including Elastic Joining of Structures" |
| 12/631,632 - Dec. 4, 2009 2010-0155253 - Jun. 24, 2010 — | Kim, "Microprobe Tips and Methods for Making" |
| 12/828,274 - Jun. 30, 2010 — 8,262,916 - Sep. 11, 2012 | Smalley, "Enhanced Methods for at least Partial In Situ Release of Sacrificial Material From Cavities or Channels and/or Sealing of Etching Holes During Fabrication of Multi-Layer Microscale or Millimeter-scale Complex Three-Dimensional Structures" |
| 12/906,970 - Oct. 18, 2010 2011-0132767 - Jun. 11, 2009 8,613,846 - Dec. 24, 2013 | Wu, "Multi-Layer, Multi-Material Fabrication Methods for Producing Micro-Scale and Millimeter-Scale Devices with Enhanced Electrical or Mechanical Properties" |
| 13/273,873 - Oct. 14, 2011 2012-0064227 - Mar. 15, 2012 8,723,543 - May 13, 2014 | Chen, "Cantilever Microprobes For Contacting Electronic Components and Methods for Making Such Probes" |
| 14/280,517 - May 16, 2014 — 9,919,472 - Mar. 20, 2018 | Cohen, "Stacking and Bonding Methods for Forming Multi-Layer, Three-Dimensional, Millimeter Scale and Microscale Structures" |
| 14/333,476 - Jul. 14, 2014 2015-0021299 - Jan. 22, 2015 — | Jensen, "Batch Methods of Forming Microscale or Millimeter Scale Structures Using Electro Discharge Machining Alone or In Combination with Other Fabrication Methods" |
| 14/660,903 - Mar. 17, 2015 — — | Chen, "Methods of Forming Parts from One or More Layers of Deposited Material(s)" |
| 14/720,719 - May 22, 2015 9,878,401 - Jan. 30, 2018 | Veeramani, "Methods of Forming Parts Using Laser Machining" |
| 60/533,947 - Dec. 31, 2003 — — | Kumar, "Probe Arrays and Method for Making" |

Though various portions of this specification have been provided with headers, it is not intended that the headers be used to limit the application of teachings found in one portion of the specification from applying to other portions of the specification. For example, alternatives acknowledged in association with one embodiment or aspect, are intended to apply to all embodiments or aspects to the extent that the features of the different embodiments or aspects make such application functional and do not otherwise contradict or remove all benefits of the adopted embodiment or aspect. Various other embodiments of the present invention exist. Some of these embodiments may be based on a combination of the teachings set forth herein directly with various teachings incorporated herein by reference.

In view of the teachings herein, many further embodiments, alternatives in design and uses of the embodiments of the instant invention will be apparent to those of skill in the art. As such, it is not intended that the invention be limited to the particular illustrative embodiments, alternatives, and uses described above but instead that it be solely limited by the claims presented hereafter.

We claim:

1. A thermal management system for a semiconductor device comprising:
   (a) at least one micro cold plate, comprising:
      (I) at least one fluid inlet selected from the group consisting of: a) at least one header, and b) at least one manifold;
      (II) at least one fluid outlet selected from the group consisting of: a) at least one header, and b) at least one manifold;
      (III) a hybrid microjet and microchannel heat transfer array, comprising:
         a) a plurality of microjet structures for directing a heat transfer fluid from the at least one fluid inlet onto at least one surface of a primary heat exchange region that is selected from the group consisting of:
            (A) at least one surface of a heat source;
            (B) at least one surface in proximity to the at least one heat source surface wherein a separation distance between the at least one surface onto which jetting occurs and the at least one heat source surface is selected from the group consisting of: (i) 10 mm, (ii) 5 mm, (iii) 2 mm, (iv) 1 mm, (v) 500 um, (vi) <=200 um, (vii) <=100 um, (viii) <=50 um, (ix) <=20 um, and (x) <=10 um;
(C) at least one surface of a solid material separated from at least one surface of a heat source by a gap that is occupied by at least one highly conductive transfer material that is selected from the group consisting of: (i) a different solid, (ii) a semi-liquid, and (3) a liquid, wherein a thickness of the gap is selected from the group consisting of: (i) 10 mm, (ii) 5 mm, (iii) 2 mm, (iv) 1 mm, (v) 500 um, (vi) <=200 um, (vii) <=100 um, (viii) <=50 um, (ix) <=20 um, and (x) <=10 um; and
(D) at least one surface of a solid that is in intimate contact with at least one surface or a plurality of separate surfaces of a heat source; and
b) a plurality of post jetting microchannel flow paths to direct the heat transfer fluid from the primary heat exchange region to the at least one outlet header or manifold, wherein the at least one surface of the primary heat exchange region onto which jetting occurs is closer, in the jetting direction, to the at least one surface of the heat source than are the microchannel flow paths;
(b) at least one flow path to move heated fluid, from the fluid outlet to at least one heat exchanger;
(c) at least one flow path to move cooled fluid, directly or indirectly, from the at least one heat exchanger back into the fluid; and
(d) at least one pump functionally configured to direct the fluid through the a loop including to, through, and out of the at least one cold plate and to, through, and out of the heat exchanger.

2. The system of claim 1 additionally comprising a feature selected from the group consisting of:
(a) the at least one surface onto which jetting occurs comprises a plurality of jetting well surfaces with each jetting well surface surrounded by walls that direct fluid away from the jetting well surfaces into the microjet flow paths;
(b) each of the plurality of jetting surfaces is configured to directly receive jetted fluid from a single jet orifice;
(c) the jets have elongated cross-sectional configurations, in a plane perpendicular to a jetting direction, with a length to width aspect ratio selected from the group consisting of: (I) <=10 to 1, (II) <=5 to 1, (III) <=3 to 1, or (IV) <=2 to 1;
(d) the microchannels direct fluid received from the jetting structures along paths that flow past outside walls of the microjet structures initially in a direction that is substantially anti-parallel to the direction of jetting and then in a direction that is substantially perpendicular to the direction of jetting;
(e) the at least one fluid inlet is spaced further from the surface onto which jetting occurs than does a flow path through the microchannels after the fluid leaves the jetting wells;
(f) the device comprises a component selected from the group consisting of: (I) an IC; (II) a microprocessor; (III) an SOC; (IV) an RFIC; (V) an optical transmitter; (VI) am optical receiver; (VII) a power amplifier; (VIII) a GPU; (IX) a CPU; (X) a DSP; (XI) an ASIC; (XII) an APU; (XIII) an LED; (XIV) a laser diode; (XV) a power electronic device; (XVI) a power inverter; (XVII) a power converter; (XVIII) a photonic device, (XIX) a propulsion system; (XX) a solar array; (XXI) a radiator; (XXII) an engine of a micro drone; (XXIII) a spacecraft component; (XXIV) a solid state power amplifier; (XXV) a traveling wave tube amplifier; (XXVI) a package that holds one or more of the devices of (I)-(XXV), and (XXVII) a stack of devices sandwiched between separated heat transfer arrays;
(g) the majority of the heat exchange from a solid to the fluid occurs via a surface of a first metal and wherein selected portions of the heat transfer array are formed from a second metal of higher thermal conductive than the first metal such that heat conductivity as a whole is improved relative to the heat conductivity if the second metal were replaced with the first metal;
(h) the regions onto which jetted fluid impinges are strengthened with a material different from that used to form the side walls of the jetting structures;
(i) the heat transfer array comprises a plurality of adhered planar layers of at least one material where successive layers can be distinguished by stair-stepped configurations and wherein a layer stacking axis is substantially perpendicular to a direction of fluid jetting;
(j) the heat to be removed requires a heat flux, from at least a portion of the primary heat transfer region, selected from the group consisting of: (I) >=200 W/cm$^2$, (II) >=400 W/cm$^2$ and (III) >=800 W/cm$^2$;
(k) the temperature of the at least one surface of the heat source is to be held to a temperature selected from the group consisting of (I) <=100° C., (II) <=80° C., and (III) <=65° C.;
(l) the temperature of the at least one surface of the heat source is to be held to a temperature selected from the group consisting of (I) <=100° C., (II) <=80° C., and (III) <=65° C., and wherein a variation in temperature over the at least one surface of the heat source is to be held at a temperature selected from the group consisting of (I) <=20° C., (II) <=15° C., and (III) <=10° C.;
(m) the temperature of the at least one surface of the heat source is to be held to a temperature selected from the group consisting of (I) <=100° C., (II) <=80° C., and (III) <=65° C., wherein a variation in temperature over the at least one surface of the heat source is to be held at a temperature selected from the group consisting of (I) <=20° C., (II) <=15° C., and (III) <=10° C., and wherein a flow of the heat transfer fluid through the heat transfer array is selected from the group consisting of: (I) <=2.0 L/min per 4 mm×4 mm area covered by the heat transfer array, (II) <=1 L/min per 4 mm×4 mm area covered by the heat transfer array, and (III) <=0.5 L/min per 4 mm×4 mm area covered by the heat transfer array;
(n) at least a portion of the plurality of microjet structures provide flow paths with a cross-sectional dimension in the range selected from the group consisting of (I) 15 to 300 um and (II) 30-200 um; and
(o) at least a portion of the post jetting microchannels have a cross-sectional dimension in the range selected from the group consisting of: (I) 15-300 um and (II) 30-150 um.

3. A microjet heat transfer array, comprising:
(a) a plurality of microjet structures for directing fluid from at least one group inlet onto at least one surface of a primary heat exchange region, wherein the primary heat exchange region is selected from the group consisting of:
- (I) at least one surface of a heat source;
- (II) at least one surface in proximity to a heat source surface wherein a separation distance between the at least one surface onto which jetting occurs and at least one surface of a heat source is less than 10 millimeters;
- (III) at least one surface of a solid material separated from a surface of a heat source by a gap that is occupied by at least one highly conductive transfer material that is selected from the group consisting of:
  - (A) a solid,
  - (B) a semi-liquid,
  - (C) a liquid, and
  - (D) a gaseous material having a heat conductivity that is greater than that of aluminum;
(b) a plurality of post jetting flow paths to direct the fluid from the primary heat exchange region to at least one group outlet comprising paths selected from the group consisting of:
- (I) flow paths that extend antiparallel to the jetting direction along a length that is greater than a width of the flow path that extends radially away from the jet,
- (II) flow paths that extend antiparallel to the jetting direction along a length that is greater than a height of a last stage of a multi-stage jet,
- (III) flow paths that extend through well walls that connect an interior of a jetting well to an interior of another jetting well,
- (IV) flow paths that extend through well walls that connect an interior of a jetting well to an interior of another jetting well wherein a width of a flow path connecting two such wells is less than a nominal diameter of one of the two such wells, and
- (V) flow paths that maintain the majority of the fluid from a given jet within a lateral extent from that jet that is no more than N lateral separation distances of neighboring jets before such fluid reaches a vertical separation from the jetting surface that is greater a height of the jetting channel of that jet, where N is selected from the group consisting of 1, 2, 3, 4, and 5.

4. The heat transfer array of claim 3 comprising a feature selected from the group consisting of:
- (a) a jetting configuration in combination with pre-jetting and post jetting fluid flow paths that provide the array with a uniform vertical heat conductivity across lateral dimensions of the heat transfer array with a possible exception of an external lateral wall region surrounding the array where uniformity has a maximum heat conductivity difference selected from the group consisting of: (I) less than 25%, (II) less than 20%, (III) less than 15%, (IV) less than 10%, and (V) less than 5%;
- (b) a configuration allowing two-dimensional side-by-side tiling of heat transfer arrays while maintaining a uniform vertical heat conductivity across the group of tiled arrays where uniformity has a maximum heat conductivity difference selected from the group consisting of: (I) less than 25%, (II) less than 20%, (III) less than 15%, (IV) less than 10%, and (V) less than 5%;
- (c) a number of inlet to jetting flow path splitting (or dividing levels) equal to N and a number of post jetting recombination stages equal to M, where N>M, and wherein a jet height is consider to be a height of associated with a final stage of the jet;
- (d) the at least one inlet comprises a plurality of inlets with at least a portion of the inlets being located above the jetting area of the plurality of microjet structures, wherein the at least portion of the inlets comprise an amount selected from the group consisting of: (I) a majority of the inlets, (II) more than 67% of the inlets, and (III) all the inlets;
- (e) the at least one inlet comprises a single inlet with the single inlet being located above the jetting area of the plurality of microjet structures;
- (f) the at least one outlet comprises a plurality of outlets with at least a portion of the outlets being located above the jetting area of the plurality of microjet structures, wherein the at least portion of the outlets comprise an amount selected from the group consisting of: (I) a majority of the inlets, (II) more than 67% of the inlets, and (III) all the inlets;
- (g) the at least one outlet comprises a single outlet with the single outlet being located above the jetting area of the plurality of microjet structures;
- (h) The HTA forming part of a cold plate that further comprises a manifold connected to the at least one inlet, with the manifold being located entirely above a region that is limited to all jetting structures, post jetting flow paths and intervening regions;
- (i) The HTA forming part of a cold plate that further comprises a manifold connected to the at least one outlet, with the manifold being located entirely above a region that is limited to all jetting structures, post jetting flow paths and intervening regions;
- (j) the heat transfer array having an inlet to jetting orifice flow impedance of I and a post jetting to exit impedance of J where I>J by an amount selected from the group consisting of: (1) at least 20%, (II) at least 50%, (II) at least 100%, (III) at least 200%, and (IV) at least 400%;
- (k) the heat transfer array having an average inlet to jetting orifice flow impedance (per jet) of I and an average post jetting to exit (per jet) impedance of J where I>J by an amount selected from the group consisting of: (I) at least 20%, (II) at least 50%, (III) at least 100%, (IV) at least 200%, and (V) at least 400%;
- (l) the heat transfer array is configured to be laterally scalable while providing uniform heat transfer rates from one side of the array to an opposite side of the array, where such rates per unit area within an average for the entire per unit area selected from the group consisting of: (I) within 5%, (II) within 10%, (III) within 20%, and (IV) within 30% wherein the unit area consists of no fewer than an area associated with 5% of plurality of jets;
- (m) the heat transfer array is configured such that the existence of a flow inlet region of the array does not cause any first portion of the heat transfer array to have a first heat transfer rate (HTR1) that is substantially different from a second heat transfer rate (HTR2) of a second similarly sized portion of the heat transfer array wherein substantially different is a difference in heat transfer rate that greater than D, where D is selected from the group consisting of: (I) 40%, (II) 30%, (III) 20%, (IV) 10%, and (V) 5%, and wherein the first and second portions include primary heat transfer regions that undergo jetting from a number of jets that is no less than an amount J where J is selected from the group consisting of (I) 20%, (II) 10%, and (III) 5% of the jets of the array;

(n) the heat transfer array is configured such that the existence of a flow outlet region of the array does not cause any first portion of the heat transfer array to have a first heat transfer rate (HTR1) that is substantially different from a second heat transfer rate (HTR2) of a second similarly sized portion of the heat transfer array wherein substantially different is a difference in heat transfer rate that greater than D, where D is selected from the group consisting of: (I) 40%, (II) 30%, (III) 20%, (IV) 10%, and (V) 5%, and wherein the first and second portions include primary heat transfer regions that undergo jetting from a number of jets that is no less than an amount J where J is selected from the group consisting of no less than four jets and also no less (I) 20%, (II) 10%, and (III) 5% of the jets of the array;

(o) the heat transfer array has wells into which jets provide fluid flow, wherein at least one condition exists that is selected from the group consisting of:
  (I) at least a portion of the wells have at least one nearest neighbor flow path connection;
  (II) at least a portion of the wells have at least one second nearest neighbor flow path connection;
  (III) at least a portion of the wells have a mixture of nearest and second nearest neighbor flow path connections;
  (IV) at least a portion of the well walls have non-flow channels that provide thermal expansion/contraction stress relief;
  (V) at least each of a portion of the jets direct a flow of fluid into a plurality of wells;
  (VI) at least a portion of the jets have configurations that are different from a configuration of their respective wells;
  (VII) at least a portion of the jets have configurations that are different from a configuration of other jets;
  (VIII) at least a portion of the wells have configurations that are different from a configuration of other wells;
  (IX) at least a portion of some jets each comprise at least one spacer on a side wall of the jets that sets a minimum spacing of other portions of such jets from their respective well walls;
  (X) at least a portion of some wells comprise walls that hold an inward extending spacer that sets a minimum spacing of the well walls from their respective jets;
  (XI) at least one spacer attached to a single jet that provides lateral displacement inhibition in only one direction but not in a direction selected form the group consisting or: (A) the opposite direction, and (B) a perpendicular direction;
  (XII) at least one spacer attached to a single well that provides lateral displacement inhibition of a respective jet in only one direction but not in a direction selected form the group consisting or: (A) the opposite direction, and (B) a perpendicular direction;
  (XIII) at least one tab connected to a jet that interacts with a well wall to provide a desired vertical spacing between a bottom of the jet and a jetting surface;
  (XIV) at least one tab connected to a jet that does not provide a balanced vertical force on the jet when encountering a well wall but where such a balanced forced is provided by tabs on a plurality of grouped jets;
  (XV) at least two deflectable tabs attached to at least one jet that provide a lateral restoring force when the at least one jet is misaligned with a defined location within at least one well;
  (XV1) at least two deflectable tabs attached to at least two partially opposing walls of at least one well which provide at least one respective jet with a lateral restoring force when the at least one respective jet is misaligned with a defined location with the at least one well; and (p) the separation distance is selected from the group consisting of an amount less than (I) 5 mm, (II) 2 mm, (III) 1 mm, (IV) 500 um, (V) <=200 um, (VI) <=100 um, (VII) <=50 um, (VIII) <=20 um, and (IX) <=10 um.

5. A micro cold plate, comprising:
(a) at least one fluid inlet selected from the group consisting of: (1) at least one header, and (2) at least one manifold;
(b) at least one fluid outlet selected from the group consisting of: (1) at least one header, and (2) at least one manifold;
(c) a heat transfer array according to claim 3.

* * * * *